US012701888B2

(12) United States Patent
Yamazaki et al.

(10) Patent No.: US 12,701,888 B2
(45) Date of Patent:        Aug. 4, 2026

(54) DISPLAY APPARATUS, METHOD FOR FABRICATING DISPLAY APPARATUS, DISPLAY MODULE, AND ELECTRONIC APPARATUS

(71) Applicant: SEMICONDUCTOR ENERGY LABORATORY CO., LTD., Atsugi (JP)

(72) Inventors: Shunpei Yamazaki, Tokyo (JP); Hiroki Adachi, Tochigi (JP); Rai Sato, Tochigi (JP); Daisuke Kubota, Atsugi (JP); Kentaro Hayashi, Atsugi (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 311 days.

(21) Appl. No.: 18/571,991

(22) PCT Filed: Jun. 14, 2022

(86) PCT No.: PCT/IB2022/055475
§ 371 (c)(1),
(2) Date: Dec. 19, 2023

(87) PCT Pub. No.: WO2022/269408
PCT Pub. Date: Dec. 29, 2022

(65) Prior Publication Data
US 2024/0365628 A1        Oct. 31, 2024

(30) Foreign Application Priority Data

Jun. 25, 2021        (JP) ................................. 2021-105816
Jun. 25, 2021        (JP) ................................. 2021-105820

(51) Int. Cl.
        *H10K 59/35*                (2023.01)
        *H10K 39/34*                (2026.01)
        *H10K 59/12*                (2023.01)

(52) U.S. Cl.
        CPC ........... *H10K 59/353* (2023.02); *H10K 39/34* (2023.02); *H10K 59/1201* (2023.02)

(58) Field of Classification Search
        None
        See application file for complete search history.

(56) References Cited

U.S. PATENT DOCUMENTS 5,953,985  A        9/1999  Kobayashi
6,120,338  A        9/2000  Hirano et al.
                    (Continued)

FOREIGN PATENT DOCUMENTS

CN        103022072  A        4/2013
CN        104157665  A        11/2014
                    (Continued)

OTHER PUBLICATIONS

International Search Report (Application No. PCT/IB2022/055475) Dated Aug. 30, 2022.
(Continued)

*Primary Examiner* — Sue A Purvis
*Assistant Examiner* — Jordan M Klein
(74) *Attorney, Agent, or Firm* — Fish & Richardson P.C.

(57)        ABSTRACT

A display apparatus through which a user can see the background and which is capable of performing image capturing with high sensitivity is provided. The display apparatus includes a first light-emitting element, a second light-emitting element adjacent to the first light-emitting element, a light-receiving element adjacent to the second light-emitting element, a first organic layer provided between the second light-emitting element and the light-receiving element, and a second organic layer provided between the first light-emitting element and the second light-emitting element over a substrate with a visible-light-transmitting property. The first light-emitting element has a (Continued)

structure in which a first pixel electrode, a first light-emitting layer, and a common electrode are stacked in this order. The second light-emitting element has a structure in which a second pixel electrode, a second light-emitting layer, and the common electrode are stacked in this order. The light-receiving element has a structure in which a third pixel electrode, a photoelectric conversion layer, and the common electrode are stacked in this order. Transmittance of light with a wavelength which is at least part of the visible light wavelength in the first organic layer is lower than transmittance of light with the wavelength in the second organic layer.

20 Claims, 38 Drawing Sheets

(56)                    References Cited

U.S. PATENT DOCUMENTS

| | | | |
|---|---|---|---|
| 8,492,764 B2 | 7/2013 | Yamazaki et al. | |
| 9,088,006 B2 | 7/2015 | Yamazaki et al. | |
| 9,155,498 B2 | 10/2015 | Akiyama | |
| 9,167,994 B2 | 10/2015 | Akiyama | |
| 9,627,648 B2 | 4/2017 | Yamazaki et al. | |
| 10,003,047 B2 | 6/2018 | Yamazaki et al. | |
| 10,141,544 B2 | 11/2018 | Tsuda et al. | |
| 10,381,599 B2 | 8/2019 | Yamazaki et al. | |
| 10,862,036 B2 | 12/2020 | Ke et al. | |
| 10,903,453 B2 | 1/2021 | Yamazaki et al. | |
| 11,487,373 B2 | 11/2022 | Kubota et al. | |
| 11,621,407 B2 | 4/2023 | Yamazaki et al. | |
| 11,793,010 B2 | 10/2023 | Yamazaki et al. | |
| 11,839,106 B2 | 12/2023 | Yamazaki et al. | |
| 12,096,659 B2 | 9/2024 | Kamada et al. | |
| 12,161,006 B2 | 12/2024 | Yamazaki et al. | |
| 2002/0072139 A1 | 6/2002 | Kashiwabara | |
| 2011/0148290 A1 | 6/2011 | Oota | |
| 2012/0256204 A1 | 10/2012 | Yoshizumi et al. | |
| 2012/0273804 A1 | 11/2012 | Hatano | |
| 2012/0276484 A1 | 11/2012 | Izumi et al. | |
| 2013/0075761 A1* | 3/2013 | Akiyama | H10F 55/25 |
| | | | 257/E31.095 |
| 2013/0084531 A1 | 4/2013 | Hamaguchi et al. | |
| 2013/0084664 A1 | 4/2013 | Yoshitoku et al. | |
| 2013/0084666 A1 | 4/2013 | Oshige | |
| 2013/0280839 A1 | 10/2013 | Sonoda et al. | |
| 2013/0295705 A1 | 11/2013 | Sonoda et al. | |
| 2014/0004640 A1 | 1/2014 | Hamaguchi et al. | |
| 2014/0004642 A1 | 1/2014 | Otsuka et al. | |
| 2014/0350366 A1 | 11/2014 | Akiyama | |
| 2015/0060826 A1 | 3/2015 | Matsumoto et al. | |
| 2015/0069360 A1 | 3/2015 | Sato | |
| 2015/0076476 A1 | 3/2015 | Odaka et al. | |
| 2016/0172595 A1 | 6/2016 | Malinowski et al. | |
| 2016/0315133 A1 | 10/2016 | Sato | |
| 2017/0141167 A1 | 5/2017 | Naganuma | |
| 2017/0256754 A1 | 9/2017 | Defranco et al. | |
| 2018/0190908 A1 | 7/2018 | Ke et al. | |
| 2020/0203662 A1 | 6/2020 | Mollard et al. | |
| 2021/0096678 A1 | 4/2021 | Kubota et al. | |
| 2021/0351250 A1* | 11/2021 | Guo | H10K 59/121 |
| 2022/0392972 A1* | 12/2022 | Heo | H10K 59/35 |
| 2023/0032743 A1 | 2/2023 | Kubota et al. | |
| 2024/0397755 A1 | 11/2024 | Kamada et al. | |

FOREIGN PATENT DOCUMENTS

| | | | |
|---|---|---|---|
| CN | 104681593 A | 6/2015 | |
| CN | 108292714 A | 7/2018 | |
| CN | 112578933 A | 3/2021 | |
| JP | 2000-036385 A | 2/2000 | |
| JP | 2003-059663 A | 2/2003 | |
| JP | 2007-035347 A | 2/2007 | |
| JP | 2008-098106 A | 4/2008 | |
| JP | 2008-147072 A | 6/2008 | |
| JP | 2008-251270 A | 10/2008 | |
| JP | 2011-054941 A | 3/2011 | |
| JP | 2013-073965 A | 4/2013 | |
| JP | 2014-120218 A | 6/2014 | |
| JP | 2014-135251 A | 7/2014 | |
| JP | 2014-197522 A | 10/2014 | |
| JP | 2014-232568 A | 12/2014 | |
| JP | 2015-115178 A | 6/2015 | |
| JP | 2016-197494 A | 11/2016 | |
| JP | 2018-116924 A | 7/2018 | |
| JP | 2018-521459 | 8/2018 | |
| JP | 2019-179696 A | 10/2019 | |
| JP | 2020-160305 A | 10/2020 | |
| JP | 2021-057039 A | 4/2021 | |
| KR | 2013-0033278 A | 4/2013 | |
| KR | 2018-0021002 A | 2/2018 | |
| KR | 2021-0037556 A | 4/2021 | |
| TW | 201316495 | 4/2013 | |
| TW | 201444321 | 11/2014 | |
| TW | 201705585 | 2/2017 | |
| TW | 202117694 | 5/2021 | |
| WO | WO-2017/001353 | 1/2017 | |
| WO | WO-2019/234543 | 12/2019 | |
| WO | WO-2020/053692 | 3/2020 | |

OTHER PUBLICATIONS

Written Opinion (Application No. PCT/IB2022/055475) Dated Aug. 30, 2022.

Lamprecht.B et al., "Organic optoelectronic device fabrication using standard UV photolithography", Phys. Stat. Sol. (RRL) (Physica Status Solidi. Rapid Research Letters.), Oct. 30, 2007, vol. 2, No. 1, pp. 16-18.

Zakhidov.A et al., "Orthogonal processing: A new strategy for organic electronics", Chem. Sci. (Chemical Science), Apr. 7, 2011, vol. 2, No. 6, pp. 1178-1182.

Malinowski.P et al., "High resolution photolithography for direct view active matrix organic light-emitting diode augmented reality displays", J. Soc. Inf. Display (Journal of The Society for Information Display), Apr. 2, 2018, vol. 26, No. 3, pp. 128-136.

Malinowski.P et al., "Photolithographic patterning of organic photodetectors with a non-fluorinated photoresist system", Organic Electronics, Jul. 12, 2014, vol. 15, No. 10, pp. 2355-2359.

Malinowski.P et al., "Multicolor 1250 ppi OLED Arrays Patterned by Photolithography", SID Digest '16 : SID International Symposium Digest of Technical Papers, May 22, 2016, vol. 47, No. 1, pp. 1009-1012.

Papadopoulos.N et al., "AMOLED Displays with In-Pixel Photodetector", Liquid Crystals and Display Technology, Jul. 9, 2020, pp. 1-19.

Ke.T et al., "Technology Developments in High-Resolution FMM-free OLED and Beol IGZO TFTs for Power-Efficient Microdisplays", SID Digest '21 : SID International Symposium Digest of Technical Papers, May 1, 2021, vol. 52, No. 1, pp. 127-130.

Malinowski.P et al., "Integration of additional functionalities into the frontplane of AMOLED displays", SID Digest '20 : SID International Symposium Digest of Technical Papers, Aug. 1, 2020, vol. 51, No. 1, pp. 646-649.

Malinowski.P et al., "Organic photolithography for displays with integrated fingerprint scanner", SID Digest '19 : SID International Symposium Digest of Technical Papers, May 29, 2019, vol. 50, No. 1, pp. 1007-1010.

Ke.T et al., "Island and Hole Fabrication on OLED Stack for High-Resolution Sensor in Display Application", IDW '20 : Proceedings of The 27th International Display Workshops, Dec. 9, 2020, vol. 27, pp. 902-905.

Gather.M et al., "Solution-Processed Full-Color Polymer-OLED Displays Fabricated by Direct Photolithography", SID Digest '06 : SID International Symposium Digest of Technical Papers, Jun. 1, 2006, vol. 37, No. 1, pp. 909-911.

Malinowski.P et al., "Photolithography as Enabler of AMOLED Displays Beyond 1000 ppi", SID Digest '17 : SID International

(56)          References Cited

OTHER PUBLICATIONS

Symposium Digest of Technical Papers, May 1, 2017, vol. 48, No. 1, pp. 623-626.

* cited by examiner

FIG. 29A
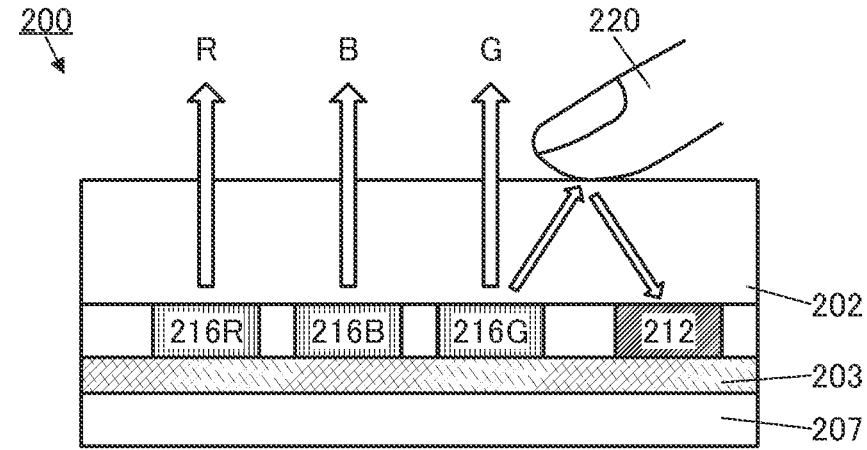
FIG. 29B
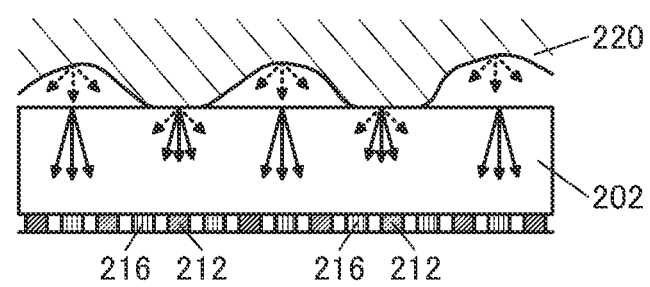
FIG. 29C
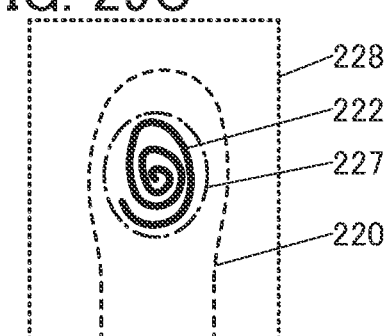
FIG. 29D
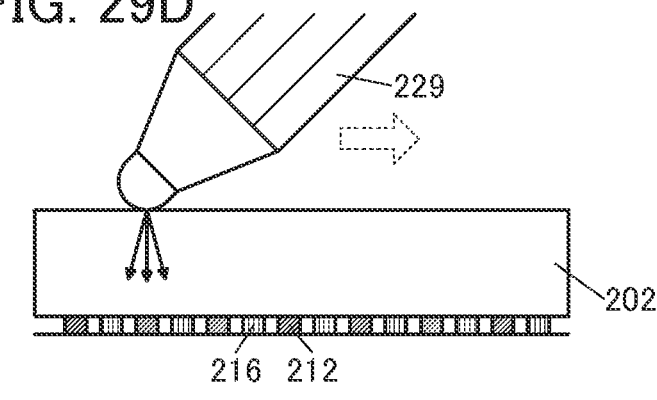
FIG. 29E
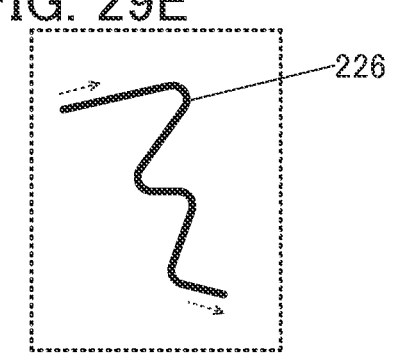
FIG. 29F
| 216R | 216G |
|------|------|
| 216B | 212  |
FIG. 29G
| 216 R | 216 G | 216 B |
|-------|-------|-------|
| 212 | | |
FIG. 29H
| 216 R | 216 G | 216 B | 216 W |
|-------|-------|-------|-------|
| 212 | | | |

FIG. 31A
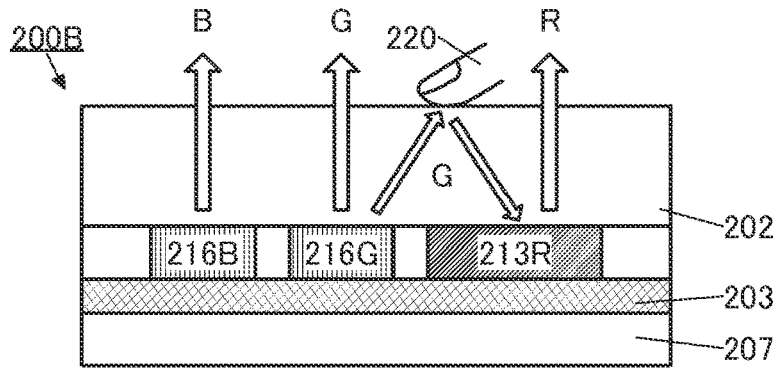
FIG. 31B     FIG. 31C     FIG. 31D     FIG. 31E
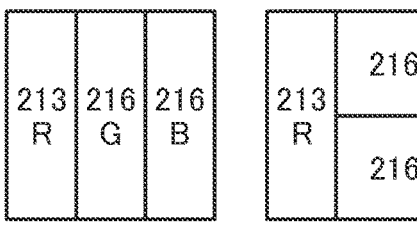
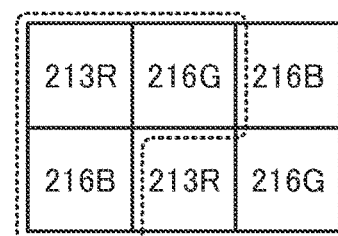
FIG. 31F                FIG. 31H
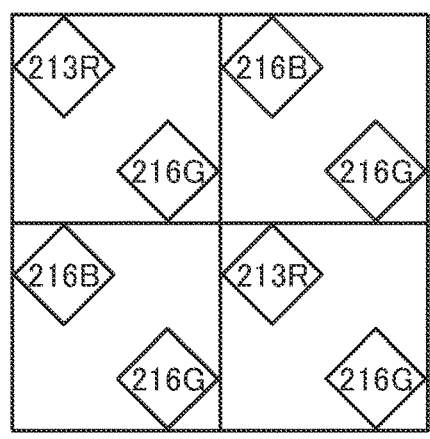
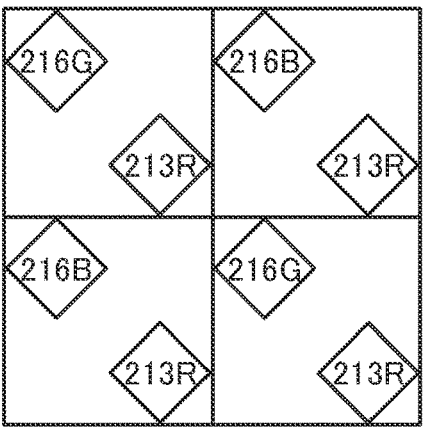
FIG. 31G                FIG. 31I
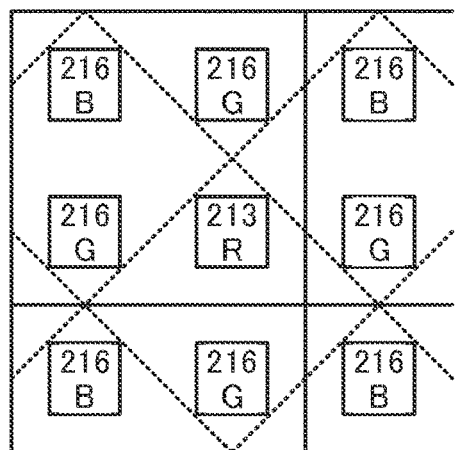
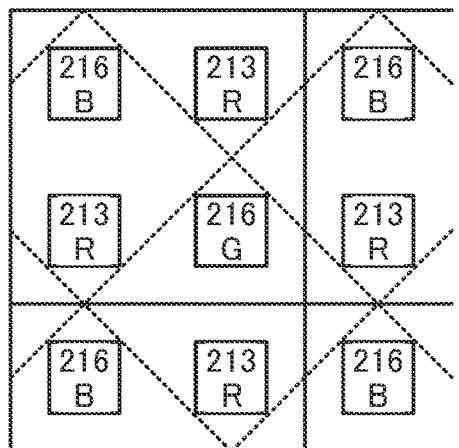

380A

380B

DISPLAY APPARATUS, METHOD FOR FABRICATING DISPLAY APPARATUS, DISPLAY MODULE, AND ELECTRONIC APPARATUS

CROSS REFERENCE TO RELATED APPLICATIONS

This application is a U.S. National Phase Application under 35 U.S.C. § 371 of International Application PCT/IB2022/055475, filed on Jun. 14, 2022, which is incorporated by reference and claims the benefit of foreign priority applications filed in Japan on Jun. 25, 2021, as Application No. 2021-105816 and 2021-105820.

TECHNICAL FIELD

One embodiment of the present invention relates to a display apparatus. One embodiment of the present invention relates to an image capturing device. One embodiment of the present invention relates to a display apparatus having an image capturing function. One embodiment of the present invention relates to a display module. One embodiment of the present invention relates to an electronic apparatus.

Note that one embodiment of the present invention is not limited to the above technical field. Examples of a technical field of one embodiment of the present invention disclosed in this specification and the like include a semiconductor device, a display apparatus, a light-emitting apparatus, a power storage device, a memory device, an electronic apparatus, a lighting device, an input device, an input/output device, a driving method thereof, and a fabricating method thereof. A semiconductor device refers to any device that can function by utilizing semiconductor characteristics.

BACKGROUND ART

In recent years, display apparatuses have been required to have higher resolution in order to display high-definition images. In addition, display apparatuses used in information terminal devices such as smartphones, tablet terminals, and notebook PCs (personal computers) have been required to have lower power consumption as well as higher resolution. Furthermore, display apparatuses have been required to have a variety of functions such as a function of a touch sensor and a function of capturing images of fingerprints for authentication in addition to a function of displaying images.

Light-emitting apparatuses including light-emitting elements have been developed as display apparatuses, for example. Light-emitting elements (also referred to as EL elements) utilizing an electroluminescence (hereinafter referred to as EL) phenomenon have features such as ease of reduction in thickness and weight, high-speed response to an input signal, and driving with a direct-constant voltage source, and have been used in display apparatuses. For example, Patent Document 1 discloses a flexible light-emitting apparatus including an organic EL element.

Non-Patent Document 1 discloses a method for fabricating an organic optoelectronic device using standard UV photolithography.

REFERENCE

[Patent Document 1] Japanese Published Patent Application No. 2014-197522

[Non-Patent Document 1] B. Lamprecht et al., "Organic optoelectronic device fabrication using standard UV photolithography" phys.stat.sol.(RRL)2, No. 1, p. 16-18 (2008)

SUMMARY OF THE INVENTION

Problems to be Solved by the Invention

An object of one embodiment of the present invention is to provide a display apparatus or image capturing device capable of performing image capturing with high sensitivity. Another object of one embodiment of the present invention is to provide a display apparatus or image capturing device with high resolution. Another object of one embodiment of the present invention is to provide a display apparatus or image capturing device with a high aperture ratio. Another object of one embodiment of the present invention is to provide a display apparatus through which a user can see the background. Another object of one embodiment of the present invention is to provide a display apparatus with high light extraction efficiency. Another object of one embodiment of the present invention is to provide a display apparatus having high display quality. Another object of one embodiment of the present invention is to provide a display apparatus capable of obtaining biological information such as fingerprints. Another object of one embodiment of the present invention is to provide a display apparatus functioning as a touch sensor. Another object of one embodiment of the present invention is to provide a highly functional display apparatus. Another object of one embodiment of the present invention is to provide a display apparatus or image capturing device with high reliability. Another object of one embodiment of the present invention is to provide a display apparatus or image capturing device having a novel structure. Another object of one embodiment of the present invention is to provide an electronic apparatus including the display apparatus or the image capturing device. Another object of one embodiment of the present invention is to provide a method for fabricating the display apparatus, the image capturing device, or the electronic apparatus.

Note that the description of these objects does not preclude the presence of other objects. Note that one embodiment of the present invention does not have to achieve all the objects. Note that other objects can be derived from the description of the specification, the drawings, the claims, and the like.

Means for Solving the Problems

One embodiment of the present invention is a display apparatus including a first light-emitting element, a second light-emitting element adjacent to the first light-emitting element, a light-receiving element adjacent to the second light-emitting element, a first organic layer provided between the second light-emitting element and the light-receiving element, and a second organic layer provided between the first light-emitting element and the second light-emitting element over a substrate having a visible-light-transmitting property. The first light-emitting element includes a first pixel electrode, a first light-emitting layer over the first pixel electrode, and a common electrode over the first light-emitting layer. The second light-emitting element includes a second pixel electrode, a second light-emitting layer over the second pixel electrode, and the common electrode over the second light-emitting layer. The light-receiving element includes a third pixel electrode, a photoelectric conversion layer over the third pixel electrode, and the common electrode over the photoelectric conversion layer. The common electrode is provided over the first organic layer and the second organic layer. The common electrode has a visible-light-transmitting property. Transmittance of light with a specific wavelength which is at least part of a visible light wavelength through the first organic layer is lower than transmittance of light with the specific wavelength in the second organic layer.

Another embodiment of the present invention is a display apparatus including a first light-emitting element, a second light-emitting element adjacent to the first light-emitting element, a light-receiving element adjacent to the second light-emitting element, a first organic layer provided between the second light-emitting element and the light-receiving element, and a second organic layer provided between the first light-emitting element and the second light-emitting element over a substrate having a visible-light-transmitting property. The first light-emitting element includes a first pixel electrode, a first light-emitting layer over the first pixel electrode, and a common electrode over the first light-emitting layer. The second light-emitting element includes a second pixel electrode, a second light-emitting layer over the second pixel electrode, and the common electrode over the second light-emitting layer. The common electrode is provided over the first organic layer and over the second organic layer. The common electrode has a visible-light-transmitting property. The light-receiving element includes a third pixel electrode, a photoelectric conversion layer over the third pixel electrode, and the common electrode over the photoelectric conversion layer. Transmittance of at least one of red light, green light, and blue light through the first organic layer is lower than the transmittance of the light in the second organic layer.

In the above embodiment, the first and second pixel electrodes may have a visible-light-transmitting property.

In the above embodiment, end portions of the first to third pixel electrodes may have a tapered shape, the first light-emitting layer may cover the end portion of the first pixel electrode, the second light-emitting layer may cover the end portion of the second pixel electrode, and the photoelectric conversion layer may cover the end portion of the third pixel electrode.

In the above embodiment, the first light-emitting layer may include a first tapered portion between the end portion of the first pixel electrode and the second organic layer, the second light-emitting layer may include a second tapered portion between the end portion of the second pixel electrode and the second organic layer, and the photoelectric conversion layer may include a third tapered portion between the end portion of the third pixel electrode and the first organic layer.

In the above embodiment, a first carrier-transport layer over the first light-emitting layer, a second carrier-transport layer over the second light-emitting layer, and a third carrier-transport layer over the photoelectric conversion layer may be provided.

In the above embodiment, a common layer over the first carrier-transport layer, the second carrier-transport layer, the third carrier-transport layer, the first organic layer, and the second organic layer and the common electrode over the common layer may be provided.

In the above embodiment, the common layer may include a carrier-injection layer.

A display module including the display apparatus of one embodiment of the present invention and at least one of a connector and an integrated circuit is also one embodiment of the present invention.

An electronic apparatus including the display module of one embodiment of the present invention and at least one of a battery, a camera, a speaker, and a microphone is also one embodiment of the present invention.

Another embodiment of the present invention is a method for fabricating a display apparatus including the following steps: a step of forming a first pixel electrode, a second pixel electrode, and a third pixel electrode over a substrate having a visible-light-transmitting property; a step of forming a first light-emitting film over the substrate and over the first to third pixel electrodes; a step of forming a first sacrificial film over the first light-emitting film, processing the first light-emitting film and the first sacrificial film to form a first light-emitting layer and a first sacrificial layer over the first light-emitting layer; a step of forming a second light-emitting film over the substrate, the second pixel electrode, the third pixel electrode, and the first sacrificial layer; a step of forming a second sacrificial film over the second light-emitting film, processing the second light-emitting film and the second sacrificial film to form a second light-emitting layer adjacent to the first light-emitting layer and a second sacrificial layer over the second light-emitting layer; a step of forming a photoelectric conversion film over the substrate, the third pixel electrode, the first sacrificial layer, and the second sacrificial layer; a step of forming a third sacrificial film over the photoelectric conversion film, processing the photoelectric conversion film and the third sacrificial film to form a photoelectric conversion layer adjacent to the second light-emitting layer and a third sacrificial layer over the photoelectric conversion layer; a step of forming a first organic layer between the second light-emitting layer and the photoelectric conversion layer; a step of forming a second organic layer, between the first light-emitting layer and the second light-emitting layer, whose transmittance of light with a specific wavelength which is at least part of a visible light wavelength is higher than transmittance of light with the specific wavelength in the first organic layer; a step of removing at least part of the first to third sacrificial layers; and a step of forming a common electrode having a visible-light-transmitting property over the first light-emitting layer, the second light-emitting layer, the photoelectric conversion layer, the first organic layer, and the second organic layer.

Another embodiment of the present invention is a method for fabricating a display apparatus including the following steps: a step of forming a first pixel electrode, a second pixel electrode, and a third pixel electrode over a substrate having a visible-light-transmitting property; a step of forming a first light-emitting film over the substrate and over the first to third pixel electrodes; a step of forming a first sacrificial film over the first light-emitting film; a step of processing the first light-emitting film and the first sacrificial film to form a first light-emitting layer and a first sacrificial layer over the first light-emitting layer; a step of forming a second light-emitting film over the substrate, the second pixel electrode, the third pixel electrode, and the first sacrificial layer; a step of forming a second sacrificial film over the second light-emitting film; a step of processing the second light-emitting film and the second sacrificial film to form a second light-emitting layer adjacent to the first light-emitting layer and a second sacrificial layer over the second light-emitting layer; a step of forming a photoelectric conversion film over the substrate, over the third pixel electrode, the first sacrificial layer, and the second sacrificial layer; a step of forming a third sacrificial film over the photoelectric conversion film; a step of processing the photoelectric conversion film and the third sacrificial film to form a photoelectric conversion layer adjacent to the second light-emitting layer and a third sacrificial layer over the photoelectric conversion layer; a step of forming a first organic layer between the second light-emitting layer and the photoelectric conversion layer; a step of forming a second organic layer whose transmittance of at least one of red light, green light, and blue light through the first organic layer is lower than the transmittance of the light in the second organic layer; a step of removing at least part of the first to third sacrificial layer; and a step of forming a common electrode having a visible-light-transmitting property over the first light-emitting layer, the second light-emitting layer, the photoelectric conversion layer, the first organic layer, and the second organic layer.

In the above embodiment, the first and second pixel electrodes may have a visible-light-transmitting property.

In the above embodiment, a protective film may be formed over the first to third sacrificial layers and over the first organic layer before formation of the second organic layer, an organic film may be formed over the protective film, and the organic film may be processed to form the second organic layer.

In the above embodiment, the protective film may be processed to form a protective layer below the second organic layer.

In the above embodiment, a common layer may be formed over the first light-emitting layer, the second light-emitting layer, the photoelectric conversion layer, the first organic layer, and the second organic layer after removing at least part of the first to third sacrificial layers.

In the above embodiment, the common layer may include a carrier-injection layer.

In the above embodiment, the method may be employed in which a film functioning as a first carrier-transport layer is formed over the first light-emitting film after formation of the first light-emitting film and formation of the first sacrificial film; the first light-emitting film, the film functioning as a first carrier-transport layer, and the first sacrificial film are processed to form the first light-emitting layer, the first carrier-transport layer over the first light-emitting layer, and the first sacrificial layer over the first carrier-transport layer; a film functioning as a second carrier-transport layer is formed over the second light-emitting film after formation of the second light-emitting film and formation of the second sacrificial film; the second light-emitting film, the film functioning as a second carrier-transport layer, and the second sacrificial film are processed to form the second light-emitting layer, the second carrier-transport layer over the second light-emitting layer, and the second sacrificial layer over the second carrier-transport layer; a film functioning as a third carrier-transport layer is formed over the photoelectric conversion film after formation of the photoelectric conversion film and formation of the third sacrificial film; and the photoelectric conversion film, the film functioning as a third carrier-transport layer, and the third sacrificial film are processed to form the photoelectric conversion layer, the third carrier-transport layer over the photoelectric conversion layer, and the third sacrificial layer over the third carrier-transport layer.

In the above embodiment, the method may be employed in which the first to third pixel electrodes are formed so that end portions of the first to third pixel electrodes have a tapered shape, the first light-emitting film is processed to form the first light-emitting layer to cover the end portion of the first pixel electrode, the second light-emitting film is processed to form the second light-emitting layer to cover the end portion of the second pixel electrode, and the photoelectric conversion film is processed to form the photoelectric conversion layer to cover the end portion of the third pixel electrode.

In the above embodiment, the method may be employed in which the first light-emitting film is processed to form the first light-emitting layer so as to include a first tapered portion between the end portion of the first pixel electrode and the end portion of the first sacrificial layer, the second light-emitting film is processed to form the second light-emitting layer so as to include a second tapered portion between the end portion of the second pixel electrode and the end portion of the second sacrificial layer, and the photoelectric conversion film is processed to form the photoelectric conversion layer so as to include a third tapered portion between the end portion of the third pixel electrode and the end portion of the third sacrificial layer.

Effect of the Invention

According to one embodiment of the present invention, a display apparatus or image capturing device capable of performing image capturing with high sensitivity can be provided. According to one embodiment of the present invention, a display apparatus or image capturing device with high resolution can be provided. According to another embodiment of the present invention, display apparatus or image capturing device with a high aperture ratio can be provided. According to another embodiment of the present invention, a display apparatus or image capturing device through which a user can see the background can be provided. According to one embodiment of the present invention, a display apparatus with high light extraction efficiency can be provided. According to one embodiment of the present invention, a display apparatus having high display quality can be provided. According to one embodiment of the present invention, a display apparatus capable of obtaining biological information such as fingerprints can be provided. According to one embodiment of the present invention, a display apparatus functioning as a touch sensor can be provided. According to one embodiment of the present invention, a highly functional display apparatus can be provided. According to one embodiment of the present invention, a display apparatus or image capturing device with high reliability can be provided. According to one embodiment of the present invention, a display apparatus or image capturing device having a novel structure can be provided. According to one embodiment of the present invention, an electronic apparatus including the display apparatus or the image capturing device can be provided. According to one embodiment of the present invention, a method for fabricating the display apparatus, the image capturing device, or the electronic apparatus can be provided.

Note that the description of these effects does not preclude the presence of other effects. Note that one embodiment of the present invention does not necessarily have all of these effects. Other effects can be derived from the description of the specification, the drawings, the claims, or the like.

BRIEF DESCRIPTION OF THE DRAWINGS

FIG. 1B, FIG. 1C1, and FIG. 1C2 are cross-sectional views illustrating structure examples of a display apparatus.

FIG. 2 is a cross-sectional view illustrating a structure example of a display apparatus.

FIG. 5A, FIG. 5B1, and FIG. 5B2 are cross-sectional views illustrating structure examples of a display apparatus.

FIG. 16B1 and FIG. 16B2 are cross-sectional views illustrating structure examples of transistors.

FIG. 17 is a cross-sectional view illustrating a structure example of a display apparatus.

FIG. 18 is a cross-sectional view illustrating a structure example of a display apparatus.

FIG. 19 is a cross-sectional view illustrating a structure example of a display apparatus.

FIG. 29A, FIG. 29B, and FIG. 29D are cross-sectional views illustrating examples of a display apparatus. FIG. 29C and FIG. 29E are diagrams illustrating examples of images. FIG. 29F to FIG. 29H are top views illustrating examples of a pixel.

FIG. 31A is a cross-sectional view illustrating a structure example of a display apparatus. FIG. 31B to FIG. 31I are top views illustrating examples of a pixel.

MODE FOR CARRYING OUT THE INVENTION

Figure 1A:
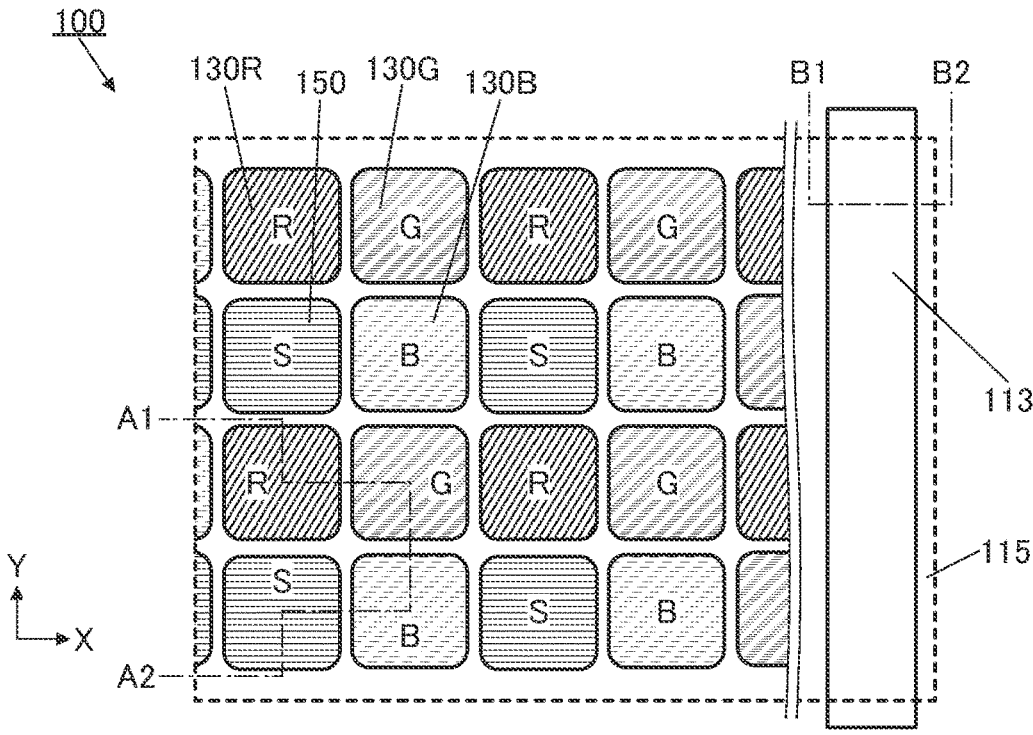
FIG. 1A is a top view illustrating a structure example of a display apparatus.

Hereinafter, embodiments will be described with reference to the drawings. Note that the embodiments can be implemented with many different modes, and it will be readily understood by those skilled in the art that modes and details thereof can be changed in various ways without departing from the spirit and scope thereof. Thus, the present invention should not be interpreted as being limited to the following description of the embodiments.

Note that in structures of the present invention described below, the same reference numerals are commonly used for the same portions or portions having similar functions in different drawings, and a repeated description thereof is omitted. Furthermore, the same hatch pattern is used for the portions having similar functions, and the portions are not especially denoted by reference numerals in some cases.

Note that in each drawing described in this specification and the like, the size, the layer thickness, or the region of each component is exaggerated for clarity in some cases. Therefore, the size, the layer thickness, or the region is not limited to the illustrated scale.

Note that ordinal numbers such as "first" and "second" in this specification and the like are used in order to avoid confusion among components and do not limit the number of components.

Note that the expressions indicating directions, such as "over" and "under," are basically used to correspond to the directions in the drawings. However, in some cases, the term "over" or "under" in the specification indicates a direction that does not correspond to the apparent direction in the drawings, for the purpose of easy description or the like. For example, when the stacked order (or formation order) of a stack is described, even in the case where a surface on which the stack is provided (e.g., a formation surface, a support surface, a bonding surface, or a flat surface) is located above the stack in the drawings, the direction and the opposite direction are referred to as "under" and "over", respectively, in some cases.

In this specification and the like, the terms "film" and "layer" can be interchanged with each other depending on the case or circumstances. For example, in some cases, the term "conductive layer" or "insulating layer" can be interchanged with the term "conductive film" or "insulating film."

Note that in this specification and the like, an EL layer refers to a layer that contains at least a light-emitting substance (also referred to as a light-emitting layer) or a stack including the light-emitting layer provided between a pair of electrodes of a light-emitting element. A PD layer refers to a layer that is provided between a pair of electrodes of a light-receiving element and contains at least a photoelectric conversion material (such a layer is also referred to as an active layer or a photoelectric conversion layer), or a stack including an active layer.

In this specification and the like, a display panel that is one embodiment of a display apparatus has a function of displaying (outputting), for example, an image on (to) the display surface. Thus, the display panel is one embodiment of an output device.

Furthermore, in this specification and the like, a substrate of a display panel to which a connector such as an FPC (Flexible Printed Circuit) or a TCP (Tape Carrier Package) is attached, or a substrate on which an IC is mounted by a COG (Chip On Glass) method or the like is referred to as a display panel module, a display module, or simply a display panel or the like in some cases.

Embodiment 1

In this embodiment, a structure example of a display apparatus of one embodiment of the present invention and an example of a method for fabricating the display apparatus will be described.

One embodiment of the present invention is a display apparatus in which a light-emitting element (also referred to as a light-emitting device) and a light-receiving element (also referred to as a light-receiving device) are provided over a substrate. The light-emitting element includes a pair of electrodes and an EL layer therebetween. The light-receiving element includes a pair of electrodes and a PD layer therebetween. Here, the EL layer includes at least alight-emitting layer and preferably includes a plurality of layers. The EL layer preferably includes, for example, a light-emitting layer and a carrier-transport layer (a hole-transport layer or an electron-transport layer) over the light-emitting layer. The PD layer includes at least an active layer (also referred to as a photoelectric conversion layer) and preferably includes a plurality of layers. The PD layer preferably includes, for example, an active layer and a carrier-transport layer (a hole-transport layer or an electron-transport layer) over the active layer.

The light-emitting element is preferably an organic EL element (organic electroluminescent element). The light-receiving element is preferably an organic photodiode (organic photoelectric conversion element).

The display apparatus preferably includes two or more light-emitting elements that emit light of different colors. The light-emitting elements that emit light of different colors include respective EL layers containing different materials. For example, when three kinds of light-emitting elements that emit red (R) light, green (G) light, and blue (B) light are included, a full-color display apparatus can be achieved.

One embodiment of the present invention is capable of performing image capturing by a plurality of light-receiving elements and thus functions as an image capturing device. In this case, the light-emitting elements can be used as a light source for image capturing. Moreover, one embodiment of the present invention is capable of displaying an image with a plurality of light-emitting elements and thus functions as a display apparatus. Accordingly, one embodiment of the present invention can be regarded as a display apparatus that has an image capturing function or an image capturing apparatus that has a display function.

In the display apparatus of one embodiment of the present invention, the light-receiving elements as well as the light-emitting elements are arranged in a matrix in a display portion, for example. Hence, the display portion has a function of a light-receiving portion in addition to a function of displaying an image. An image can be captured with a plurality of light-receiving elements provided in the display portion, so that the display apparatus can function as an image sensor or a touch sensor. That is, the display apparatus of one embodiment of the present invention can capture an image in the display portion, for example. Alternatively, the display apparatus of one embodiment of the present invention can sense an object approaching or touching the display portion. Furthermore, since the light-emitting elements provided in the display portion can be used as a light source at the time of receiving light, a light source does not need to be provided separately from the display apparatus; thus, a highly functional display apparatus can be provided without increasing the number of electronic components.

In this specification and the like, a "touch sensor" includes a "contactless touch sensor" having a function of detecting an object in proximity to but not in contact with the sensor in some cases.

In one embodiment of the present invention, when an object reflects light emitted by the light-emitting element included in the display portion, the light-receiving element can sense the reflected light; thus, image capturing and touch sensing of the object can be performed even in a dark environment.

Furthermore, when a finger, a palm, or the like contacts the display portion in the display apparatus of one embodiment of the present invention, an image of the fingerprint or the palm print can be captured. Thus, an electronic apparatus including the display apparatus of one embodiment of the present invention can perform biometric authentication by using the captured image of the fingerprint or the palm print. Accordingly, an image capturing device for the fingerprint authentication or palm-print authentication does not need to be additionally provided, and the number of components of the electronic apparatus can be reduced. Since the light-receiving elements are arranged in a matrix in the display portion, an image of a fingerprint or a palm print can be captured in any position in the display portion, which can provide a highly convenient electronic apparatus.

Here, as a way of forming EL layers separately between light-emitting elements of different colors and forming a PD layer, an evaporation method using a shadow mask such as a metal mask is known. However, this method causes a deviation from the designed shape and position of an island-shaped organic film due to various influences such as the accuracy of the metal mask, the positional deviation between the metal mask and a substrate, a warp of the metal mask, and expansion of the outline of a deposited film due to vapor scattering, for example; accordingly, it is difficult to achieve high resolution and high aperture ratio. In addition, dust derived from a material attached to the metal mask in evaporation is generated in some cases. Such dust might cause defective patterning of the light-emitting elements. In addition, a short circuit derived from the dust may occur. Furthermore, a step of cleaning the material attached to the metal mask is necessary. Thus, a measure has been taken for pseudo increase in resolution (also referred to as pixel density) by employing a unique pixel arrangement such as a PenTile arrangement, for example.

In one embodiment of the present invention, fine patterning of an EL layer and a PD layer is performed without a shadow mask such as a metal mask. In this manner, a highly functional display apparatus with high resolution and high aperture ratio can be achieved. Moreover, EL layers can be separately formed, enabling the display apparatus to perform extremely clear display with high contrast and high display quality.

In the case where EL layers and a PD layer are separately formed, spaces are formed between adjacent EL layers and between an EL layer and a PD layer adjacent to each other. In the case where a common electrode is formed over EL layers and a PD layer, for example, the common electrode is formed in the space and disconnection of the common electrode is caused in some cases. Furthermore, the common electrode is locally thinned in the space and the electric resistance is increased in some cases. In view of the above, the space is filled with an insulating layer; hence, the occurrence of the above defects are inhibited and a highly reliable display apparatus can be achieved.

Here, when the substrate provided in the display apparatus is a substrate having a visible-light-transmitting property and an insulating layer having a high visible-light-transmitting property is provided in the above-described space, external light can pass through the insulating layer, for example. When the pair of electrodes of the light-emitting element is an electrode having a visible-light-transmitting property, the external light can pass through the light-emitting element, for example. Thus, a user of the display apparatus can see the background of the display apparatus as a real image.

In this specification and the like, in the case where A has a transmitting property with respect to light B, transmittance of light B through A is greater than or equal to 5%.

In the case where an insulating layer having a high-visible-light-transmitting property is provided in the above-described space, part of light emitted from an EL layer is incident on a PD layer due to stray light and noise is caused when image capturing is performed using a light-receiving element including the PD layer; thus, the image capturing sensitivity is decreased in some cases.

In view of the above, in the display apparatus of one embodiment of the present invention, an insulating layer having a high-visible-light-transmitting property is provided in the space between EL layers and an insulating layer having a high-visible-light-blocking property is provided in the space between an EL layer and a PD layer. In this manner, the display apparatus of one embodiment of the present invention enables a user of the display apparatus to see the background as a real image while inhibiting a decrease in image capturing sensitivity due to stray light.

The insulating layer provided in the space can be, for example, an organic layer such as a resin layer. For example, the insulating layer provided in the space between EL layers can be a photosensitive resin layer used as a photoresist. The insulating layer provided in a space between an EL layer and a PD layer can be a coloring layer (also referred to as a color filter), for example, a color resist (also referred to as a photosensitive resist for a color filter). For example, when the insulating layer provided in the space between EL layers is a photoresist and the insulating layer provided in the space between an EL layer and a PD layer is a color resist, the insulating layers can be formed in the spaces only by light exposure and development performed after application of the photoresist or the color resist.

Structure Example 1

FIG. TA is a schematic top view of a display apparatus 100. The display apparatus 100 includes a plurality of light-emitting elements 130R that exhibit red, a plurality of light-emitting elements 130G that exhibit green, a plurality of light-emitting elements 130B that exhibit blue, and a plurality of light-receiving elements 150. In FIG. TA, light-emitting regions of the light-emitting elements are denoted by R, G, and B to easily differentiate the light-emitting elements. In addition, light-receiving regions of the light-receiving elements are denoted by S in FIG. TA.

In this specification and the like, for example, the term "light-emitting element 130" is sometimes used to describe matters common to the light-emitting element 130R, the light-emitting element 130G, and the light-emitting element 130B. Likewise, in the description of matters common to other components that are distinguished using alphabets, reference numerals without such alphabets are sometimes used.

The light-emitting elements 130R, the light-emitting elements 130G, the light-emitting elements 130B, and the light-receiving elements 150 are arranged in a matrix. FIG. TA illustrates a structure in which two types of elements are alternately arranged in one line. Note that the arrangement method of the light-emitting elements and light-receiving elements is not limited thereto; another arrangement method such as a stripe arrangement, an S-stripe arrangement, a delta arrangement, a Bayer arrangement, or a zigzag arrangement may be employed, or a PenTile arrangement or a diamond arrangement may also be used.

As the light-emitting elements 130R, the light-emitting elements 130G, and the light-emitting element 130B, EL elements such as OLEDs (Organic Light Emitting Diodes) or QLEDs (Quantum-dot Light Emitting Diodes) are preferably used. As a light-emitting substance contained in the EL element, a substance that emits fluorescent light (a fluorescent material), a substance that emits phosphorescent light (a phosphorescent material), an inorganic compound (e.g., a quantum dot material), a substance that exhibits thermally activated delayed fluorescence (a thermally activated delayed fluorescent (TADF) material), and the like can be given.

As the light-receiving element 150, a pn-type or pin-type photodiode (also referred to as a PD) can be used, for example. The light-receiving element 150 functions as a photoelectric conversion element that detects light entering the light-receiving element 150 and generates electric charge. The amount of generated electric charge in the photoelectric conversion element is determined depending on the amount of incident light. It is particularly preferable to use an organic photodiode including a layer containing an organic compound as the light-receiving element 150. An organic photodiode, which is easily made thin, lightweight, and large in area and has a high degree of freedom for shape and design, can be used in a variety of devices.

By including the light-receiving elements 150, the display apparatus 100 can capture images. Thus, the display apparatus 100 can function as an image sensor or a touch sensor. That is, the display apparatus 100 can take an image in the display portion, for example. Alternatively, the display apparatus 100 can sense an object approaching or touching the display portion. Moreover, the light-emitting elements 130 can be utilized as a light source at the time of receiving light; hence, it is not necessary to provide a light source separately from the display apparatus 100. Consequently, the display apparatus 100 can be a highly functional display apparatus without increasing the number of electronic components.

In the display apparatus 100, when an object reflects light emitted from the light-emitting element 130, the light-receiving element 150 can sense the reflected light. Thus, the display apparatus 100 can capture images even in a dark environment and sense a touch (including a contactless touch) of an object.

Furthermore, when a finger, a palm, or the like touches the display portion in the display apparatus 100, an image of the fingerprint or the palm print can be captured. Thus, an electronic apparatus including the display apparatus 100 can perform biometric authentication by using the captured image of the fingerprint or the palm print. Accordingly, an image capturing device for the fingerprint authentication or palm-print authentication does not need to be additionally provided, and the number of components of the electronic apparatus can be reduced. Since the light-receiving elements 150 are arranged in a matrix in the display portion, an image of a fingerprint or a palm print can be captured in any position in the display portion. Hence, an electronic apparatus including the display apparatus 100 can be a highly convenient electronic apparatus.

FIG. 1A illustrates a common electrode 115 included in the light-emitting element 130R, the light-emitting element 130G, the light-emitting element 130B, and the light-receiving element 150, and a connection electrode 113 electrically connected to the common electrode 115.

The connection electrode 113 is supplied with a potential to be supplied to the common electrode 115. The connection electrode 113 is provided outside the display portion where the light-emitting elements 130 and the light-receiving elements 150 are arranged.

The connection electrode 113 can be provided along the outer periphery of the display portion. For example, the connection electrode 113 may be provided along one side of the outer periphery of the display portion or two or more sides of the outer periphery of the display portion. That is, when the display portion has a rectangular top surface, the top surface of the connection electrode 113 can have a band shape, an L shape, a square bracket shape, a frame-like shape, or the like.

Figure 1B:
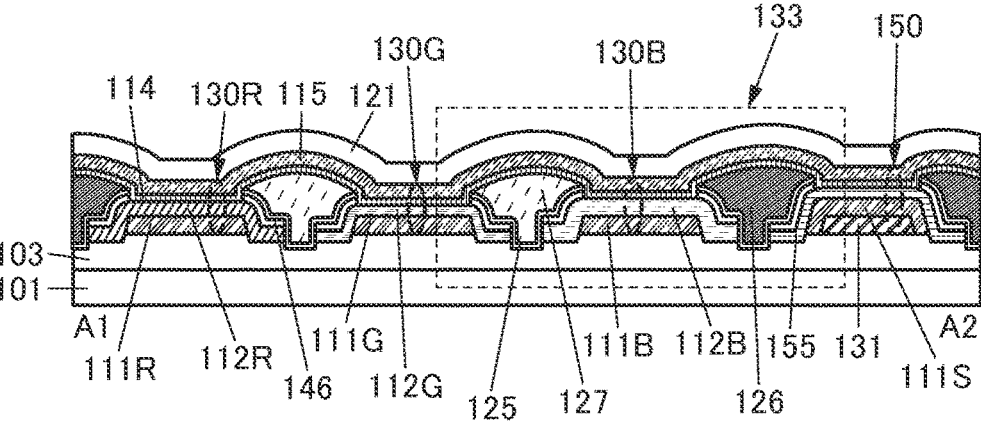

FIG. 1B is a schematic cross-sectional view taken along dashed-dotted line A1-A2 in FIG. TA. FIG. 1B illustrates a substrate 101, an insulating layer 103 over the substrate 101, the light-emitting element 130R, the light-emitting element 130G, the light-emitting element 130B, and the light-receiving element 150 over the insulating layer 103.

The substrate 101 can be a substrate having a visible-light-transmitting property. The substrate 101 can be a glass substrate, a quartz substrate, a sapphire substrate, or a plastic substrate, for example.

The insulating layer 103 can have a function of an interlayer insulating layer. Although not illustrated in FIG. 1B, for example, a layer including a transistor can be provided over the substrate 101 and the insulating layer 103 can be provided to cover the layer. The insulating layer 103 is preferably planarized but is not necessarily planarized.

Here, as illustrated in FIG. 1B, the insulating layer 103 may have a depressed portion between adjacent light-emitting elements 130. The insulating layer 103 may have a depressed portion between the light-emitting element 130 and the light-receiving element 150 adjacent to each other. Note that in some cases, the insulating layer 103 does not have a depressed portion between the adjacent light-emitting elements 130 or between the light-emitting element 130 and the light-receiving element 150 adjacent to each other.

The light-emitting element 130R includes a pixel electrode 111R, an EL layer 112R over the pixel electrode 111R, a common layer 114 over the EL layer 112R, and the common electrode 115 over the common layer 114. The light-emitting element 130G includes a pixel electrode

111G, an EL layer 112G over the pixel electrode 111G, the common layer 114 over the EL layer 112G, and the common electrode 115 over the common layer 114. The light-emitting element 130B includes a pixel electrode 111B, an EL layer 112B over the pixel electrode 1111B, the common layer 114 over the EL layer 112B, and the common electrode 115 over the common layer 114. The light-receiving element 150 includes a conductive layer 131, a pixel electrode 111S over the conductive layer 131, a PD layer 155 over the pixel electrode 111S, the common layer 114 over the PD layer 155, and the common electrode 115 over the common layer 114. Note that in some cases, the pixel electrode 111 is referred to as a lower electrode and the common electrode 115 is referred to as an upper electrode.

The EL layer 112R included in the light-emitting element 130R contains at least a light-emitting organic compound that emits light with intensity in the red wavelength range (for example, a wavelength greater than or equal to 590 nm and less than 830 nm). The EL layer 112G included in the light-emitting element 130G contains at least a light-emitting organic compound that emits light with intensity in a green wavelength range (for example, a wavelength greater than or equal to 490 nm and less than 590 nm). The EL layer 112B included in the light-emitting element 130B contains at least a light-emitting organic compound that emits light with intensity in a blue wavelength range (for example, a wavelength greater than or equal to 360 nm and less than 490 nm). A layer that is included in an EL layer 112 and contains a light-emitting organic compound can be referred to as a light-emitting layer. Note that the display apparatus 100 may include the EL layer 112 that emits light with intensity in the infrared light range, e.g., the near infrared light range (for example, a wavelength greater than or equal to 830 nm and less than 2500 nm).

It is preferable that the EL layer 112 include a carrier-transport layer over the light-emitting layer. Accordingly, the light-emitting layer is inhibited from being exposed on the outermost surface during the fabrication process of the display apparatus 100, so that damage to the light-emitting layer can be reduced. Thus, the reliability of the display apparatus 100 can be increased.

Furthermore, the EL layer 112 can include one or more of a hole-injection layer, a hole-transport layer, a hole-blocking layer, an electron-blocking layer, an electron-transport layer, and an electron-injection layer. For example, the EL layer 112 can have a structure in which a hole-injection layer, a hole-transport layer, a light-emitting layer, and an electron-transport layer are stacked in this order from the pixel electrode 111 side. Alternatively, the EL layer 112 can have a structure in which an electron-injection layer, an electron-transport layer, a light-emitting layer, and a hole-transport layer are stacked in this order from the pixel electrode 111 side.

In this specification and the like, visible light refers to light with a wavelength greater than or equal to 360 nm and less than 830 nm, for example, and infrared light refers to light with a wavelength greater than or equal to 830 nm, for example.

In this specification and the like, a hole or an electron is sometimes referred to as a "carrier". Specifically, a hole-injection layer or an electron-injection layer may be referred to as a "carrier-injection layer", a hole-transport layer or an electron-transport layer may be referred to as a "carrier-transport layer", and a hole-blocking layer or an electron-blocking layer may be referred to as a "carrier-blocking layer". Note that in some cases, the above-described carrier-injection layer, carrier-transport layer, and carrier-blocking layer cannot be distinguished from each other depending on the cross-sectional shape, characteristics, or the like. One layer may have two or three functions of the carrier-injection layer, the carrier-transport layer, and the carrier-blocking layer in some cases.

The PD layer 155 included in the light-receiving element 150 contains a photoelectric conversion material having sensitivity to visible light or infrared light. A wavelength range to which the photoelectric conversion material contained in the PD layer 155 has sensitivity preferably includes one or more of the wavelength range of light emitted from the light-emitting element 130R, the wavelength range of light emitted from the light-emitting element 130G, and the wavelength range of light emitted from the light-emitting element 130B. Alternatively, a photoelectric conversion material having sensitivity to infrared light, which has a longer wavelength than light emitted from the light-emitting element 130R, may be used. A layer that is included in the PD layer 155 and contains a photoelectric conversion material can be referred to as an active layer or a photoelectric conversion layer.

The PD layer 155 preferably includes a carrier-transport layer over an active layer. Accordingly, the active layer is inhibited from being exposed on the outermost surface during the fabrication process of the display apparatus 100, so that damage to the active layer can be reduced. Thus, the reliability of the display apparatus 100 can be increased.

Furthermore, the PD layer 155 can include one or more of a hole-transport layer, a hole-blocking layer, an electron-blocking layer, and an electron-transport layer. For example, the PD layer 155 can have a structure in which a hole-transport layer, an active layer, and an electron-transport layer are stacked in this order from the pixel electrode 111 side. Alternatively, the EL layer 112 can have a structure in which an electron-transport layer, an active layer, and a hole-transport layer are stacked in this order from the pixel electrode 111 side.

The common layer 114 can be an electron-injection layer or a hole-injection layer. In the case where the common layer 114 includes an electron-injection layer, the EL layer 112 does not need to include an electron-injection layer; in the case where the common layer 114 includes a hole-injection layer, the EL layer 112 does not need to include a hole-injection layer. In this case, for the common layer 114, a material with as low electric resistance as possible is preferably used. Alternatively, it is preferable to form the common layer 114 as thin as possible, in which case the electric resistance of the common layer 114 in the thickness direction can be reduced. For example, the thickness of the common layer 114 is preferably greater than or equal to 1 nm and less than or equal to 5 nm, further preferably greater than or equal to 1 nm and less than or equal to 3 nm.

Note that the common layer 114 may include a hole-transport layer, a hole-blocking layer, an electron-blocking layer, or an electron-transport layer. Thus, the common layer 114 can include one or more of a hole-injection layer, a hole-transport layer, a hole-blocking layer, an electron-blocking layer, an electron-transport layer, and an electron-injection layer. A structure can be employed in which the layer included in the common layer 114 is not included in the EL layer 112 and the PD layer 155.

Here, the function of the common layer 114 in the light-emitting element 130 is different from the function of the common layer 114 in the light-receiving element 150 in some cases. For example, the common layer 114 can have a function of an electron-injection layer or a hole-injection layer in the light-emitting element 130, and can have a function of an electron-transport layer or a hole-transport layer in the light-receiving element 150.

The conductive layer 131 can be a conductive layer having a visible-light-reflecting property, for example, a metal material can be used. For example, it is possible to use a metal material such as gold, silver, platinum, magnesium, nickel, tungsten, chromium, molybdenum, iron, cobalt, copper, palladium, or titanium; or an alloy material containing any of these metal materials (e.g., an alloy of silver and magnesium) for the conductive layer 131. Alternatively, a nitride of the metal material (e.g., titanium nitride) or the like may be used for the conductive layer 131.

The pixel electrode 111 and the common electrode 115 each can be a conductive layer having a visible-light-transmitting property. For example, a conductive oxide such as indium oxide, indium tin oxide, indium zinc oxide, zinc oxide, or zinc oxide containing gallium or graphene can be used for the pixel electrode 111 and the common electrode 115. Alternatively, a metal material such as gold, silver, platinum, magnesium, nickel, tungsten, chromium, molybdenum, iron, cobalt, copper, palladium, or titanium; or an alloy material containing any of these metal materials can be used for the pixel electrode 111 and the common electrode 115. Alternatively, a nitride of the metal material (e.g., titanium nitride) or the like may be used for the pixel electrode 111 and the common electrode 115. Note that in the case of using the metal material or the alloy material (or the nitride thereof), the thickness is preferably set small enough to have a light-transmitting property. Furthermore, a stacked-layer film of the above materials can be used for a conductive layer. For example, a stacked-layer film of an alloy of silver and magnesium and an indium tin oxide is preferably used for the pixel electrode 111 and the common electrode 115 because the conductivity of the pixel electrode 111 and the common electrode 115 can be increased.

A protective layer 146 is provided over the EL layer 112 and the PD layer 155. For example, the protective layer 146 is provided in regions of the EL layer 112 and the PD layer 155 which are not in contact with the common layer 114.

An insulating layer 125 and an insulating layer 126 are provided between the light-emitting element 130 and the light-receiving element 150 adjacent to each other. For example, the insulating layer 125 and the insulating layer 126 are provided between the EL layer 112 and the PD layer 155 adjacent to each other. The insulating layer 125 and an insulating layer 127 are provided between two light-emitting elements 130 adjacent to each other. For example, the insulating layer 125 and the insulating layer 127 are provided between two adjacent EL layers 112.

Specifically, the insulating layer 125 is provided over a side surface of the EL layer 112, a side surface of the PD layer 155, and a side surface of the protective layer 146, the top surface of the protective layer 146, and the top surface of the insulating layer 103, for example. Providing the insulating layer 125 can inhibit entry of an impurity such as water from the side surfaces of the EL layer 112 and the PD layer 155 to the inside.

The insulating layer 126 can be provided over the insulating layer 125 and can fill a space between the EL layer 112 and the PD layer 155 adjacent to each other. Furthermore, the insulating layer 127 can be provided over the insulating layer 125 and can fill a space between the two adjacent EL layers 112. The common layer 114 and the common electrode 115 are provided over the insulating layer 126 and the insulating layer 127.

Providing the insulating layer 126 and the insulating layer 127 can inhibit generation of disconnection in the common electrode 115 over the space between the EL layer 112 and the PD layer 155 adjacent to each other and the space between two adjacent EL layers 112, and thus generation of a connection defect can be inhibited. Furthermore, it is possible to inhibit an increase in electric resistance due to local thinning of the common electrode 115 by a step. Accordingly, the display apparatus 100 can be a highly reliable display apparatus.

The protective layer 146 and the insulating layer 125 can contain an inorganic material. As the protective layer 146 and the insulating layer 125, an inorganic insulating film such as an oxide insulating film, a nitride insulating film, an oxynitride insulating film, or a nitride oxide insulating film can be used, for example. The protective layer 146 and the insulating layer 125 may each have a single-layer structure or a stacked-layer structure. Examples of the oxide insulating film include a silicon oxide film, an aluminum oxide film, a magnesium oxide film, an indium gallium zinc oxide film, a gallium oxide film, a germanium oxide film, an yttrium oxide film, a zirconium oxide film, a lanthanum oxide film, a neodymium oxide film, a hafnium oxide film, and a tantalum oxide film. Examples of the nitride insulating film include a silicon nitride film and an aluminum nitride film. Examples of the oxynitride insulating film include a silicon oxynitride film and an aluminum oxynitride film. Examples of the nitride oxide insulating film include a silicon nitride oxide film and an aluminum nitride oxide film. In particular, when an inorganic insulating film such as an aluminum oxide film, a hafnium oxide film, or a silicon oxide film formed by an atomic layer deposition (ALD) method is used as the protective layer 146 and the insulating layer 125, the protective layer 146 and the insulating layer 125 with few pin holes and having an excellent function of protecting the EL layer 112 can be formed.

Note that in this specification and the like, oxynitride refers to a material that contains more oxygen than nitrogen in its composition, and nitride oxide refers to a material that contains more nitrogen than oxygen in its composition. For example, in the case where silicon oxynitride is described, it refers to a material that contains more oxygen than nitrogen in its composition; in the case where silicon nitride oxide is described, it refers to a material that contains more nitrogen than oxygen in its composition.

The protective layer 146 and the insulating layer 125 can be formed by a sputtering method, a chemical vapor deposition (CVD) method, a pulsed laser deposition (PLD) method, an ALD method, or the like. The insulating layer 125 is preferably formed by an ALD method achieving favorable coverage.

Here, for the insulating layer 126, a material having a high-visible-light-blocking property is used, for example. In this case, it is possible to further inhibit part of light emitted from the EL layer 112 adjacent to the PD layer 155 from being incident on the PD layer 155 due to stray light as compared with the case where a material having a high-visible-light-transmitting property is used for the insulating layer 126, for example. Thus, the display apparatus 100 can be a display apparatus that can perform image capturing with little noise and with high image capturing sensitivity. Meanwhile, for the insulating layer 127, a material having a high-visible-light-transmitting property can be used, for example.

In one embodiment of the present invention, in the insulating layer 126, transmittance of light with a specific wavelength which is at least part of a wavelength of visible light is lower than transmittance of the light with the specific wavelength in the insulating layer 127. For example, in the case where the specific wavelength is 600 nm, transmittance of light with a wavelength of 600 nm in the insulating layer 126 is lower than transmittance of light with a wavelength of 600 nm in the insulating layer 127. In the insulating layer 126, transmittance of at least one of red light (e.g., a wavelength greater than or equal to 590 nm and less than 830 nm), green light (e.g., a wavelength greater than or equal to 490 nm and less than 590 nm), and blue light (e.g., a wavelength greater than or equal to 360 nm and less than 490 nm) can be lower than transmittance of light with the color(s) in the insulating layer 127, for example. For example, the transmittance of green light in the insulating layer 126 can be lower than the transmittance of green light in the insulating layer 127. Accordingly, the insulating layer 126 can be referred to as a coloring layer in some cases.

A wavelength of light to which the insulating layer 126 has a light-blocking property is preferably a wavelength of light to which the PD layer 155 has sensitivity. For example, in the case where the PD layer has sensitivity to light whose wavelength corresponds to green light, the insulating layer 126 preferably has a light-blocking property with respect to the light whose wavelength corresponds to green light. Thus, a decrease in the image capturing sensitivity of the display apparatus 100 due to stray light can be suitably inhibited.

The insulating layer 126 and the insulating layer 127 can contain an organic material. Thus, the insulating layer 126 and the insulating layer 127 can be referred to as an organic layer. For the insulating layer 126 and the insulating layer 127, a phenol resin, an acrylic resin, a polyimide resin, an epoxy resin, an imide resin, a polyamide resin, a polyimide-amide resin, a silicone resin, a siloxane resin, a benzocy-clobutene-based resin, a precursor of any of these resins, or the like can be used, for example. For example, a novolac resin that is a kind of a phenol resin can be used for the insulating layer 126 and the insulating layer 127. In the case where the insulating layer 126 includes a resin, the insulating layer 126 can be referred to as a resin layer; in the case where the insulating layer 127 includes a resin, the insulating layer 127 can be referred to as a resin layer.

Moreover, for the insulating layer 126 and the insulating layer 127, a photosensitive resin can be used. For example, a color resist can be used for the insulating layer 126 and photoresist can be used for the insulating layer 127. In this case, the insulating layer 126 and the insulating layer 127 can be formed by a spin coating method, a spraying method, a screen printing method, a painting method, or the like.

A reflective film (e.g., a metal film containing one or more selected from silver, palladium, copper, titanium, aluminum, and the like) may be provided between the insulating layer 125 and the insulating layer 127 so that light emitted from the light-emitting layer is reflected by the reflective film; hence, the function of increasing the light extraction efficiency may be added.

A protective layer 121 is provided over the common electrode 115 to cover the light-emitting element 130 and the light-receiving element 150. The protective layer 121 has a function of preventing diffusion of impurities such as water into the light-emitting element 130 and the light-receiving element 150 from above.

The protective layer 121 can have, for example, a single-layer structure or a stacked-layer structure at least including an inorganic insulating film. As the inorganic insulating film, for example, an oxide film or a nitride film such as a silicon oxide film, a silicon oxynitride film, a silicon nitride oxide film, a silicon nitride film, an aluminum oxide film, an aluminum oxynitride film, or a hafnium oxide film can be given. A semiconductor material such as indium gallium oxide or indium gallium zinc oxide may be used for the protective layer 121.

As the protective layer 121, a stacked film of an inorganic insulating film and an organic insulating film can also be used. For example, a structure in which an organic insulating film is interposed between a pair of inorganic insulating films is preferable. Furthermore, the organic insulating film preferably functions as a planarization film. This enables the top surface of the organic insulating film to be flat, and accordingly, coverage with the inorganic insulating film thereover is improved, which leads to an improvement in barrier properties. Moreover, the top surface of the protective layer 121 is flat, which is preferable because the influence of an uneven shape due to a lower structure can be reduced in the case where a component (e.g., a color filter, an electrode of a touch sensor, a lens array, or the like) is provided above the protective layer 121.

For the insulating layer 103, a material similar to the material that can be used for the protective layer 121 can be used.

Figure 1B:
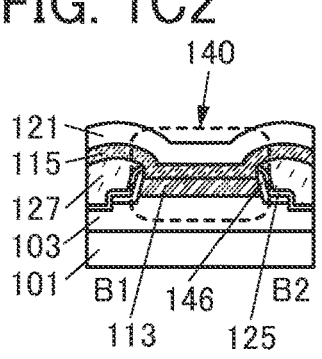

FIG. 1C1 is a schematic cross-sectional view taken along dashed-dotted line B1-B2 in FIG. TA and illustrates a connection portion 140 in which the connection electrode 113 is electrically connected to the common electrode 115.

The connection portion 140 includes the connection electrode 113 over the insulating layer 103, the common layer 114 over the connection electrode 113, the common electrode 115 over the common layer 114, and the protective layer 121 over the common electrode 115. The protective layer 146 is provided to cover an end portion of the connection electrode 113 and the insulating layer 125, the insulating layer 127, the common layer 114, the common electrode 115, and the protective layer 121 are stacked in this order over the protective layer 146. Note that the insulating layer 126 may be provided instead of the insulating layer 127 in the connection portion 140.

The connection electrode 113 is electrically connected to the connection electrode 115 in the connection portion 140. The connection electrode 113 is electrically connected to an FPC (not illustrated), for example. Thus, for example, by supplying power supply potentials to the FPC, the common electrode 115 can be supplied with the power supply potentials through the connection electrode 113.

The connection electrode 113 can be formed by a step similar to that of the pixel electrode 111. For example, a conductive film is formed over the insulating layer 103 and the conductive layer 131 and processed by, for example, an etching method, so that the pixel electrode 111 and the connection electrode 113 can be formed. Thus, the connection electrode 113 can contain a material similar to that of the pixel electrode 111. Note that the connection electrode 113 may include a material similar to that of the conductive layer 131. In that case, the connection electrode 113 can be formed by the same step as the formation of the conductive layer 131.

Here, in the case where the electric resistance of the common layer 114 in the thickness direction is negligible, electrical continuity between the connection electrode 113 and the common electrode 115 can be maintained even when the common layer 114 is provided between the connection electrode 113 and the common electrode 115. When the common layer 114 is provided not only in the display portion but also in the connection portion 140, the common layer 114 can be formed, for example, without using a metal mask such as a mask for specifying a deposition area (also referred to as an area mask or a rough metal mask to be distinguished from a fine metal mask). Accordingly, the fabrication process of the display apparatus 100 can be simplified, so that the manufacturing cost of the display apparatus 100 can be reduced. Thus, the display apparatus 100 can be an inexpensive display apparatus.

Figure 2:
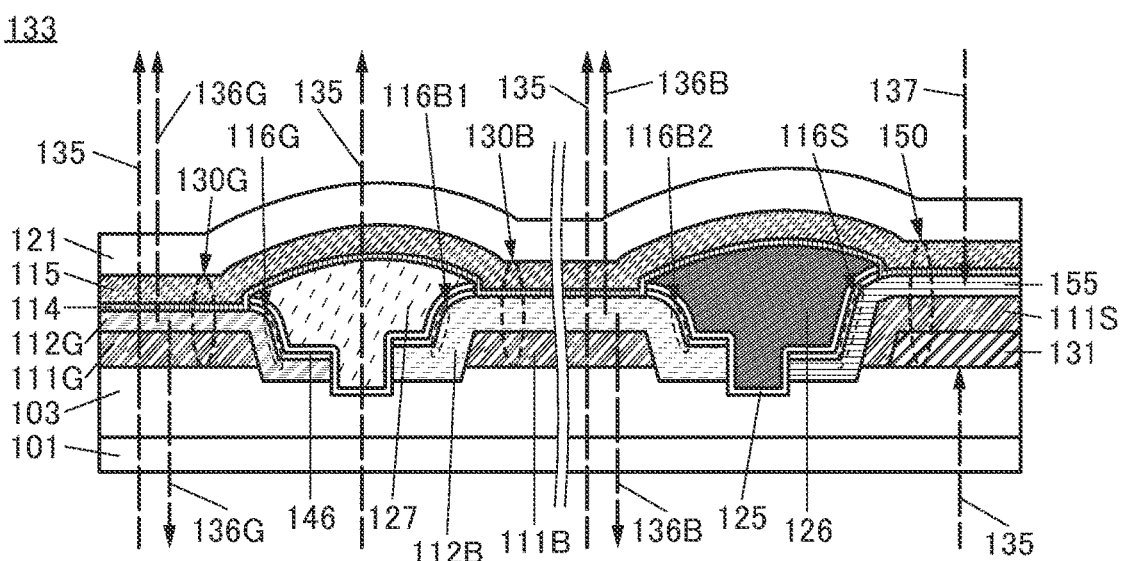

The structure illustrated in FIG. 1C2 is a modification example of the structure illustrated in FIG. 1C1. FIG. 1C2 illustrates a structure example in which the common layer 114 is not provided in the connection portion 140. In the example illustrated in FIG. 1C2, a structure in which the connection electrode 113 is in contact with the common electrode 115 can be employed. Thus, electric resistance between the connection electrode 113 and the common electrode 115 can be decreased.

FIG. 2 is an enlarged view of a region 133 illustrated in FIG. 1B. FIG. 2 illustrates the insulating layer 126, the insulating layer 127, and the peripheral region.

FIG. 2 illustrates light 135, which is external light. As described above, the substrate 101, the pixel electrode 111, the insulating layer 127, and the common electrode 115 have a visible-light-transmitting property. Thus, the light 135 can pass through the display apparatus 100. Thus, a user of the display apparatus 100 can see the background (the transmission image) as a real image through the display apparatus 100. In addition, the user of the display apparatus 100 can see an image displayed by the light-emitting element 130 and superimposed on the transmission image of the display apparatus 100. Thus, the display apparatus 100 can perform augmented reality (AR) display, for example.

As described above, in the display apparatus 100, when the insulating layer 126 provided between the EL layer 112 and the PD layer 155 is a layer having a high-visible-light-blocking property, a decrease in the image capturing sensitivity due to stray light can be inhibited.

In this manner, the insulating layer 126 provided between the EL layer 112 and the PD layer 155 adjacent to each other and the insulating layer 127 provided between two adjacent EL layers 112 are separately formed in the display apparatus 100. Specifically, the insulating layer 126 can be provided in a region that is over the insulating layer 125 and between the EL layer 112 and the PD layer 155 adjacent to each other and the insulating layer 127 can be provided in the other region over the insulating layer 125, for example. In addition, the insulating layer 126 is, for example, an insulating layer with a high-visible-light-blocking property, and the insulating layer 127 is, for example, an insulating layer with a high-visible-light-transmitting property. As described above, the display apparatus 100 enable a user of the display apparatus 100 to see the background (the transmission image) as a real image and can inhibit a decrease in the image capturing sensitivity due to stray light at the same time.

Note that when the insulating layer 127 is an insulating layer having a high light-transmitting property, for example, light emitted from the EL layer 112 can be inhibited from being absorbed by the insulating layer 127. Thus, the display apparatus 100 can be a display apparatus with high light extraction efficiency.

In the display apparatus 100, the substrate 101 and the pixel electrode 111 provided below the EL layer 112 and the common electrode 115 provided over the EL layer 112 each can have a visible-light-transmitting property. Thus, light 136 emitted from the EL layer 112 is emitted to both the substrate 101 side and the protective layer 121 side. Accordingly, the display apparatus 100 can be a dual-emission display apparatus. Note that FIG. 2 illustrates, as the light 136, light 136G emitted from the EL layer 112G and light 136B emitted from the EL layer 112B.

FIG. 2 illustrates light 137 incident on the PD layer 155. The light-receiving element 150 can detect the light 137. Here, the conductive layer 131 having a visible-light-reflecting property is provided so as to include a region overlapping with the pixel electrode 111S and the PD layer 155, whereby the light 135 that enters the substrate 101 side can be inhibited from entering the PD layer 155 through the pixel electrode 111S. Thus, a decrease in the image capturing sensitivity of the display apparatus 100 due to the light 135 can be inhibited.

As illustrated in FIG. 2, an end portion of the pixel electrode 111 preferably has a tapered shape, in which case foreign substances (also referred to as dust, a particle, or the like) in the fabrication process can be suitably removed by, for example, washing.

In this specification and the like, a tapered shape indicates a shape in which at least part of a side surface of a component is inclined to a substrate surface. For example, a tapered shape preferably includes a region where the angle between the inclined side surface and the substrate surface (such an angle is also referred to as a taper angle) is less than 90°.

The EL layer 112 and the PD layer 155 can be provided to cover the end portion of the pixel electrode 111. FIG. 2 illustrates an example in which the EL layer 112G covers an end portion of the pixel electrode 111G, the EL layer 112B covers end portions of the pixel electrode 111B, and the PD layer 155 covers an end portion of the pixel electrode 111S. Here, when the end portion of the pixel electrode 111 has a tapered shape, the EL layer 112 and the PD layer 155 can each include a tapered portion 116 in a cross-sectional view. FIG. 2 illustrates an example in which the EL layer 112G includes a tapered portion 116G between the end portion of the pixel electrode 111G and the insulating layer 127. In addition, FIG. 2 illustrates an example in which the EL layer 112B includes a tapered portion 116B1 between the left side end portion of the pixel electrode 111B and the insulating layer 127 and a tapered portion 116B2 between the right side end portion of the pixel electrode 111B and the insulating layer 126. Furthermore, FIG. 2 illustrates an example in which the PD layer 155 includes a tapered portion 116S between an end portion of the pixel electrode 111S and the insulating layer 126.

When the EL layer 112 and the PD layer 155 include the tapered portions 116, the coverage of the pixel electrode 111 with the EL layer 112 and the PD layer 155 can be improved. Thus, generation of disconnection and local thinning of the EL layer 112 and the PD layer 155 can be inhibited. Accordingly, the display apparatus 100 can be a highly reliable display apparatus.

FIG. 2 illustrates an example in which the pixel electrode 111S covers an end portion of the conductive layer 131. Note that the pixel electrode 111S does not necessarily cover the end portion of the conductive layer 131. In this case, the end portion of the conductive layer 131 can be in contact with the PD layer 155, for example.

In addition, FIG. 2 illustrates an example in which the bottom surface of the insulating layer 125 is located below the bottom surface of the EL layer 112 and the bottom surface of the PD layer 155, and the bottom surface of the EL layer 112 and the bottom surface of the PD layer 155 are located below the bottom surface of the pixel electrode 111. The display apparatus 100 having such a structure can include a depressed portion between the EL layers 112 and between the EL layer 112 and the PD layer 155, for example, in the insulating layer 103. Although details are described later, the depressed portions are formed when the EL layer 112 and the PD layer 155 are formed.

Structure Example 2

Figure 3A:
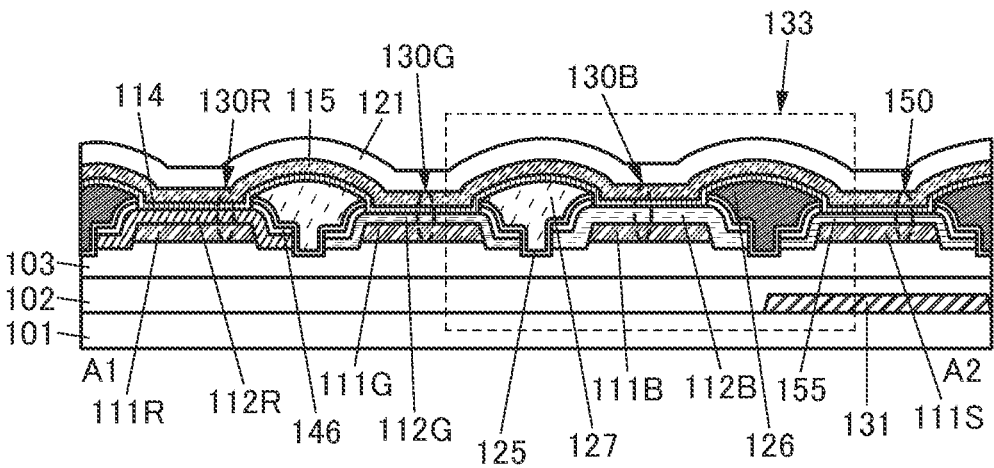
FIG. 3A and FIG. 3B are cross-sectional views illustrating a structure example of a display apparatus.

Although FIG. 1B illustrates a structure in which the conductive layer 131 is in contact with the pixel electrode 111S, one embodiment of the present invention is not limited thereto. FIG. 3A illustrates a modification example of the structure illustrated in FIG. 1B, in which the conductive layer 131 is provided over the substrate 101 and the insulating layer 102 is provided to cover the conductive layer 131. In the structure illustrated in FIG. 3A, an insulating layer 103 is provided over the insulating layer 102. The pixel electrode 111S is provided so as to include a region overlapping with the conductive layer 131. For the insulating layer 102, a material similar to the material that can be used for the protective layer 121 can be used. Note that the insulating layer 102 is preferably planarized but is not necessarily planarized.

Figure 3B:
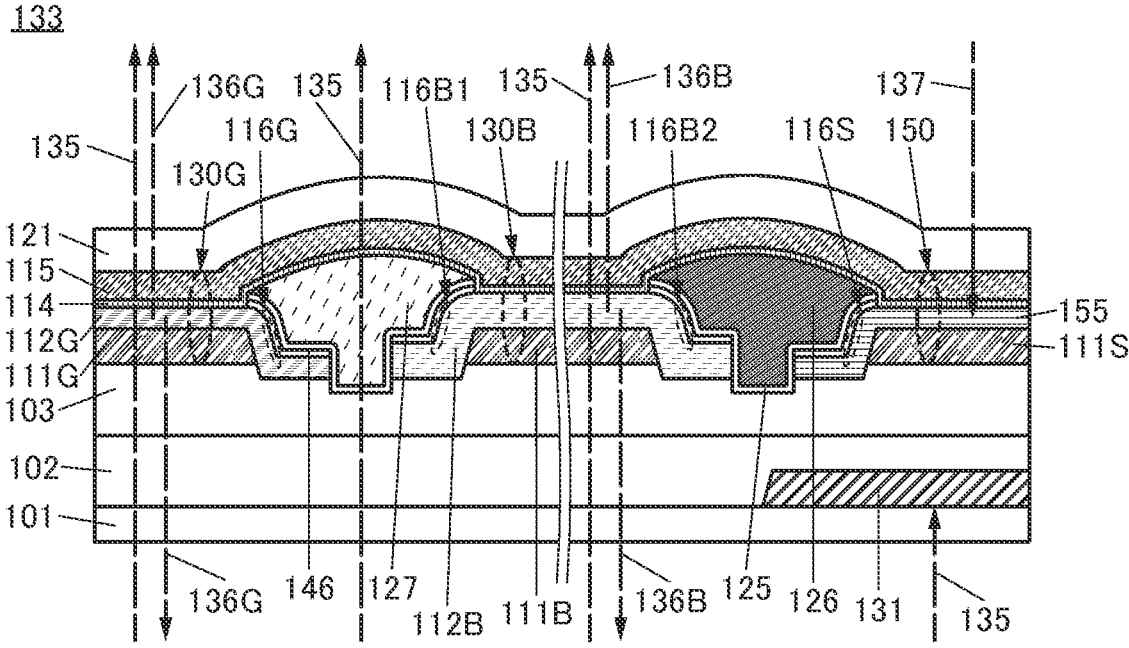

FIG. 3B is an enlarged view of the region 133 illustrated in FIG. 3A. As illustrated in FIG. 3B, by providing the conductive layer 131 having a visible-light-reflecting property is provided so as to include a region overlapping with the pixel electrode 111S and the PD layer 155, the light 135 that enters the substrate 101 side is inhibited from entering the PD layer 155 through the pixel electrode 111S even when the conductive layer 131 is not in contact with the pixel electrode 111S. Thus, a decrease in the image capturing sensitivity of the display apparatus 100 due to the light 135 is suitably inhibited.

With the structure illustrated in FIG. 3A and FIG. 3B, the display apparatus 100 can include a larger area of the conductive layer 131 seen from above. For example, the area of the conductive layer 131 seen from above can be larger than or equal to the area of the pixel electrode 111S seen from above. In addition, the area of the conductive layer 131 seen from above can be larger than or equal to the area of the PD layer 155 seen from above, for example. In this manner, the light 135 that enters the substrate 101 side is suitably inhibited from entering the PD layer 155, so that a decrease in the image capturing sensitivity of the display apparatus 100 due to the light 135 is suitably inhibited. Meanwhile, the display apparatus 100 with the structure illustrated in FIG. 2A and FIG. 2B can be fabricated through a simple process. This can reduce the manufacturing cost of the display apparatus 100 and make the display apparatus 100 an inexpensive display apparatus. Note that a light-blocking layer, for example, an insulating light-blocking layer may be provided instead of the conductive layer 131.

Structure Example 3

Figure 4A:
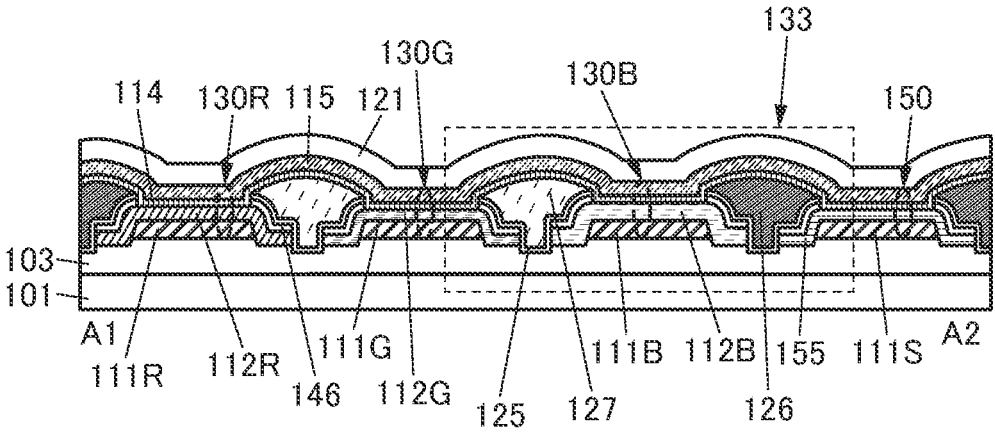
FIG. 4A and FIG. 4B are cross-sectional views illustrating a structure example of a display apparatus.

FIG. 4A illustrates a modification example of the structure illustrated in FIG. 1B, in which the conductive layer 131 is not provided. In the example illustrated in FIG. 4A, each of the pixel electrode 111R, the pixel electrode 111G, the pixel electrode 1111B, and the pixel electrode 111S can be a conductive layer having a visible-light-reflecting property. Each of the pixel electrode 111R, the pixel electrode 111G, the pixel electrode 111B, and the pixel electrode 111S can contain a material similar to that of the conductive layer 131. Note that in the display apparatus 100 with the structure illustrated in FIG. 4A, each of the pixel electrode 111R, the pixel electrode 111G, and the pixel electrode 111B may be a conductive layer having a visible-light-transmitting property, and the pixel electrode 111S may be a conductive layer having a visible-light-reflecting property. That is, the pixel electrode 111R, the pixel electrode 111G, the pixel electrode 111B, and the pixel electrode 111S may be separately formed.

Figure 4B:
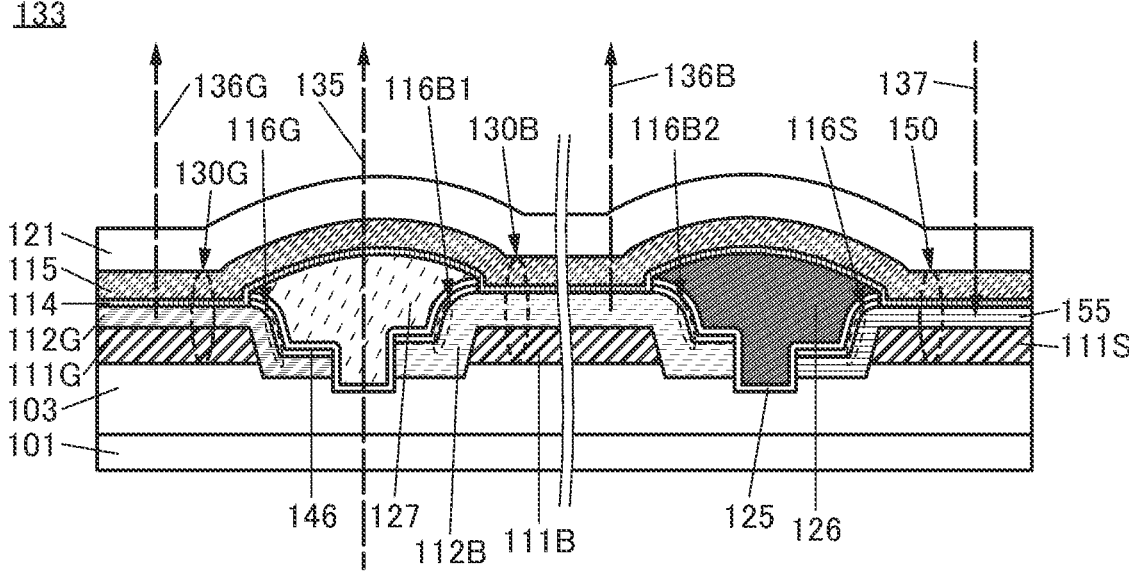

FIG. 4B is an enlarged view of the region 133 illustrated in FIG. 4A. The insulating layer 127 has a visible-light-transmitting property. Thus, even if the pixel electrode 111 has a visible-light-reflecting property, the light 135, which is external light, can pass through the display apparatus 100 as long as the substrate 101 and the common electrode 115 have a visible-light-transmitting property. Thus, a user of the display apparatus 100 can see the background (the transmission image) as a real image through the display apparatus 100. In addition, the user of the display apparatus 100 can see an image displayed by the light-emitting element 130 and superimposed on the transmission image of the display apparatus 100. Thus, the display apparatus 100 can perform augmented reality (AR) display, for example.

When the display apparatus 100 has the structure illustrated in FIG. 4A and FIG. 4B, the fabrication process of the display apparatus 100 can be simplified. This can reduce the manufacturing cost of the display apparatus 100 and make the display apparatus 100 an inexpensive display apparatus. Meanwhile, the display apparatus 100 with the structure illustrated in FIG. 1B and FIG. 2 can be a display apparatus having a high light-transmitting property with respect to the light 135.

Structure Example 4

Figure 5A:
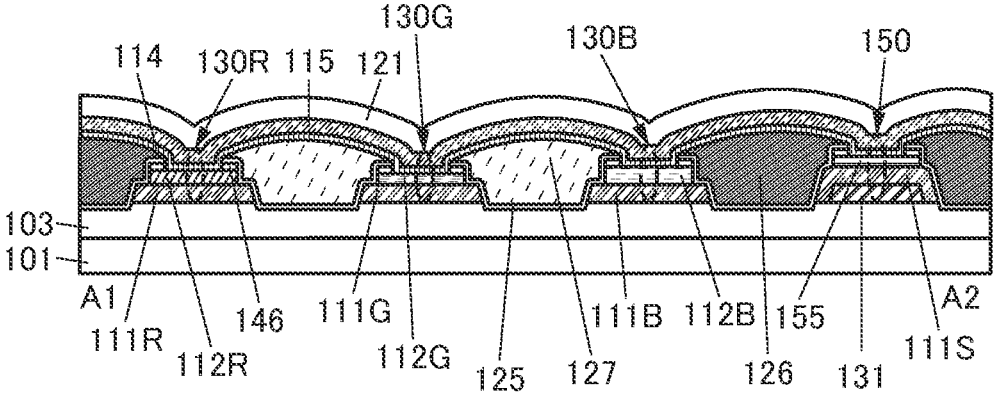
Figure 5A:
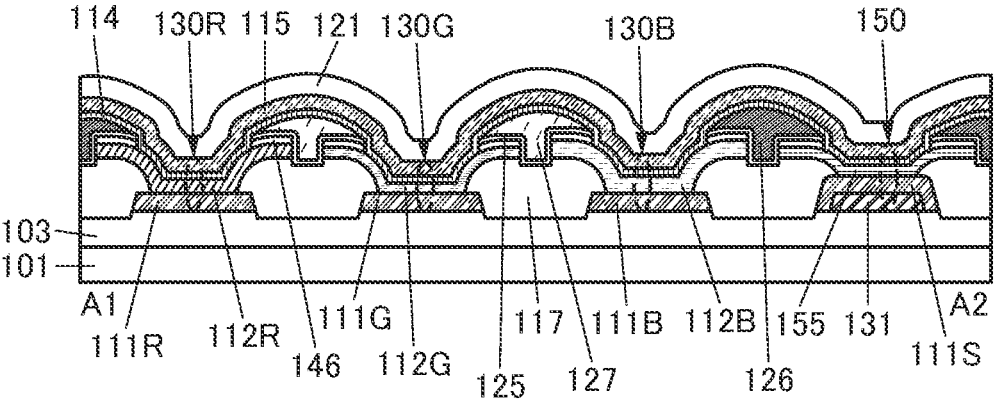
Figure 5A:
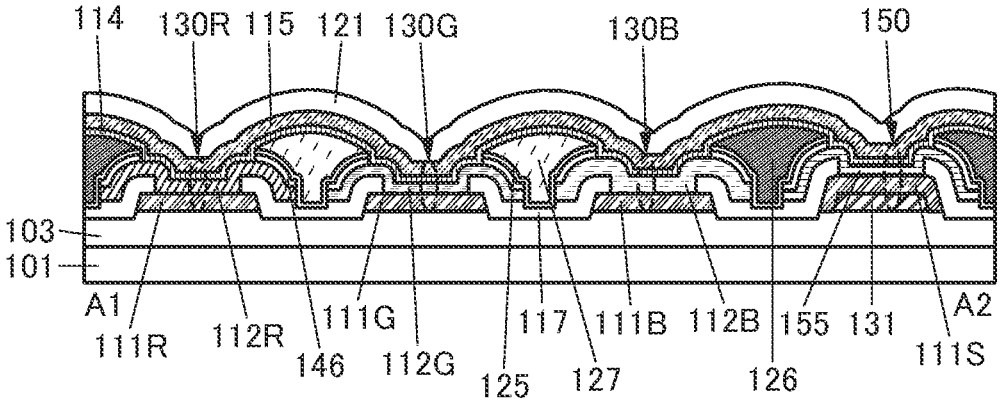

FIG. 5A illustrates a modification example of the structure illustrated in FIG. 1B, in which an end portion of the EL layer 112 and an end portion of the PD layer 155 are located inward from the end portion of the pixel electrode 111. Specifically, FIG. 5A illustrates an example in which an end portion of the EL layer 112R is located inward from an end portion of the pixel electrode 111R, an end portion of the EL layer 112G is located inward from an end portion of the pixel electrode 111G, an end portion of the EL layer 112B is located inward from an end portion of the pixel electrode 111B, and the end portion of the PD layer 155 is located inward from the end portion of the pixel electrode 111S.

Since the display apparatus 100 illustrated in FIG. 5A has a structure in which the EL layer 112 and the PD layer 155 do not cover the end portion of the pixel electrode 111, generation of a step in the EL layer 112 and the PD layer 155 can be inhibited. Thus, generation of disconnection of the EL layer 112 and the PD layer 155 can be inhibited; thus, the display apparatus 100 can be a highly reliable display apparatus.

FIG. 5B1 illustrates a modification example of the structure illustrated in FIG. 1B, in which an insulating layer 117 is provided between the light-emitting element 130 and the light-receiving element 150 adjacent to each other and between two adjacent light-emitting elements 130. The insulating layer 117 is provided so as to cover the end portion of the pixel electrode 111. Regions of the EL layer 112 and the PD layer 155 which are not in contact with the pixel electrode 111 are provided over the insulating layers 117. Thus, the display apparatus 100 with the structure illustrated in FIG. 5B1 includes a region where the insulating layer 117 is provided between the pixel electrode 111 and each of the EL layer 112 and the PD layer 155 in the periphery of the end portion of the pixel electrode 111.

The protective layer 146 is provided over the EL layer 112 and the PD layer 155 so as to include a region overlapping with the insulating layer 117. The insulating layer 125 is provided over the protective layer 146 and the insulating layer 117, and the insulating layer 126 and the insulating layer 127 are provided over the insulating layer 125. Note that as illustrated in FIG. 5B1, the insulating layer 117 has a depressed portion between the EL layers 112 and between the EL layer 112 and the PD layer 155 in some cases. The depressed portions are formed when the EL layer 112 and the PD layer 155 are formed.

Providing the insulating layer 117 so as to cover the end portion of the pixel electrodes 111 can prevent a short circuit between the adjacent pixel electrodes 111. When an organic material, for example, an organic resin is used for the insulating layer 117, the end portion of the insulating layer 117 can have a moderately curved surface. Thus, coverage with a layer formed over the insulating layer 117 can be improved. Furthermore, the insulating layer 117 can include a region in which the top surface is planarized.

Examples of an organic insulating material that can be used for the insulating layer 117 include an acrylic resin, an epoxy resin, a polyimide resin, a polyamide resin, a poly-imide-amide resin, a polysiloxane resin, a benzocy-clobutene-based resin, and a phenol resin.

FIG. 5B2 illustrates a modification example of the structure illustrated in FIG. 5B1, in which an end portion of the insulating layer 117 is angular and the top surface of the insulating layer 117 is not planarized. For the insulating layer 117 illustrated in FIG. 5B2, an inorganic material can be used, for example.

Examples of an inorganic material that can be used for the insulating layer 117 include silicon oxide, aluminum oxide, gallium oxide, germanium oxide, yttrium oxide, zirconium oxide, lanthanum oxide, neodymium oxide, hafnium oxide, tantalum oxide, silicon nitride, aluminum nitride, silicon oxynitride, aluminum oxynitride, silicon nitride oxide, and aluminum nitride oxide.

Fabrication Method Example 1

An example of a method for fabricating the display apparatus of one embodiment of the present invention will be described below with reference to drawings. Here, description is made using the display apparatus 100 described in the above structure examples as an example.

Note that thin films included in the display apparatus (insulating films, semiconductor films, conductive films, and the like) can be formed by a sputtering method, a CVD method, a vacuum evaporation method, a PLD method, an ALD method, or the like. Examples of the CVD method include a plasma-enhanced chemical vapor deposition (PECVD) method, a thermal CVD method, and the like. An example of the thermal CVD method is a metal organic chemical vapor deposition (MOCVD: Metal Organic CVD) method. Examples of an ALD method include a PEALD method and a thermal ALD method.

Alternatively, thin films included in the display apparatus (insulating films, semiconductor films, conductive films, and the like) can be formed by a method such as spin coating, dipping, spray coating, ink-jetting, dispensing, screen printing, offset printing, a doctor knife method, slit coating, roll coating, curtain coating, or knife coating.

In addition, when the thin films included in the display apparatus are processed, a photolithography method can be used, for example. Besides, the thin films may be processed by a nanoimprinting method, a sandblasting method, a lift-off method, or the like. Island-shaped thin films may be directly formed by a deposition method using a shielding mask such as a metal mask.

There are the following two typical examples of a photolithography method. In one of the methods, a resist mask is formed over a thin film that is to be processed, the thin film is processed by etching or the like, and the resist mask is removed, for example. In the other method, after a photosensitive thin film is formed, light exposure and development are performed, so that the thin film is processed into a desired shape.

For light used for light exposure in a photolithography method, for example, an i-line (with a wavelength of 365 nm), a g-line (with a wavelength of 436 nm), an h-line (with a wavelength of 405 nm), or light in which these lines are mixed can be used. Besides, ultraviolet light, KrF laser light, ArF laser light, or the like can be used. In addition, light exposure may be performed by liquid immersion exposure technique. As the light used for the light exposure, extreme ultraviolet (EUV) light or X-rays may be used. Furthermore, instead of the light used for the light exposure, an electron beam can also be used. Extreme ultraviolet light, X-rays, or an electron beam is preferably used, in which case extremely minute processing can be performed. Note that when light exposure is performed by scanning of a beam such as an electron beam, a photomask is not needed.

For etching of the thin films, a dry etching method, a wet etching method, a sandblasting method, or the like can be used.

FIG. 6A to FIG. 11B are schematic cross-sectional views illustrating an example of a method for fabricating the display apparatus 100 in which the light-emitting elements 130 and the light-receiving element 150 have the structure illustrated in FIG. 1B and the connection portion 140 has the structure illustrated in FIG. 1C1.

Figure 6A:
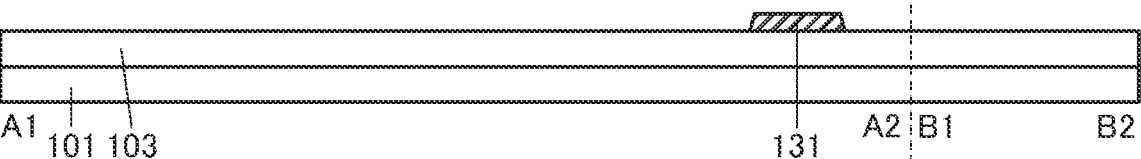
FIG. 6A to FIG. 6E are cross-sectional views illustrating an example of a method for fabricating a display apparatus.

To fabricate the display apparatus 100, first, the insulating layer 103 is formed over the substrate 101 having a visible-light-transmitting property. Then, the conductive layer 131 is formed over the insulating layer 103 (FIG. 6A). For example, a conductive film having a visible-light-reflecting property is formed over the insulating layer 103 and then part of the conductive film is removed by etching, whereby the conductive layer 131 can be formed.

Figure 6B:
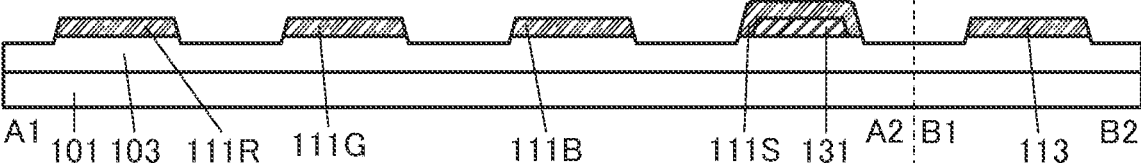

Next, the pixel electrode 111R, the pixel electrode 111G, the pixel electrode 111B, and the connection electrode 113 are formed over the insulating layer 103, and the pixel electrode 111S is formed over the conductive layer 131 (FIG. 6B). For example, a conductive film having a visible-light-transmitting property is formed over the insulating layer 103 and over the conductive layer 131 and part of the conductive film is removed by etching, whereby the pixel electrode 111R, the pixel electrode 111G, the pixel electrode 111B, the pixel electrode 111S, and the connection electrode 113 can be formed. Here, the pixel electrode 111S is formed so as to cover the conductive layer 131, whereby the conductive layer 131 can be inhibited from being etched at the time of forming the pixel electrode 111S even when the etching selectivity of the conductive layer 131 and the pixel electrode 111S is low.

Subsequently, an EL film 112Rf to be the EL layer 112R later is formed over the pixel electrode 111R, the pixel electrode 111G, the pixel electrode 111B, the pixel electrode 111S, and the insulating layer 103. Here, the EL film 112Rf can be provided so as not to overlap with the connection electrode 113. For example, the EL film 112Rf can be formed so as not to overlap with the connection electrode 113 when formed by shielding a region including the connection electrode 113 with a metal mask. The metal mask used here does not need to shield a pixel region of the display portion; hence, a fine mask is not required and a rough metal mask can be used, for example.

The EL film 112Rf includes at least a film containing a light-emitting compound (light-emitting film). The EL film 112Rf preferably includes a light-emitting film and a film functioning as a carrier-transport layer over the light-emitting film. Accordingly, the light-emitting film is inhibited from being exposed on the outermost surface during the fabrication process of the display apparatus 100, so that damage to the light-emitting film can be reduced. Thus, the reliability of the display apparatus 100 can be increased.

The EL film 112Rf may have a structure in which one or more of films functioning as a hole-injection layer, a hole-transport layer, a hole-blocking layer, an electron-blocking layer, an electron-transport layer, and an electron-injection layer are stacked. For example, the EL film 112Rf can have a structure in which a film functioning as a hole-injection layer, a film functioning as a hole-transport layer, the light-emitting film, and a film functioning as an electron-transport layer are stacked in this order. Alternatively, the EL film 112Rf can have a structure in which a film functioning as an electron-injection layer, a film functioning as an electron-transport layer, the light-emitting film, and a film functioning as a hole-transport layer are stacked in this order.

The EL film 112Rf can be formed by, for example, an evaporation method, a sputtering method, or an inkjet method. Note that without limitation to this, the above deposition method can be used as appropriate.

Next, a sacrificial film 144Ra is formed over the EL film 112Rf, the connection electrode 113, and the insulating layer 103, and a sacrificial film 144Rb is formed over the sacrificial film 144Ra. That is, a sacrificial film having a two-layer structure is formed over the EL film 112Rf, the connection electrode 113, and the insulating layer 103. Note that the sacrificial film may have a single-layer structure or a stacked-layer structure of three or more layers. In a subsequent step of forming another sacrificial film, a sacrificial film has a two-layer structure; however, the sacrificial film may have a single-layer structure or a stacked-layer structure of three or more layers.

The sacrificial film 144Ra and the sacrificial film 144Rb can be formed by, for example, a sputtering method, a CVD method, an ALD method, or a vacuum evaporation method. Note that a formation method that causes less damage to the EL film is preferable, and the sacrificial film 144Ra formed directly on the EL film 112Rf is suitably formed by an ALD method or a vacuum evaporation method.

As the sacrificial film 144Ra, an inorganic film such as a metal film, an alloy film, a metal oxide film, a semiconductor film, or an inorganic insulating film or an organic film such as an organic insulating film can be suitably used.

Alternatively, an oxide film can be used as the sacrificial film 144Ra. An oxide film or an oxynitride film of silicon oxide, silicon oxynitride, aluminum oxide, aluminum oxynitride, hafnium oxide, hafnium oxynitride, or the like can also be typically used. A nitride film, for example, can also be used as the sacrificial film 144Ra. Specifically, it is also possible to use a nitride such as silicon nitride, aluminum nitride, hafnium nitride, titanium nitride, tantalum nitride, tungsten nitride, gallium nitride, or germanium nitride. A film containing such an inorganic insulating material can be formed by a deposition method such as a sputtering method, a CVD method, or an ALD method; the sacrificial film 144Ra, which is formed directly on the EL film 112Rf, is particularly preferably formed by an ALD method.

For the sacrificial film 144Ra, a metal material such as nickel, tungsten, chromium, molybdenum, cobalt, palladium, titanium, aluminum, silver, yttrium, zirconium, or tantalum or an alloy material containing the metal material can be used, for example. It is particularly preferable to use a low-melting-point material such as aluminum or silver.

Alternatively, for the sacrificial film 144Ra, a metal oxide such as an indium gallium zinc oxide (an In—Ga—Zn oxide) can be used. It is also possible to use indium oxide, an indium zinc oxide (an In—Zn oxide), an indium tin oxide (an In—Sn oxide), an indium titanium oxide (an In—Ti oxide), an indium tin zinc oxide (an In—Sn—Zn oxide), an indium titanium zinc oxide (an In—Ti—Zn oxide), an indium gallium tin zinc oxide (an In—Ga—Sn—Zn oxide), or the like. Alternatively, indium tin oxide containing silicon can also be used, for example.

Note that an element M (M is one or more kinds selected from aluminum, silicon, boron, yttrium, copper, vanadium, beryllium, titanium, iron, nickel, germanium, zirconium, molybdenum, lanthanum, cerium, neodymium, hafnium, tantalum, tungsten, and magnesium) can be employed instead of gallium. Specifically, M is preferably one or more kinds selected from gallium, aluminum, and yttrium.

Any of the above-described materials that can be used for the sacrificial film 144Ra can be used for the sacrificial film 144Rb. For example, from the above materials that can be used for the sacrificial film 144Ra, one material can be selected for the sacrificial film 144Ra and another material can be selected for the sacrificial film 144Rb. Alternatively, one or more materials can be selected for the sacrificial film 144Ra from the above materials that can be used for the sacrificial film 144Ra, and one or more materials selected from the materials excluding the material(s) selected for the sacrificial film 144Ra can be used for the sacrificial film 144Rb.

Specifically, aluminum oxide formed by an ALD method is suitably used for the sacrificial film 144Ra, and silicon nitride formed by a sputtering method is suitably used for the sacrificial film 144Rb. In the case of employing this structure, the deposition temperature at the time of depositing the materials by an ALD method and a sputtering method is preferably higher than or equal to room temperature and lower than or equal to 120° C., further preferably higher than or equal to room temperature and lower than or equal to 100° C., in which case adverse effects on the EL film 112Rf can be reduced. In the case of the stacked-layer structure of the sacrificial film 144Ra and the sacrificial film 144Rb, a stress applied to the stacked-layer structure is preferably small. Specifically, a stress applied to the stacked-layer structure is preferably higher than or equal to −500 MPa and less than or equal to +500 MPa, further preferably higher than or equal to −200 MPa and lower than or equal to +200 MPa, in which case troubles in the process, such as film separation and peeling, can be inhibited.

As the sacrificial film 144Ra, it is possible to use a film highly resistant to etching treatment performed on various EL films such as the EL film 112Rf, i.e., a film having high etching selectivity. Moreover, as the sacrificial film 144Ra, it is particularly preferable to use a film that can be removed by a wet etching method less likely to cause damage to EL films.

For the sacrificial film 144Ra, a material that can be dissolved in a chemically stable solvent may be used. In particular, a material that is dissolved in water or alcohol can be suitably used for the sacrificial film 144Ra. In deposition of the sacrificial film 144Ra, it is preferable that application of such a material that has been dissolved in a solvent such as water or alcohol be performed by a wet deposition method followed by heat treatment for evaporating the solvent. In that case, the heat treatment is preferably performed in a reduced-pressure atmosphere, in which case the solvent can be removed at a low temperature in a short time and thermal damage to the EL film 112Rf can be reduced accordingly.

Examples of the wet deposition method that can be used for forming the sacrificial film 144Ra include spin coating, dipping, spray coating, ink-jetting, dispensing, screen printing, offset printing, a doctor knife method, slit coating, roll coating, curtain coating, knife coating, and the like.

For the sacrificial film 144Ra, an organic material such as polyvinyl alcohol (PVA), polyvinylbutyral, polyvinylpyrrolidone, polyethylene glycol, polyglycerin, pullulan, water-soluble cellulose, or an alcohol-soluble polyamide resin can be used.

As the sacrificial film 144Rb, a film, which has high etching selectivity over the sacrificial film 144Ra, is preferably used.

It is preferable that an inorganic insulating material such as aluminum oxide, hafnium oxide, or silicon oxide formed by an ALD method be used as the sacrificial film 144Ra, and a metal material such as nickel, tungsten, chromium, molybdenum, cobalt, palladium, titanium, aluminum, yttrium, zirconium, or tantalum or an alloy material containing any of the metal materials formed by a sputtering method be used as the sacrificial film 144Rb. Tungsten formed by a sputtering method is particularly preferably used as the sacrificial film 144Rb. Alternatively, a metal oxide containing indium, such as indium gallium zinc oxide (In—Ga—Zn oxide), formed by a sputtering method may be used as the sacrificial film 144Rb. Furthermore, an inorganic material may be used for the sacrificial film 144Rb. For example, it is possible to use an oxide film or a nitride film such as a silicon oxide film, a silicon oxynitride film, a silicon nitride oxide film, a silicon nitride film, an aluminum oxide film, an aluminum oxynitride film, or a hafnium oxide film.

Alternatively, as the sacrificial film 144Rb, an organic film that can be used as the EL film 112Rf and the like may be used. For example, the organic film that is used as the EL film 112Rf can be used as the sacrificial film 144Rb. The use of such an organic film is preferable, in which case the deposition apparatus for the EL film 112Rf or the like can be used in common. Furthermore, the sacrificial film 144Rb can be removed at the same time as, for example, the etching of the EL film 112Rf; thus, the process can be simplified.

Figure 6C:
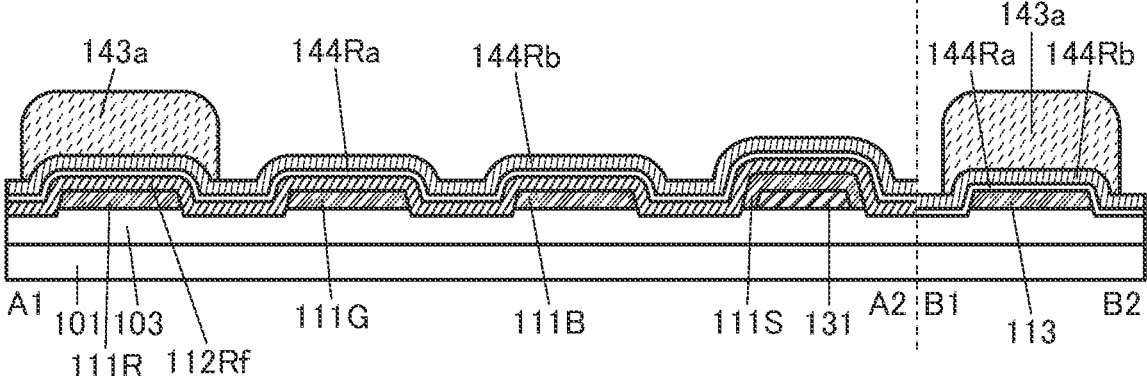

Next, a resist mask 143a is formed over the sacrificial film 144Rb (FIG. 6C). For the resist mask 143a, a resist material containing a photosensitive resin, such as a positive type resist material or a negative type resist material can be used.

Figure 6D:
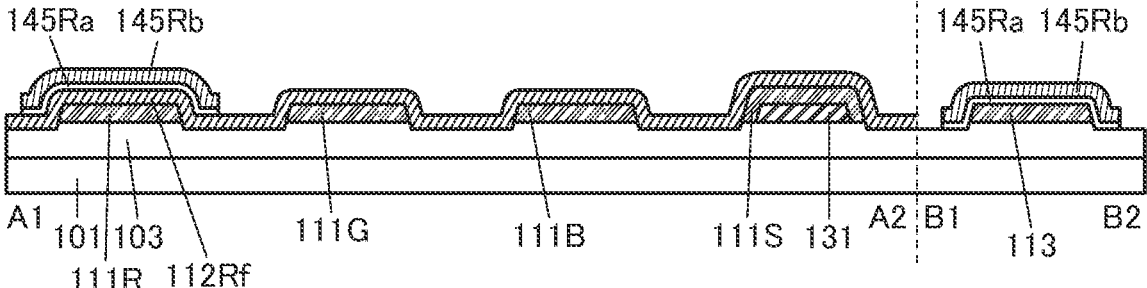

Then, part of the sacrificial film 144Rb and the sacrificial film 144Ra that is not covered with the resist mask 143a is removed by etching, whereby island-shaped or band-shaped sacrificial layer 145Rb and sacrificial layer 145Ra are formed (FIG. 6D). Here, as illustrated in FIG. 6D, the sacrificial layer 145Rb and the sacrificial layer 145Ra can be formed over the pixel electrode 111R and the connection electrode 113, for example.

Here, it is preferable that part of the sacrificial film 144Rb be removed by etching using the resist mask 143a, the resist mask 143a be removed after the sacrificial layer 145Rb is formed, and then the sacrificial film 144Ra be etched using the sacrificial layer 145Rb as a hard mask. In this case, the etching of the sacrificial film 144Rb preferably employs etching conditions with high selectivity with the sacrificial film 144Ra. Although a wet etching method or a dry etching method can be used for the etching for forming the hard mask, a shrinkage of the pattern can be inhibited by using a dry etching method.

Processing of the sacrificial film 144Ra and the sacrificial film 144Rb and removal of the resist mask 143a can be performed by a wet etching method or a dry etching method. For example, the sacrificial film 144Ra and the sacrificial film 144Rb can be processed by a dry etching method using a gas containing fluorine. The resist mask 143a can be removed by a dry etching method using a gas containing oxygen (also referred to as an oxygen gas) (such a method is also referred to as a plasma ashing method).

When the sacrificial film 144Ra is etched using the sacrificial layer 145Rb as a hard mask, the resist mask 143a can be removed while the EL film 112Rf is covered with the sacrificial film 144Ra. For example, if the EL film 112Rf is exposed to oxygen, the electrical characteristics of the light-emitting element 130R are adversely affected in some cases. Thus, in the case where the resist mask 143a is removed by a method using an oxygen gas, such as plasma ashing, the sacrificial film 144Ra is preferably etched using the sacrificial layer 145Rb as a hard mask.

Figure 6E:
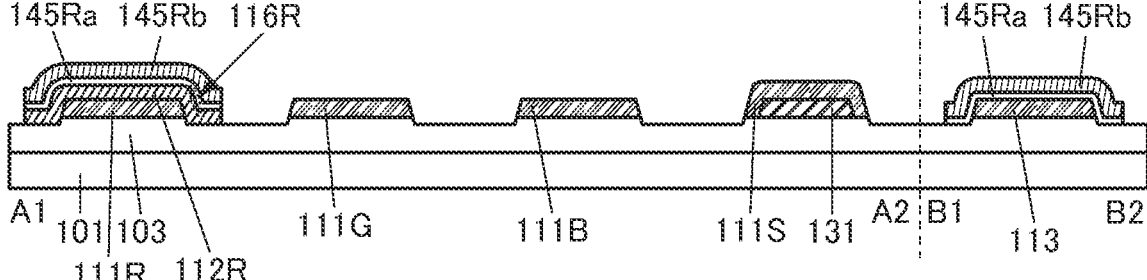

Next, part of the EL film 112Rf that is not covered by the sacrificial layer 145Ra is removed by etching, so that an island-shaped or band-shaped EL layer 112R is formed (FIG. 6E). Here, as illustrated in FIG. 6E, in the case where the end portion of the pixel electrode 111R has a tapered shape and the EL layer 112R covers the end portion of the pixel electrode 111R, the EL layer 112R can include a tapered portion 116R.

In addition, when a dry etching method using an oxygen gas is used for the etching of the EL film 112Rf, the etching rate can be increased. Thus, etching under a low-power condition can be performed while the etching rate is kept adequately high; hence, damage due to the etching can be reduced. Furthermore, a defect such as attachment of a reaction product generated at the etching to, for example, EL layer 112R can be inhibited.

Meanwhile, when the EL film 112Rf is etched by a dry etching method using an etching gas that does not contain oxygen as its main component, a change in properties of the EL film 112Rf can be inhibited, so that the display apparatus 100 can be a highly reliable display apparatus. Examples of the etching gas that does not contain oxygen as its main component include a gas containing $CF_4$, $C_4F_8$, $SF_6$, $CHF_3$, $Cl_2$, $H_2O$, $BCl_3$, or the like and a gas containing a Group 18 element such as He. Alternatively, a mixed gas of the above gas and a dilution gas that does not contain oxygen can be used as the etching gas. Note that etching of the EL film 112Rf is not limited to the above and may be performed by a dry etching method using another gas or a wet etching method.

If impurities are attached to a side surface of the EL layer 112R when the EL layer 112R is formed by the etching of the EL film 112Rf, the impurities might enter the inside of the EL layer 112R in the subsequent step. This degrades the reliability of the display apparatus 100 in some cases. Thus, it is preferable to remove impurities attached to a surface of the EL layer 112R after the formation of the EL layer 112R, in which case the reliability of the display apparatus 100 can be increased.

Impurities attached to the surface of the EL layer 112R can be removed, for example, by irradiation of the surface of the EL layer 112R with an inert gas. Here, the surface of the EL layer 112R is exposed right after the EL layer 112R is formed. Specifically, the side surface of the EL layer 112R is exposed. Accordingly, impurities attached to the EL layer 112R can be removed, for example, when the substrate where the EL layer 112R is formed is put in an inert gas atmosphere after the formation of the EL layer 112R. As the inert gas, one or more selected from Group 18 elements (typically, helium, neon, argon, xenon, krypton, and the like) and nitrogen can be used, for example.

Note that in the case where the EL film 112Rf is processed, a method in which processing is performed directly on the light-emitting film included in the EL film 112Rf by a photolithography method can be employed. In this case, damage to the light-emitting layer (e.g., processing damage) might be caused to significantly degrade the reliability. Thus, in order to fabricate the display apparatus 100, the sacrificial layer 145Ra and the sacrificial layer 145Rb are formed over a film located above the light-emitting film (for example, a film functioning as a carrier-transport layer or a carrier-injection layer, more specifically, a film functioning as an electron-transport layer, a hole-transport layer, an electron-injection layer, or a hole-injection layer) and then the light-emitting film is processed. Thus, the display apparatus 100 can be a highly reliable display apparatus.

Next, the EL film 112Gf to be the EL layer 112G later is formed over the sacrificial layer 145Rb, the pixel electrode 111G, the pixel electrode 111B, the pixel electrode 111S, and the insulating layer 103. Forming the EL film 112Gf after the formation of the sacrificial layer 145Ra can inhibit the EL film 112Gf from being in contact with the top surface of the EL layer 112R. For the formation of the EL film 112Gf, for example, the description of the formation of the EL film 112Rf can be referred to.

Figure 7A:
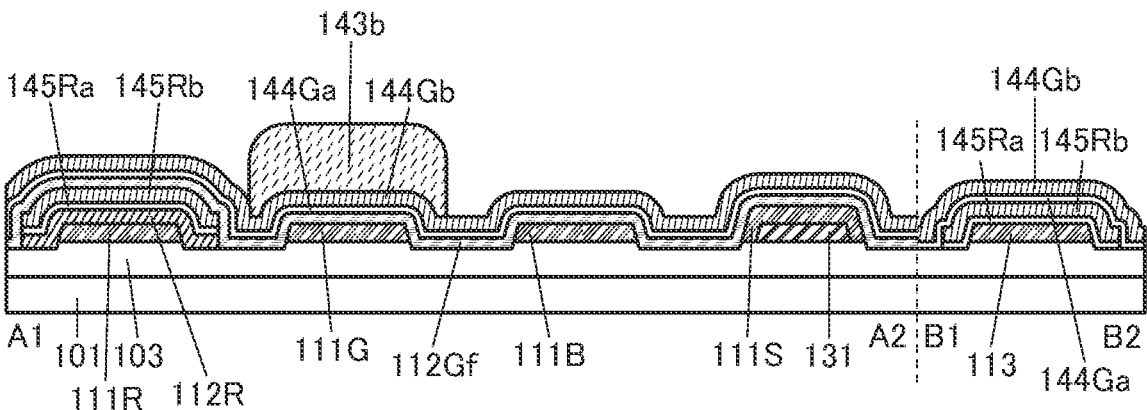
FIG. 7A to FIG. 7C are cross-sectional views illustrating an example of a method for fabricating a display apparatus.

Subsequently, a sacrificial film 144Ga is formed over the EL film 112Gf, the sacrificial layer 145Rb, and the insulating layer 103, and a sacrificial film 144Gb is formed over the sacrificial film 144Ga. Then, a resist mask 143b is formed over the sacrificial film 144Gb (FIG. 7A). The description of the formation and the like of the sacrificial film 144Ra, the sacrificial film 144Rb, and the resist mask 143a can be referred to for the formation and the like of the sacrificial film 144Ga, the sacrificial film 144Gb, and the resist mask 143b.

Figure 7B:
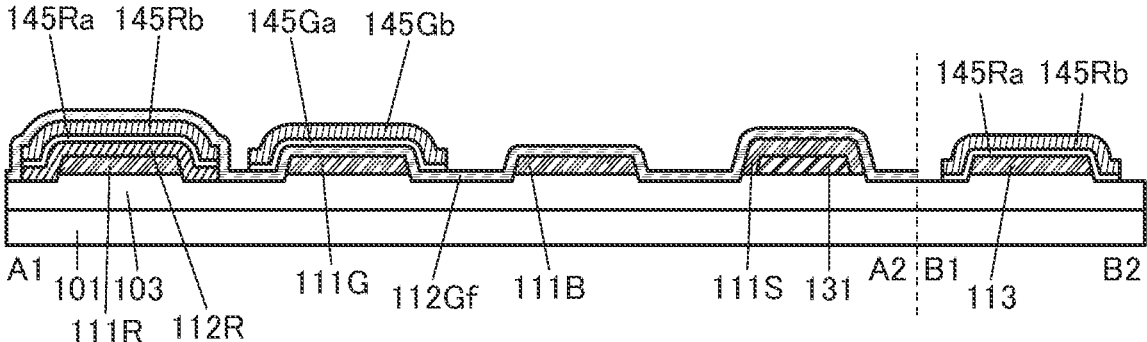

Then, part of the sacrificial film 144Gb and the sacrificial film 144Ga that are not covered with the resist mask 143b are removed by etching, whereby an island-shaped or band-shaped sacrificial layer 145Gb and an island-shaped or band-shaped sacrificial layer 145Ga are formed. In addition, the resist mask 143b is removed (FIG. 7B). Here, the sacrificial layer 145Gb and the sacrificial layer 145Ga can be formed over the pixel electrode 111G. The description of the formation of the sacrificial layer 145Rb and the sacrificial layer 145Ra, removal of the resist mask 143a, and the like can be referred to for the formation of the sacrificial layer 145Gb and the sacrificial layer 145Ga, removal of the resist mask 143b, and the like.

Figure 7C:
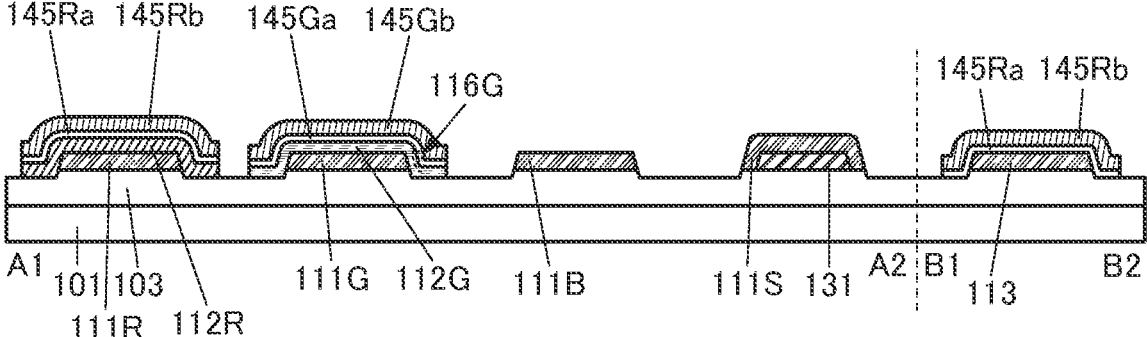

Next, part of the EL film 112Gf that is not covered by the sacrificial layer 145Ga is removed by etching, so that the island-shaped or band-shaped EL layer 112G is formed (FIG. 7C). Here, in the case where the end portion of the pixel electrode 111G has a tapered shape and the EL layer 112G covers the end portion of the pixel electrode 111G as illustrated in FIG. 7C, the EL layer 112G can include the tapered portion 116G.

For the formation of the EL layer 112G, for example, the description of the formation of the EL layer 112R can be referred to. As in the case of the EL layer 112R, it is preferable to remove impurities attached to the surface of the EL layer 112G. For example, impurities attached to the EL layer 112G can be removed when the substrate where the EL layer 112G is formed is put in an inert gas atmosphere after the formation of the EL layer 112G.

In the case where the EL film 112Gf is processed, the sacrificial layer 145Ga and the sacrificial layer 145Gb are formed over a film located above the light-emitting film, and the light-emitting film is processed. Thus, the display apparatus 100 can be a highly reliable display apparatus.

Subsequently, an EL film 112Bf to be the EL layer 112B later is formed over the sacrificial layer 145Rb, the sacrificial layer 145Gb, the pixel electrode 111B, the pixel electrode 111S, and the insulating layer 103. Forming the EL film 112Bf after the formation of the sacrificial layer 145Ga can inhibit the EL film 112Bf from being in contact with the top surface of the EL layer 112G. For the formation of the EL film 112Bf, for example, the description of the formation of the EL film 112Rf can be referred to.

Figure 8A:
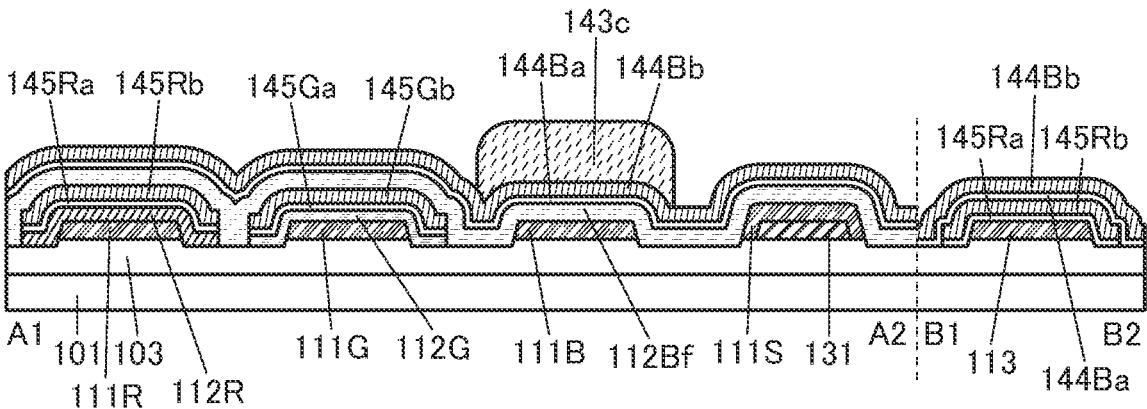
FIG. 8A to FIG. 8C are cross-sectional views illustrating an example of a method for fabricating a display apparatus.

Next, a sacrificial film 144Ba is formed over the EL film 112Bf, the sacrificial layer 145Rb, and the insulating layer 103, and a sacrificial film 144Bb is formed over the sacrificial film 144Ba. Then, a resist mask 143c is formed over the sacrificial film 144Bb (FIG. 8A). The description of the formation and the like of the sacrificial film 144Ra, the sacrificial film 144Rb, and the resist mask 143a can be referred to for the formation and the like of the sacrificial film 144Ba, the sacrificial film 144Bb, and the resist mask 143c.

Figure 8B:
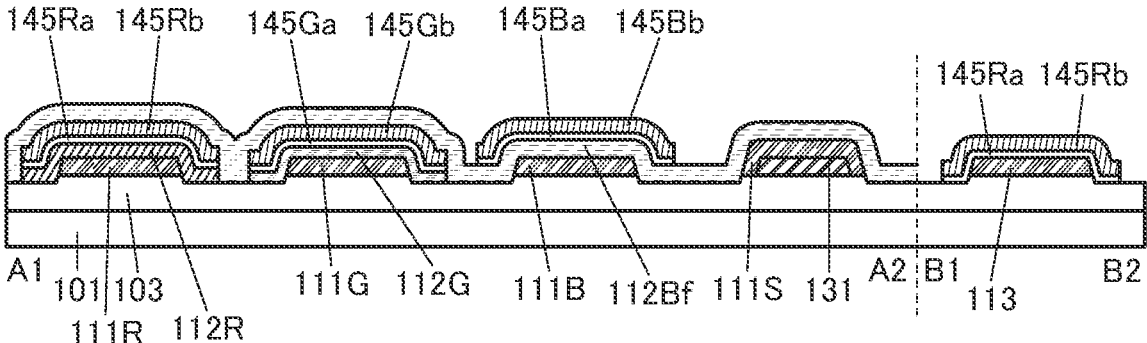

Subsequently, part of the sacrificial film 144Bb and the sacrificial film 144Ba that are not covered with the resist mask 143c are removed by etching, whereby an island-shaped or band-shaped sacrificial layer 145Bb and an island-shaped or band-shaped sacrificial layer 145Ba are formed. Furthermore, the resist mask 143c is removed (FIG. 8B). Here, the sacrificial layer 145Bb and the sacrificial layer 145Ba can be formed over the pixel electrode 111B. The description of the formation of the sacrificial layer 145Rb and the sacrificial layer 145Ra, removal of the resist mask 143a, and the like can be referred to for the formation of the sacrificial layer 145Bb and the sacrificial layer 145Ba, removal of the resist mask 143c, and the like.

Figure 8C:
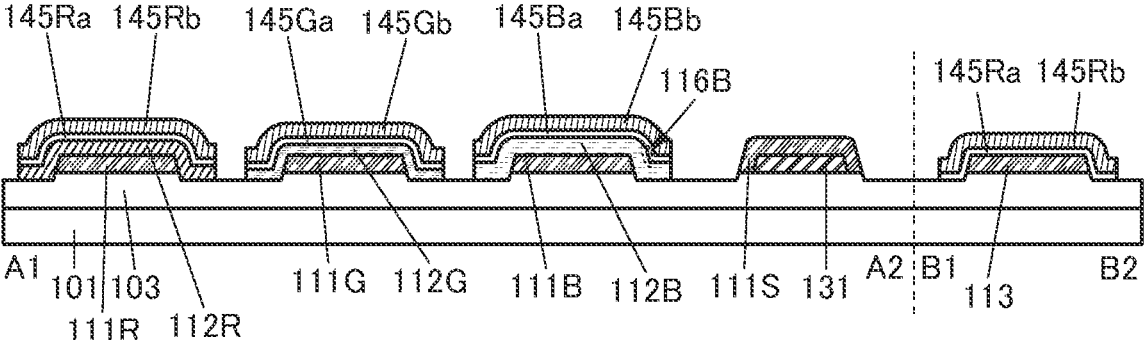

Next, part of the EL film 112Bf that is not covered with the sacrificial layer 145Ba is removed by etching, so that the island-shaped or band-shaped EL layer 112B is formed (FIG. 8C). Here, as illustrated in FIG. 8C, the end portion of the pixel electrode 111B has a tapered shape and the EL layer 112B covers the end portion of the pixel electrode 111B as illustrated in FIG. 8C, the EL layer 112B can include a tapered portion 116B.

For the formation of the EL layer 112B, for example, the description of the formation of the EL layer 112R can be referred to. As in the case of the EL layer 112R and the EL layer 112G, it is preferable to remove impurities attached to the surface of the EL layer 112B. For example, impurities attached to the EL layer 112B can be removed when the substrate where the EL layer 112B is formed is put in an inert gas atmosphere after the formation of the EL layer 112B.

In the case where the EL film 112Bf is processed, the sacrificial layer 145Ba and the sacrificial layer 145Bb are formed over a film located above the light-emitting film, and the light-emitting film is processed. Thus, the display apparatus 100 can be a highly reliable display apparatus.

Subsequently, a PD film 155f to be the PD layer 155 later is formed over the sacrificial layer 145Rb, the sacrificial layer 145Gb, the sacrificial layer 145Bb, the pixel electrode 111S, and the insulating layer 103. Forming the PD film 155f after the formation of the sacrificial layer 145Ba can inhibit the PD film 155f from being in contact with the top surface of the EL layer 112B. For the formation of the PD film 155f, for example, the description of the formation of the EL film 112Rf can be referred to.

The PD film 155f includes at least a film containing a photoelectric conversion material having sensitivity to visible light or infrared light (a photoelectric conversion film). Furthermore, the PD film 155f preferably includes a photoelectric conversion film and a film functioning as a carrier-transport layer over the photoelectric conversion film. Accordingly, the photoelectric conversion film is inhibited from being exposed on the outermost surface during the fabrication process of the display apparatus 100, so that damage to the photoelectric conversion film can be reduced. Thus, the reliability of the display apparatus 100 can be increased.

The PD film 155f may have a structure in which one or more films functioning as a hole-transport layer, a hole-blocking layer, an electron-blocking layer, and an electron-transport layer are stacked. For example, the PD film 155f can have a structure in which a film functioning as a hole-transport layer, the photoelectric conversion film, and a film functioning as an electron-transport layer are stacked in this order. Alternatively, the PD film 155f can have a structure in which a film functioning as an electron-transport layer, the photoelectric conversion film, and a film functioning as a hole-transport layer are stacked in this order.

Figure 9A:
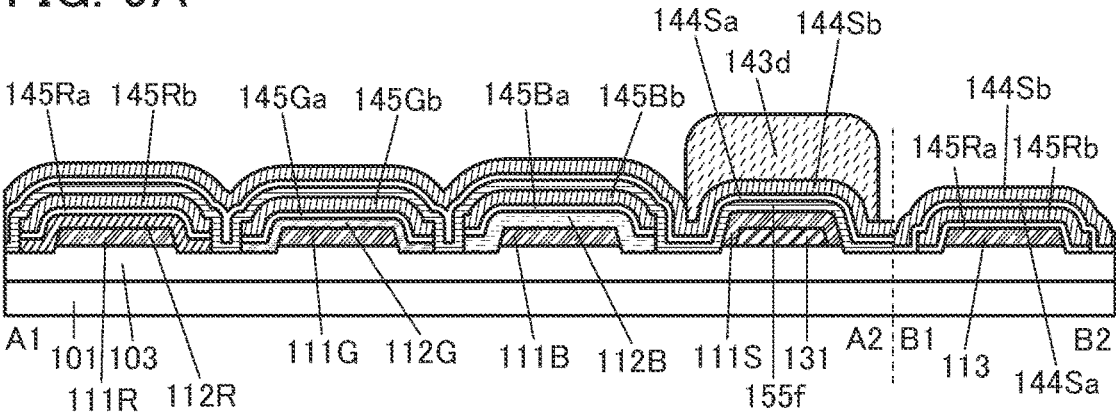
FIG. 9A to FIG. 9D are cross-sectional views illustrating an example of a method for fabricating a display apparatus.

Next, a sacrificial film 144Sa is formed over the PD film 155f, the sacrificial layer 145Rb, and the insulating layer 103, and a sacrificial film 144Sb is formed over the sacrificial film 144Sa. Then, a resist mask 143d is formed over the sacrificial film 144Sb (FIG. 9A). The description of the formation and the like of the sacrificial film 144Ra, the sacrificial film 144Rb, and the resist mask 143a can be referred to for the formation and the like of the sacrificial film 144Sa, the sacrificial film 144Sb, and the resist mask 143d.

Figure 9B:
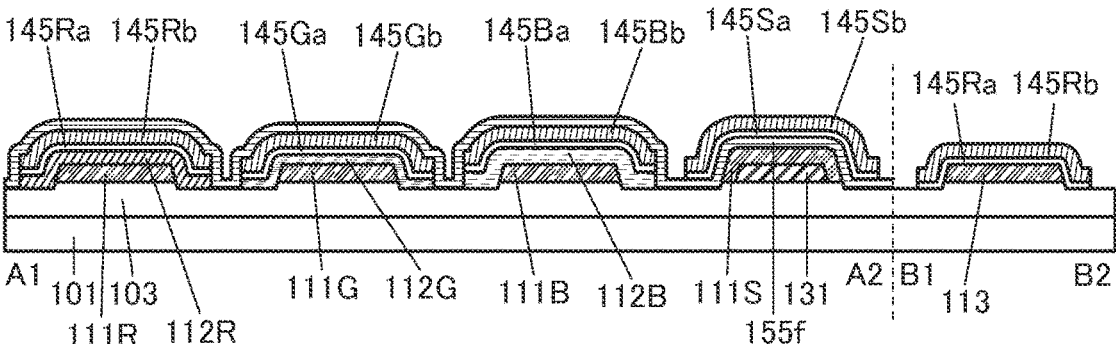

Then, part of the sacrificial film 144Sb and the sacrificial film 144Sa that are not covered with the resist mask 143d are removed by etching, whereby an island-shaped or band-shaped sacrificial layer 145Sb and an island-shaped or band-shaped 145Sa are formed. In addition, the resist mask 143d is removed (FIG. 9B). Here, the sacrificial layer 145Sb and the sacrificial layer 145Sa can be formed over the pixel electrode 111S. The description of the formation of the sacrificial layer 145Rb and the sacrificial layer 145Ra, removal of the resist mask 143a, and the like can be referred to for the formation of the sacrificial layer 145Sb and the sacrificial layer 145Sa, removal of the resist mask 143d, and the like.

Figure 9C:
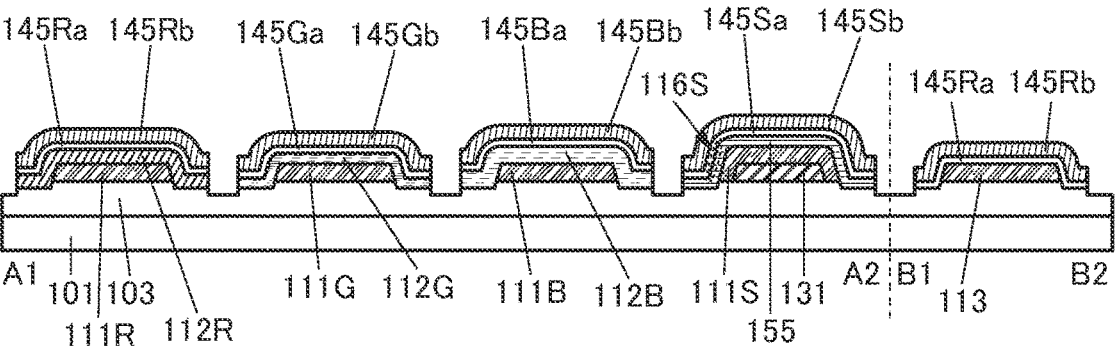

Next, part of the PD film 155f that is not covered by the sacrificial layer 145Sa is removed by etching, so that an island-shaped or band-shaped PD layer 155 is formed (FIG. 9C). Here, when the end portion of the pixel electrode 111S has a tapered shape and the PD layer 155 covers the end portion of the pixel electrode 111S as illustrated in FIG. 9C, the PD layer 155 can include a tapered portion 116S.

For the formation of the PD layer 155, for example, the description of the formation of the EL layer 112R can be referred to. As in the case of the EL layer 112R, the EL layer 112G, and the EL layer 112B, it is preferable to remove impurities attached to a surface of the PD layer 155. For example, impurities attached to the PD layer 155 can be removed when the substrate where the PD layer 155 is formed is put in an inert gas atmosphere after the formation of the PD layer 155.

Note that in the case where the PD film 155f is processed, the sacrificial layer 145Sa and the sacrificial layer 145Sb are formed over a film located above the photoelectric conversion film, and the photoelectric conversion film is processed. Thus, the display apparatus 100 can be a highly reliable display apparatus.

As described above, through the steps illustrated in FIG. 6C to FIG. 9C, the EL layer 112R, the EL layer 112G, the EL layer 112B, and the PD layer 155 can be separately formed. Note that in the above steps, the EL layer 112R, the EL layer 112G, the EL layer 112B, and the PD layer 155 are formed in this order; however, the formation order of the EL layer 112R, the EL layer 112G, the EL layer 112B, and the PD layer 155 is not particularly limited. For example, the EL layer 112 may be formed after the formation of the PD layer 155.

Figure 9D:
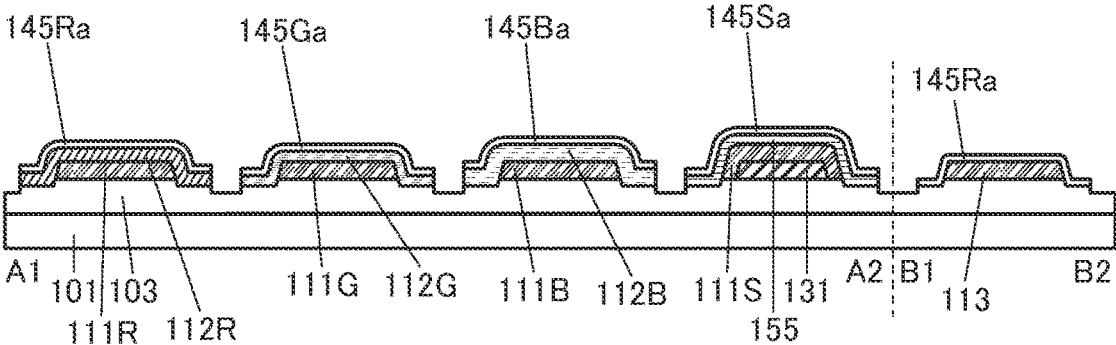

Subsequently, the sacrificial layer 145Rb, the sacrificial layer 145Gb, the sacrificial layer 145Bb, and the sacrificial layer 145Sb are removed by, for example, etching (FIG. 9D). The sacrificial layer 145Rb, the sacrificial layer 145Gb, the sacrificial layer 145Bb, and the sacrificial layer 145Sb are preferably removed by a method having high selectivity over the sacrificial layer 145Ra, the sacrificial layer 145Ga, the sacrificial layer 145Ba, and the sacrificial layer 145Sa. For example, the sacrificial layer 145Rb, the sacrificial layer 145Gb, the sacrificial layer 145Bb, and the sacrificial layer 145Sb can be removed by a dry etching method. Note that the sacrificial layer 145Rb, the sacrificial layer 145Gb, the sacrificial layer 145Bb, and the sacrificial layer 145Sb may be removed not right after the formation of the EL layer 112R, the EL layer 112G, the EL layer 112B, or the PD layer 155 but in a later step.

Next, an insulating film 125f to be the insulating layer 125 later is formed to cover the top surface of the insulating layer 103, the side surfaces of the EL layer 112 and the PD layer 155, and a side surface and the top surface of the sacrificial layer 145a.

In this specification and the like, for example, a description common to the sacrificial layer 145Ra, the sacrificial layer 145Ga, the sacrificial layer 145Ba, and the sacrificial layer 145Sa is sometimes made using the term "sacrificial layer 145a". A description common to the sacrificial layer 145a and the sacrificial layer 145b is sometimes made using the term "sacrificial layer 145". Moreover, other components are sometimes described using reference numerals with the letters of the alphabet omitted, as mentioned above.

Although the insulating film 125f can be formed by a sputtering method, a CVD method, a PLD method, an ALD method, or the like, the insulating film 125f is preferably formed by an ALD method achieving favorable coverage. For the insulating film 125f, an inorganic material can be used, for example, and an inorganic insulating film such as an oxide insulating film, a nitride insulating film, an oxynitride insulating film, or a nitride oxide insulating film can be used. In particular, using an inorganic insulating film such as an aluminum oxide film, a hafnium oxide film, or a silicon oxide film formed by an ALD method enables the insulating film 125f to have few pinholes.

Figure 10A:
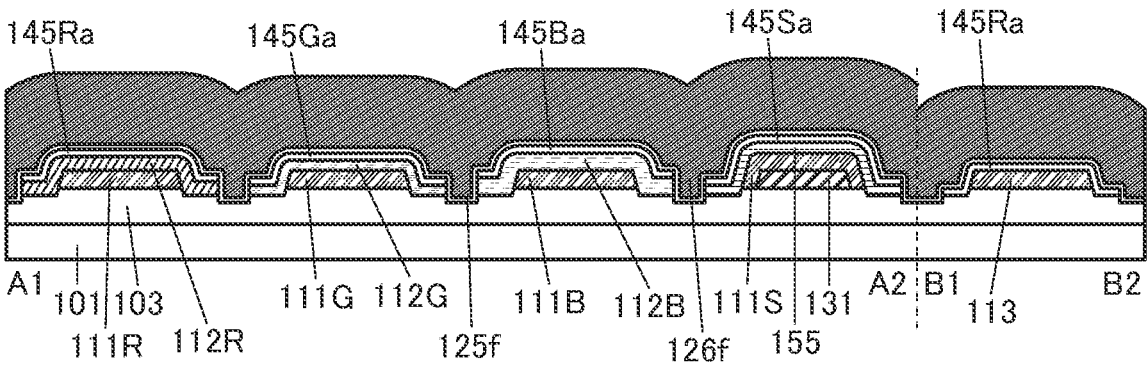
FIG. 10A to FIG. 10D are cross-sectional views illustrating an example of a method for fabricating a display apparatus.

Then, an insulating film 126f to be the insulating layer 126 later is formed over the insulating film 125f (FIG. 10A). For example, an organic material can be used for the insulating film 126f. A color resist can be used for the insulating film 126f, for example. In the case where a color resist is used for the insulating film 126f, a negative resist which reduces solubility of a light-exposure portion is preferably used for the insulating film 126f.

When a color resist is used for the insulating film 126f, the insulating film 126f can be formed by a spin coating method, a spraying method, a screen printing method, a painting method, or the like.

As illustrated in FIG. 10A, the insulating film 126f may have a slight unevenness reflecting unevenness of the formation surface. Alternatively, the insulating film 126f is planarized in some cases.

Figure 10B:
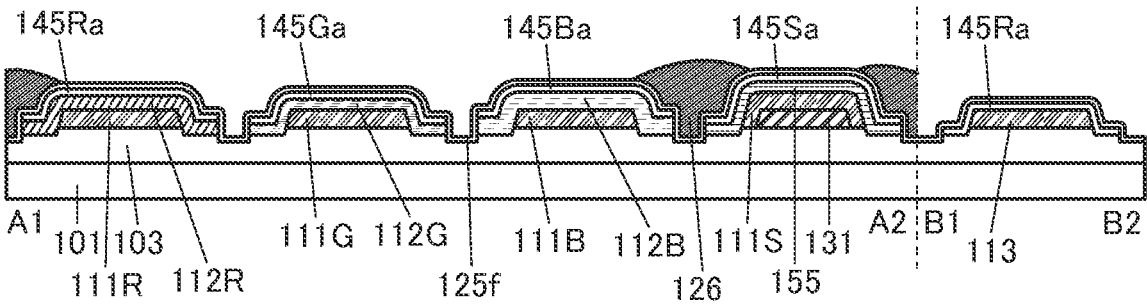

Next, the insulating layer 126 is formed between the EL layer 112 and the PD layer 155 adjacent to each other (FIG. 10B). Here, when a photosensitive material such as a color resist is used for the insulating film 126f, the insulating layer 126 can be formed without providing an etching mask such as a resist mask or a hard mask. Since a photosensitive material such as a color resist can be processed only by light exposure and development steps, the insulating layer 126 can be formed without using a dry etching method, for example. Thus, the process can be simplified. In addition, damage to the EL layer 112 and the PD layer 155 due to etching of the insulating film 126f can be reduced.

The insulating layer 126 may alternatively be formed by performing etching substantially uniformly on the top surface of the insulating film 126f. Such uniform etching for planarization is also referred to as etch back. Note that the light exposure and development steps and the etch back step may be used in combination to form the insulating layer 126.

The insulating layer 126 may alternatively be formed by processing the insulating film 126f, for example, by a dry etching method. In that case, a material without photosensitivity can be used for the insulating film 126f.

Figure 10C:
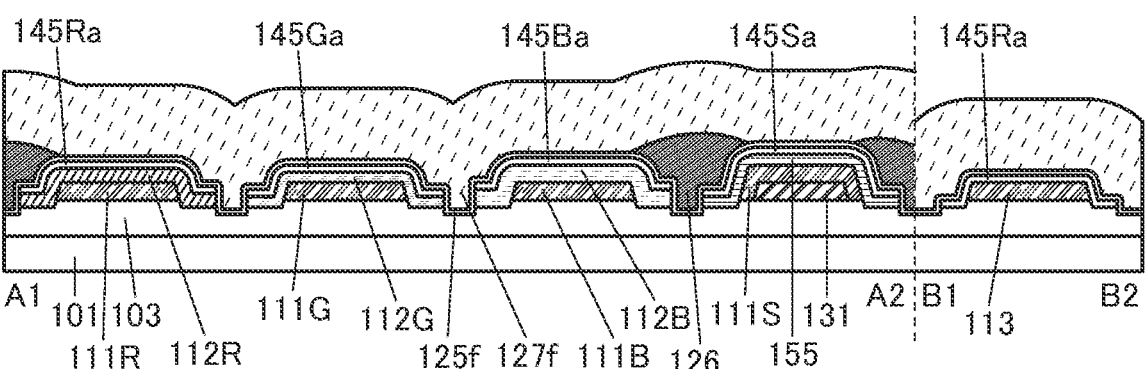

Then, an insulating film 127f to be the insulating layer 127 later is formed over the insulating film 125f and the insulating layer 126 (FIG. 10C). For the insulating film 127f, an organic material can be used, for example. A photoresist can be used as the insulating film 127f, for example. In the case where a photoresist is used for the insulating film 127f, either a negative resist which reduces solubility of a light exposure portion or a positive resist which increases solubility of a light exposure portion may be used for the insulating film 127f.

When a photoresist is used for the insulating film 127f, the insulating film 127f can be formed by a spin coating method, a spraying method, a screen printing method, a painting method, or the like.

As illustrated in FIG. 10C, the insulating film 127f may have a slight unevenness reflecting unevenness of the formation surface. Alternatively, the insulating film 127f is planarized in some cases.

Figure 10D:
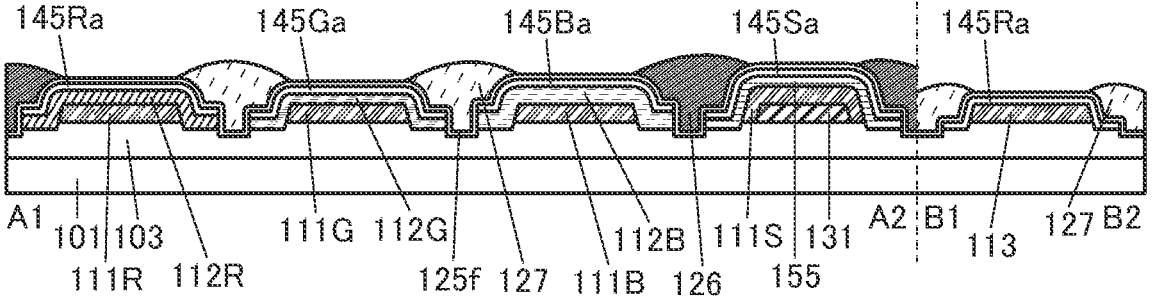

Next, an insulating layer 127 is formed between two adjacent EL layers 112 (FIG. 10D). Specifically, for example, the insulating layer 127 can be formed in a region where the insulating layer 125 is formed in a later step and where the insulating layer 126 is not formed. Here, when a photosensitive material such as a photoresist is used for the insulating film 127f, the insulating layer 127 can be formed without providing an etching mask such as a resist mask or a hard mask. Since a photosensitive material such as a photoresist can be processed only by light exposure and development steps, the insulating layer 127 can be formed without using a dry etching method, for example. Thus, the process can be simplified. In addition, damage to the EL layer 112 and the PD layer 155 due to etching of the insulating film 127f can be reduced.

Here, in the case where a photosensitive material is used for the insulating film 127f, using a positive resist for the insulating layer 126 leads to dissolution and disappearance of the insulating layer 126 at the time of development of the insulating layer 127f in some cases. Thus, as described above, a negative resist is preferably used for the insulating film 126f to be the insulating layer 126.

Etch back may be performed on the top surface of the insulating film 127f. Note that the light exposure and development steps and the etch back step may be used in combination to form the insulating layer 127.

The insulating film 127 may alternatively be formed by processing the insulating film 127f, for example, by a dry etching method. In that case, a material without photosensitivity can be used for the insulating film 127f. For the insulating layer 126, a positive resist can be used as well as a negative resist.

In the insulating layer 127, the transmittance of light with a specific wavelength which is at least part of a visible light wavelength is higher than the transmittance of the light with the specific wavelength in the insulating layer 126. Furthermore, the insulating layer 127 can have a structure in which the transmittance of at least one of red light, green light, and blue light through the insulating layer 127 is higher than the transmittance of the light in the insulating layer 126, for example.

As described above, through the steps illustrated in FIG. 10A to FIG. 10D, the insulating layer 126 provided between the EL layer 112 and the PD layer 155 adjacent to each other and the insulating layer 127 provided between the two adjacent EL layers 112 can be separately formed. Specifically, for example, the insulating layer 126 can be formed in a region where the insulating layer 125 is formed in a later step and between the EL layer 112 and the PD layer 155 adjacent to each other, and the insulating layer 127 can be formed in the other region. Here, in the case where a negative resist is used for the insulating layer 127, the insulating layer 126 can be formed after the formation of the insulating layer 127. Even when a photosensitive material is not used for the insulating layer 127, the insulating layer 126 can be formed after the formation of the insulating layer 127.

Figure 11A:
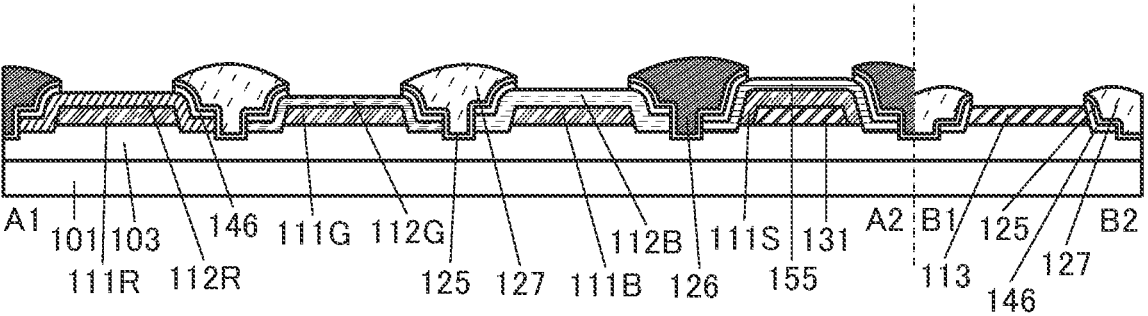
FIG. 11A and FIG. 11B are cross-sectional views illustrating an example of a method for fabricating a display apparatus.

Next, the sacrificial layer 145a is etched to form the protective layer 146 and the insulating film 125f is etched to form the insulating layer 125 (FIG. 11A). Here, the protective layer 146 is formed by etching the sacrificial layer 145a; thus, the protective layer 146 can also be referred to as a sacrificial layer.

The sacrificial layer 145a and the insulating film 125f can be etched using the insulating layer 126 and the insulating layer 127 as masks. Thus, the insulating layer 125 and the protective layer 146 are formed so as to overlap with the insulating layer 126, and the insulating layer 125 and the protective layer 146 are formed so as to overlap with the insulating layer 127. Note that when the step illustrated in FIG. 9D is not performed, that is, the PD layer 155 is formed and then the insulating film 125f is deposited without the removal of the sacrificial layer 145b, the sacrificial layer 145b and the sacrificial layer 145a are etched to form the protective layer 146.

For etching of the sacrificial layer 145a, it is preferable to use a method that causes damage to the EL layer 112 and the PD layer 155 as little as possible. For example, the sacrificial layer 145a can be etched by a wet etching method.

Anisotropic etching is preferably performed for the etching of the insulating film 125f, in which case the insulating layer 125 can be suitably formed without patterning using a photolithography method, for example. Forming the insulating layer 125 without patterning using a photolithography method, for example, enables simplification of the fabrication process of the display apparatus 100, resulting in lower manufacturing cost of the display apparatus 100. Thus, the display apparatus 100 can be an inexpensive display apparatus. As an example of anisotropic etching, a dry etching method can be given. In the case where the insulating film

125f is etched by a dry etching method, the insulating film 125f can be etched using an etching gas that can be used in etching of the sacrificial film 144, for example.

Next, vacuum baking treatment is performed to remove water adsorbed on the surface of the EL layer 112 and the surface of the PD layer 155, for example. The vacuum baking is preferably performed in a range of temperatures with which properties of the organic compounds contained in the EL layer 112 and the PD layer 155 are not changed, and can be performed at temperatures higher than or equal to 70° C. and lower than or equal to 120° C., preferably higher than or equal to 80° C. and lower than or equal to 100° C., for example. Note that the vacuum baking treatment is not necessarily performed when water adsorbed on the surface of the EL layer 112 and the surface of the PD layer 155 are small in amount and is less likely to adversely affect the reliability of the display apparatus 100, for example.

Next, the common layer 114 is formed over the EL layer 112, the PD layer 155, the insulating layer 126, the insulating layer 127, and the connection electrode 113. As described above, the common layer 114 includes at least one of a hole-injection layer, a hole-transport layer, a hole-blocking layer, an electron-blocking layer, an electron-transport layer, and an electron-injection layer, and includes, for example, an electron-injection layer or a hole-injection layer. The common layer 114 can be formed by, for example, an evaporation method, a sputtering method, an inkjet method, or the like. Note that in the case where the common layer 114 is not provided over the connection electrode 113, a metal mask that shields the connection electrode 113 is used in the formation of the common layer 114. The metal mask used here does not need to shield a pixel region of the display portion; hence, a fine mask is not required and a rough metal mask can be used, for example.

Next, the common electrode 115 is formed over the common layer 114. The common electrode 115 can be formed by a sputtering method or a vacuum evaporation method, for example. As described above, the common electrode 115 can be a conductive layer having a light-transmitting property.

Figure 11B:
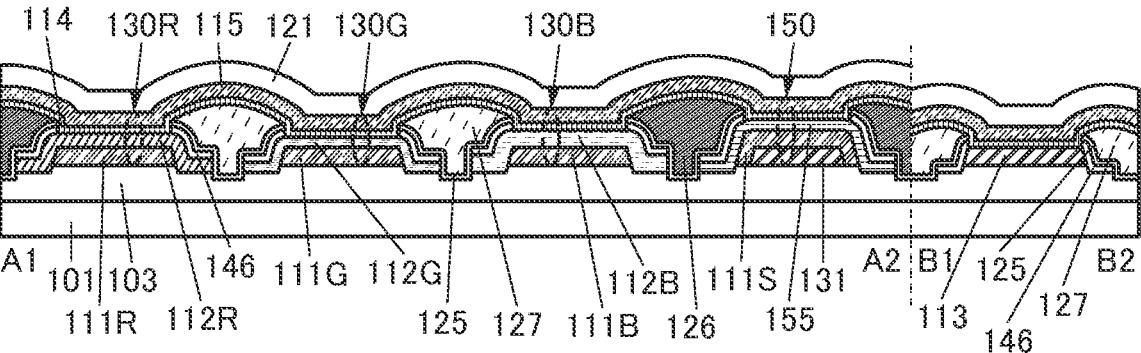

Next, the protective layer 121 is formed over the common electrode 115 (FIG. 11B). When an inorganic insulating film is used as the protective layer 121, the protective layer 121 is preferably formed by a sputtering method, a CVD method, or an ALD method, for example. When an organic insulating film is used as the protective layer 121, the protective layer 121 is preferably formed by an inkjet method, in which case a uniform film can be formed in a desired area, for example.

Through the above steps, the display apparatus 100 can be fabricated.

In this specification and the like, a device fabricated using a metal mask or an FMM (a fine metal mask or a high-resolution metal mask) is sometimes referred to as a device having an MM (metal mask) structure. In addition, in this specification and the like, a device fabricated without using a metal mask or an FMM is sometimes referred to as a device having an MML (metal maskless) structure.

Note that in the method for fabricating a display apparatus having an MML structure as illustrated in FIG. 6A to FIG. 11B, an island-shaped EL layer 112 is formed not by patterning using a metal mask but by depositing the EL film 112f over an entire surface and then processing the EL film 112f. Similarly, the island-shaped PD layer 155 is formed not by patterning using a metal mask but by depositing the PD film 155f over an entire surface and then processing the PD film 155f.

According to the above, a display apparatus and an image capturing device having high definition or a high aperture ratio can be obtained. In addition, a display apparatus that has an image capturing function and high definition or a high aperture ratio can be obtained. Moreover, EL layers 112 can be formed separately for the respective colors, enabling the display apparatus to perform extremely clear display with high contrast and high display quality. Furthermore, providing the sacrificial layers over the EL layer 112 and the PD layer 155 can reduce damage to the EL layer 112 and the PD layer 155 during the fabrication process of the display apparatus 100, so that the reliability of the light-emitting element 130 and the light-receiving element 150 can be increased.

The display apparatus 100 can have a structure in which an insulator for covering the end portion of the pixel electrode 111 is not provided. In other words, an insulating layer is not provided between the pixel electrode 111 provided in the light-emitting element 130 and the EL layer 112, or between the pixel electrode 111 provided in the light-receiving element 150 and the PD layer 155. With this structure, light emitted from the EL layer 112 can be extracted efficiently, and light with which the PD layer 155 is irradiated can be detected with high sensitivity.

The display apparatus 100 can efficiently extract light from the EL layer 112, leading to extremely low viewing angle dependence. For example, in the display apparatus 100 of one embodiment of the present invention, the viewing angle (the maximum angle with a certain contrast ratio maintained when the screen is seen from an oblique direction) can be greater than or equal to 100° and less than 180°, preferably greater than or equal to 1500 and less than or equal to 170°. Note that the viewing angle refers to that in both the vertical direction and the horizontal direction. The display apparatus of one embodiment of the present invention can have improved viewing angle dependence and high image visibility.

In the case where a display apparatus 100 is a device having a fine metal mask (FMM) structure, for example, the pixel arrangement structure or the like is limited in some cases. Here, a device having an FMM structure will be described below.

In the formation of a device having an FMM structure, a metal mask provided with an opening portion (also referred to as an FMM) is set to be opposed to a substrate so that an EL can be deposited to a desired region at the time of EL evaporation. Then, the EL is deposited to the desired region by EL evaporation through the FMM. When the area of the substrate at the time of EL evaporation is larger, the area of the FMM is increased and accordingly the weight of the FMM is also increased. In addition, heat or the like is applied to the FMM at the time of EL evaporation and may change the shape of the FMM, for example. For example, there is a method in which EL evaporation is performed while a certain level of tension is applied to the FMM; therefore, the weight and strength of the FMM are important parameters.

The pixel arrangement structure with an FMM needs to be designed under certain restrictions; for example, the above-described parameters and the like need to be considered. On the other hand, the display apparatus of one embodiment of the present invention, which has the MML structure, has an advantageous effect of a higher degree of freedom in a configuration of pixel arrangement than in the case of employing the FMM structure, for example. Note that the MML structure has higher design flexibility than the FMM structure and thus is highly compatible with flexible devices, for example.

Fabrication Method Example 2

FIG. 12A to FIG. 14B are schematic cross-sectional views illustrating an example of a method for fabricating the display apparatus 100, which is different from that illustrated in FIG. 6A to FIG. 11B.

Figure 12A:
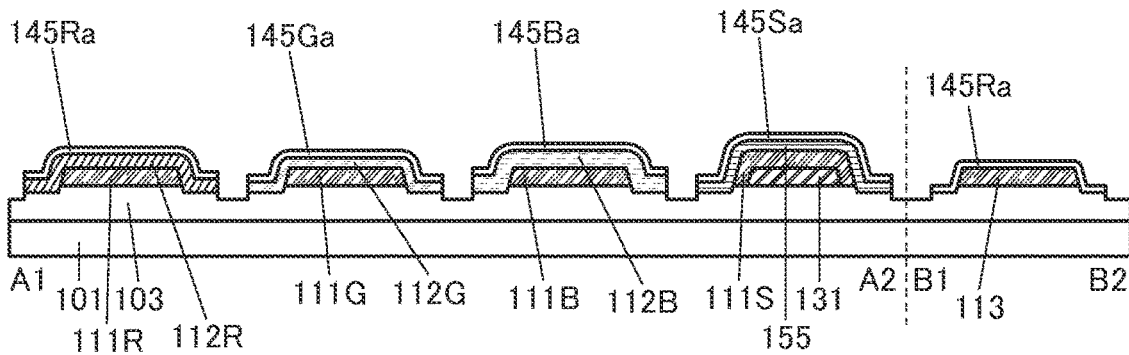
FIG. 12A to FIG. 12D are cross-sectional views illustrating an example of a method for fabricating a display apparatus.

First, steps similar to those illustrated in FIG. 6A to FIG. 9D are performed. Thus, the pixel electrode 111R, the pixel electrode 111G, the pixel electrode 111B, the conductive layer 131, and the connection electrode 113 are formed over the insulating layer 103. Furthermore, the pixel electrode 111S is formed over the conductive layer 131. In addition, the EL layer 112R is formed over the pixel electrode 111R, the EL layer 112G is formed over the pixel electrode 111G, the EL layer 112B is formed over the pixel electrode 111B, and the PD layer 155 is formed over the pixel electrode 111S. Furthermore, the sacrificial layer 145Ra is formed over the EL layer 112R and the connection electrode 113, the sacrificial layer 145Ga is formed over the EL layer 112G, the sacrificial layer 145Ba is formed over the EL layer 112B, and the sacrificial layer 145Sa is formed over the PD layer 155 (FIG. 12A). Note that the step illustrated in FIG. 9D is not necessarily performed. In that case, the sacrificial layer 145b remains over the sacrificial layer 145a.

Next, the insulating film 125f to be the insulating layer 125 later is formed to cover the top surface of the insulating layer 103 and the side surfaces of the EL layer 112 and the PD layer 155 and the top surface and a side surface of the sacrificial layer 145a. As described above, the insulating film 125f can be formed by a sputtering method, a CVD method, a PLD method, an ALD method, or the like and is preferably formed by an ALD method achieving favorable coverage. For the insulating film 125f, an inorganic material can be used, for example, and an inorganic insulating film such as an oxide insulating film, a nitride insulating film, an oxynitride insulating film, or a nitride oxide insulating film can be used, for example. In particular, using an inorganic insulating film such as an aluminum oxide film, a hafnium oxide film, or a silicon oxide film formed by an ALD method enables the insulating film 125f to have few pinholes.

Figure 12B:
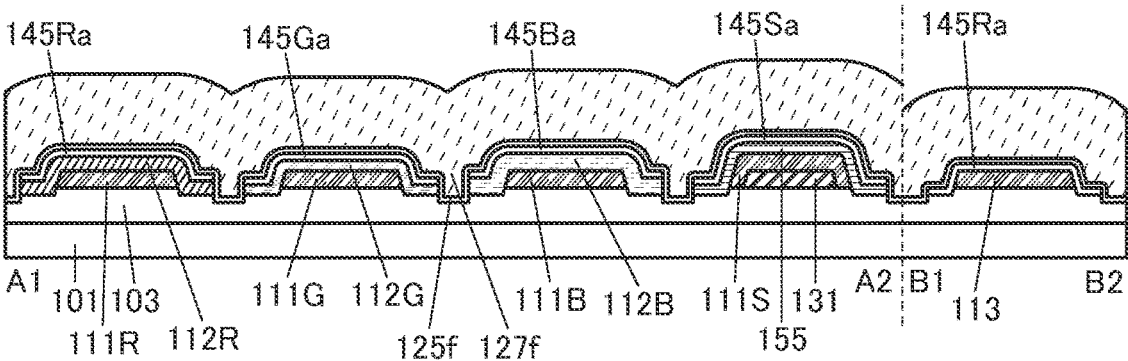

Then, the insulating film 127f to be the insulating layer 127 later is formed over the insulating film 125f (FIG. 12B). As described above, an organic material can be used for the insulating film 127f, for example. A photoresist can be used for the insulating film 127f, for example. When a photoresist is used for the insulating film 127f, the insulating film 127f can be formed by a spin coating method, a spraying method, a screen printing method, a painting method, or the like.

Figure 12C:
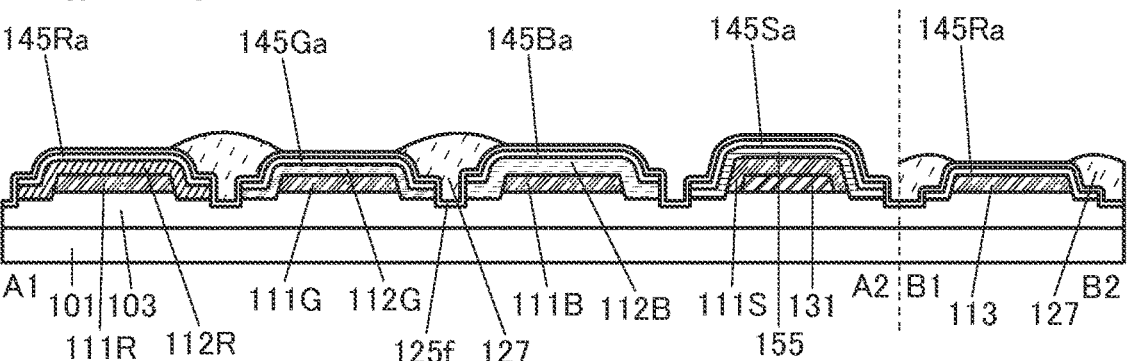

Next, the insulating layer 127 is formed between two adjacent EL layers 112 (FIG. 12C). Specifically, the insulating layer 127 can be formed in a region in which the insulating layer 125 is formed in a later step other than the region between the EL layer 112 and the PD layer 155 adjacent to each other. As described above, when a photosensitive material such as a photoresist is used for the insulating film 127f, the insulating layer 127 can be formed without providing an etching mask such as a resist mask or a hard mask. Since a photosensitive material such as a photoresist can be processed only by light exposure and development steps, the insulating layer 127 can be formed without using a dry etching method, for example. Thus, the process can be simplified. In addition, damage to the EL layer 112 and the PD layer 155 due to etching of the insulating film 127f can be reduced.

Figure 12D:
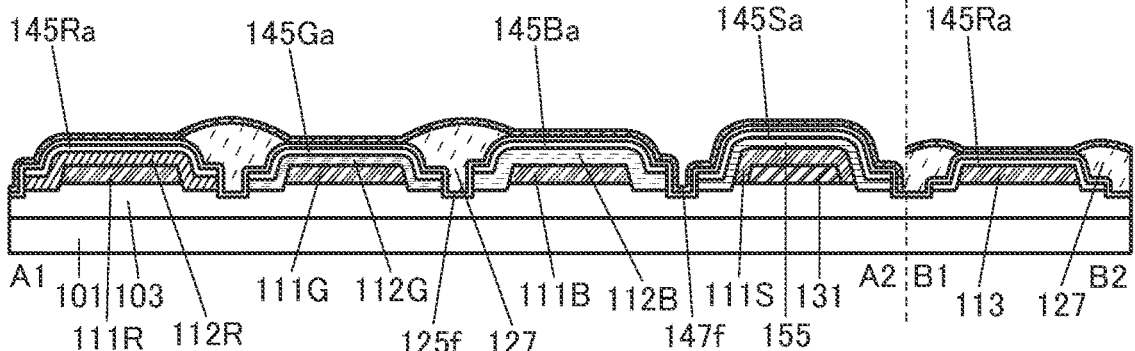

Next, a protective film 147f is formed over the insulating layer 127 and the insulating film 125f (FIG. 12D). For the protective film 147f, a material similar to the material that can be used for the insulating film 125f can be used. For the protective film 147f, a material similar to the material that can be used for the sacrificial film 144b can be used. For example, an inorganic material can be used for the protective film 147f; specifically, an inorganic insulating film such as an oxide insulating film, a nitride insulating film, an oxynitride insulating film, a nitride oxide insulating film, or the like can be used. A metal material can be used for the protective film 147f. Furthermore, a metal oxide such as indium gallium zinc oxide can be used for the protective film 147f.

The protective film 147f can be formed by a sputtering method, a CVD method, a PLD method, an ALD method, or the like and like the insulating film 125f, the protective film 147f is preferably formed by an ALD method achieving favorable coverage.

Figures 13A, 13B, 13C:
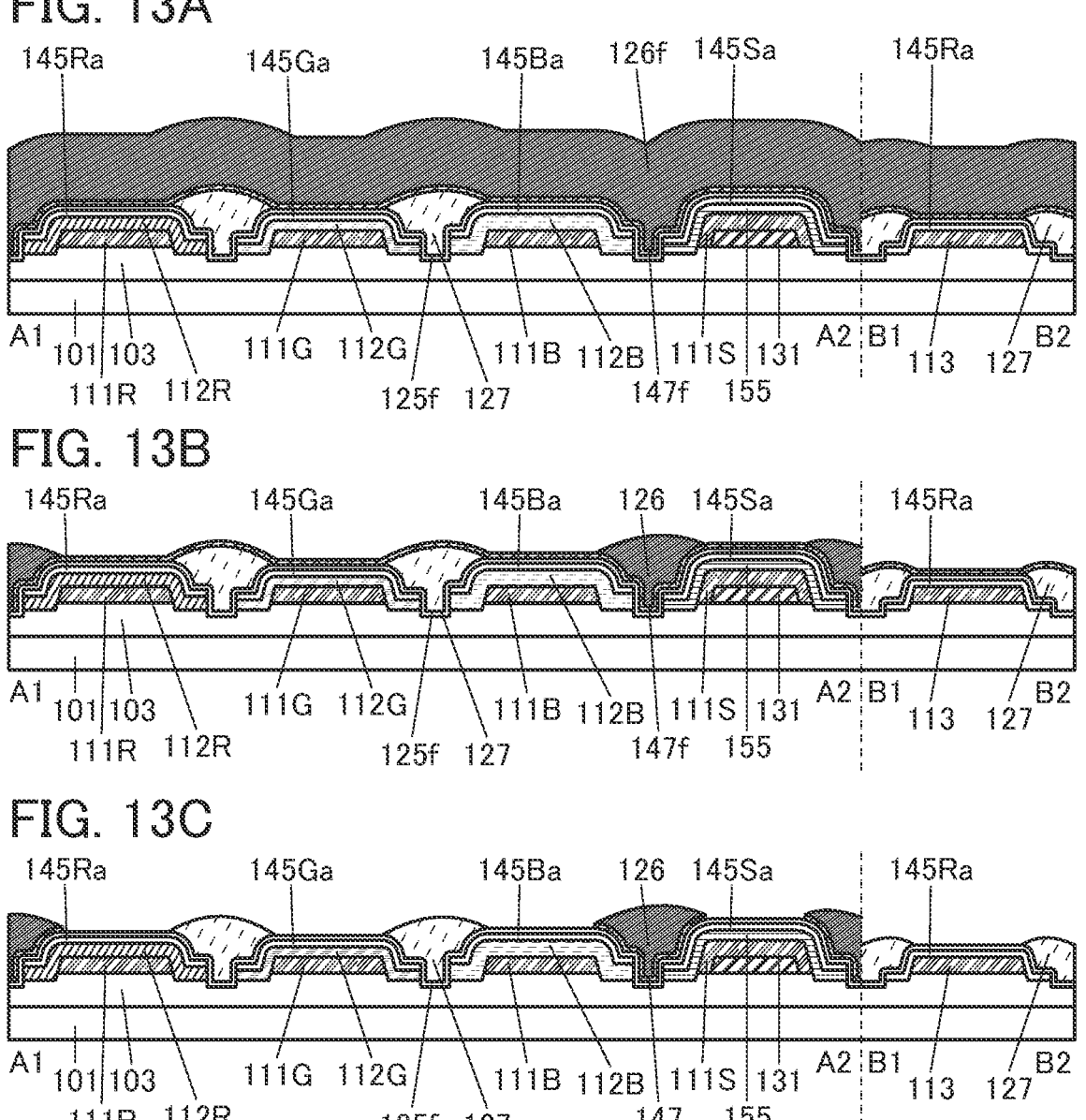
FIG. 13A to FIG. 13C are cross-sectional views illustrating an example of a method for fabricating a display apparatus.

Then, an insulating film 126f to be the insulating layer 126 later is formed over the protective film 147f (FIG. 13A). As described above, an organic material can be used for the insulating film 126f, for example. A color resist can be used for the insulating film 126f, for example. When a color resist is used for the insulating film 126f, the insulating film 126f can be formed by a spin coating method, a spraying method, a screen printing method, a painting method, or the like.

Next, the insulating layer 126 is formed between the EL layer 112 and the PD layer 155 adjacent to each other (FIG. 13B). As described above, when a photosensitive material such as a color resist is used for the insulating film 126f, the insulating layer 126 can be formed without providing an etching mask such as a resist mask or a hard mask. Since a photosensitive material such as a color resist can be processed only by light exposure and development steps, the insulating layer 126 can be formed without using a dry etching method, for example. Thus, the process can be simplified. In addition, damage to the EL layer 112 and the PD layer 155 due to etching of the insulating film 126f can be reduced.

The insulating layer 127 is formed, the protective film 147f is formed, and then the insulating film 126f is formed over the protective film 147f, whereby the insulating layer 126f is inhibited from being in contact with the insulating layer 127. Thus, even when a positive resist is used for the insulating layer 127, for example, dissolution and disappearance of the insulating layer 127 at the time of development of the insulating film 126f can be inhibited. Thus, the range of choices for materials of the insulating layer 127 can be widened. Note that after the insulating layer 126 is formed, the protective film 147f may be formed over the insulating layer 126, and the insulating layer 127 may be formed over the protective film 147f.

Next, the protective film 147f is etched to form the protective layer 147 (FIG. 13C). The protective film 147f is located under the insulating layer 126 and over the insulating layer 127, and can be etched using the insulating layer 126 as a mask. Thus, the protective layer 147 is formed so as to overlap with the insulating layer 126.

Etching of the protective film 147f can be performed by a method similar to that for etching of the sacrificial film 144a. For example, the protective film 147f can be etched by a wet etching method. Note that the protective film 147f may be etched by a dry etching method.

Figure 14A:
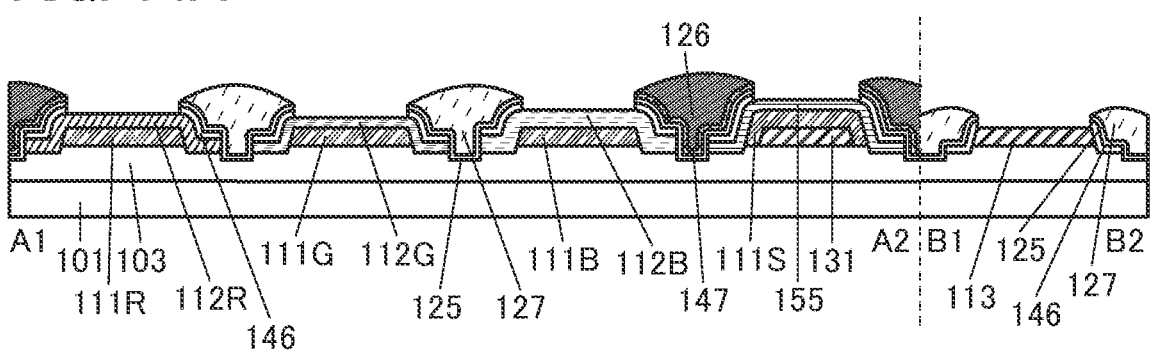
FIG. 14A and FIG. 14B are cross-sectional views illustrating an example of a method for fabricating a display apparatus.

Next, the sacrificial layer 145a is etched to form the protective layer 146 and the insulating film 125f is etched to form the insulating layer 125 (FIG. 14A). As described above, the sacrificial layer 145a can be etched by a wet etching method, and the insulating film 125f can be etched by a dry etching method, for example.

Next, vacuum baking treatment is performed to remove water adsorbed on the surface of the EL layer 112 and the surface of the PD layer 155. As described above, the vacuum baking is preferably performed in a range of temperatures with which properties of the organic compounds contained in the EL layer 112 and the PD layer 155 are not changed, and can be performed at temperatures higher than or equal to 70° C. and lower than or equal to 120° C., preferably higher than or equal to 80° C. and lower than or equal to 100° C., for example. The vacuum baking treatment is not necessarily performed when water adsorbed on the surface of the EL layer 112 and the surface of the PD layer 155 are small in amount and are less likely to adversely affect the reliability of the display apparatus 100, for example.

Figure 14B:
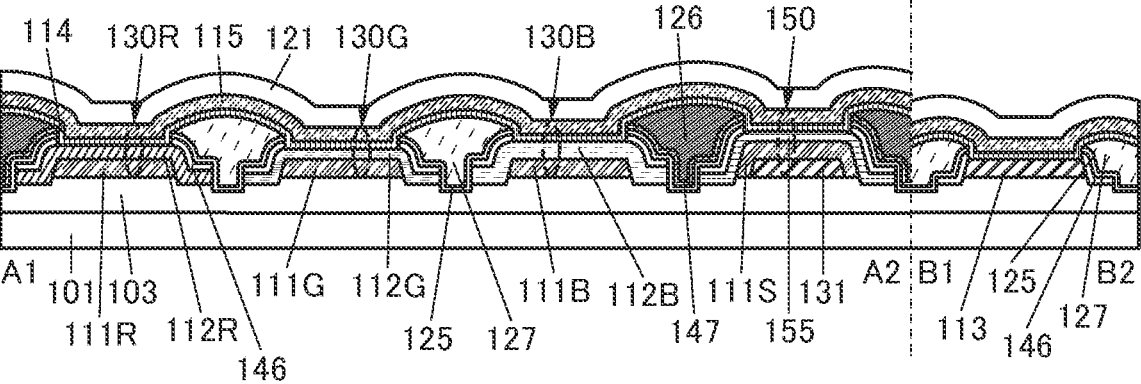

Next, the common layer 114 is formed over the EL layer 112, the PD layer 155, the insulating layer 126, the insulating layer 127, and the connection electrode 113. Then, the common electrode 115 is formed over the common layer 114, and the protective layer 121 is formed over the common electrode 115 (FIG. 14B).

Through the above steps, the display apparatus 100 can be fabricated.

At least part of the structure examples, the drawings corresponding thereto, and the like illustrated in this embodiment can be combined with the other structure examples, the other drawings, and the like as appropriate.

At least part of this embodiment can be implemented in combination with the other embodiments described in this specification as appropriate.

Embodiment 2

In this embodiment, a display apparatus of one embodiment of the present invention will be described.

The display apparatus in this embodiment can be a high-definition display apparatus or a large-sized display apparatus. Accordingly, the display apparatus of this embodiment can be used for display portions of a digital camera, a digital video camera, a digital photo frame, a mobile phone, a portable game console, a portable information terminal, and an audio reproducing device, in addition to display portions of electronic apparatuses with a relatively large screen, such as a television device, a desktop or notebook personal computer, a monitor of a computer, digital signage, and a large game machine such as a pachinko machine.

Figure 15:
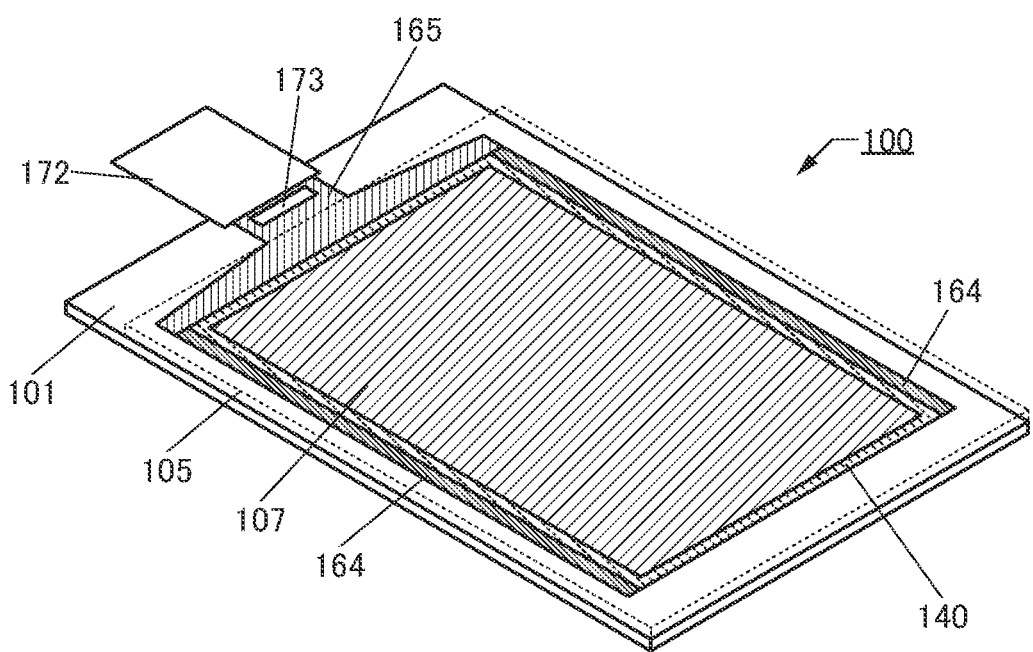
FIG. 15 is a perspective view illustrating a structure example of a display apparatus.
Figure 16A:
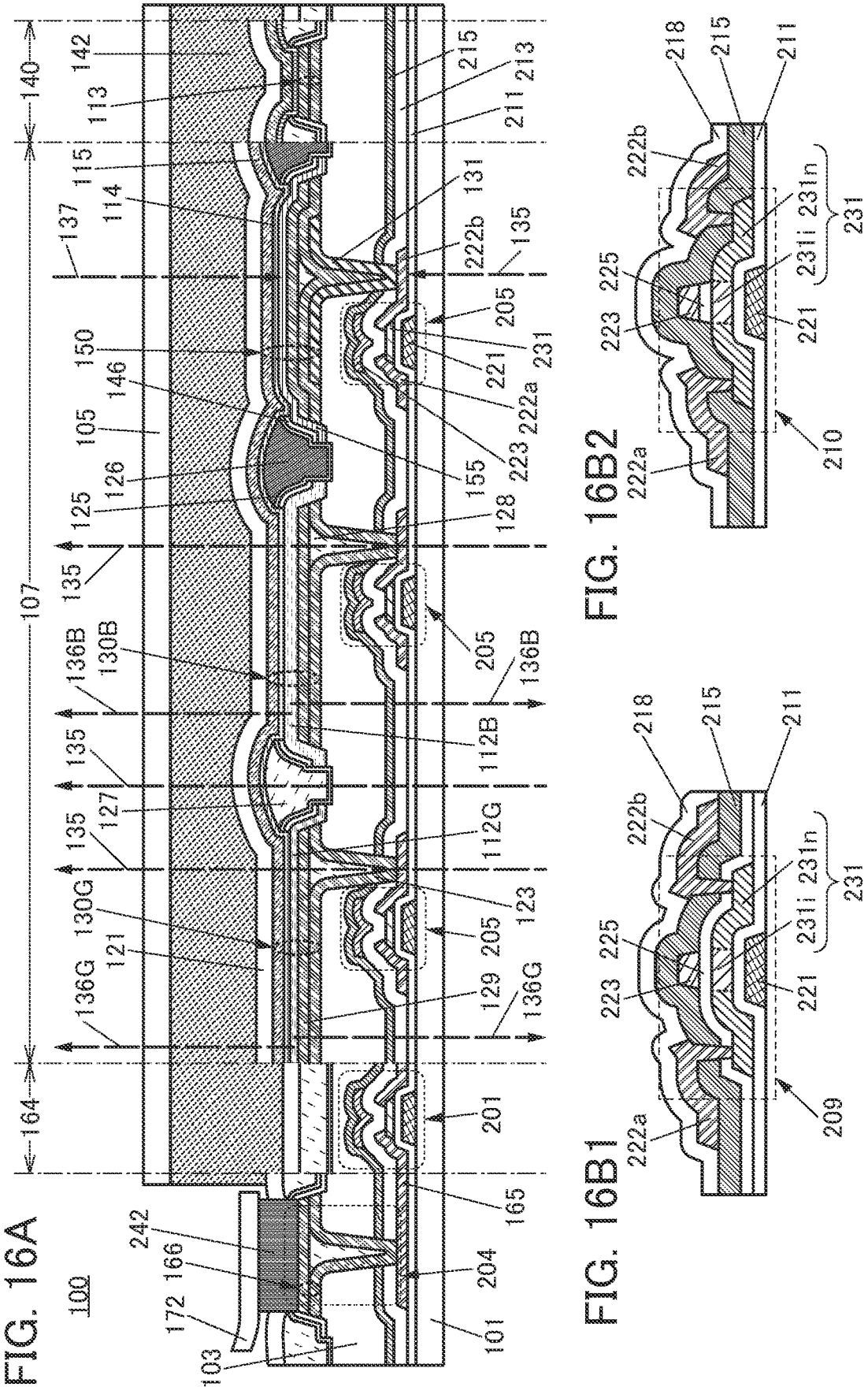
FIG. 16A is a cross-sectional view illustrating a structure example of a display apparatus.

FIG. 15 illustrates a perspective view of a display apparatus 100 and FIG. 16A illustrates a cross-sectional view of the display apparatus 100.

The display apparatus 100 has a structure in which the substrate 101 and a substrate 105 are attached to each other. In FIG. 15, the substrate 105 is denoted by a dashed line.

The display apparatus 100 includes a display portion 107, the connection portion 140, a circuit 164, a wiring 165, and the like. FIG. 15 illustrates an example in which an IC 173 and an FPC 172 are mounted on the display apparatus 100. Thus, the structure illustrated in FIG. 15 can be regarded as a display module including the display apparatus 100, the IC (integrated circuit), and the FPC. Here, a display apparatus in which a substrate is equipped with a connector such as an FPC or a substrate is mounted with an IC is referred to as a display module.

The connection portion 140 is provided outside the display portion 107. The connection portion 140 can be provided along one side or a plurality of sides of the display portion 107. The number of the connection portions 140 may be one or more. FIG. 15 illustrates an example where the connection portion 140 is provided to surround the four sides of the display portion. In the connection portion 140, a common electrode of a light-emitting element is electrically connected to a conductive layer, so that a potential can be supplied to the common electrode.

As the circuit 164, a scan line driver circuit can be used, for example.

The wiring 165 has a function of supplying a signal and electric power to the display portion 107 and the circuit 164. The signal and electric power are input to the wiring 165 from the outside through the FPC 172 or from the IC 173.

FIG. 15 illustrates an example in which the IC 173 is provided over the substrate 101 by a COG method, a COF (Chip On Film) method, or the like. An IC including a scan line driver circuit, a signal line driver circuit, or the like can be used as the IC 173, for example. Note that the display apparatus 100 and the display module may have a structure that is not provided with an IC. The IC may be mounted on the FPC by a COF method or the like.

FIG. 16A illustrates an example of cross sections of part of a region including the FPC 172, part of the circuit 164, part of the display portion 107, part of the connection portion 140, and part of a region including an end portion of the display apparatus 100.

FIG. 16A illustrates a structure in which the insulating layer 127 is provided over the insulating layer 125 except in the display portion 107. Note that the insulating layer 126 may be provided in at least part of a region over the insulating layer 125 except in the display portion 107.

The display apparatus 100 illustrated in FIG. 16A includes a transistor 201, a transistor 205, the light-emitting element 130, the light-receiving element 150, and the like between the substrate 101 and the substrate 105. FIG. 16A illustrates the light-emitting element 130G and the light-emitting element 130B each as the light-emitting element 130.

Like the substrate 101, the substrate 105 has a visible-light-transmitting property. For example, a substrate similar to the substrate that can be used as the substrate 101 can be used as the substrate 105.

Other than a difference in the structure of the pixel electrode, the light-emitting element 130 and the light-receiving element 150 each have the stacked-layer structure illustrated in FIG. 1B. Embodiment 1 can be referred to for the details of the light-emitting element 130 and the light-receiving element 150.

The light-emitting element 130 includes a conductive layer 123 and a conductive layer 129 over the conductive layer 123. The light-receiving element 150 includes the conductive layer 131, the conductive layer 123 over the conductive layer 131, and the conductive layer 129 over the conductive layer 123. Here, one or both of the conductive layer 123 and the conductive layer 129 in the light-emitting element 130 and the light-receiving element 150 can be referred to as a pixel electrode.

The conductive layer 123 can be provided to cover the conductive layer 131, for example. The conductive layer 123 is connected to a conductive layer 222b included in the transistor 205 through an opening provided in the insulating layer 103. Here, in the display apparatus 100, an end portion of the conductive layer 123 and an end portion of the conductive layer 129 are aligned or substantially aligned with each other; however, one embodiment of the present invention is not limited thereto. For example, the conductive layer 129 may be provided so as to cover the end portion of the conductive layer 123.

As described above, the conductive layer 131 has a visible-light-reflecting property. The conductive layer 123 and the conductive layer 129 have a visible-light-transmitting property.

A depressed portion is formed in each of the conductive layer 131 and the conductive layer 123 so as to cover the opening provided in the insulating layer 103. A layer 128 is embedded in the depressed portions.

The layer 128 has a function of planarizing the depressed portion of the conductive layer 123. The conductive layer 129 electrically connected to the conductive layer 123 is provided over the conductive layer 123 and the layer 128. Thus, the region overlapping with the depressed portion of the conductive layer 123 can also be used as a light-emitting region, so that the aperture ratio of a pixel can be increased. Note that in the case where the area of the layer 128 seen from above is sufficiently smaller than the area of the conductive layer 123 seen from above, for example, the conductive layer 129 is not necessarily provided.

The layer 128 can be a layer having a visible-light-transmitting property. The layer 128 may be an insulating layer or a conductive layer. Any of a variety of inorganic insulating materials, organic insulating materials, and conductive materials can be used for the layer 128 as appropriate. In particular, the layer 128 is preferably formed using an insulating material.

An insulating layer containing an organic material can be suitably used as the layer 128. For the layer 128, an acrylic resin, a polyimide resin, an epoxy resin, a polyamide resin, a polyimide-amide resin, a siloxane resin, a benzocyclobutene-based resin, a phenol resin, a precursor of any of these resins, or the like can be used, for example. A photosensitive resin can be used for the layer 128. As the photosensitive resin, a positive photosensitive material or a negative photosensitive material can be used.

When a photosensitive resin is used, the layer 128 can be fabricated only by light-exposure and development steps, reducing the influence of dry etching, wet etching, or the like on the surface of the conductive layer 123. When the layer 128 is formed using a negative photosensitive resin, the layer 128 can sometimes be formed using the same photomask (light-exposure mask) as the photomask used for forming the opening in the insulating layer 103.

The top surface and a side surface of the conductive layer 129 are covered with the EL layer 112 or the PD layer 155. Note that the side surface of the conductive layer 129 is not necessarily covered with the EL layer 112 or the PD layer 155. In addition, part of the top surface of the conductive layer 129 is not necessarily covered with the EL layer 112 or the PD layer 155.

The protective layer 146 is provided to cover part of the top surface of the EL layer 112, and the protective layer 146 is provided to cover part of the top surface of the PD layer 155. The insulating layer 125 is provided so as to cover the top and side surfaces of the protective layer 146, the side surface of the EL layer 112, and the side surface of the PD layer 155. Furthermore, the insulating layer 126 is provided between the EL layer 112 and the PD layer 155 over the insulating layer 125, and the insulating layer 127 is provided between the two adjacent EL layers 112 over the insulating layer 125. Specifically, for example, the insulating layer 126 can be provided between the EL layer 112 and the PD layer 155 adjacent to each other in a region over the insulating layer 125 and the insulating layer 127 can be provided in the other region over the insulating layer 125. The common layer 114 is provided over the EL layer 112, the PD layer 155, the insulating layer 126, and the insulating layer 127, and the common electrode 115 is provided over the common layer 114. The common layer 114 and the common electrode 115 are each one continuous film shared by a plurality of light-emitting elements 130 and light-receiving elements 150.

The protective layer 121 is provided over the light-emitting element 130 and the light-receiving element 150. Providing the protective layer 121 covering light-emitting element 130 and the light-receiving element 150 can inhibit entry of impurities such as water into light-emitting element 130 and the light-receiving element 150, so that the reliability of light-emitting element 130 and the light-receiving element 150 can be increased.

The protective layer 121 and the substrate 105 are bonded to each other with an adhesive layer 142. A solid sealing structure, a hollow sealing structure, or the like can be employed to seal the light-emitting elements. In FIG. 16A, a solid sealing structure is employed in which a space between the substrate 105 and the substrate 101 is filled with the adhesive layer 142. Alternatively, a hollow sealing structure in which the space is filled with an inert gas (e.g., nitrogen or argon) may be employed. The adhesive layer 142 may be provided not to overlap with the light-emitting element 130 and the light-receiving element 150. The space may be filled with a resin different from that of the frame-like adhesive layer.

The connection electrode 113 is provided over the insulating layer 103 in the connection portion 140. In FIG. 16A, an example is illustrated in which the connection electrode 113 has a stacked-layer structure of a conductive film obtained by processing the same conductive film as the conductive layer 123 and a conductive film obtained by processing the same conductive film as the conductive layer 129. A side surface of the connection electrode 113 is covered with the protective layer 146. The insulating layer 125 is provided over the protective layer 146, and the insulating layer 127 is provided over the insulating layer 125. The common layer 114 is provided over the connection electrode 113, and the common electrode 115 is provided over the common layer 114. The connection electrode 113 and the common electrode 115 are electrically connected to each other with the common layer 114 therebetween. Note that the common layer 114 is not necessarily formed in the connection portion 140. In that case, the connection electrode 113 and the common electrode 115 are directly in contact with each other and electrically connected to each other.

The transistor 201 and the transistor 205 are formed over the substrate 101. These transistors can be fabricated using the same materials in the same steps.

An insulating layer 211, an insulating layer 213, an insulating layer 215, and the insulating layer 103 are provided in this order over the substrate 101. Part of the insulating layer 211 functions as a gate insulating layer of each transistor. Part of the insulating layer 213 functions as a gate insulating layer of each transistor. The insulating layer 215 is provided to cover the transistors. The insulating layer 103 is provided to cover the transistors and has a function of a planarization layer. Note that there is no limitation on the number of gate insulating layers and the number of insulating layers covering the transistors, and each insulating layer may have either a single layer or two or more layers.

A material through which impurities such as water and hydrogen do not easily diffuse is preferably used for at least one layer of the insulating layers covering the transistors. This allows the insulating layer to function as a barrier layer. Such a structure can effectively inhibit diffusion of impurities into the transistors from the outside and increase the reliability of the display apparatus.

An inorganic insulating film is preferably used as each of the insulating layer 211, the insulating layer 213, and the insulating layer 215. As the inorganic insulating film, for example, a silicon nitride film, a silicon oxynitride film, a silicon oxide film, a silicon nitride oxide film, an aluminum oxide film, an aluminum nitride film, or the like can be used. A hafnium oxide film, an yttrium oxide film, a zirconium oxide film, a gallium oxide film, a tantalum oxide film, a magnesium oxide film, a lanthanum oxide film, a cerium oxide film, a neodymium oxide film, or the like may also be used. A stack including two or more of the above insulating films may also be used.

An organic insulating layer is suitable for the insulating layer 103 functioning as a planarization layer. Examples of materials that can be used for the organic insulating layer include an acrylic resin, a polyimide resin, an epoxy resin, a polyamide resin, a polyimide-amide resin, a siloxane resin, a benzocyclobutene-based resin, a phenol resin, and precursors of these resins. Alternatively, the insulating layer 103 may have a stacked-layer structure including an organic insulating layer and an inorganic insulating film. The outermost layer of the insulating layer 103 preferably has a function of an etching protective film. Accordingly, a depressed portion can be inhibited from being formed in the insulating layer 103 at the time of processing the conductive layer 123, conductive layer 129, or the like. Alternatively, a depressed portion may be provided in the insulating layer 103 at the time of processing the conductive layer 123, the conductive layer 129, or the like.

Each of the transistor 201 and the transistor 205 includes a conductive layer 221 functioning as a gate, the insulating layer 211 functioning as a gate insulating layer, a conductive layer 222a and the conductive layer 222b functioning as a source and a drain, a semiconductor layer 231, the insulating layer 213 functioning as a gate insulating layer, and a conductive layer 223 functioning as agate. Here, a plurality of layers obtained by processing the same conductive film are illustrated with the same hatching pattern. The insulating layer 211 is located between the conductive layer 221 and the semiconductor layer 231. The insulating layer 213 is located between the conductive layer 223 and the semiconductor layer 231.

Here, at least some of the layers included in the transistor 201 and the transistor 205 preferably have a visible-light-transmitting property. For example, the conductive layer 222a and the conductive layer 222b preferably have a visible-light-transmitting property. As described above, the substrate 101, the conductive layer 123, the layer 128, the conductive layer 129, the insulating layer 127, the common electrode 115, the substrate 105, and the like can have a visible-light-transmitting property, and thus can transmit the light 135, which is external light. Thus, a user of the display apparatus 100 can see the background (the transmission image) as a real image through the display apparatus 100. Accordingly, when at least some of the layers included in the transistor 201 and the transistor 205 have a visible-light-transmitting property, the transmittance of the light 135 in the display apparatus 100 can be increased.

The conductive layer 221 and the conductive layer 223 may have a visible-light-transmitting property and a visible-light-reflecting property. When the conductive layer 221 and the conductive layer 223 have a visible-light-transmitting property, the transmittance of the light 135 in the display apparatus 100 can be increased. Meanwhile, when the conductive layer 221 and the conductive layer 223 have a property of reflecting visible light, the light 135 can be inhibited from entering the semiconductor layer 231. Thus, damage to the semiconductor layer 231 can be reduced, leading to an increase in the reliability of the display apparatus 100.

FIG. 16A illustrates light 136G emitted from the EL layer 112G, light 136B emitted from the EL layer 112B, and light 137 entering the PD layer 155, in addition to the light 135. As illustrated in FIG. 16A, the display apparatus 100 can be a dual-emission display apparatus.

There is no particular limitation on the structures of the transistors included in the display apparatus of this embodiment. For example, a planar transistor, a staggered transistor, an inverted staggered transistor, or the like can be used. In addition, the transistor structure may be either a top-gate structure or a bottom-gate structure. Alternatively, gates may be provided above and below a semiconductor layer where a channel is formed.

The structure in which the semiconductor layer where a channel is formed is interposed between two gates is used for the transistor 201 and the transistor 205. The two gates may be connected to each other and supplied with the same signal to drive the transistor. Alternatively, a potential for controlling the threshold voltage may be supplied to one of the two gates and a potential for driving may be supplied to the other to control the threshold voltage of the transistor.

There is no particular limitation on the crystallinity of a semiconductor material used for the transistors, and an amorphous semiconductor or a semiconductor having crystallinity (a microcrystalline semiconductor, a polycrystalline semiconductor, a single crystal semiconductor, or a semiconductor partly including crystal regions) may be used. A semiconductor having crystallinity is preferably used, in which case deterioration of the transistor characteristics can be inhibited.

The semiconductor layer of the transistor preferably includes a metal oxide (also referred to as an oxide semiconductor). That is, a transistor including a metal oxide in its channel formation region (hereinafter, also referred to as an OS transistor) is preferably used for the display apparatus of this embodiment.

Examples of an oxide semiconductor having crystallinity include a CAAC (c-axis-aligned crystalline) —OS and an nc (nanocrystalline) —OS.

Alternatively, a transistor using silicon in its channel formation region (a Si transistor) may be used. As silicon, single crystal silicon, polycrystalline silicon, amorphous silicon, and the like can be given. In particular, a transistor containing low-temperature polysilicon (LTPS) in its semiconductor layer (hereinafter, also referred to as an "LTPS transistor") can be used. The LTPS transistor has high field-effect mobility and favorable frequency characteristics.

With the use of Si transistors such as LTPS transistors, a circuit required to be driven at a high frequency (e.g., a source driver circuit) can be formed on the same substrate as the display portion. Thus, external circuits mounted on the display apparatus can be simplified, and costs of parts and mounting costs can be reduced.

An OS transistor has extremely higher field-effect mobility than a transistor containing amorphous silicon. In addition, the OS transistor has an extremely low leakage current between a source and a drain in an off state (hereinafter, also referred to as off-state current), and electric charge accumulated in a capacitor that is connected in series to the transistor can be held for a long period. Furthermore, power consumption of the display apparatus can be reduced with an OS transistor.

The off-state current value per micrometer of channel width of the OS transistor at room temperature can be lower than or equal to 1 aA ($1 \times 10^{-18}$ A), lower than or equal to 1 zA ($1 \times 10^{-21}$ A), or lower than or equal to 1 yA ($1 \times 10^{-24}$ A). Note that the off-state current value per micrometer of channel width of a Si transistor at room temperature is higher than or equal to 1 fA ($1 \times 10^{-5}$ A) and lower than or equal to 1 pA ($1 \times 10^{-2}$ A). In other words, the off-state current of an OS transistor is lower than that of a Si transistor by approximately ten orders of magnitude.

To increase the emission luminance of the light-emitting element included in the pixel circuit, the amperage fed through the light-emitting element needs to be increased. For this, it is necessary to increase the source-drain voltage of a driving transistor included in the pixel circuit. Since an OS transistor has a higher withstand voltage between the source and the drain than a Si transistor, a high voltage can be applied between the source and the drain of the OS transistor. Thus, when an OS transistor is used as the driving transistor in the pixel circuit, the amperage flowing through the light-emitting element can be increased, so that the emission luminance of the light-emitting element can be increased.

When transistors operate in a saturation region, a change in source-drain current relative to a change in gate-source voltage can be smaller in an OS transistor than in a Si transistor. Accordingly, when an OS transistor is used as the driving transistor included in the pixel circuit, the current flowing between the source and the drain can be set minutely by a change in gate-source voltage; hence, the amperage flowing through the light-emitting element can be controlled. Accordingly, the gray scale in the pixel circuit can be increased.

Regarding saturation characteristics of current flowing when the transistor operates in a saturation region, the OS transistor can make current (saturation current) flow more stably than the Si transistor even when the source-drain voltage gradually increases. Thus, by using an OS transistor as the driving transistor, a stable current can be fed through a light-emitting element even when the current-voltage characteristics of the light-emitting element vary, for example. In other words, when the OS transistor operates in the saturation region, the source-drain current hardly changes with an increase in the source-drain voltage; hence, the emission luminance of the light-emitting element can be stable.

As described above, with use of an OS transistor as a driving transistor included in the pixel circuit, it is possible to achieve "inhibition of black floating", "increase in emission luminance", "increase in gray scale", "inhibition of variation in light-emitting elements", and the like.

The semiconductor layer preferably includes indium, M (M is one or more kinds selected from gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium), and zinc, for example. In particular, M is preferably one or more kinds selected from aluminum, gallium, yttrium, and tin.

It is particularly preferable that an oxide containing indium (In), gallium (Ga), and zinc (Zn) (also referred to as IGZO) be used as the semiconductor layer. Alternatively, it is preferable to use an oxide containing indium, tin, and zinc. Further alternatively, it is preferable to use an oxide containing indium, gallium, tin, and zinc. Further alternatively, it is preferable to use an oxide containing indium (In), aluminum (Al), and zinc (Zn) (also referred to as IAZO). Further alternatively, it is preferable to use an oxide containing indium (In), aluminum (Al), gallium (Ga), and zinc (Zn) (also referred to as IAGZO).

When the semiconductor layer is an In-M-Zn oxide, the atomic ratio of In is preferably greater than or equal to the atomic ratio of Min the In-M-Zn oxide. Examples of the atomic ratio of the metal elements in such an In-M-Zn oxide include In:M:Zn=1:1:1 or a composition in the neighborhood thereof, In:M:Zn=1:1:1.2 or a composition in the neighborhood thereof, In:M:Zn=2:1:3 or a composition in the neighborhood thereof, In:M:Zn=3:1:2 or a composition in the neighborhood thereof, In:M:Zn=4:2:3 or a composition in the neighborhood thereof, In:M:Zn=4:2:4.1 or a composition in the neighborhood thereof, In:M:Zn=5:1:3 or a composition in the neighborhood thereof, In:M:Zn=5:1:6 or a composition in the neighborhood thereof, In:M:Zn=5:1:7 or a composition in the neighborhood thereof, In:M:Zn=5:1:8 or a composition in the neighborhood thereof, In:M:Zn=6:1:6 or a composition in the neighborhood thereof, and In:M:Zn=5:2:5 or a composition in the neighborhood thereof. Note that a composition in the neighborhood includes the range of ±30% of an intended atomic ratio.

For example, when the atomic ratio is described as In:Ga:Zn=4:2:3 or a composition in the neighborhood thereof, the case is included where the atomic ratio of Ga is greater than or equal to 1 and less than or equal to 3 and the atomic ratio of Zn is greater than or equal to 2 and less than or equal to 4 with the atomic ratio of In being 4. When the atomic ratio is described as In:Ga:Zn=5:1:6 or a composition in the neighborhood thereof, the case is included where the atomic ratio of Ga is greater than 0.1 and less than or equal to 2 and the atomic ratio of Zn is greater than or equal to 5 and less than or equal to 7 with the atomic ratio of In being 5. When the atomic ratio is described as In:Ga:Zn=1:1:1 or a composition in the neighborhood thereof, the case is included where the atomic ratio of Ga is greater than 0.1 and less than or equal to 2 and the atomic ratio of Zn is greater than 0.1 and less than or equal to 2 with the atomic ratio of In being 1.

The transistor included in the circuit 164 and the transistor included in the display portion 107 may have the same structure or different structures. One structure or two or more kinds of structures may be employed for a plurality of transistors included in the circuit 164. Similarly, one structure or two or more kinds of structures may be employed for a plurality of transistors included in the display portion 107.

All of the transistors included in the display portion 107 may be OS transistors or Si transistors; alternatively, some of the transistors included in the display portion 107 may be OS transistors and the others may be Si transistors.

For example, when both an LTPS transistor and an OS transistor are used in the display portion 107, the display apparatus having low power consumption and high drive capability can be achieved. Furthermore, a structure in which an LTPS transistor and an OS transistor are combined is referred to as LTPO in some cases. As a more suitable example, it is preferable that the OS transistor be used as a transistor or the like functioning as a switch for controlling conduction and non-conduction between wirings and the LTPS transistor be used as a transistor or the like for controlling current, for example.

For example, one of the transistors included in the display portion 107 functions as a transistor for controlling current flowing through the light-emitting element and can be also referred to as a driving transistor. One of a source and a drain of the driving transistor is electrically connected to a pixel electrode of the light-emitting element. An LTPS transistor is preferably used as the driving transistor. With this structure, the amperage flowing through the light-emitting element can be increased in the pixel circuit.

On the other hand, another transistor included in the display portion 107 functions as a switch for controlling selection and non-selection of the pixel and can be referred to as a selection transistor. A gate of the selection transistor is electrically connected to a gate line, and one of a source and a drain thereof is electrically connected to a signal line. An OS transistor is preferably used as the selection transistor. With this structure, the gray scale of the pixel can be maintained even with an extremely low frame frequency (e.g., 1 fps or lower); thus, power consumption can be reduced by stopping the driver in displaying a still image.

As described above, the display apparatus of one embodiment of the present invention can have all of a high aperture ratio, high resolution, high display quality, and low power consumption.

Note that the display apparatus of one embodiment of the present invention has a structure including the OS transistor and the light-emitting element having a metal maskless (MML) structure. With this structure, the leakage current that might flow through the transistor and the leakage current that might flow between adjacent light-emitting elements (also referred to as a lateral leakage current, a side leakage current, or the like) can become extremely low. With the structure, a viewer can notice any one or more of the image crispness, the image sharpness, a high saturation, and a high contrast ratio in an image displayed on the display apparatus. With the structure where the leakage current that might flow through the transistor and the lateral leakage current that might flow between light-emitting elements are extremely low, display with little leakage of light at the time of black display can be achieved, for example.

FIG. 16B1 and FIG. 16B2 illustrate other structure examples of transistors.

The transistor 209 and the transistor 210 each include the conductive layer 221 functioning as a gate, the insulating layer 211 functioning as a gate insulating layer, the semiconductor layer 231 including a channel formation region 231i and a pair of low-resistance regions 231n, the conductive layer 222a connected to one of the pair of low-resistance regions 231n, the conductive layer 222b connected to the other of the pair of the low-resistance regions 231n, an insulating layer 225 functioning as a gate insulating layer, the conductive layer 223 functioning as a gate, and the insulating layer 215 covering the conductive layer 223. The insulating layer 211 is located between the conductive layer 221 and the channel formation region 231i. The insulating layer 225 is located at least between the conductive layer 223 and the channel formation region 231i. Furthermore, an insulating layer 218 covering the transistor may be provided.

FIG. 16B1 illustrates an example of the transistor 209 in which the insulating layer 225 covers the top surface and a side surface of the semiconductor layer 231. The conductive layer 222a and the conductive layer 222b are connected to the corresponding low-resistance regions 231n through openings provided in the insulating layer 225 and the insulating layer 215. One of the conductive layer 222a and the conductive layer 222b functions as a source, and the other functions as a drain.

Meanwhile, in the transistor 210 illustrated in FIG. 16B2, the insulating layer 225 overlaps with the channel formation region 231i of the semiconductor layer 231 and does not overlap with the low-resistance regions 231n. The structure illustrated in FIG. 16B2 can be obtained by processing the insulating layer 225 with the conductive layer 223 as a mask, for example. In FIG. 16B2, the insulating layer 215 is provided to cover the insulating layer 225 and the conductive layer 223, and the conductive layer 222a and the conductive layer 222b are connected to the corresponding low-resistance regions 231n through the openings in the insulating layer 215.

A connection portion 204 is provided in a region of the substrate 101 with which the substrate 105 does not overlap. In the connection portion 204, the wiring 165 is electrically connected to the FPC 172 through a conductive layer 166 and a connection layer 242. An example is illustrated in which the conductive layer 166 has a stacked-layer structure of a conductive film obtained by processing the same conductive film as the conductive layer 123 and a conductive film obtained by processing the same conductive film as the conductive layer 129. On the top surface of the connection portion 204, the conductive layer 166 is exposed. Thus, the connection portion 204 and the FPC 172 can be electrically connected to each other through the connection layer 242.

For the adhesive layer 142, a variety of curable adhesives, e.g., a photocurable adhesive such as an ultraviolet curable adhesive, a reactive curable adhesive, a thermosetting adhesive, and an anaerobic adhesive can be used. Examples of these adhesives include an epoxy resin, an acrylic resin, a silicone resin, a phenol resin, a polyimide resin, an imide resin, a PVC (polyvinyl chloride) resin, a PVB (polyvinyl butyral) resin, and an EVA (ethylene vinyl acetate) resin. In particular, a material with low moisture permeability, such as an epoxy resin, is preferred. Alternatively, atwo-liquid-mixture-type resin may be used. Alternatively, an adhesive sheet may be used, for example.

As the connection layer 242, an anisotropic conductive film (ACF), an anisotropic conductive paste (ACP), or the like can be used.

As materials that can be used for conductive layers such as a variety of wirings and electrodes included in a display apparatus, in addition to a gate, a source, and a drain of a transistor, metals such as aluminum, titanium, chromium, nickel, copper, yttrium, zirconium, molybdenum, silver, tantalum, or tungsten, an alloy containing the metal as its main component, and the like can be given. A film containing any of these materials can be used in a single layer or as a stacked-layer structure.

As a light-transmitting conductive material, a conductive oxide such as indium oxide, indium tin oxide, indium zinc oxide, zinc oxide, or zinc oxide containing gallium, or graphene can be used. Alternatively, a metal material such as gold, silver, platinum, magnesium, nickel, tungsten, chromium, molybdenum, iron, cobalt, copper, palladium, or titanium, or an alloy material containing the metal material can be used. Alternatively, a nitride of the metal material (e.g., titanium nitride) or the like may be used. Note that in the case of using the metal material or the alloy material (or the nitride thereof), the material is preferably made thin enough to have a light-transmitting property. Furthermore, a stacked-layer film of the above materials can be used for a conductive layer. For example, a stacked-layer film of indium tin oxide and an alloy of silver and magnesium is preferably used because it can increase the conductivity. These materials can also be used for the conductive layers such as a variety of wirings and electrodes included in a display apparatus, and conductive layers (conductive layers functioning as a pixel electrode or a common electrode) included in the light-emitting element.

Examples of insulating materials that can be used for the insulating layers include a resin such as an acrylic resin or an epoxy resin, and an inorganic insulating material such as silicon oxide, silicon oxynitride, silicon nitride oxide, silicon nitride, or aluminum oxide.

Figure 17:
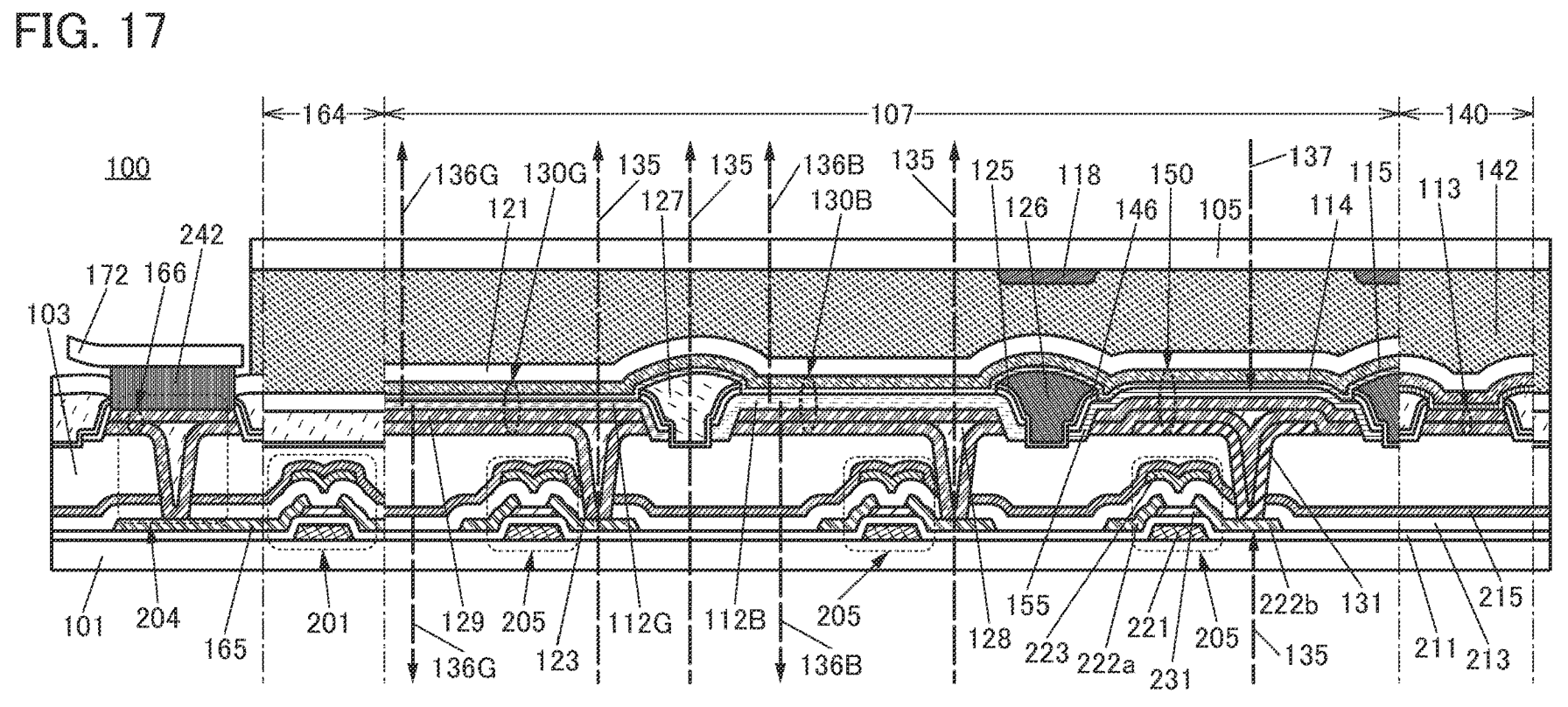

FIG. 17 illustrates a modification example of the structure illustrated in FIG. 16A, in which a light-blocking layer 118 is provided over the insulating layer 126. FIG. 17 illustrates an example in which the light-blocking layer 118 is provided on a surface of the substrate 105 on the substrate 101 side.

Providing the light-blocking layer 118 over the insulating layer 126 can suitably inhibit part of light emitted from the EL layer 112 adjacent to the PD layer 155 from being incident on the PD layer 155 due to stray light, for example. Thus, the display apparatus 100 illustrated in FIG. 17 can be a display apparatus with little noise and capable of performing image capturing with high image capturing sensitivity.

Figure 18:
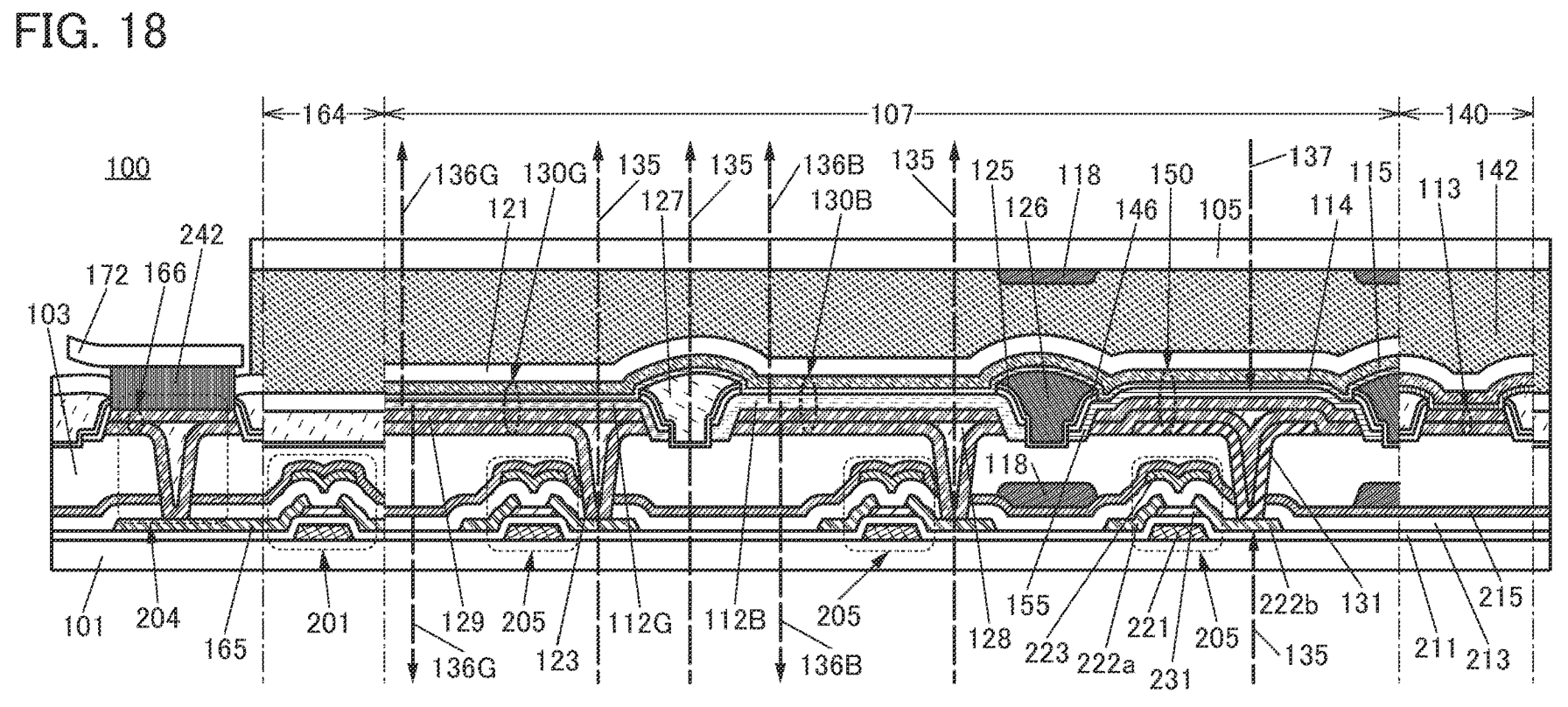

FIG. 18 is a modification example of the structure illustrated in FIG. 17, in which the light-blocking layer 118 is provided not only over the insulating layer 126 but also under the insulating layer 126. FIG. 18 illustrates an example in which the light-blocking layer 118 is provided over the insulating layer 215 in addition to a surface of the substrate 105 on the substrate 101 side.

As described above, the display apparatus 100 can be a dual-emission display apparatus. Thus, providing the light-blocking layer 118 over the insulating layer 126 and under the insulating layer 126 can suitably inhibit part of the light emitted from the EL layer 112 adjacent to the PD layer 155 from being incident on the PD layer 155 due to stray light, for example. Accordingly, the display apparatus 100 illustrated in FIG. 18 can be a display apparatus with little noise and capable of performing image capturing with high image capturing sensitivity. Note that the light-blocking layer 118 may be provided under the insulating layer 126 and the light-blocking layer 118 is not necessarily provided over the insulating layer 126.

Figure 19:
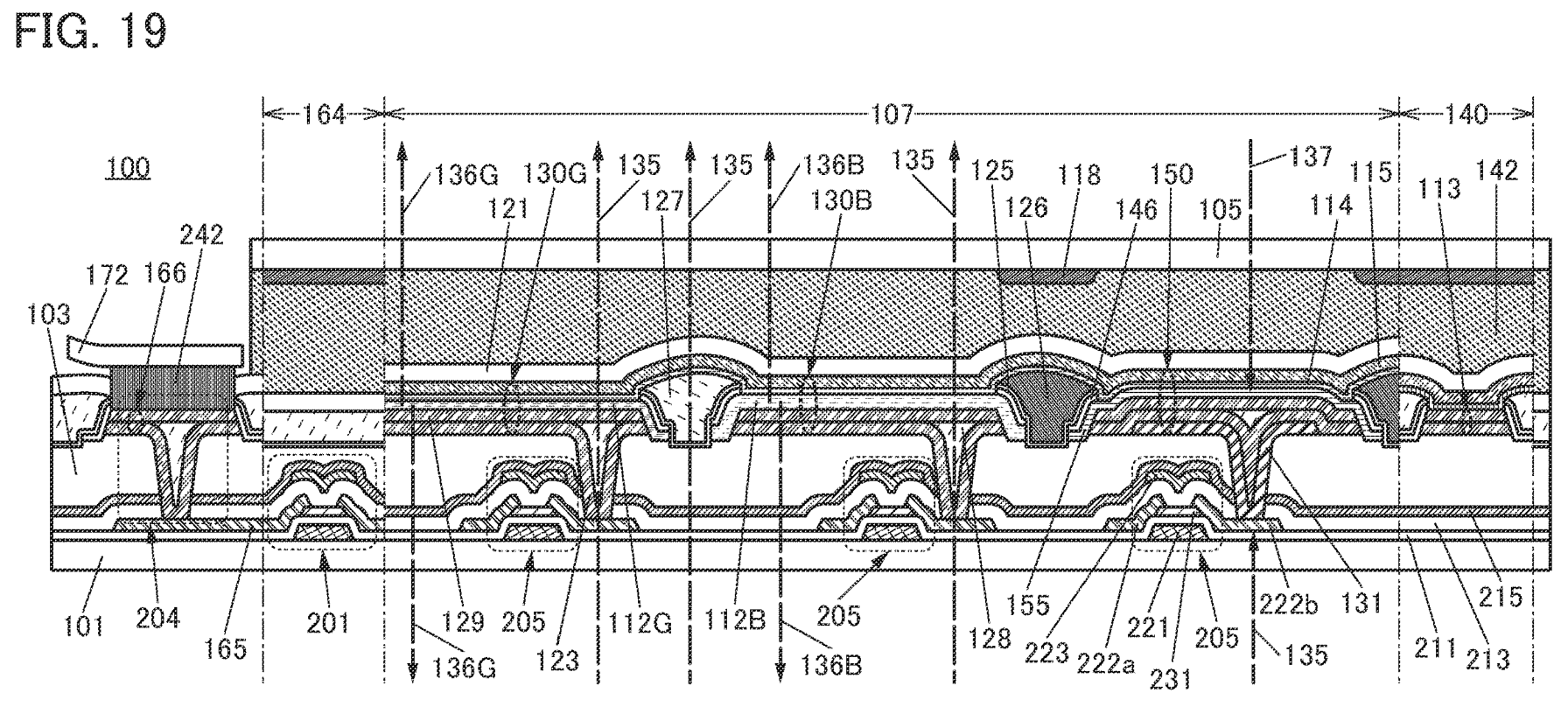

FIG. 19 illustrates a modification example of the structure illustrated in FIG. 17 which is different from the structure illustrated in FIG. 17 in that the light-blocking layer 118 is provided in the circuit 164 and the connection portion 140. With the structure of the display apparatus 100 illustrated in FIG. 19, external light can be inhibited from passing through the circuit 164 and the connection portion 140.

Here, FIG. 20A to FIG. 20D illustrate cross-sectional structures of a region 138 including the conductive layer 123, the layer 128, and the vicinity thereof in the display apparatus 100.

Figure 20A:
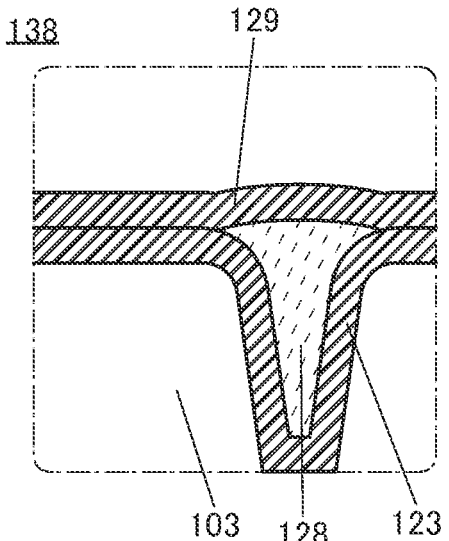
FIG. 20A to FIG. 20D are cross-sectional views illustrating structure examples of a display apparatus.

FIG. 16A illustrates an example in which the top surface of the layer 128 and the top surface of the conductive layer 123 are substantially level with each other; however, the present invention is not limited thereto. For example, as illustrated in FIG. 20A, the top surface of the layer 128 may be at a higher level than the top surface of the conductive layer 123. In this case, the top surface of the layer 128 has a convex shape that is gently bulged toward the center.

Figure 20B:
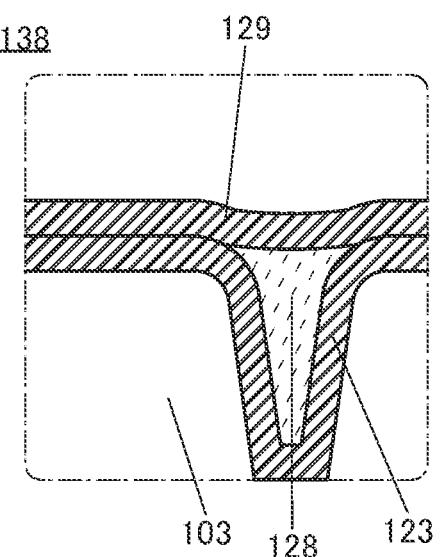

As illustrated in FIG. 20B, the top surface of the layer 128 may be at a lower level than the top surface of the conductive layer 123. In this case, the top surface of the layer 128 has a concave shape that is gently recessed toward the center.

Figure 20C:
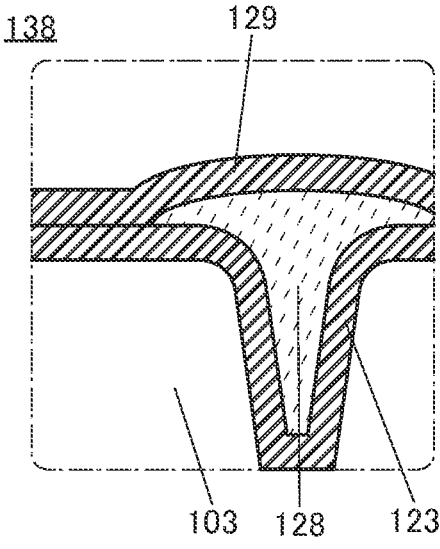

When the top surface of the layer 128 is at a higher level than the top surface of the conductive layer 123 as illustrated in FIG. 20C, the upper portion of the layer 128 may be formed to extend beyond a depressed portion formed in the conductive layer 123. In this case, part of the layer 128 may be formed to cover part of the conductive layer 123 which is substantially flat.

Figure 20D:
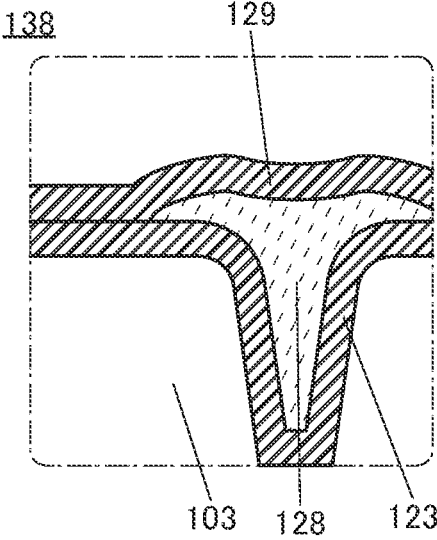

As illustrated in FIG. 20D, part of the top surface of layer 128 has another depressed portion in the structure illustrated in FIG. 20C, in some cases. The depressed portion has a shape that is gently recessed toward the center.

Figure 21:
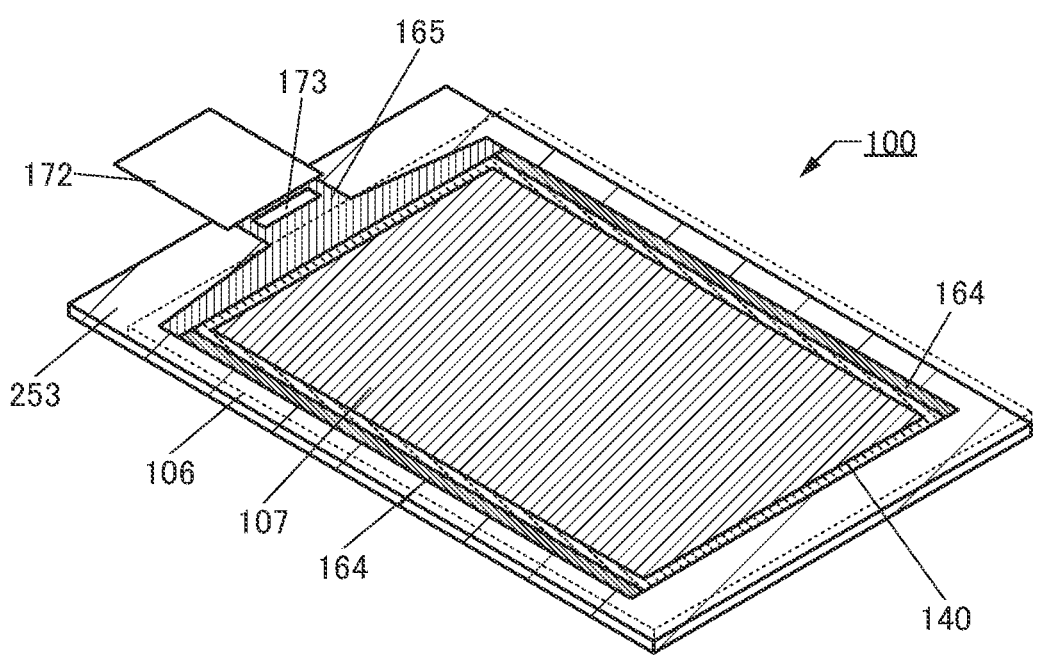
FIG. 21 is a perspective view illustrating a structure example of a display apparatus.
Figure 22:
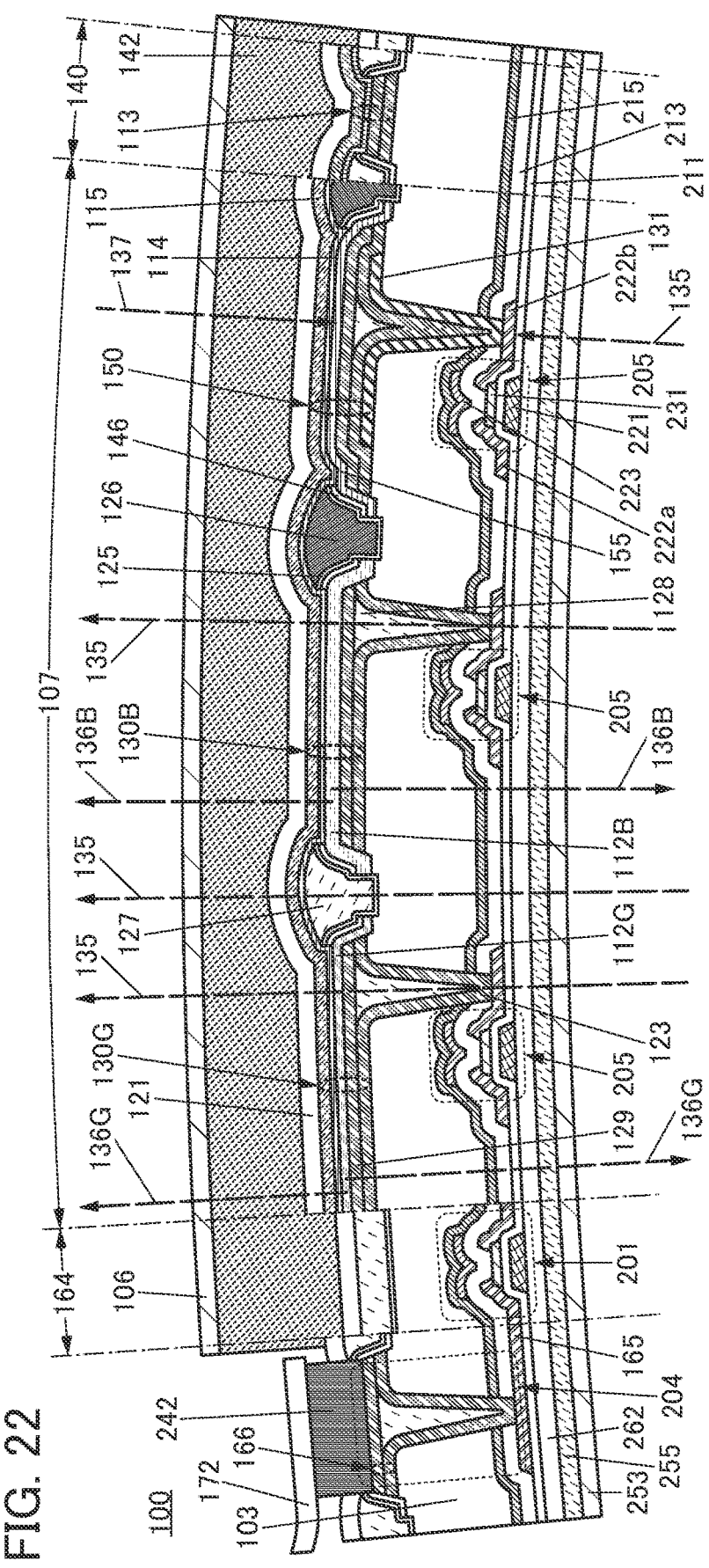
FIG. 22 is a cross-sectional view illustrating a structure example of a display apparatus.

FIG. 21 is a perspective view illustrating the display apparatus 100. FIG. 21 illustrates a modification example of the display apparatus 100 illustrated in FIG. 15. FIG. 22 is a cross-sectional view of the display apparatus 100 illustrated in FIG. 21.

In the display apparatus 100 illustrated in FIG. 21 and FIG. 22, a substrate 253 is provided instead of the substrate 101 and a substrate 106 is provided instead of the substrate 105.

An insulating layer 262 is provided over the substrate 253 with an adhesive layer 255 therebetween. In other words, the substrate 253 and the insulating layer 262 are attached to each other with the adhesive layer 255. The transistor 201 and the transistor 205 are formed over the insulating layer 262. The insulating layer 211, an insulating layer 213, an insulating layer 215, and the insulating layer 103 are provided in this order over the insulating layer 262.

As a method for fabricating the display apparatus 100 illustrated in FIG. 22, first, the insulating layer 262 is formed over a formation substrate, and transistors, the light-emitting elements 130, the light-receiving element 150, and the like are formed over the insulating layer 262. Next, the substrate 106 is attached onto the light-emitting elements 130, the light-emitting element 150, and the like with the adhesive layer 142. Then, the substrate 253 is attached to a surface exposed by separation of the formation substrate with the adhesive layer 255, whereby the components formed over the formation substrate are transferred onto the substrate 253.

The substrate 253 and the substrate 106 have a visible-light-transmitting property. Since the substrate 253 and the substrate 106 have flexibility, the substrate 253 and the substrate 106 are flexible substrates. Accordingly, the display apparatus 100 can have flexibility. That is, the display apparatus 100 can be a flexible display.

For each of the substrate 253 and the substrate 106, a polyester resin such as polyethylene terephthalate (PET) or polyethylene naphthalate (PEN), a polyacrylonitrile resin, an acrylic resin, a polyimide resin, a polymethyl methacrylate resin, a polycarbonate (PC) resin, a polyether sulfone (PES) resin, a polyamide resin (e.g., nylon or aramid), a polysiloxane resin, a cycloolefin resin, a polystyrene resin, a polyamide-imide resin, a polyurethane resin, a polyvinyl chloride resin, a polyvinylidene chloride resin, a polypropylene resin, a polytetrafluoroethylene (PTFE) resin, an ABS resin, or cellulose nanofiber can be used, for example. Glass that is thin enough to have flexibility may be used for one or both of the substrate 253 and the substrate 106.

A material that can be used for the insulating layer 211, the insulating layer 213, and the insulating layer 215 can be used for the insulating layer 262, and an inorganic insulating film is preferably used. A material that can be used for the adhesive layer 142 can be used for the adhesive layer 255.

As described above, the substrate 253, the conductive layer 123, the layer 128, the conductive layer 129, the insulating layer 127, the common electrode 115, the substrate 106, and the like have a visible-light-transmitting property, and thus can transmit the light 135, which is external light. Thus, a user of the display apparatus 100 can see the background (the transmission image) as a real image through the display apparatus 100. Accordingly, when at least some of the layers included in the transistor 201 and the transistor 205 have a visible-light-transmitting property, the transmittance of the light 135 in the display apparatus 100 can be increased.

Figure 23:
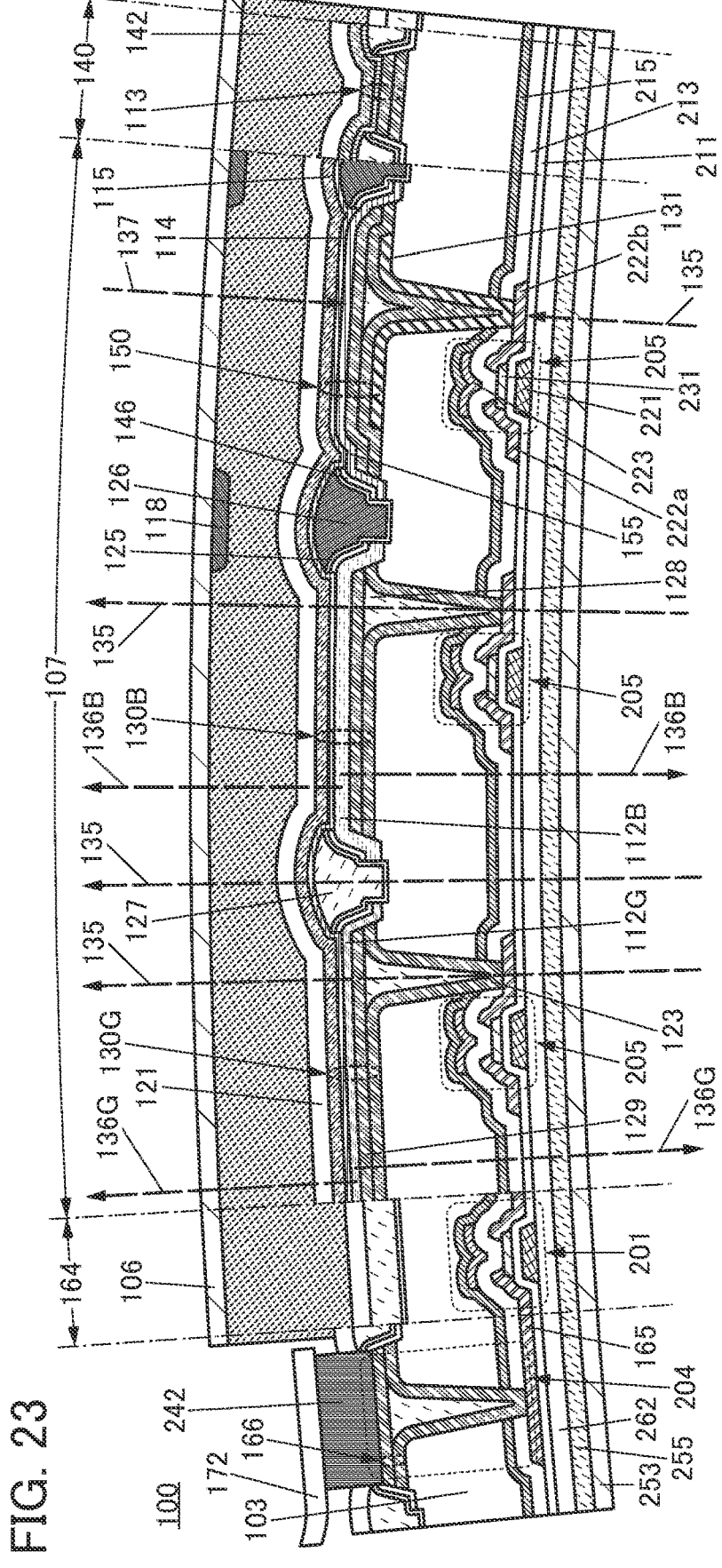
FIG. 23 is a cross-sectional view illustrating a structure example of a display apparatus.

FIG. 23 is a modification example of the structure illustrated in FIG. 22, in which the light-blocking layer 118 is provided over the insulating layer 126. FIG. 23 illustrates an example in which the light-blocking layer 118 is provided on the surface of the substrate 106 on the substrate 253 side.

Providing the light-blocking layer 118 over the insulating layer 126 can suitably inhibit part of the light emitted from the EL layer 112 adjacent to the PD layer 155 from entering the PD layer 155 due to stray light, for example. Thus, the display apparatus 100 illustrated in FIG. 23 can be a display apparatus with little noise and capable of performing image capturing with high image capturing sensitivity.

Figure 24:
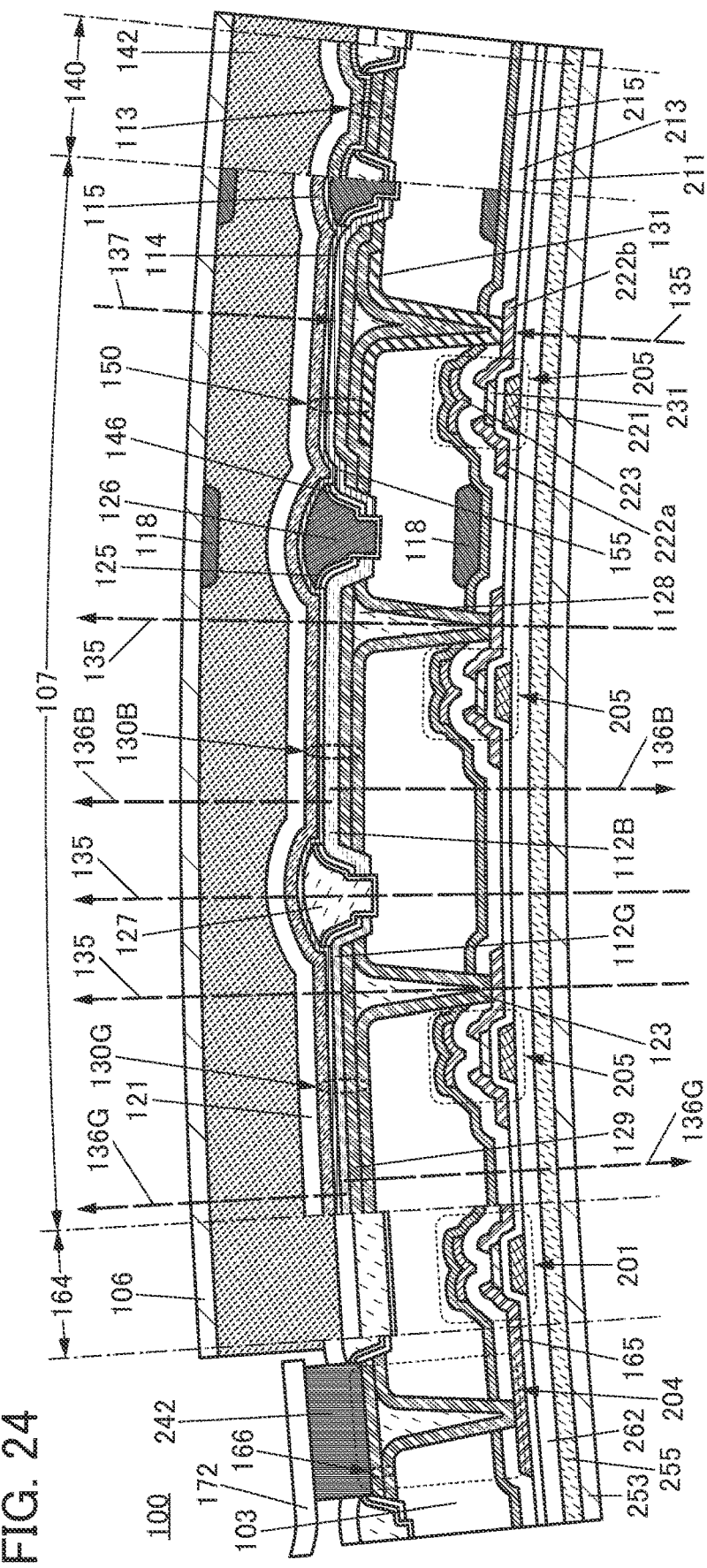
FIG. 24 is a cross-sectional view illustrating a structure example of a display apparatus.

FIG. 24 is a modification example of the structure illustrated in FIG. 23, in which the light-blocking layer 118 is provided not only over the insulating layer 126 but also under the insulating layer 126. FIG. 24 illustrates an example in which the light-blocking layer 118 is provided over the insulating layer 215 in addition to the surface of the substrate 106 on the substrate 253 side.

As described above, the display apparatus 100 can be a dual-emission display apparatus. Thus, providing the light-blocking layer 118 over the insulating layer 126 and under the insulating layer 126 can suitably inhibit part of the light emitted from the EL layer 112 adjacent to the PD layer 155 from entering the PD layer 155 due to stray light, for example. Accordingly, the display apparatus 100 illustrated in FIG. 24 can be a display apparatus with little noise and capable of performing image capturing with high image capturing sensitivity. Note that the light-blocking layer 118 may be provided under the insulating layer 126 and the light-blocking layer 118 is not necessarily provided over the insulating layer 126.

Figure 25:
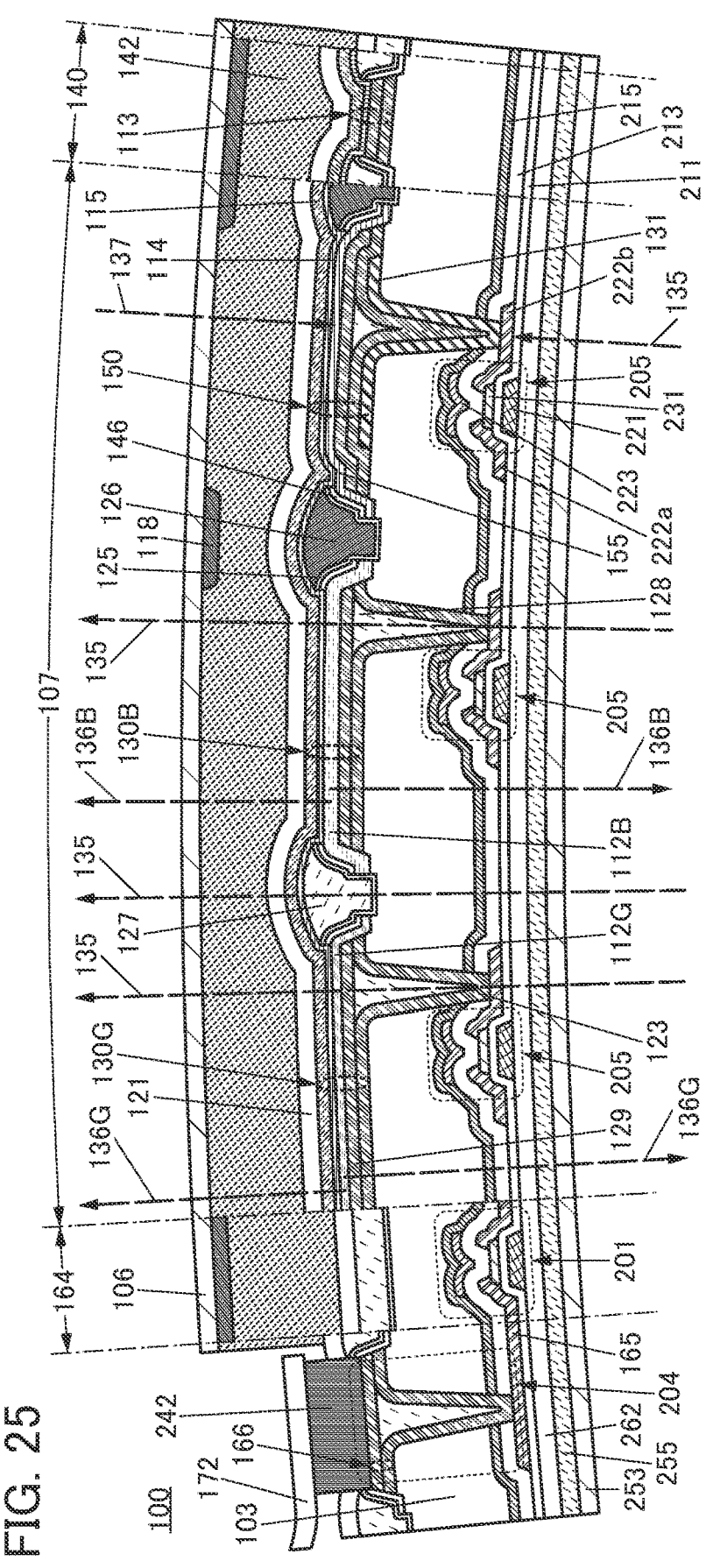
FIG. 25 is a cross-sectional view illustrating a structure example of a display apparatus.

FIG. 25 is a modification example of the structure illustrated in FIG. 23 which is different from the structure illustrated in FIG. 23 in that the light-blocking layer 118 is provided in the circuit 164 and the connection portion 140. With the structure illustrated in FIG. 25, external light can be inhibited from passing through the circuit 164 and the connection portion 140 in the display apparatus 100.

At least part of the structure examples, the drawings corresponding thereto, and the like illustrated in this embodiment can be combined with the other structure examples, the other drawings, and the like as appropriate.

At least part of this embodiment can be implemented in combination with the other embodiments or an example described in this specification as appropriate.

Embodiment 3

In this embodiment, a display panel of one embodiment of the present invention will be described.

One embodiment of the present invention is a display panel capable of increasing its size by arranging a plurality of display panels to partly overlap one another. In two of the overlapping display panels, at least a display panel located on the display surface side (upper side) includes a region transmitting visible light that is adjacent to a display portion. A pixel of a display panel placed on the lower side and the region transmitting visible light of the display panel placed on the upper side are provided to overlap with each other. Thus, the two of the overlapping display panels can display a seamless and contiguous image when seen from the display surface side (in a plan view).

For example, the display panel of one embodiment of the present invention is a stacked-layer panel including a first display panel and a second display panel. The first display panel includes a first region, and the first region includes a first pixel and a second pixel. The second display panel includes a second region, a third region, and a fourth region. The second region includes a third pixel, the third region has a function of transmitting visible light, and the fourth region has a function of blocking visible light. The second pixel of the first display panel and the third region of the second display panel have a region where they overlap with each other. The aperture ratio of the second pixel is preferably higher than the aperture ratio of the first pixel.

For one or both of the first display panel and the second display panel, the display apparatus described above as an example, which includes a light-emitting element and a light-receiving element, can be used. In other words, at least one of the first pixel, the second pixel, and the third pixel includes a light-emitting element and a light-receiving element.

More details of the structure of one embodiment of the present invention are as follows.

Structure Example 1

Figure 26A:
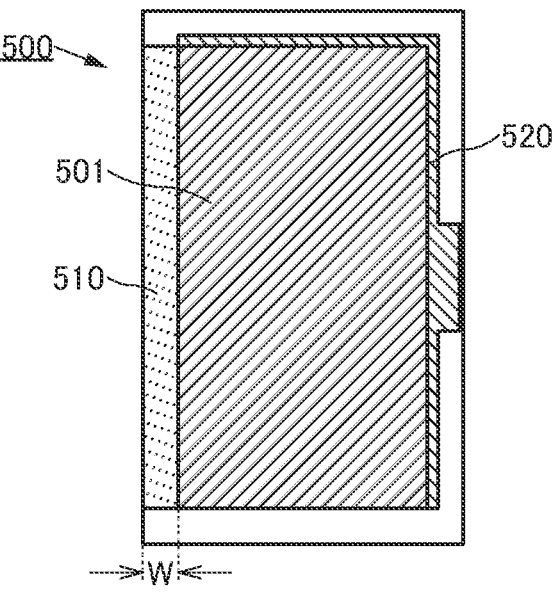
FIG. 26A and FIG. 26B are top views illustrating structure examples of a display apparatus.

FIG. 26A is a schematic top view of a display panel 500 included in the display panel of one embodiment of the present invention. As a structure of the display panel 500, each of the structures of the display apparatus 100 illustrated in FIG. 22 to FIG. 25 can be employed. Note that in FIG. 26A, W represents the width. The same applies to the drawings other than FIG. 26A.

The display panel 500 includes a display portion 501, and a region 510 transmitting visible light and a region 520 having a portion blocking visible light that are adjacent to the display portion 501.

Here, an image can be displayed on the display portion 501 and an image can be captured by the display portion 501 even when the display panel 500 is used independently.

In the region 510, for example, a pair of substrates included in the display panel 500 and a sealant for sealing the display element interposed between the pair of substrates may be provided. Here, for a member provided in the region 510, a material transmitting visible light is used.

In the region 520, for example, a wiring electrically connected to pixels included in the display portion 501 is provided. In addition to such wiring, driver circuits (such as a scan line driver circuit and a signal line driver circuit) for driving the pixels or a circuit such as a protective circuit may be provided. Furthermore, the region 520 includes a region where a terminal electrically connected to an external terminal or a wiring layer (also referred to as a connection terminal), a wiring electrically connected to the terminal, and the like are provided.

Figure 26B:
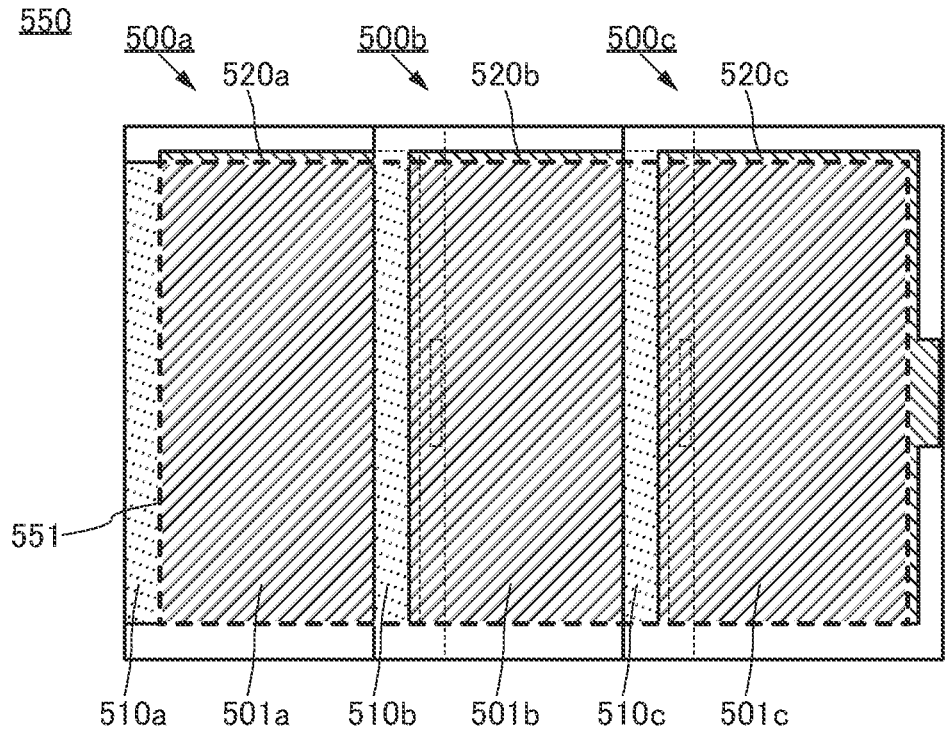

FIG. 26B is a schematic top view illustrating a structure example of the display panel 550 including the display panel 500 illustrated in FIG. 26A. FIG. 26B illustrates an example in which the display panel 550 includes three display panels 500.

Hereinafter, to distinguish the display panels from each other, the same components included in the display panels from each other, or the same components relating to the display panels from each other, letters are added to reference numerals of them in this embodiment. Unless otherwise specified, in a plurality of display panels partly overlapping with each other, "a" is added to reference numerals for a display panel placed on the lowest side (the side opposite to the display surface side), components thereof, and the like, and to one or more display panels placed on the upper side of the display panel, components thereof, and the like, "b" or letters after "b" in alphabetical order are added from the lower side in some cases. Furthermore, unless otherwise specified, in describing a structure in which a plurality of display panels is included, letters are not added when a common part of the display panels, the components, or the like is described.

The display panel 550 illustrated in FIG. 26B includes a display panel 500a, a display panel 500b, and a display panel 500c.

The display panel 500b is placed so that part of the display panel 500b is stacked over an upper side (a display surface side) of the display panel 500a. Specifically, the display panel 500b is placed so that a display portion 501a of the display panel 500a and a region 510b transmitting visible light of the display panel 500b overlap with each other and the display portion 501a of the display panel 500a and a region 520b blocking visible light of the display panel 500b do not overlap with each other.

The display panel 500c is placed so that part of the display panel 500c is stacked over an upper side (a display surface side) of the display panel 500b. Specifically, the display panel 500c is placed so that a display portion 501b of the display panel 500b and a region 510c transmitting visible light of the display panel 500c overlap with each other and the display portion 501b of the display panel 500b and a region 520c blocking visible light of the display panel 500c do not overlap with each other.

The region 510b transmitting visible light overlaps with the display portion 501a; thus, the whole display portion 501a can be visually recognized from the display surface side. Similarly, the whole display portion 501b can also be visually recognized from the display surface side when the region 510c overlaps with the display portion 501b. Therefore, a region where the display portion 501a, the display portion 501b, and a display portion 501c are placed seamlessly can serve as a display portion 551 of the display panel 550.

The display portion 551 of the display panel 550 can be enlarged by the number of display panels 500. Here, by using display panels each having an image capturing function (i.e., display panels each including a pixel in which a light-emitting element and a light-receiving element are provided) as all the display panels 500, the entire display portion 551 can serve as an image capturing region.

Structure Example 2

In FIG. 26B, a plurality of display panels 500 overlap with each other in one direction; however, a plurality of display panels 500 may overlap with each other in two directions of the vertical and horizontal directions.

Figure 27A:
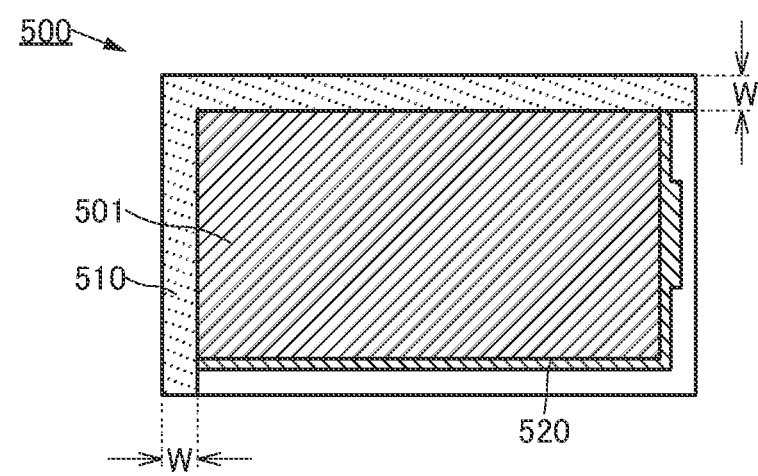
FIG. 27A to FIG. 27C are top views illustrating structure examples of display panels.

FIG. 27A is a schematic top view illustrating an example of the display panel 500 in which the shape of the region 510 is different from that in FIG. 26A. In the display panel 500 illustrated in FIG. 27A, the region 510 that transmits visible light is placed along two sides of the display portion 501.

Figure 27B:
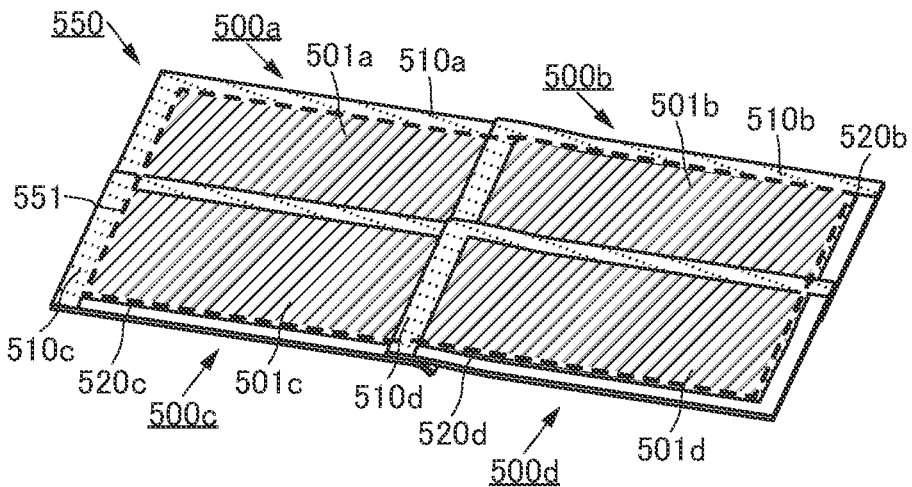
Figure 27C:
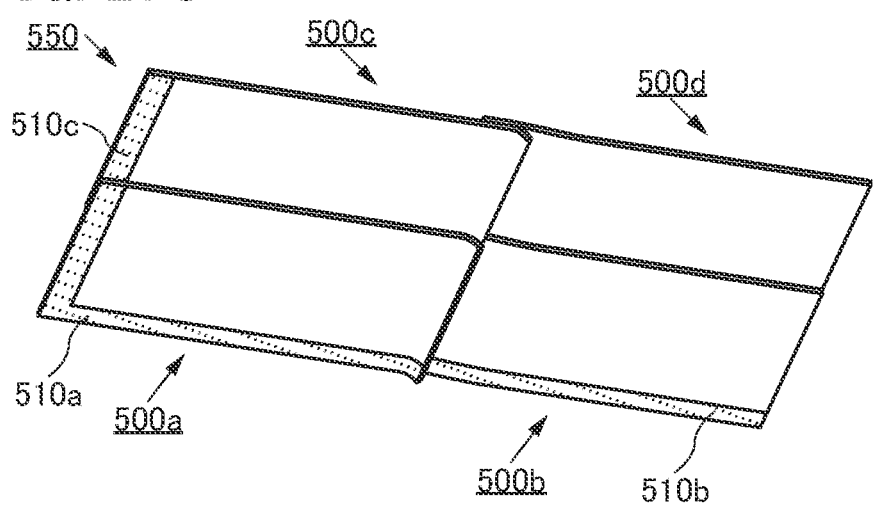

FIG. 27B is a schematic perspective view of the display panel 550 in which the display panels 500 illustrated in FIG. 27A are arranged in two rows and two columns. FIG. 27C is a schematic perspective view of the display panel 550 when seen from a side opposite to the display surface side.

In FIG. 27B and FIG. 27C, a region along a short side of the display portion 501a of the display panel 500a overlaps with part of the region 510b of the display panel 500b. In addition, a region along a long side of the display portion 501a of the display panel 500a overlaps with part of the region 510c of the display panel 500c. Moreover, a region 510d of a display panel 500d overlaps with a region along a long side of the display portion 501b of the display panel 500b and a region along a short side of the display portion 501c of the display panel 500c.

Therefore, as illustrated in FIG. 27B, a region where the display portion 501a, the display portion 501b, the display portion 501c, and the display portion 501d are placed seamlessly can serve as the display portion 551 of the display panel 550.

Here, it is preferable that a flexible material be used for the pair of substrates included in the display panel 500 and the display panel 500 have flexibility. Thus, as in the display panel 500a in FIG. 27B and FIG. 27C, for example, part of the display panel 500a is curved, whereby the part of the display panel 500a is placed under the display portion 501b of the adjacent display panel 500b so as to overlap with the display portion 501b.

Moreover, each display panel 500 is made flexible, in which case the display panel 500b can be curved gently so that the height of the top surface of the display portion 501b of the display panel 500b is the same as the height of the top surface of the display portion 501a of the display panel 500a. Thus, the display portions can have uniform height except in the vicinity of a region where the display panel 500a and the display panel 500b overlap with each other, and the display quality of an image displayed on the display portion 551 of the display panel 550 can be improved.

Although the relation between the display panel 500a and the display panel 500b is taken as an example in the above description, the same applies to the relation between any other two adjacent display panels.

To reduce the step between two adjacent display panels 500, the thickness of the display panel 500 is preferably small. For example, the thickness of the display panel 500 is preferably less than or equal to 1 μmm, further preferably less than or equal to 300 μm, still further preferably less than or equal to 100 μm.

A substrate for protecting the display portion 551 of the display panel 550 may be provided. The substrate may be provided for each display panel, or one substrate may be provided for a plurality of display panels.

Note that although the structure where the four rectangular display panels 500 are stacked is described above, when the number of display panels 500 is increased, an extremely large stacked-layer panel can be obtained. Furthermore, by changing a method for arranging a plurality of display panels 500, the shape of the contour of the display portion of the stacked-layer panel can be any of a variety of non-rectangular shapes such as a circular shape, an elliptical shape, and a polygonal shape, for example. In addition, when the display panels 500 are arranged in a three-dimensional manner, a stacked-layer panel including a display portion with a three-dimensional shape, for example, a cylindrical shape, a spherical shape, or a hemispherical shape can be obtained.

Figure 28A:
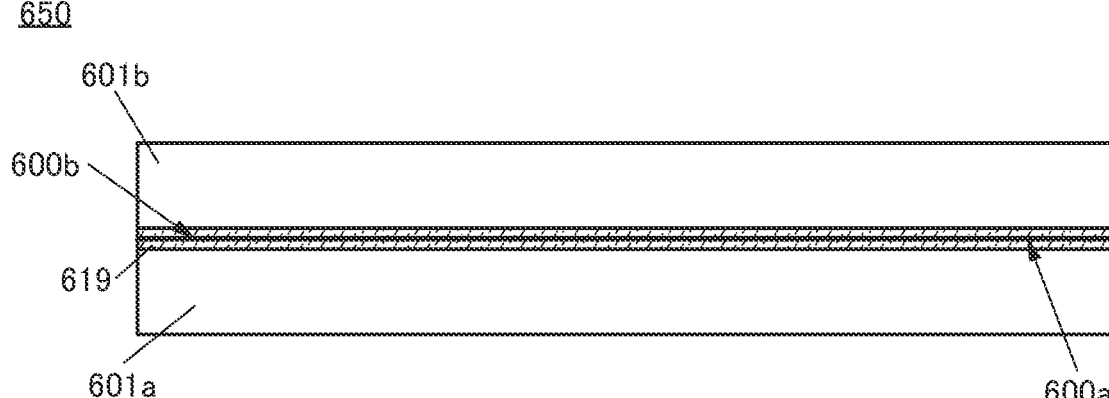
FIG. 28A and FIG. 28B are cross-sectional views illustrating a structure example of a display panel.

FIG. 28A is a cross-sectional view illustrating a structure of a display panel 650 of one embodiment of the present invention. In the display panel 650, a display panel 600a and a display panel 600b are interposed between a substrate 601a and a substrate 601b, and the space between the substrate 601a and the substrate 601b is filled with an adhesive layer 619.

For the substrate 601a and the substrate 601b, a material similar to the material that can be used for the substrate 253 and the substrate 106 described in Embodiment 2 can be used. For the adhesive layer 619, a material similar to the material that can be used for the adhesive layer 255 described in Embodiment 2 can be used.

Each of the structures of the display apparatus 100 illustrated in FIG. 22 to FIG. 25 can be used as the structure of the display panel 600a and the display panel 600b. The display panel 600 preferably has flexibility like the display panel 500.

Figure 28B:
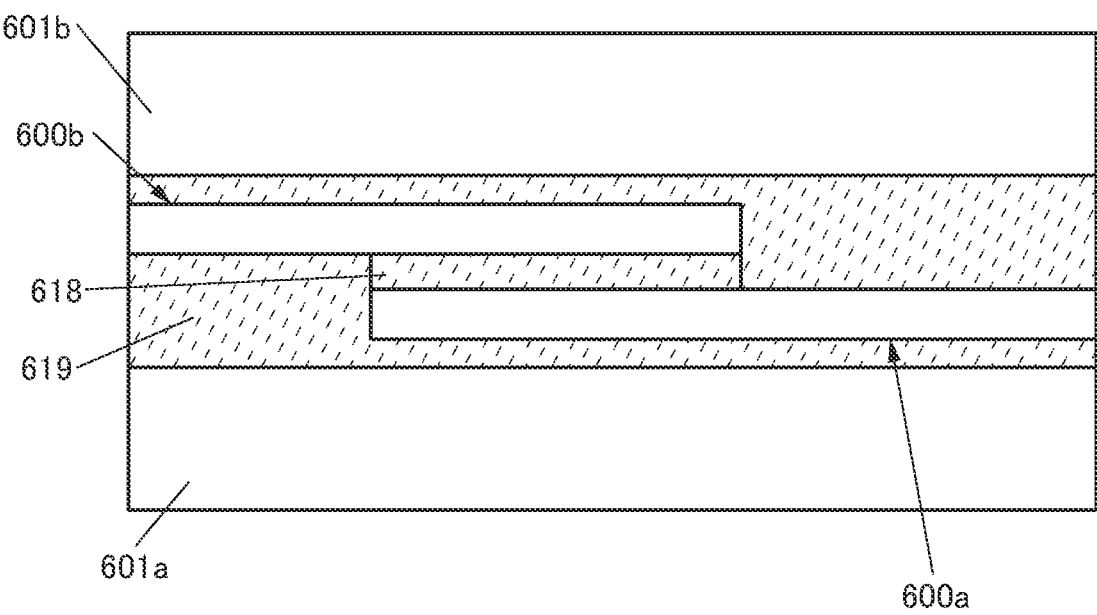

FIG. 28B is an enlarged view of the structure illustrated in FIG. 28A. As illustrated in FIG. 28B, an end portion of the display panel 600a and an end portion of the display panel 600b are attached to each other with an adhesive layer 618 so as to overlap with each other. Specifically, an end portion of the display portion of the display panel 600a and an end portion of the display portion of the display panel 600b are attached to each other with the adhesive layer 618 so as to overlap with each other. In other words, the display panel 650 can have a structure in which the display panel 600a and the display panel 600b are stacked. For the adhesive layer 618, a material similar to the material that can be used for the adhesive layer 619 can be used.

With a structure in which a plurality of display panels 600 are stacked, the display panel 650 can be a large-sized display panel as well as the display panel 600. The display panel 650 may have a structure in which three or more display panels 600 are stacked. By increasing the number of display panels 600 included in the display panel 650, the size of the display panel 650 can be increased.

At least part of the structure examples, the drawings corresponding thereto, and the like illustrated in this embodiment can be combined with the other structure examples, the other drawings, and the like as appropriate.

At least part of this embodiment can be implemented in combination with the other embodiments described in this specification as appropriate.

Embodiment 4

In this embodiment, a display apparatus of one embodiment of the present invention will be described.

The display apparatus of one embodiment of the present invention includes a light-receiving element (also referred to as a light-receiving device) and a light-emitting element (also referred to as a light-emitting device). Alternatively, the display apparatus of one embodiment of the present invention may include a light-emitting and light-receiving element (also referred to as a light-emitting and light-receiving device) and a light-emitting element.

First, a display apparatus including a light-receiving element and a light-emitting element is described.

The display apparatus of one embodiment of the present invention includes a light-receiving element and a light-emitting element in a light-emitting and light-receiving portion. In the display apparatus of one embodiment of the present invention, the light-emitting elements are arranged in a matrix in the light-emitting and light-receiving portion, and an image can be displayed on the light-emitting and light-receiving portion. Furthermore, the light-receiving elements are arranged in a matrix in the light-emitting and light-receiving portion, and the light-emitting and light-receiving portion has one or both of an image capturing function and a sensing function. The light-emitting and light-receiving portion can be used as an image sensor, a touch sensor, or the like. That is, by detecting light with the light-emitting and light-receiving portion, an image can be captured and touch operation of an object (e.g., a finger or a stylus) can be detected. Furthermore, in the display apparatus of one embodiment of the present invention, the light-emitting elements can be used as a light source of the sensor. Accordingly, a light-receiving portion and a light source do not need to be provided separately from the display apparatus; hence, the number of components of an electronic apparatus can be reduced.

In the display apparatus of one embodiment of the present invention, when an object reflects (or scatters) light emitted from the light-emitting element included in the light-emitting and light-receiving portion, the light-receiving element can detect the reflected light (or the scattered light); thus, image capturing, touch operation detection, or the like is possible even in a dark place.

The light-emitting element included in the display apparatus of one embodiment of the present invention functions as a display element (also referred to as a display device).

As the light-emitting element, an EL element (also referred to as an EL device) such as an OLED or a QLED is preferably used. Examples of a light-emitting substance contained in the EL element include a substance that emits fluorescent light (a fluorescent material), a substance that emits phosphorescent light (a phosphorescent material), inorganic compounds (e.g., quantum dot materials), and a substance exhibiting thermally activated delayed fluorescence (a thermally activated delayed fluorescent (TADF) material). An LED such as a micro LED can also be used as the light-emitting element.

The display apparatus of one embodiment of the present invention has a function of detecting light with the use of a light-receiving element.

When the light-receiving elements are used as an image sensor, the display apparatus can capture an image using the light-receiving elements. For example, the display apparatus can be used as a scanner.

An electronic apparatus including the display apparatus of one embodiment of the present invention can obtain data related to biological information such as a fingerprint or a palm print by using a function of an image sensor. That is, a biometric authentication sensor can be incorporated in the display apparatus. When the display apparatus incorporates a biometric authentication sensor, the number of components of an electronic apparatus can be reduced as compared to the case where a biometric authentication sensor is provided separately from the display apparatus; thus, the size and weight of the electronic apparatus can be reduced.

When the light-receiving elements are used as the touch sensor, the display apparatus can detect touch operation of an object with the use of the light-receiving elements.

As the light-receiving element, a pn photodiode or a pin photodiode can be used, for example. The light-receiving element functions as a photoelectric conversion element (also referred to as a photoelectric conversion device) that detects light entering the light-receiving element and generates charge. The amount of charge generated from the light-receiving element depends on the amount of light entering the light-receiving element.

It is particularly preferable to use an organic photodiode including a layer containing an organic compound as the light-receiving element. An organic photodiode, which is easily made thin, lightweight, and large in area and has a high degree of freedom for shape and design, can be used in a variety of devices.

In one embodiment of the present invention, organic EL elements (also referred to as organic EL devices) are used as the light-emitting elements, and organic photodiodes are used as the light-receiving elements. The organic EL elements and the organic photodiodes can be formed over one substrate. Thus, the organic photodiodes can be incorporated in the display apparatus including the organic EL elements.

In the case where all the layers of the organic EL elements and the organic photodiodes are formed separately, the number of film formation steps becomes extremely large. However, a large number of layers of the organic photodiodes can have a structure in common with the organic EL elements; thus, concurrently forming the layers that can have a common structure can inhibit an increase in the number of film formation steps.

For example, one of a pair of electrodes (a common electrode) can be a layer shared by the light-receiving element and the light-emitting element. For example, at least one of a hole-injection layer, a hole-transport layer, an electron-transport layer, and an electron-injection layer may be a layer shared by the light-receiving element and the light-emitting element. When the light-receiving element and the light-emitting element include a common layer in such a manner, the number of film formation steps and the number of masks can be reduced, thereby reducing the number of manufacturing steps and the manufacturing cost of the display apparatus. Furthermore, the display apparatus including the light-receiving element can be manufactured using an existing manufacturing apparatus and an existing manufacturing method for the display apparatus.

Next, a display apparatus including light-emitting and light-receiving elements and light-emitting elements is described. Note that functions, behavior, effects, and the like similar to those in the above are not described in some cases.

In the display apparatus of one embodiment of the present invention, a subpixel exhibiting any color includes a light-emitting and light-receiving element instead of a light-emitting element, and subpixels exhibiting the other colors each include a light-emitting element. The light-emitting and light-receiving element has both a function of emitting light (a light-emitting function) and a function of receiving light (a light-receiving function). For example, in the case where a pixel includes three subpixels of a red subpixel, a green subpixel, and a blue subpixel, at least one of the subpixels includes a light-emitting and light-receiving element, and the other subpixels each include a light-emitting element. Thus, the light-emitting and light-receiving portion of the display apparatus of one embodiment of the present invention has a function of displaying an image using both light-emitting and light-receiving elements and light-emitting elements.

The light-emitting and light-receiving element functions as both a light-emitting element and a light-receiving element, whereby the pixel can have a light-receiving function without an increase in the number of subpixels included in the pixel. Thus, the light-emitting and light-receiving portion of the display apparatus can be provided with one or both of an image capturing function and a sensing function while keeping the aperture ratio of the pixel (aperture ratio of each subpixel) and the resolution of the display apparatus. Accordingly, in the display apparatus of one embodiment of the present invention, the aperture ratio of the pixel can be more increased and the resolution can be increased more easily than in a display apparatus provided with a subpixel including a light-receiving element separately from a subpixel including a light-emitting element.

In the light-emitting and light-receiving portion of the display apparatus of one embodiment of the present invention, the light-emitting and light-receiving elements and the light-emitting elements are arranged in a matrix, and an image can be displayed on the light-emitting and light-receiving portion. The light-emitting and light-receiving portion can be used as an image sensor, a touch sensor, or the like. In the display apparatus of one embodiment of the present invention, the light-emitting elements can be used as a light source of the sensor. Thus, image capturing, touch operation detection, or the like is possible even in a dark place.

The light-emitting and light-receiving element can be fabricated by combining an organic EL element and an organic photodiode. For example, by adding an active layer of an organic photodiode to a stacked-layer structure of an organic EL element, the light-emitting and light-receiving element can be manufactured. Furthermore, in the light-emitting and light-receiving element fabricated by combining an organic EL element and an organic photodiode, concurrently forming layers that can be shared by the organic EL element can inhibit an increase in the number of film formation steps.

For example, one of a pair of electrodes (a common electrode) can be a layer shared by the light-emitting and light-receiving element and the light-emitting element. For example, at least one of a hole-injection layer, a hole-transport layer, an electron-transport layer, and an electron-injection layer may be a layer shared by the light-emitting and light-receiving element and the light-emitting element.

Note that a layer included in the light-emitting and light-receiving element might have a different function between the case where the light-emitting and light-receiving element functions as a light-receiving element and the case where the light-emitting and light-receiving element functions as a light-emitting element. In this specification, the name of a component is based on its function in the case where the light-emitting and light-receiving element functions as a light-emitting element.

The display apparatus of this embodiment has a function of displaying an image with the use of the light-emitting elements and the light-emitting and light-receiving elements. That is, the light-emitting elements and the light-emitting and light-receiving elements function as display elements.

The display apparatus of this embodiment has a function of detecting light with the use of the light-emitting and light-receiving elements. The light-emitting and light-receiving element can detect light having a shorter wavelength than light emitted from the light-emitting and light-receiving element itself.

When the light-emitting and light-receiving elements are used as an image sensor, the display apparatus of this embodiment can capture an image using the light-emitting and light-receiving elements. When the light-emitting and light-receiving elements are used as a touch sensor, the display apparatus of this embodiment can detect touch operation of an object with the use of the light-emitting and light-receiving elements.

The light-emitting and light-receiving element functions as a photoelectric conversion element. The light-emitting and light-receiving element can be fabricated by adding an active layer of the light-receiving element to the above-described structure of the light-emitting element. For the light-emitting and light-receiving element, an active layer of a pn photodiode or a pin photodiode can be used, for example.

It is particularly preferable to use, for the light-emitting and light-receiving element, an active layer of an organic photodiode including a layer containing an organic compound. An organic photodiode, which is easily made thin, lightweight, and large in area and has a high degree of freedom for shape and design, can be used in a variety of devices.

The display apparatus that is an example of the display apparatus of one embodiment of the present invention is specifically described below with reference to drawings.

Structure Example 1

FIG. 29A is a schematic view of a display panel 200. The display panel 200 includes a substrate 207, a substrate 202, a light-receiving element 212, a light-emitting element 216R, a light-emitting element 216G, a light-emitting element 216B, a functional layer 203, and the like.

The light-emitting element 216R, the light-emitting element 216G, the light-emitting element 216B, the light-receiving element 212 are provided between the substrate 207 and the substrate 202. The light-emitting element 216R, the light-emitting element 216G, and the light-emitting element 216B emit red (R) light, green (G) light, and blue (B) light, respectively. Note that in the following description, the term "light-emitting element 216" may be used when the light-emitting element 216R, the light-emitting element 216G, and the light-emitting element 216B are not distinguished from each other.

The display panel 200 includes a plurality of pixels arranged in a matrix. One pixel includes one or more subpixels. One subpixel includes one light-emitting element. For example, the pixel can have a structure including three subpixels (e.g., three colors of R, G, and B or three colors of yellow (Y), cyan (C), and magenta (M)) or four subpixels (e.g., four colors of R, G, B, and white (W) or four colors of R, G, B, and Y). The pixel further includes the light-receiving element 212. The light-receiving element 212 may be provided in all the pixels or may be provided in some of the pixels. In addition, one pixel may include a plurality of light-receiving elements 212.

FIG. 29A illustrates a finger 220 touching a surface of the substrate 202. Part of light emitted from the light-emitting element 216G is reflected at a contact portion of the substrate 202 and the finger 220. In the case where part of the reflected light is incident on the light-receiving element 212, the contact of the finger 220 with the substrate 202 can be detected. That is, the display panel 200 can function as a touch sensor.

The functional layer 203 includes a circuit for driving the light-emitting element 216R, the light-emitting element 216G, and the light-emitting element 216B and a circuit for driving the light-receiving element 212. The functional layer 203 is provided with a switch, a transistor, a capacitor, a wiring, and the like. Note that in the case where the light-emitting element 216R, the light-emitting element 216G, the light-emitting element 216B, and the light-receiving element 212 are driven by a passive-matrix method, a structure not provided with a switch, a transistor, or the like may be employed.

The display panel 200 preferably has a function of detecting a fingerprint of the finger 220. FIG. 29B schematically illustrates an enlarged view of the contact portion in a state where the finger 220 touches the substrate 202. FIG. 29B illustrates light-emitting elements 216 and the light-receiving elements 212 that are alternately arranged.

The fingerprint of the finger 220 is formed of depressed portions and projected portions. Therefore, as illustrated in FIG. 29B, the projected portions of the fingerprint touch the substrate 202.

Reflection of light from a surface, an interface, or the like is categorized into regular reflection and diffuse reflection. Regularly reflected light is highly directional light with an angle of reflection equal to the angle of incidence. Diffusely reflected light has low directionality and low angular dependence of intensity. As for regular reflection and diffuse reflection, diffuse reflection components are dominant in the light reflected from the surface of the finger 220. Meanwhile, regular reflection components are dominant in the light reflected from the interface between the substrate 202 and the air.

The intensity of light that is reflected from contact surfaces or non-contact surfaces between the finger 220 and the substrate 202 and is incident on the light-receiving elements 212 positioned directly below the contact surfaces or the non-contact surfaces is the sum of intensities of regularly reflected light and diffusely reflected light. As described above, regularly reflected light (indicated by solid arrows) is dominant near the depressed portions of the finger 220, where the finger 220 is not in contact with the substrate 202; whereas diffusely reflected light (indicated by dashed arrows) from the finger 220 is dominant near the projected portions of the finger 220, where the finger 220 is in contact with the substrate 202. Thus, the intensity of light received by the light-receiving element 212 positioned directly below the depressed portion is higher than the intensity of light received by the light-receiving element 212 positioned directly below the projected portion. Accordingly, a fingerprint image of the finger 220 can be captured.

In the case where an arrangement interval between the light-receiving elements 212 is smaller than a distance between two projected portions of a fingerprint, preferably a distance between a depressed portion and a projected portion adjacent to each other, a clear fingerprint image can be obtained. The distance between a depressed portion and a projected portion of a human's fingerprint is approximately 200 μm; thus, the arrangement interval between the light-receiving elements 212 is, for example, less than or equal to 400 μm, preferably less than or equal to 200 μm, further preferably less than or equal to 150 μm, still further preferably less than or equal to 100 μm, even still further preferably less than or equal to 50 μm and greater than or equal to 1 μm, preferably greater than or equal to 10 μm, further preferably greater than or equal to 20 μm.

FIG. 29C illustrates an example of a fingerprint image captured by the display panel 200. In an image-capturing range 228 in FIG. 29C, the outline of the finger 220 is indicated by a dashed line and the outline of a contact portion 227 is indicated by a dashed-dotted line. In the contact portion 227, a high-contrast image of a fingerprint 222 can be captured owing to a difference in the amount of light incident on the light-receiving elements 212.

The display panel 200 can also function as a touch sensor or a pen tablet. FIG. 29D illustrates a state where a tip of a stylus 229 slides in a direction indicated with a dashed arrow while the tip of the stylus 229 touches the substrate 202.

As illustrated in FIG. 29D, when diffusely reflected light that is diffused at the contact surface of the tip of the stylus 229 and the substrate 202 is incident on the light-receiving element 212 that overlaps with the contact surface, the position of the tip of the stylus 229 can be detected with high accuracy.

FIG. 29E illustrates an example of a path 226 of the stylus 229 that is detected by the display panel 200. The display panel 200 can detect the position of a detection target, such as the stylus 229, with high position accuracy, so that high-resolution drawing can be performed using, for example, a drawing application. Unlike the case of using a capacitive touch sensor, an electromagnetic induction touch pen, or the like, the display panel 200 can detect even the position of a highly insulating object to be detected, the material of a tip portion of the stylus 229 is not limited, and a variety of writing materials (e.g., a brush, a glass pen, a quill pen, and the like) can be used.

Here, FIG. 29F to FIG. 29H illustrate examples of a pixel that can be used in the display panel 200.

The pixels illustrated in FIG. 29F and FIG. 29G each include the light-emitting element 216R for red (R), the light-emitting element 216G for green (G), the light-emitting element 216B for blue (B), and the light-receiving element 212. The pixels each include a pixel circuit for driving the light-emitting element 216R, the light-emitting element 216G, the light-emitting element 216B, and the light-receiving element 212.

FIG. 29F illustrates an example in which three light-emitting elements and one light-receiving element are provided in a matrix of 2×2. FIG. 29G illustrates an example in which three light-emitting elements are arranged in one line and one laterally long light-receiving element 212 is provided below the three light-emitting elements.

The pixel illustrated in FIG. 29H is an example including a light-emitting element 216W for white (W). Here, four light-emitting elements are arranged in one line and the light-receiving element 212 is provided below the four light-emitting elements.

Note that the pixel structure is not limited to the above, and a variety of arrangement methods can be employed.

Structure Example 2

An example of a structure including light-emitting elements emitting visible light, a light-emitting element emitting infrared light, and a light-receiving element is described below.

Figure 30A:
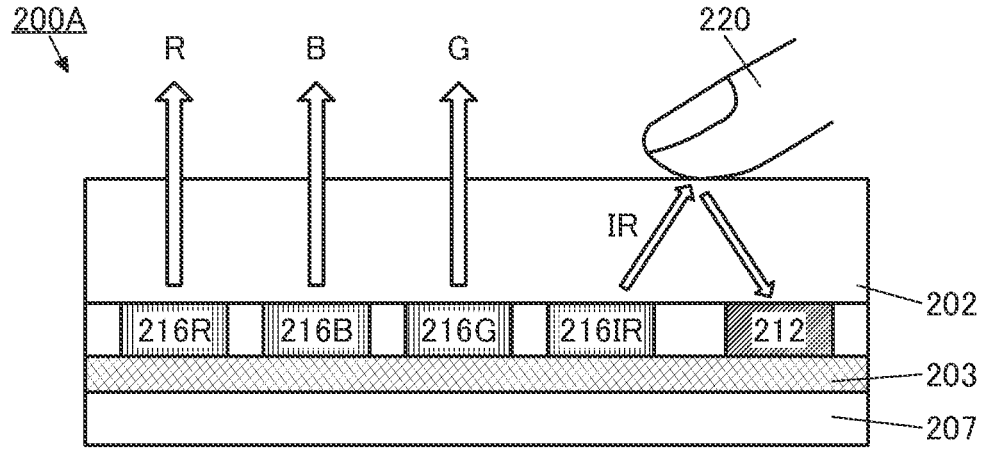
FIG. 30A is a cross-sectional view of a structure example of a display apparatus.

A display panel 200A illustrated in FIG. 30A includes a light-emitting element 216IR in addition to the components illustrated in FIG. 29A as an example. The light-emitting element 216IR is a light-emitting element emitting infrared light IR. Moreover, in this case, an element capable of receiving at least the infrared light IR emitted from the light-emitting element 216IR is preferably used as the light-receiving element 212. As the light-receiving element 212, an element capable of receiving visible light and infrared light is further preferably used.

As illustrated in FIG. 30A, when the finger 220 touches the substrate 202, the infrared light IR emitted from the light-emitting element 216IR is reflected by the finger 220 and part of reflected light is incident on the light-receiving element 212, so that the positional information of the finger 220 can be obtained.

Figure 30B:
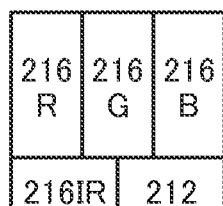
FIG. 30B to FIG. 30D are top views illustrating examples of a pixel.
Figure 30C:
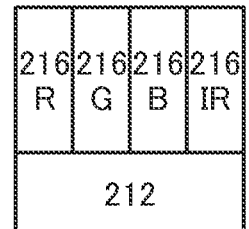
Figure 30D:
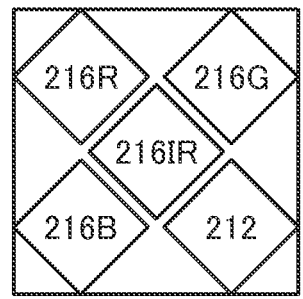

FIG. 30B to FIG. 30D illustrate examples of a pixel that can be used in the display panel 200A.

FIG. 30B illustrates an example in which three light-emitting elements are arranged in one line and the light-emitting element 216IR and the light-receiving element 212 are arranged below the three light-emitting elements in a horizontal direction. FIG. 30C illustrates an example in which four light-emitting elements including the light-emitting element 216IR are arranged in one line and the light-receiving element 212 is provided below the four light-emitting elements.

FIG. 30D illustrates an example in which three light-emitting elements and the light-receiving element 212 are arranged in all directions with the light-emitting element 216IR as the center.

Note that in the pixels illustrated in FIG. 30B to FIG. 30D, the positions of the light-emitting elements can be interchangeable, or the positions of the light-emitting element and the light-receiving element can be interchangeable.

Structure Example 3

An example of a structure including a light-emitting element emitting visible light and a light-emitting and light-receiving element emitting and receiving visible light is described below.

A display panel 200B illustrated in FIG. 31A includes the light-emitting element 216B, the light-emitting element 216G, and a light-emitting and light-receiving element 213R. The light-emitting and light-receiving element 213R has a function of a light-emitting element that emits red (R) light, and a function of a photoelectric conversion element that receives visible light. FIG. 31A illustrates an example in which the light-emitting and light-receiving element 213R receives green (G) light emitted from the light-emitting element 216G. Note that the light-emitting and light-receiving element 213R may receive blue (B) light emitted from the light-emitting element 216B. The light-emitting and light-receiving element 213R may receive both green light and blue light.

For example, the light-emitting and light-receiving element 213R preferably receives light having a shorter wavelength than light emitted from itself. Alternatively, the light-emitting and light-receiving element 213R may receive light (e.g., infrared light) having a longer wavelength than light emitted from itself. The light-emitting and light-receiving element 213R may receive light having approximately the same wavelength as light emitted from itself; however, in that case, the light-emitting and light-receiving element 213R also receives light emitted from itself, whereby its emission efficiency might be decreased. Therefore, the peak of the emission spectrum and the peak of the absorption spectrum of the light-emitting and light-receiving element 213R preferably overlap as little as possible.

Here, light emitted from the light-emitting and light-receiving element is not limited to red light. Furthermore, the light emitted from the light-emitting elements is not limited to the combination of green light and blue light. For example, the light-emitting and light-receiving element can be an element that emits green or blue light and receives light having a different wavelength from light emitted from itself.

The light-emitting and light-receiving element 213R serves as both a light-emitting element and a light-receiving element as described above, whereby the number of elements provided in one pixel can be reduced. Thus, higher resolution, a higher aperture ratio, higher definition, and the like can be easily achieved.

FIG. 31B to FIG. 31I illustrate examples of a pixel that can be used in the display panel 200B.

FIG. 31B illustrates an example in which the light-emitting and light-receiving element 213R, the light-emitting element 216G, and the light-emitting element 216B are arranged in one line. FIG. 31C illustrates an example in which the light-emitting element 216G and the light-emitting element 216B are alternately arranged in the vertical direction and the light-emitting and light-receiving element 213R is provided alongside the light-emitting elements.

FIG. 31D illustrates an example in which three light-emitting elements (the light-emitting element 216G, the light-emitting element 216B, and a light-emitting element 216X) and one light-emitting and light-receiving element are arranged in a matrix of 2×2. The light-emitting element 216X is an element that emits light of a color other than R, G, and B. The light of a color other than R, G, and B can be white (W) light, yellow (Y) light, cyan (C) light, magenta (M) light, infrared light (IR), ultraviolet light (UV), or the like. In the case where the light-emitting element 216X emits infrared light, the light-emitting and light-receiving element preferably has a function of detecting infrared light or a function of detecting both visible light and infrared light. The wavelength of light detected by the light-emitting and light-receiving element can be determined depending on the application of a sensor.

FIG. 31E illustrates two pixels. A region that includes three elements and is enclosed by a dotted line corresponds to one pixel. Each of the pixels includes the light-emitting element 216G, the light-emitting element 216B, and the light-emitting and light-receiving element 213R. In the left pixel in FIG. 31E, the light-emitting element 216G is provided in the same row as the light-emitting and light-receiving element 213R, and the light-emitting element 216B is provided in the same column as the light-emitting and light-receiving element 213R. In the right pixel in FIG. 31E, the light-emitting element 216G is provided in the same row as the light-emitting and light-receiving element 213R, and the light-emitting element 216B is provided in the same column as the light-emitting element 216G. In the pixel layout in FIG. 31E, the light-emitting and light-receiving element 213R, the light-emitting element 216G, and the light-emitting element 216B are repeatedly arranged in both the odd-numbered row and the even-numbered row, and in each column, the light-emitting elements or the light-emitting element and the light-emitting and the receiving elements arranged in the odd-numbered row and the even-numbered row emit light of different colors.

FIG. 31F illustrates four pixels which employ a PenTile arrangement; adjacent two pixels have different combinations of light-emitting elements or light-emitting and light-receiving elements that emit light of two different colors. FIG. 31F illustrates the top-surface shapes of the light-emitting elements or light-emitting and light-receiving elements.

The upper left pixel and the lower right pixel illustrated in FIG. 31F each include the light-emitting and light-receiving element 213R and the light-emitting element 216G. The upper right pixel and the lower left pixel each include the light-emitting element 216G and the light-emitting element 216B. That is, in the example illustrated in FIG. 31F, the light-emitting element 216G is provided in each pixel.

The top surface shape of the light-emitting elements and the light-emitting and light-receiving elements is not particularly limited and can be a circular shape, an elliptical shape, a polygonal shape, a polygonal shape with rounded corners, or the like. For example, FIG. 31F illustrates examples in which the top surface shapes of the light-emitting elements and the light-emitting and light-receiving elements are each a square tilted at approximately 45° (a diamond shape). Note that the top surface shape of the light-emitting elements and the light-emitting and light-receiving elements may vary depending on the color thereof, or the light-emitting elements and the light-emitting and light-receiving elements of some colors or every color may have the same top surface shape.

The sizes of light-emitting regions (or light-emitting and light-receiving regions) of the light-emitting elements and the light-emitting and light-receiving elements may vary depending on the color thereof, or the light-emitting elements and the light-emitting and light-receiving elements of some colors or every color may have light-emitting regions of the same size. For example, in FIG. 31F, the light-emitting region of the light-emitting element 216G provided in each pixel may have a smaller area than the light-emitting region (or the light-emitting and light-receiving region) of the other elements.

FIG. 31G is a modification example of the pixel arrangement illustrated in FIG. 31F. Specifically, the structure of FIG. 31G is obtained by rotating the structure of FIG. 31F by 45°. Although one pixel is regarded as including two elements in FIG. 31F, one pixel can be regarded as being formed of four elements as illustrated in FIG. 31G.

FIG. 31H is a modification example of the pixel arrangement illustrated in FIG. 31F. The upper left pixel and the lower right pixel illustrated in FIG. 31H each include the light-emitting and light-receiving element 213R and the light-emitting element 216G. The upper right pixel and the lower left pixel each include the light-emitting and light-receiving element 213R and the light-emitting element 216B. That is, in the example illustrated in FIG. 31H, the light-emitting and light-receiving element 213R is provided in each pixel. The structure illustrated in FIG. 31H achieves higher-resolution image capturing than the structure illustrated in FIG. 31F because of having the light-emitting and light-receiving element 213R in each pixel. Thus, the accuracy of biometric authentication can be increased, for example.

FIG. 31I illustrates a modification example of the pixel arrangement in FIG. 31H, obtained by rotating the pixel arrangement illustrated in FIG. 31H by 45°.

In FIG. 31I, one pixel is described as being formed of four elements (two light-emitting elements and two light-emitting and light-receiving elements). One pixel including a plurality of light-emitting and light-receiving elements having a light-receiving function allows high-resolution image capturing. Accordingly, the accuracy of biometric authentication can be increased. For example, the resolution of image capturing can be the square root of 2 times the resolution of display.

A display apparatus that employs the structure illustrated in FIG. 31H or FIG. 31I includes p (p is an integer greater than or equal to 2) first light-emitting elements, q (q is an integer greater than or equal to 2) second light-emitting elements, and r (r is an integer greater than p and q) light-emitting and light-receiving elements. As for p and r, r=2p is satisfied. As for p, q, and r, r=p+q is satisfied. Either the first light-emitting elements or the second light-emitting elements emit green light, and the other light-emitting elements emit blue light. The light-emitting and light-receiving elements emit red light and have a light-receiving function.

In the case where touch operation is detected with the light-emitting and light-receiving elements, for example, it is preferable that light emitted from a light source be hard for a user to recognize. Since blue light has lower visibility than green light, light-emitting elements that emit blue light are preferably used as a light source. Accordingly, the light-emitting and light-receiving elements preferably have a function of receiving blue light. Note that without limitation to the above, light-emitting elements used as a light source can be selected as appropriate depending on the sensitivity of the light-emitting and light-receiving elements.

As described above, the display apparatus of this embodiment can employ any of various types of pixel arrangements.

At least part of any of the structure examples, the drawings corresponding thereto, and the like described in this embodiment can be implemented in combination with any of the other structure examples, the other drawings, and the like as appropriate.

At least part of this embodiment can be implemented in combination with the other embodiments described in this specification as appropriate.

Embodiment 5

In this embodiment, a light-emitting element (also referred to as a light-emitting device) and a light-receiving element (also referred to as a light-receiving device) that can be used in a light-emitting and light-receiving apparatus of one embodiment of the present invention will be described.

In this specification and the like, a structure in which light-emitting layers in light-emitting devices of different colors (here, blue (B), green (G), and red (R)) are separately formed or separately patterned may be referred to as an SBS (Side By Side) structure. In this specification and the like, a light-emitting device capable of emitting white light may be referred to as a white-light-emitting device. Note that a combination of white-light-emitting devices with coloring layers (e.g., color filters) enables a full-color display apparatus.

Light-emitting devices can be classified roughly into a single structure and a tandem structure. A device having a single structure includes one light-emitting unit between a pair of electrodes, and the light-emitting unit preferably includes one or more light-emitting layers. When white light emission is obtained using two light-emitting layers, the two light-emitting layers are selected such that emission colors of the two light-emitting layers are complementary colors. For example, by making the emission color of a first light-emitting layer and the emission color of a second light-emitting layer complementary colors, the light-emitting device can be configured to emit white light as a whole. When white light emission is obtained using three or more light-emitting layers, the light-emitting device is configured to emit white light as a whole by combining emission colors of the three or more light-emitting layers.

A device having a tandem structure includes two or more light-emitting units between a pair of electrodes, and each light-emitting unit preferably includes one or more light-emitting layers. When light-emitting layers that emit light of the same color are used in each light-emitting unit, luminance per predetermined current can be increased, and the light-emitting device can have higher reliability than that with a single structure. To obtain white light emission in the tandem structure, the structure is made so that light from light-emitting layers of the plurality of light-emitting units can be combined to be white light. Note that a combination of emission colors for obtaining white light emission is similar to that in the case of a single structure. In the device having a tandem structure, an intermediate layer such as a charge-generation layer is suitably provided between the plurality of light-emitting units.

When the above white-light-emitting device (having a single structure or a tandem structure) and the above light-emitting device having an SBS structure are compared to each other, the light-emitting device having an SBS structure can have lower power consumption than the white-light-emitting device. To reduce power consumption, a light-emitting device having an SBS structure is suitably used. Meanwhile, the white-light-emitting device is suitable in terms of lower manufacturing cost or higher manufacturing yield because the manufacturing process of the white-light-emitting device is simpler than that of the light-emitting device having an SBS structure.

[Device Structure]

Next, detailed structures of the light-emitting element, the light-receiving element, and the light-emitting and light-receiving element which can be used in the display apparatus of one embodiment of the present invention will be described.

The display apparatus of one embodiment of the present invention can have any of the following structures: a top-emission structure in which light is emitted in a direction opposite to the substrate where the light-emitting elements are formed, a bottom-emission structure in which light is emitted toward the substrate where the light-emitting elements are formed, and a dual-emission structure in which light is emitted toward both surfaces.

In this embodiment, a top-emission display apparatus is described as an example.

In this specification and the like, unless otherwise specified, in describing a structure including a plurality of components (e.g., light-emitting elements or light-emitting layers), alphabets are omitted when a common part of the components is described. For example, the term "light-emitting layer 383" is sometimes used to describe a common part of a light-emitting layer 383R, a light-emitting layer 383G, and the like.

Figure 32A:
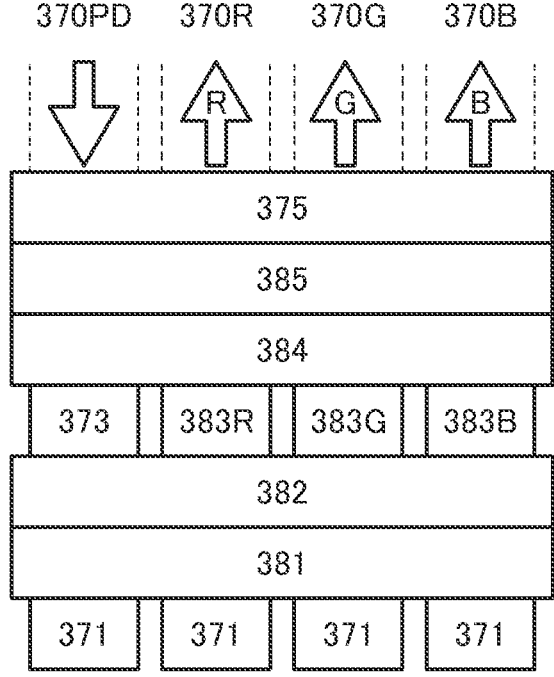
FIG. 32A and FIG. 32B are diagrams illustrating structure examples of a display apparatus.

A display apparatus 380A illustrated in FIG. 32A includes a light-receiving element 370PD, a light-emitting element 370R that emits red (R) light, a light-emitting element 370G that emits green (G) light, and a light-emitting element 370B that emits blue (B) light.

Each of the light-emitting elements includes a pixel electrode 371, a hole-injection layer 381, a hole-transport layer 382, a light-emitting layer, an electron-transport layer 384, an electron-injection layer 385, and a common electrode 375 that are stacked in this order. The light-emitting element 370R includes the light-emitting layer 383R, the light-emitting element 370G includes the light-emitting layer 383G, and the light-emitting element 370B includes a light-emitting layer 383B. The light-emitting layer 383R contains a light-emitting substance that emits red light, the light-emitting layer 383G contains a light-emitting substance that emits green light, and the light-emitting layer 383B contains a light-emitting substance that emits blue light.

The light-emitting elements are electroluminescent elements that emit light to the common electrode 375 side by voltage application between the pixel electrode 371 and the common electrode 375.

The light-receiving element 370PD includes the pixel electrode 371, the hole-injection layer 381, the hole-transport layer 382, an active layer 373, the electron-transport layer 384, the electron-injection layer 385, and the common electrode 375 that are stacked in this order.

The light-receiving element 370PD is a photoelectric conversion element that receives light entering from the outside of the display apparatus 380A and converts it into an electric signal.

This embodiment is described assuming that the pixel electrode 371 functions as an anode and the common electrode 375 functions as a cathode in both of the light-emitting element and the light-receiving element. In other words, the light-receiving element is driven by application of reverse bias between the pixel electrode 371 and the common electrode 375, whereby light incident on the light-receiving element can be detected and charge can be generated and extracted as current.

In the display apparatus of this embodiment, an organic compound is used for the active layer 373 of the light-receiving element 370PD. The light-receiving element 370PD can share the layers other than the active layer 373 with the light-emitting elements. Therefore, the light-receiving element 370PD can be formed concurrently with the formation of the light-emitting elements only by adding a step of forming the active layer 373 in the fabrication step of the light-emitting elements. The light-emitting elements and the light-receiving element 370PD can be formed over one substrate. Accordingly, the light-receiving element 370PD can be incorporated into the display apparatus without a significant increase in the number of fabrication steps.

The display apparatus 380A is an example in which the light-receiving element 370PD and the light-emitting elements have a common structure except that the active layer 373 of the light-receiving element 370PD and the light-emitting layers 383 of the light-emitting elements are separately formed. Note that the structures of the light-receiving element 370PD and the light-emitting elements are not limited thereto. The light-receiving element 370PD and the light-emitting elements may include separately formed layers in addition to the active layer 373 and the light-emitting layers 383. The light-receiving element 370PD and the light-emitting elements preferably include at least one layer used in common (common layer). Thus, the light-receiving element 370PD can be incorporated into the display apparatus without a significant increase in the number of fabrication steps.

A conductive film having a visible-light-transmitting property is used as the electrode through which light is extracted, which is either the pixel electrode 371 or the common electrode 375. A conductive film having a visible-light-reflecting property is preferably used as the electrode through which light is not extracted.

The light-emitting element includes at least the light-emitting layer 383. In addition to the light-emitting layer 383, the light-emitting element may further include a layer containing a substance having a high hole-injection property, a substance having a high hole-transport property, a hole-blocking material, a substance having a high electron-transport property, a substance having a high electron-injection property, a substance with a bipolar property (a substance having a high electron- and hole-transport property), and the like.

For example, the light-emitting elements and the light-receiving element can share at least one of the hole-injection layer, the hole-transport layer, the electron-transport layer, and the electron-injection layer. Furthermore, at least one of the hole-injection layer, the hole-transport layer, the electron-transport layer, and the electron-injection layer can be separately formed for the light-emitting elements and the light-receiving element.

The hole-injection layer is a layer that injects holes from an anode to the light-emitting element and contains a material having a high hole-injection property. As the material having a high hole-injection property, an aromatic amine compound or a composite material containing a hole-transport material and an acceptor material (an electron-accepting material) can be used.

In the light-emitting elements, the hole-transport layer is a layer that transports holes, which are injected from the anode by the hole-injection layer, to the light-emitting layer. In the light-receiving element, the hole-transport layer is a layer that transports holes, which are generated in the active layer on the basis of incident light, to the anode. The hole-transport layer is a layer that contains a hole-transport material. As the hole-transport material, a substance having a hole mobility greater than or equal to $1 \times 10^{-6}$ cm$^2$/Vs is preferable. Note that other substances can also be used as long as they have a property of transporting more holes than electrons. As the hole-transport material, materials having a high hole-transport property, such as a π-electron rich heteroaromatic compound (e.g., a carbazole derivative, a thiophene derivative, and a furan derivative) and an aromatic amine (a compound having an aromatic amine skeleton), are preferable.

In the light-emitting element, the electron-transport layer is a layer that transports electrons, which are injected from the cathode by the electron-injection layer, to the light-emitting layer. In the light-receiving element, the electron-transport layer is a layer that transports electrons, which are generated in the active layer on the basis of incident light, to the cathode. The electron-transport layer is a layer that contains an electron-transport material. As the electron-transport material, a substance having an electron mobility greater than or equal to $1 \times 10^{-6}$ cm$^2$/Vs is preferable. Note that other substances can also be used as long as they have a property of transporting more electrons than holes. As the electron-transport material, it is possible to use a material having a high electron-transport property, such as a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative having a quinoline ligand, a benzoquinoline derivative, a quinoxaline derivative, a dibenzoquinoxaline derivative, a pyridine derivative, a bipyridine derivative, a pyrimidine derivative, or a π-electron deficient heteroaromatic compound such as a nitrogen-containing heteroaromatic compound.

The electron-injection layer is a layer that injects electrons from the cathode to the light-emitting element and contains a material having a high electron-injection property. As the material having a high electron-injection property, an alkali metal, an alkaline earth metal, or a compound thereof can be used. As the material having a high electron-injection property, a composite material containing an electron-transport material and a donor material (electron-donating material) can also be used.

The light-emitting layer 383 is a layer that contains a light-emitting substance. The light-emitting layer 383 can contain one or more kinds of light-emitting substances. As the light-emitting substance, a substance that exhibits an emission color of blue, violet, bluish violet, green, yellowish green, yellow, orange, red, or the like is used as appropriate. Alternatively, as the light-emitting substance, a substance that emits near-infrared light can be used.

Examples of the light-emitting substance include a fluorescent material, a phosphorescent material, a TADF material, and a quantum dot material.

Examples of the fluorescent material include a pyrene derivative, an anthracene derivative, a triphenylene derivative, a fluorene derivative, a carbazole derivative, a dibenzothiophene derivative, a dibenzofuran derivative, a dibenzoquinoxaline derivative, a quinoxaline derivative, a pyridine derivative, a pyrimidine derivative, a phenanthrene derivative, and a naphthalene derivative.

Examples of the phosphorescent material include an organometallic complex (particularly an iridium complex) having a 4H-triazole skeleton, a 1H-triazole skeleton, an imidazole skeleton, a pyrimidine skeleton, a pyrazine skeleton, or a pyridine skeleton; an organometallic complex (particularly an iridium complex) having a phenylpyridine derivative including an electron-withdrawing group as a ligand; a platinum complex; and a rare earth metal complex.

The light-emitting layer 383 may contain one or more kinds of organic compounds (e.g., a host material and an assist material) in addition to the light-emitting substance (a guest material). As one or more kinds of organic compounds, one or both of the hole-transport material and the electron-transport material can be used. Alternatively, as one or more kinds of organic compounds, a bipolar material or a TADF material may be used.

The light-emitting layer 383 preferably contains a phosphorescent material and a combination of a hole-transport material and an electron-transport material that easily forms an exciplex. With such a structure, light emission can be efficiently obtained by ExTET (Exciplex-Triplet Energy Transfer), which is energy transfer from an exciplex to a light-emitting substance (a phosphorescent material). When a combination of materials is selected so as to form an exciplex that exhibits light emission whose wavelength overlaps with the wavelength of a lowest-energy-side absorption band of the light-emitting substance, energy can be transferred smoothly and light emission can be obtained efficiently. With this structure, high efficiency, low-voltage driving, and a long lifetime of the light-emitting element can be achieved at the same time.

In a combination of materials for forming an exciplex, the HOMO level (the highest occupied molecular orbital level) of the hole-transport material is preferably higher than or equal to the HOMO level of the electron-transport material. The LUMO level (the lowest unoccupied molecular orbital level) of the hole-transport material is preferably higher than or equal to the LUMO level of the electron-transport material. The LUMO levels and the HOMO levels of the materials can be derived from the electrochemical characteristics (the reduction potentials and the oxidation potentials) of the materials that are measured by cyclic voltammetry (CV).

The formation of an exciplex can be confirmed by a phenomenon in which the emission spectrum of a mixed film in which the hole-transport material and the electron-transport material are mixed is shifted to the longer wavelength side than the emission spectrum of each of the materials (or has another peak on the longer wavelength side), observed by comparison of the emission spectrum of the hole-transport material, the emission spectrum of the electron-transport material, and the emission spectrum of the mixed film of these materials, for example. Alternatively, the formation of an exciplex can be confirmed by a difference in transient response, such as a phenomenon in which the transient photoluminescence (PL) lifetime of the mixed film has longer lifetime components or has a larger proportion of delayed components than that of each of the materials, observed by comparison of the transient PL of the hole-transport material, the transient PL of the electron-transport material, and the transient PL of the mixed film of these materials. The transient PL can be rephrased as transient electroluminescence (EL). That is, the formation of an exciplex can also be confirmed by a difference in transient response observed by comparison of the transient EL of the hole-transport material, the transient EL of the electron-transport material, and the transient EL of the mixed film of these materials.

The active layer 373 includes a semiconductor. Examples of the semiconductor include an inorganic semiconductor such as silicon and an organic semiconductor including an organic compound. This embodiment illustrates an example in which an organic semiconductor is used as the semiconductor included in the active layer 373. An organic semiconductor is preferably used, in which case the light-emitting layer 383 and the active layer 373 can be formed by the same method (e.g., a vacuum evaporation method) and thus the same manufacturing apparatus can be used.

Examples of an n-type semiconductor material contained in the active layer 373 are electron-accepting organic semiconductor materials such as fullerene (e.g., $C_{60}$ fullerene and $C_{70}$ fullerene) and a fullerene derivative. Fullerene has a soccer ball-like shape, which is energetically stable. Both the HOMO level and the LUMO level of fullerene are deep (low). Having a deep LUMO level, fullerene has an extremely high electron-accepting property (acceptor property). In general, when π-electron conjugation (resonance) spreads in a plane as in benzene, an electron-donating property (donor property) becomes high; however, since fullerene has a spherical shape, fullerene has a high electron-accepting property even when π-electron conjugation spreads. The high electron-accepting property efficiently causes rapid charge separation and is useful for alight-receiving element. Both $C_{60}$ and $C_{70}$ have a wide absorption band in the visible light region, and $C_{70}$ is especially preferable because of having a larger π-electron conjugation system and a wider absorption band in the long wavelength region than $C_{60}$. Other examples of fullerene derivatives include [6,6]-Phenyl-$C_{71}$-butyric acid methyl ester (abbreviation: $PC_{70}BM$), [6,6]-Phenyl-$C_{61}$-butyric acid methyl ester (abbreviation: $PC_{60}BM$), and 1',1'',4',4''-Tetrahydro-di [1,4]methanonaphthaleno[1,2:2',3',56,60:2'',3''][5,6]fullerene-$C_{60}$ (abbreviation: ICBA).

Another example of an n-type semiconductor material includes a perylenetetracarboxylic derivative such as N,N-dimethyl-3,4,9,10-perylenetetracarboxylic diimide (abbreviation: Me-PTCDI).

Another example of an n-type semiconductor material includes 2,2'-(5,5'-(thieno[3,2-b]thiophene-2,5-diyl)bis (thiophene-5,2-diyl))bis(methan-1-yl-1-ylidene)dimalono-nitrile (abbreviation: FT2TDMN).

Other examples of an n-type semiconductor material include a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative, a benzoquinoline derivative, a quinoxaline derivative, a dibenzoquinoxaline derivative, a pyridine derivative, a bipyridine derivative, a pyrimidine derivative, a naphthalene derivative, an anthracene derivative, a coumarin derivative, a rhodamine derivative, a triazine derivative, and a quinone derivative.

Examples of a p-type semiconductor material contained in the active layer 373 include electron-donating organic semiconductor materials such as copper(II) phthalocyanine (CuPc), tetraphenyldibenzoperiflanthene (DBP), zinc phthalocyanine (ZnPc), tin(II) phthalocyanine (SnPc), quinacridone, and rubrene.

Other examples of a p-type semiconductor material include a carbazole derivative, a thiophene derivative, a furan derivative, and a compound having an aromatic amine skeleton. Other examples of a p-type semiconductor material include a naphthalene derivative, an anthracene derivative, a pyrene derivative, a triphenylene derivative, a fluorene derivative, a pyrrole derivative, a benzofuran derivative, a benzothiophene derivative, an indole derivative, a dibenzofuran derivative, a dibenzothiophene derivative, an indolocarbazole derivative, a porphyrin derivative, a phthalocyanine derivative, a naphthalocyanine derivative, a quinacridone derivative, a rubrene derivative, a tetracene derivative, a polyphenylene vinylene derivative, a polyparaphenylene derivative, a polyfluorene derivative, a polyvinylcarbazole derivative, and a polythiophene derivative.

The HOMO level of the electron-donating organic semiconductor material is preferably shallower (higher) than the HOMO level of the electron-accepting organic semiconductor material. The LUMO level of the electron-donating organic semiconductor material is preferably shallower (higher) than the LUMO level of the electron-accepting organic semiconductor material.

Fullerene having a spherical shape is preferably used as the electron-accepting organic semiconductor material, and an organic semiconductor material having a substantially planar shape is preferably used as the electron-donating organic semiconductor material. Molecules of similar shapes tend to aggregate, and aggregated molecules of similar kinds, which have molecular orbital energy levels close to each other, can increase the carrier-transport property.

For example, the active layer 373 is preferably formed by co-evaporation of an n-type semiconductor and a p-type semiconductor. Alternatively, the active layer 373 may be formed by stacking an n-type semiconductor and a p-type semiconductor.

Either a low molecular compound or a high molecular compound can be used for the light-emitting element and the light-receiving element, and an inorganic compound may also be contained. Each of the layers included in the light-emitting element and the light-receiving element can be formed by an evaporation method (including a vacuum evaporation method), a transfer method, a printing method, an inkjet method, a coating method, or the like.

As the hole-transport material or the electron-blocking material, a high molecular compound such as poly(3,4-ethylenedioxythiophene)/poly(styrenesulfonic acid) (PEDOT/PSS), or an inorganic compound such as molybdenum oxide or copper iodide (CuI) can be used, for example. As the electron-transport material or the hole-blocking material, an inorganic compound such as zinc oxide (ZnO), or an organic compound such as polyethylenimine ethoxylate (PEIE) can be used. The light-receiving device may include a mixed film of PEIE and ZnO, for example.

For the active layer 373, a high molecular compound such as Poly[[4,8-bis[5-(2-ethylhexyl)-2-thienyl]benzo[1,2-b:4,5-b']dithiophene-2,6-diyl]-2,5-thiophenediyl[5,7-bis(2-ethylhexyl)-4,8-dioxo-4H,8H-benzo[1,2-c:4,5-c']dithiophene-1,3-diyl]] polymer (abbreviation: PBDB-T) or a PBDB-T derivative, which functions as a donor, can be used. For example, a method in which an acceptor material is dispersed to PBDB-T or a PBDB-T derivative can be used.

Figure 32B:
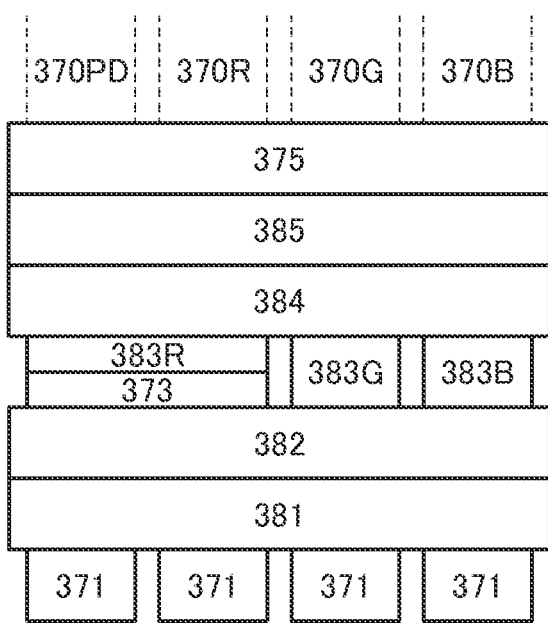

A display apparatus 380B illustrated in FIG. 32B is different from the display apparatus 380A in that the light-receiving element 370PD and the light-emitting element 370R have the same structure.

The light-receiving element 370PD and the light-emitting element 370R share the active layer 373 and the light-emitting layer 383R.

Here, it is preferable that the light-receiving element 370PD have the same structure as the light-emitting element that emits light with a wavelength longer than that of the light desired to be detected. For example, the light-receiving element 370PD with a structure for detecting blue light can have the same structure as one or both of the light-emitting element 370R and the light-emitting element 370G. For example, the light-receiving element 370PD with a structure for detecting green light can have the same structure as the light-emitting element 370R.

When the light-receiving element 370PD and the light-emitting element 370R have a common structure, the number of deposition steps and the number of masks can be smaller than those for the structure in which the light-receiving element 370PD and the light-emitting element 370R include separately formed layers. As a result, the number of manufacturing steps and the manufacturing cost of the display apparatus can be reduced.

When the light-receiving element 370PD and the light-emitting element 370R have a common structure, a margin for misalignment can be narrower than that for the structure in which the light-receiving element 370PD and the light-emitting element 370R include separately formed layers. Accordingly, the aperture ratio of a pixel can be increased, so that the light extraction efficiency of the display apparatus can be increased. This can extend the life of the light-emitting element. Furthermore, the display apparatus can exhibit a high luminance. Moreover, the resolution of the display apparatus can also be increased.

The light-emitting layer 383R contains a light-emitting substance that emits red light. The active layer 373 contains an organic compound that absorbs light with a wavelength shorter than that of red light (e.g., one or both of green light and blue light). The active layer 373 preferably contains an organic compound that does not easily absorb red light and that absorbs light with a wavelength shorter than that of red light. In that case, red light can be efficiently extracted from the light-emitting element 370R, and the light-receiving element 370PD can detect light with a wavelength shorter than that of red light with high accuracy.

Although the light-emitting element 370R and the light-receiving element 370PD have the same structure in an example of the display apparatus 380B, the light-emitting element 370R and the light-receiving element 370PD may include optical adjustment layers with different thicknesses.

Figures 33A, 33B:
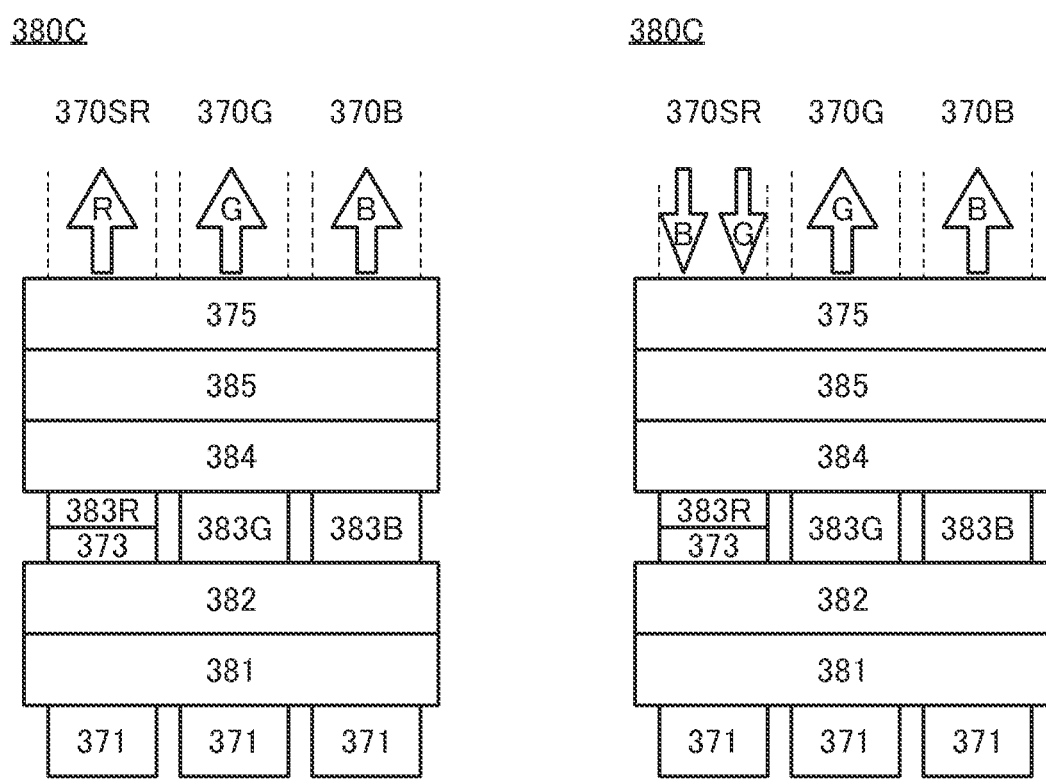
FIG. 33A to FIG. 33G are diagrams illustrating structure examples of a display apparatus.

A display apparatus 380C illustrated in FIG. 33A and FIG. 33B includes a light-emitting and light-receiving element 370SR that emits red (R) light and has a light-receiving function, the light-emitting element 370G, and the light-emitting element 370B. The above description of the display apparatus 380A can be referred to for the structures of the light-emitting element 370G and the light-emitting element 370B, for example.

The light-emitting and light-receiving element 370SR includes the pixel electrode 371, the hole-injection layer 381, the hole-transport layer 382, the active layer 373, the light-emitting layer 383R, the electron-transport layer 384, the electron-injection layer 385, and the common electrode 375 which are stacked in this order. The light-emitting and light-receiving element 370SR has the same structure as the light-emitting element 370R and the light-receiving element 370PD illustrated in the display apparatus 380B.

FIG. 33A illustrates the case where the light-emitting and light-receiving element 370SR functions as a light-emitting element. FIG. 33A illustrates an example in which the light-emitting element 370B emits blue light, the light-emitting element 370G emits green light, and the light-emitting and light-receiving element 370SR emits red light.

FIG. 33B illustrates the case where the light-emitting and light-receiving element 370SR functions as a light-receiving element. FIG. 33B illustrates an example in which the light-emitting and light-receiving element 370SR receives blue light emitted by the light-emitting element 370B and green light emitted by the light-emitting element 370G.

The light-emitting element 370B, the light-emitting element 370G, and the light-emitting and light-receiving element 370SR each include the pixel electrode 371 and the common electrode 375. In this embodiment, the case where the pixel electrode 371 functions as an anode and the common electrode 375 functions as a cathode is described as an example. The light-emitting and light-receiving element 370SR is driven by application of reverse bias between the pixel electrode 371 and the common electrode 375, whereby light incident on the light-emitting and light-receiving element 370SR can be detected and charge can be generated and extracted as current.

It can be said that the light-emitting and light-receiving element 370SR has a structure in which the active layer 373 is added to the light-emitting element. That is, the light-emitting and light-receiving element 370SR can be formed concurrently with the light-emitting elements only by adding a step of forming the active layer 373 in the formation step of the light-emitting element. The light-emitting element and the light-emitting and light-receiving element can be formed over one substrate. Thus, the display portion can be provided with one or both of an image capturing function and a sensing function without a significant increase in the number of fabricating steps.

The stacking order of the light-emitting layer 383R and the active layer 373 is not limited. FIG. 33A and FIG. 33B each illustrate an example in which the active layer 373 is provided over the hole-transport layer 382 and the light-emitting layer 383R is provided over the active layer 373. The stacking order of the light-emitting layer 383R and the active layer 373 may be reversed.

The light-emitting and light-receiving element may exclude at least one layer of the hole-injection layer 381, the hole-transport layer 382, the electron-transport layer 384, and the electron-injection layer 385. Furthermore, the light-emitting and light-receiving element may include another functional layer such as a hole-blocking layer or an electron-blocking layer.

In the light-emitting and light-receiving element, a conductive film having a visible-light-transmitting property is used as the electrode through which light is extracted. A conductive film having a visible-light-reflecting property is preferably used as the electrode through which light is not extracted.

The functions and materials of the layers constituting the light-emitting and light-receiving element are similar to those of the layers constituting the light-emitting elements and the light-receiving element and are not described in detail.

FIG. 33C to FIG. 33G illustrate examples of stacked-layer structures of light-emitting and light-receiving elements.

Figures 33C, 33D, 33E, 33F, 33G:
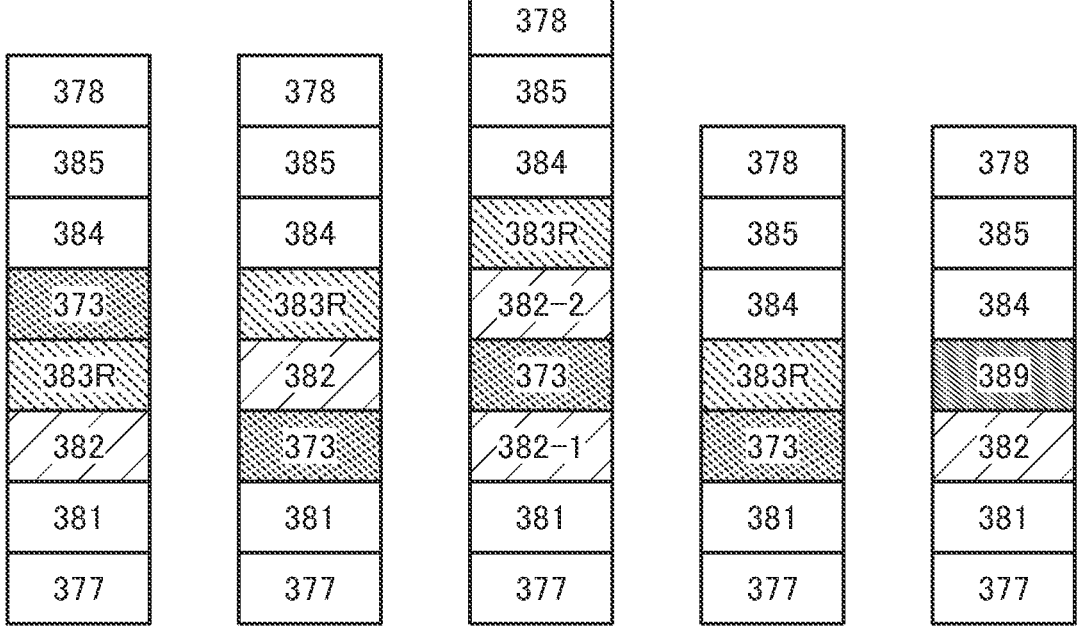

The light-emitting and light-receiving element illustrated in FIG. 33C includes a first electrode 377, the hole-injection layer 381, the hole-transport layer 382, the light-emitting layer 383R, the active layer 373, the electron-transport layer 384, the electron-injection layer 385, and a second electrode 378.

FIG. 33C illustrates an example in which the light-emitting layer 383 is provided over the hole-transport layer 382 and the active layer 373 is stacked over the light-emitting layer 383.

As illustrated in FIG. 33A to FIG. 33C, the active layer 373 and the light-emitting layer 383R may be in contact with each other.

A buffer layer is preferably provided between the active layer 373 and the light-emitting layer 383R. In that case, the buffer layer preferably has a hole-transport property and an electron-transport property. For example, a substance with a bipolar property is preferably used for the buffer layer. Alternatively, as the buffer layer, at least one layer of a hole-injection layer, a hole-transport layer, an electron-transport layer, an electron-injection layer, a hole-blocking layer, an electron-blocking layer, and the like can be used. FIG. 33D illustrates an example in which the hole-transport layer 382 is used as the buffer layer.

The buffer layer provided between the active layer 373 and the light-emitting layer 383R can inhibit transfer of excitation energy from the light-emitting layer 383R to the active layer 373. Furthermore, the optical path length (cavity length) of the microcavity structure can be adjusted with the buffer layer. Thus, high emission efficiency can be obtained from the light-emitting and light-receiving element including the buffer layer between the active layer 373 and the light-emitting layer 383R.

FIG. 33E illustrates an example of a stacked-layer structure in which a hole-transport layer 382-1, the active layer 373, a hole-transport layer 382-2, and the light-emitting layer 383R are stacked in this order over the hole-injection layer 381. The hole-transport layer 382-2 functions as a buffer layer. The hole-transport layer 382-1 and the hole-transport layer 382-2 may contain the same material or different materials. Instead of the hole-transport layer 382-2, any of the above layers that can be used as the buffer layer may be used. The positions of the active layer 373 and the light-emitting layer 383R may be interchanged.

The light-emitting and light-receiving element illustrated in FIG. 33F is different from the light-emitting and light-receiving element illustrated in FIG. 33A in that the hole-transport layer 382 is not included. In this manner, the light-emitting and light-receiving element may exclude at least one of the hole-injection layer 381, the hole-transport layer 382, the electron-transport layer 384, and the electron-injection layer 385. The light-emitting and light-receiving element may include another functional layer such as a hole-blocking layer or an electron-blocking layer.

The light-emitting and light-receiving element illustrated in FIG. 33G is different from the light-emitting and light-receiving element illustrated in FIG. 33A in including a layer 389 serving as both a light-emitting layer and an active layer instead of including the active layer 373 and the light-emitting layer 383R.

As the layer serving as both a light-emitting layer and an active layer, it is possible to use, for example, a layer containing three materials which are an n-type semiconductor that can be used for the active layer 373, a p-type semiconductor that can be used for the active layer 373, and a light-emitting substance that can be used for the light-emitting layer 383R.

Note that an absorption band on the lowest energy side of an absorption spectrum of a mixed material of the n-type semiconductor and the p-type semiconductor and a maximum peak of an emission spectrum (PL spectrum) of the light-emitting substance preferably do not overlap with each other and are further preferably positioned fully apart from each other.

At least part of any of the structure examples, the drawings corresponding thereto, and the like described in this embodiment can be implemented in combination with any of the other structure examples, the other drawings, and the like as appropriate.

At least part of this embodiment can be implemented in combination with any of the other embodiments described in this specification, as appropriate.

Embodiment 6

In this embodiment, an example of a display apparatus including a light-receiving device and the like of one embodiment of the present invention will be described.

In the display apparatus of this embodiment, a pixel can include a plurality of types of subpixels including light-emitting devices that emit light of different colors. For example, the pixel can include three types of subpixels. The three subpixels can be of three colors of red (R), green (G), and blue (B) or of three colors of yellow (Y), cyan (C), and magenta (M), for example. Alternatively, the pixel can include four types of subpixels. The four subpixels can be of four colors of R, G, B, and white (W) or of four colors of R, G, B, and Y, for example.

There is no particular limitation on the arrangement of subpixels, and a variety of methods can be employed. Examples of the arrangement of subpixels include a stripe arrangement, an S-stripe arrangement, a matrix arrangement, a delta arrangement, a Bayer arrangement, and a PenTile arrangement.

Examples of a top surface shape of the subpixel include polygons such as a triangle, a tetragon (including a rectangle and a square), and a pentagon; polygons with rounded corners; an ellipse; and a circle. Here, atop surface shape of the subpixel corresponds to atop surface shape of a light-emitting region of the light-emitting device.

In the display apparatus including light-emitting devices and a light-receiving device in each pixel, the pixel has a light-receiving function; thus, the display apparatus can detect a contact or approach of an object while displaying an image. For example, an image can be displayed by using all the subpixels included in the display apparatus; or light can be emitted by some of the subpixels as a light source and an image can be displayed by using the other subpixels.

Figure 34A:
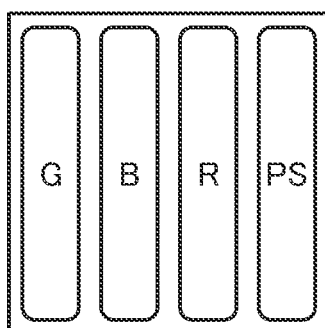
FIG. 34A to FIG. 34F are diagrams illustrating examples of a pixel.
Figure 34B:
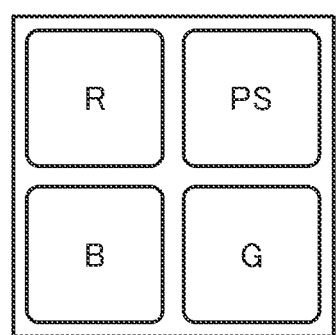
Figure 34C:
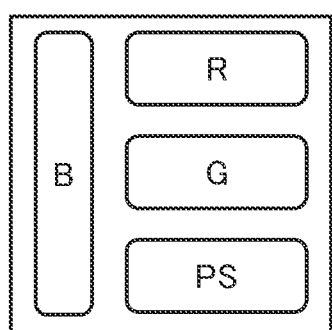

Pixels illustrated in FIG. 34A, FIG. 34B, and FIG. 34C each include a subpixel G, a subpixel B, a subpixel R, and a subpixel PS.

The pixel illustrated in FIG. 34A employs an S-stripe arrangement. The pixel illustrated in FIG. 34B employs a matrix arrangement.

In the pixel illustrated in FIG. 34C, three subpixels (the subpixel R, the subpixel G, and the subpixel S) are vertically arranged next to one subpixel (the subpixel B).

Figure 34D:
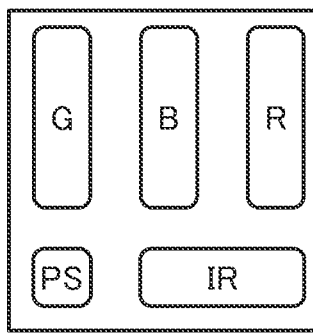
Figure 34E:
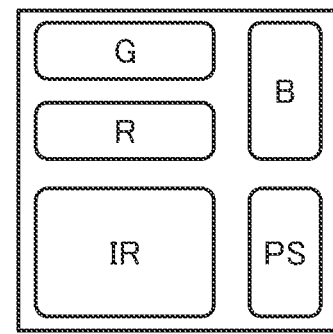
Figure 34F:
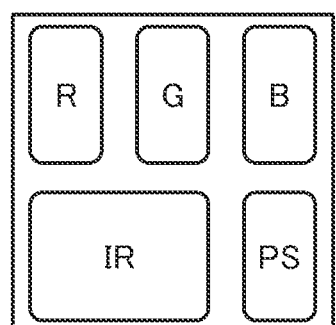

Pixels illustrated in FIG. 34D, FIG. 34E, and FIG. 34F each include the subpixel G, the subpixel B, the subpixel R, a subpixel IR, and the subpixel PS.

FIG. 34D, FIG. 34E, and FIG. 34F illustrate examples in which one pixel is provided in two rows. Three subpixels (the subpixel G, the subpixel B, and the subpixel R) are provided in the upper row (first row), and two subpixels (one subpixel PS and one subpixel IR) are provided in the lower row (second row).

In FIG. 34D, the three vertically oriented subpixel G, subpixel B, and subpixel R are arranged laterally, and the subpixel PS and the horizontally oriented subpixel IR are arranged laterally below the three subpixels. In FIG. 34E, the two horizontally oriented subpixel G and subpixel R are arranged in the vertical direction; the vertically oriented subpixel B is arranged laterally next to the subpixels G and R; and the horizontally oriented subpixel IR and the vertically oriented subpixel PS are arranged laterally below the subpixels R, G, and B. In FIG. 34F, the three vertically oriented subpixel R, subpixel G, and subpixel B are arranged laterally, and the horizontally oriented subpixel IR and the vertically oriented subpixel PS are arranged laterally below the subpixels R, G, and B. In FIG. 34E and FIG. 34F, the area of the subpixel IR is the largest, and the area of the subpixel PS is substantially the same as that of, for example, the subpixel B.

Note that the layout of the subpixels is not limited to those illustrated in FIG. 34A to FIG. 34F.

The subpixel R includes a light-emitting device that emits red light. The subpixel G includes a light-emitting device that emits green light. The subpixel B includes a light-emitting device that emits blue light. The subpixel IR includes a light-emitting device that emits infrared light. The subpixel PS includes a light-receiving device. Although there is no particular limitation on the wavelength of light that the subpixel PS detects, the light-receiving device included in the subpixel PS preferably has sensitivity to light emitted from the light-emitting device included in the subpixel R, the subpixel G, the subpixel B, or the subpixel IR. The light-receiving device preferably detects one or more of light in blue, violet, bluish violet, green, yellow green, yellow, orange, red, and infrared wavelength ranges, for example.

The light-receiving area of the subpixel PS is smaller than the light-emitting area of each of the other subpixels. A smaller light-receiving area leads to a narrower image-capturing range, inhibits a blur in an image capturing result, and improves the definition. Thus, by using the subpixel PS, high-resolution or high-definition image capturing is possible. For example, image capturing for biometric authentication with the use of a fingerprint, a palm print, the iris, the shape of a blood vessel (including the shape of a vein and the shape of an artery), a face, or the like is possible by using the subpixel PS.

Moreover, the subpixel PS can be used in a touch sensor (also referred to as a direct touch sensor), a near touch sensor (also referred to as a hover sensor, a hover touch sensor, a contactless touch sensor, or a touchless sensor), or the like. For example, the subpixel PS preferably detects infrared light. Thus, touch detection is possible even in a dark place.

Here, the touch sensor or the near touch sensor can detect an approach or contact of an object (e.g., a finger, a hand, or a pen). The touch sensor can detect an object when the display apparatus and the object come in direct contact with each other. The near touch sensor can detect an object even when the object is not in contact with the display apparatus. For example, the display apparatus can preferably detect an object when the distance between the display apparatus and the object is more than or equal to 0.1 μmm and less than or equal to 300 μmm, preferably more than or equal to 3 μmm and less than or equal to 50 μmm. With this structure, the display apparatus can be controlled without an object directly contacting with the display apparatus. In other words, the display apparatus can be controlled in a contactless (touchless) manner. With the above structure, the display apparatus can have a reduced risk of being dirty or damaged, or can be operated without the object directly touching a dirt (e.g., dust or a virus) attached to the display apparatus.

For high-resolution image capturing, the subpixel PS is preferably provided in every pixel included in the display apparatus. Meanwhile, in the case where the subpixel PS is used in a touch sensor, a near touch sensor, or the like, high accuracy is not required as compared to the case of capturing an image of a fingerprint or the like; accordingly, the subpixel PS is provided in some of the pixels in the display apparatus. When the number of subpixels PS included in the display apparatus is smaller than the number of subpixels R, for example, higher detection speed can be achieved.

Figure 34G:
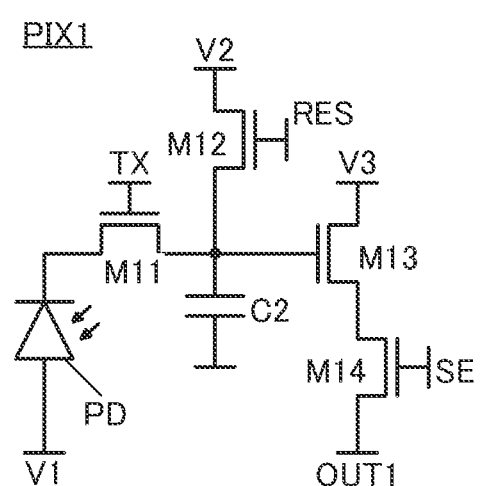
FIG. 34G and FIG. 34H are diagrams illustrating examples of a circuit diagram of a pixel.
Figure 34H:
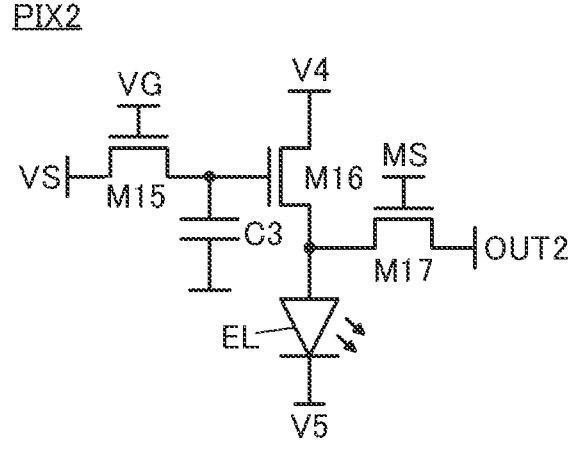

FIG. 34G illustrates an example of a pixel circuit for a subpixel including a light-receiving device. FIG. 34H illustrates an example of a pixel circuit for a subpixel including a light-emitting device.

A pixel circuit PIX1 illustrated in FIG. 34G includes a light-receiving device PD, a transistor M11, a transistor M12, a transistor M13, a transistor M14, and a capacitor C2. Here, a photodiode is used as an example of the light-receiving device PD.

An anode of the light-receiving device PD is electrically connected to a wiring V1, and a cathode of the light-receiving device PD is electrically connected to one of a source and a drain of the transistor M11. A gate of the transistor M11 is electrically connected to a wiring TX, and the other of the source and the drain of the transistor M11 is electrically connected to one electrode of the capacitor C2, one of a source and a drain of the transistor M12, and a gate of the transistor M13. A gate of the transistor M12 is electrically connected to a wiring RES, and the other of the source and the drain of the transistor M12 is electrically connected to a wiring V2. One of a source and a drain of the transistor M13 is electrically connected to a wiring V3, and the other of the source and the drain of the transistor M13 is electrically connected to one of a source and a drain of the transistor M14. A gate of the transistor M14 is electrically connected to a wiring SE, and the other of the source and the drain of the transistor M14 is electrically connected to a wiring OUT1.

A constant potential is supplied to the wiring V1, the wiring V2, and the wiring V3. When the light-receiving device PD is driven with a reverse bias, the wiring V2 is supplied with a potential higher than the potential of the wiring V1. The transistor M12 is controlled by a signal supplied to the wiring RES and has a function of resetting the potential of a node connected to the gate of the transistor M13 to a potential supplied to the wiring V2. The transistor M11 is controlled by a signal supplied to the wiring TX and has a function of controlling the timing at which the potential of the node changes, in accordance with current flowing through the light-receiving device PD. The transistor M13 functions as an amplifier transistor for performing output corresponding to the potential of the node. The transistor M14 is controlled by a signal supplied to the wiring SE and functions as a selection transistor for reading an output corresponding to the potential of the node by an external circuit connected to the wiring OUT1.

A pixel circuit PIX2 illustrated in FIG. 34H includes a light-emitting device EL, a transistor M15, a transistor M16, a transistor M17, and a capacitor C3. Here, a light-emitting diode is used as an example of the light-emitting device EL. In particular, an organic EL element is preferably used as the light-emitting device EL.

A gate of the transistor M15 is electrically connected to a wiring VG, one of a source and a drain of the transistor M15 is electrically connected to a wiring VS, and the other of the source and the drain of the transistor M15 is electrically connected to one electrode of the capacitor C3 and a gate of the transistor M16. One of a source and a drain of the transistor M16 is electrically connected to a wiring V4, and the other of the source and the drain of the transistor M16 is electrically connected to an anode of the light-emitting device EL and one of a source and a drain of the transistor M17. A gate of the transistor M17 is electrically connected to a wiring MS, and the other of the source and the drain of the transistor M17 is electrically connected to a wiring OUT2. A cathode of the light-emitting device EL is electrically connected to a wiring V5.

A constant potential is supplied to the wiring V4 and the wiring V5. The anode of the light-emitting device EL can be set to a high potential, and the cathode can be set to a lower potential than the anode. The transistor M15 is controlled by a signal supplied to the wiring VG and functions as a selection transistor for controlling a selection state of the pixel circuit PIX2. The transistor M16 functions as a driving transistor that controls current flowing through the light-emitting device EL in accordance with a potential supplied to the gate of the transistor M16. When the transistor M15 is on, a potential supplied to the wiring VS is supplied to the gate of the transistor M16, and the luminance of the light-emitting device EL can be controlled in accordance with the potential. The transistor M17 is controlled by a signal supplied to the wiring MS and has a function of outputting a potential between the transistor M16 and the light-emitting device EL to the outside through the wiring OUT2.

Here, transistors in which a metal oxide (an oxide semiconductor) is used in a semiconductor layer where a channel is formed are preferably used as the transistor M11, the transistor M12, the transistor M13, and the transistor M14 included in the pixel circuit PIX1 and the transistor M15, the transistor M16, and the transistor M17 included in the pixel circuit PIX2.

A transistor using a metal oxide having a wider band gap and a lower carrier density than silicon achieves an extremely low off-state current. Therefore, owing to the low off-state current, charge accumulated in a capacitor that is connected in series to the transistor can be retained for a long time. Hence, it is particularly preferable to use transistors containing an oxide semiconductor as the transistor M11, the transistor M12, and the transistor M15 each of which is connected in series with the capacitor C2 or the capacitor C3. Moreover, the use of transistors using an oxide semiconductor as the other transistors can reduce the manufacturing cost.

For example, the off-state current per micrometer of channel width of an OS transistor at room temperature can be lower than or equal to 1 aA ($1 \times 10^{-18}$ A), lower than or equal to 1 zA ($1 \times 10^{-21}$ A), or lower than or equal to 1 yA ($1 \times 10^{-24}$ A). Note that the off-state current per micrometer of channel width of a Si transistor at room temperature is higher than or equal to 1 fA ($1 \times 10^{-15}$ A) and lower than or equal to 1 pA ($1 \times 10^{-12}$ A). In other words, the off-state current of an OS transistor is lower than that of a Si transistor by approximately ten orders of magnitude.

Alternatively, transistors using silicon as a semiconductor where a channel is formed can be used as the transistor M11 to the transistor M17. It is particularly preferable to use silicon with high crystallinity, such as single crystal silicon or polycrystalline silicon, because high field-effect mobility can be achieved and higher-speed operation can be performed.

Alternatively, a transistor containing an oxide semiconductor may be used as at least one of the transistor M11 to the transistor M17, and transistors containing silicon may be used as the other transistors.

Although n-channel transistors are illustrated in FIG. 34G and FIG. 34H, p-channel transistors can alternatively be used.

The transistors included in the pixel circuit PIX1 and the transistors included in the pixel circuit PIX2 are preferably formed side by side over the same substrate. It is particularly preferable that the transistors included in the pixel circuit PIX1 and the transistors included in the pixel circuit PIX2 be periodically arranged in one region.

One or more layers including the transistor and/or the capacitor are preferably provided to overlap with the light-receiving device PD or the light-emitting device EL. Thus, the effective area of each pixel circuit can be reduced, and a light-receiving portion or display portion with high resolution can be achieved.

The refresh rate can be variable in the display apparatus of one embodiment of the present invention. For example, the refresh rate can be adjusted in accordance with the contents displayed on the display apparatus (e.g., adjusted in the range from 0.01 Hz to 240 Hz inclusive), whereby power consumption can be reduced. The driving with a lowered refresh rate for reducing power consumption of a display apparatus may be referred to as idling stop (IDS) driving.

The driving frequency of the touch sensor or the near touch sensor may be changed in accordance with the refresh rate. For example, when the refresh rate of the display apparatus is 120 Hz, the driving frequency of the touch sensor or the near touch sensor can be higher than 120 Hz (can typically be 240 Hz). With this structure, low power consumption can be achieved, and the response speed of the touch sensor or the near touch sensor can be increased.

At least part of any of the structure examples, the drawings corresponding thereto, and the like described in this embodiment can be implemented in combination with any of the other structure examples, the other drawings, and the like as appropriate.

At least part of this embodiment can be implemented in combination with the other embodiments described in this specification as appropriate.

Embodiment 7

In this embodiment, a high-resolution display apparatus will be described.
[Structure Example of Display Panel]

Wearable electronic apparatuses for VR, AR, and the like can provide 3D images by using parallax. In that case, it is necessary to display an image for the right eye in the right eye's field of view and display an image for the left eye in the left eye's field of view. Although the shape of a display portion in a display apparatus may be a horizontal rectangular shape, pixels provided outside the range of vision of both eyes do not contribute to display, and thus black is always displayed in these pixels.

In view of the above, it is preferred that a display portion of a display panel be divided into two regions for the right eye and for the left eye, and that pixels not be provided in an outer region which does not contribute to display. Hence, power consumption needed for writing to pixels can be reduced. Moreover, loads on source lines, gate lines, and the like are reduced, so that display with a high frame rate is possible. Consequently, smooth moving images can be displayed, which improves sense of reality.

Figures 35A, 35B, 35C, 35D, 35E, 35F, 35G, 35H, 35I, 35J:
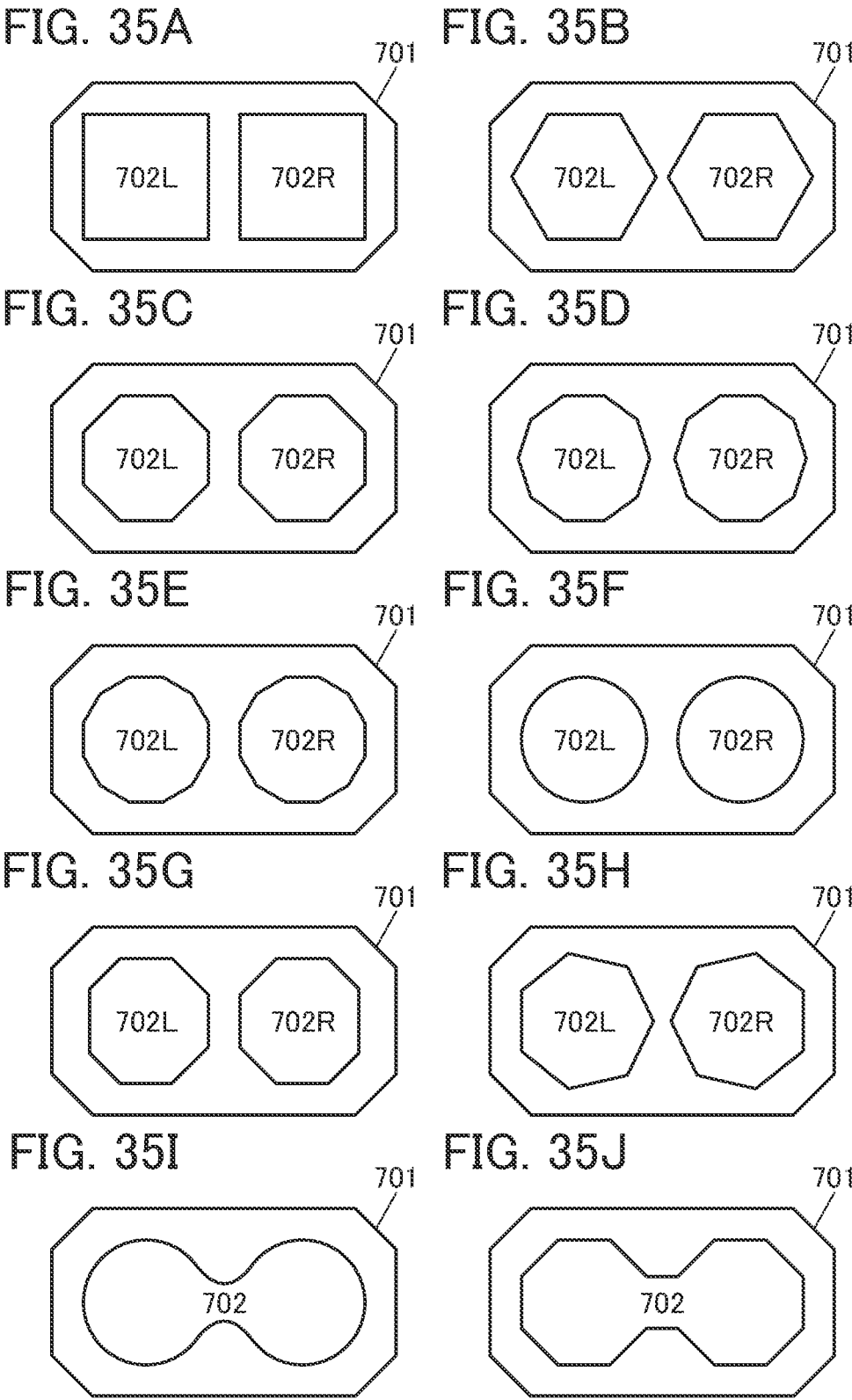
FIG. 35A to FIG. 35J are diagrams illustrating structure examples of a display apparatus.

FIG. 35A illustrates a structure example of a display panel. In FIG. 35A, a display portion 702L for the left eye and a display portion 702R for the right eye are provided inward from a substrate 701. Note that in addition to the display portion 702L and the display portion 702R, a driver circuit, a wiring, an IC, an FPC, or the like may be provided over the substrate 701.

The display portion 702L and the display portion 702R illustrated in FIG. 35A have a square top surface shape.

The top surface shapes of the display portion 702L and the display portion 702R may be other regular polygons. FIG. 35B illustrates an example in which the top surface shape is a regular hexagon; FIG. 35C illustrates an example in which the top surface shape is a regular octagon; FIG. 35D illustrates an example in which the top surface shape is a regular decagon; and FIG. 35E illustrates an example in which the top surface shape is a regular dodecagon. When a polygon with even-numbered corners is used as above, the shape of the display portion can be bilaterally symmetrical. Note that a polygon that is not a regular polygon may be used. Moreover, a regular polygon or a polygon with rounded corners may be used.

Since the display portion consists of pixels arranged in a matrix, a linear portion of the outline of the display portion is not strictly a straight line and can be partly a stair-like portion. In particular, a linear portion that is not parallel to the direction of pixel arrangement has a stair-like top surface shape. Since the user watches images without perceiving the shape of the pixels, a tilted outline, which is stair-like to be exact, of the display portion can be regarded as a straight line. Similarly, a curved portion, which is stair-like to be exact, of the outline of the display portion can be regarded as a curve.

FIG. 35F illustrates an example in which the top surface shapes of the display portion 702L and the display portion 702R are circular.

The top surface shapes of the display portion 702L and the display portion 702R may be bilaterally asymmetrical. Moreover, the top surface shapes may not necessarily be regular polygonal.

FIG. 35G illustrates an example in which the top surface shapes of the display portion 702L and the display portion 702R are bilaterally asymmetric octagonal. FIG. 35H illustrates an example in which the top surface shape is regular heptagonal. Even when the top surface shapes of the display portion 702L and the display portion 702R have a bilaterally asymmetrical shape in this manner, the display portion 702L and the display portion 702R are preferably arranged bilaterally symmetrically. Consequently, an image with no unnaturalness can be provided.

Although the structures where the display portion is divided into two are described above, the display portions may have a continuous shape.

FIG. 35I illustrates an example in which the two circular display portions 702 in FIG. 35F are connected. FIG. 35J illustrates an example in which the two regular octagonal display portions 702 in FIG. 35C are connected.

The above is the description of the structure examples of the display panel.

At least part of the structure examples, the drawings corresponding thereto, and the like described in this embodiment as an example can be combined with the other structure examples, the other drawings, and the like as appropriate.

At least part of this embodiment can be implemented in combination with the other embodiments described in this specification as appropriate.

Embodiment 8

In this embodiment, a metal oxide that can be used in the OS transistor described in the above embodiment will be described.

A metal oxide used in an OS transistor preferably contains at least indium or zinc, and further preferably contains indium and zinc. The metal oxide preferably contains indium, M(M is one or more of gallium, aluminum, yttrium, tin, silicon, boron, copper, vanadium, beryllium, titanium, iron, nickel, germanium, zirconium, molybdenum, lanthanum, cerium, neodymium, hafnium, tantalum, tungsten, magnesium, and cobalt), and zinc, for example. In particular, M is preferably one or more kinds selected from gallium, aluminum, yttrium, and tin, and M is further preferably gallium.

The metal oxide can be formed by a sputtering method, a CVD method such as an MOCVD method, or an ALD method.

Hereinafter, an oxide containing indium (In), gallium (Ga), and zinc (Zn) is described as an example of the metal oxide. Note that an oxide containing indium (In), gallium (Ga), and zinc (Zn) may be referred to as an In—Ga—Zn oxide.

<Classification of Crystal Structure>

Amorphous (including a completely amorphous structure), CAAC (c-axis-aligned crystalline), nc (nanocrystalline), CAC (cloud-aligned composite), single-crystal, and polycrystalline (poly crystal) structures can be given as examples of a crystal structure of an oxide semiconductor.

Note that the crystal structure of a film or a substrate can be evaluated with an X-ray diffraction (XRD) spectrum. For example, evaluation is possible using an XRD spectrum that is obtained by GIXD (Grazing-Incidence XRD) measurement. Note that a GIXD method is also referred to as a thin film method or a Seemann-Bohlin method. Hereinafter, an XRD spectrum obtained from GIXD measurement is simply referred to as an XRD spectrum in some cases.

For example, the XRD spectrum of a quartz glass substrate shows a peak with a substantially bilaterally symmetrical shape. On the other hand, the peak of the XRD spectrum of the In—Ga—Zn oxide film having a crystal structure has a bilaterally asymmetrical shape. The bilaterally asymmetrical peak of the XRD spectrum clearly shows the existence of crystal in the film or the substrate. In other words, the crystal structure of the film or the substrate cannot be regarded as an amorphous state unless it has a bilaterally symmetrical peak in the XRD spectrum.

In addition, the crystal structure of a film or a substrate can also be evaluated with a diffraction pattern obtained by a nanobeam electron diffraction method (NBED) (such a pattern is also referred to as a nanobeam electron diffraction pattern). For example, a halo pattern is observed in the diffraction pattern of the quartz glass substrate, which indicates that the quartz glass substrate is in an amorphous state. Furthermore, not a halo pattern but a spot-like pattern is observed in the diffraction pattern of the In—Ga—Zn oxide film formed at room temperature. Thus, it is presumed that the In—Ga—Zn oxide film formed at room temperature is in an intermediate state, which is neither a single crystal or polycrystalline state nor an amorphous state, and that it cannot be concluded that the In—Ga—Zn oxide film is in an amorphous state.

<<Structure of Oxide Semiconductor>>

Note that oxide semiconductors might be classified in a manner different from the above-described one when classified in terms of the structure. Oxide semiconductors are classified into a single crystal oxide semiconductor and a non-single-crystal oxide semiconductor, for example. Examples of the non-single-crystal oxide semiconductor include the above-described CAAC-OS and nc-OS. Other examples of the non-single-crystal oxide semiconductor include a polycrystalline oxide semiconductor, an amorphous-like oxide semiconductor (a-like OS), and an amorphous oxide semiconductor.

Here, the above-described CAAC-OS, nc-OS, and a-like OS are described in detail.

[CAAC-OS]

The CAAC-OS is an oxide semiconductor that has a plurality of crystal regions each of which has c-axis alignment in a particular direction. Note that the particular direction refers to the thickness direction of a CAAC-OS film, the normal direction of a surface where the CAAC-OS film is formed, or the normal direction of the surface of the CAAC-OS film. The crystal region refers to a region having a periodic atomic arrangement. Note that when an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that distortion refers to a portion where the orientation of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more fine crystals (crystals each of which has a maximum diameter of less than 10 nm). In the case where the crystal region is formed of one minute crystal, the maximum diameter of the crystal region is less than 10 nm. In the case where the crystal region is formed of a large number of minute crystals, the size of the crystal region may be approximately several tens of nanometers.

In the case of an In—Ga—Zn oxide, the CAAC-OS tends to have a layered crystal structure (also referred to as a layered structure) in which a layer containing indium (In) and oxygen (hereinafter, an In layer) and a layer containing gallium (Ga), zinc (Zn), and oxygen (hereinafter, a (Ga,Zn) layer) are stacked. Indium and gallium can be replaced with each other. Therefore, indium may be contained in the (Ga,Zn) layer. In addition, gallium may be contained in the In layer. Note that zinc may be contained in the In layer. Such a layer-shaped structure is observed as a lattice image in a high-resolution TEM (Transmission Electron Microscope) image, for example.

When the CAAC-OS film is subjected to structural analysis by out-of-plane XRD measurement with an XRD apparatus using θ/2θ scanning, for example, a peak indicating c-axis alignment is detected at 2θ of 31° or around 31°. Note that the position of the peak indicating c-axis alignment (the value of 2θ) may change depending on the kind, composition, or the like of the metal element contained in the CAAC-OS.

For example, a plurality of bright spots are observed in the electron diffraction pattern of the CAAC-OS film. Note that one spot and another spot are observed point-symmetrically with a spot of an incident electron beam passing through a sample (also referred to as a direct spot) as a symmetric center.

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, or the like is included in the distortion in some cases. Note that a clear crystal grain boundary (also referred to as grain boundary) cannot be observed even in the vicinity of the distortion in the CAAC-OS. That is, formation of a crystal grain boundary is inhibited by the distortion of lattice arrangement. This is probably because the CAAC-OS can tolerate distortion owing to a low density of arrangement of oxygen atoms in the a-b plane direction, an interatomic bond distance changed by substitution of a metal atom, and the like.

Note that a crystal structure in which a clear crystal grain boundary is observed is what is called polycrystal. It is highly probable that the grain boundary becomes a recombination center and traps carriers and thus decreases the on-state current, field-effect mobility, or the like of a transistor. Thus, the CAAC-OS in which no clear crystal grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a crystal grain boundary as compared with an In oxide.

The CAAC-OS is an oxide semiconductor with high crystallinity in which no clear crystal grain boundary is observed. Thus, in the CAAC-OS, a reduction in electron mobility due to the crystal grain boundary is unlikely to occur. Moreover, since the crystallinity of an oxide semiconductor might be decreased by entry of impurities, formation of defects, or the like, the CAAC-OS can be regarded as an oxide semiconductor that has small amounts of impurities and defects (e.g., oxygen vacancies). Thus, an oxide semiconductor including the CAAC-OS is physically stable. Therefore, the oxide semiconductor including the CAAC-OS is resistant to heat and has high reliability. In addition, the CAAC-OS is stable with respect to high temperatures in the manufacturing process (what is called thermal budget). Accordingly, the use of the CAAC-OS for the OS transistor can extend the degree of freedom of the manufacturing process.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a minute crystal. Note that the size of the minute crystal is, for example, greater than or equal to 1 nm and less than or equal to 10 nm, particularly greater than or equal to 1 nm and less than or equal to 3 nm; thus, the minute crystal is also referred to as a nanocrystal. Furthermore, there is no regularity of crystal orientation between different nanocrystals in the nc-OS. Thus, the orientation in the whole film is not observed. Accordingly, in some cases, the nc-OS cannot be distinguished from an a-like OS or an amorphous oxide semiconductor, depending on the analysis method. For example, when an nc-OS film is subjected to structural analysis by out-of-plane XRD measurement with an XRD apparatus using θ/2θ scanning, a peak indicating crystallinity is not detected. Furthermore, a diffraction pattern like a halo pattern is observed when the nc-OS film is subjected to electron diffraction (also referred to as selected-area electron diffraction) using an electron beam with a probe diameter larger than the diameter of a nanocrystal (e.g., larger than or equal to 50 nm). Meanwhile, in some cases, a plurality of spots in a ring-like region with a direct spot as the center are observed in the obtained electron diffraction pattern when the nc-OS film is subjected to electron diffraction (also referred to as nanobeam electron diffraction) using an electron beam with a probe diameter nearly equal to or smaller than the diameter of a nanocrystal (e.g., 1 nm or larger and 30 nm or smaller).

[a-Like OS]

The a-like OS is an oxide semiconductor having a structure between those of the nc-OS and the amorphous oxide semiconductor. The a-like OS contains a void or a low-density region. That is, the a-like OS has low crystallinity as compared with the nc-OS and the CAAC-OS. Moreover, the a-like OS has a higher hydrogen concentration in the film than the nc-OS and the CAAC-OS.

<<Structure of Oxide Semiconductor>>

Next, the above-described CAC-OS will be described in detail. Note that the CAC-OS relates to the material composition.

[CAC-OS]

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Here, the atomic ratios of In, Ga, and Zn to the metal elements contained in the CAC-OS in an In—Ga—Zn oxide are denoted by [In], [Ga], and [Zn], respectively. For example, the first region in the CAC-OS in the In—Ga—Zn oxide is a region having [In] higher than [In] in the composition of the CAC-OS film. Moreover, the second region is a region having [Ga] higher than [Ga] in the composition of the CAC-OS film. Alternatively, for example, the first region has higher [In] and lower [Ga] than the second region. Moreover, the second region is a region having [Ga] higher than [Ga] in the first region and [In] lower than [In] in the first region.

Specifically, the first region includes indium oxide and indium zinc oxide as its main component. The second region includes gallium oxide and gallium zinc oxide as its main component. That is, the first region can be rephrased as a region containing In as its main component. The second region can be rephrased as a region containing Ga as its main component.

Note that a clear boundary between the first region and the second region cannot be observed in some cases.

In addition, in a material composition of a CAC-OS in an In—Ga—Zn oxide that contains In, Ga, Zn, and O, there are regions containing Ga as a main component in part of the CAC-OS and regions containing In as a main component in another part of the CAC-OS. These regions each form a mosaic pattern and are randomly present. Thus, it is suggested that the CAC-OS has a structure in which metal elements are unevenly distributed.

The CAC-OS can be formed by a sputtering method under a condition where a substrate is intentionally not heated, for example. Furthermore, in the case where the CAC-OS is formed by a sputtering method, any one or more selected from an inert gas (typically, argon), an oxygen gas, and a nitrogen gas is used as a deposition gas. The ratio of the flow rate of an oxygen gas to the total flow rate of the deposition gas during deposition is preferably as low as possible. For example, the flow-rate proportion of an oxygen gas in the total deposition gas is preferably higher than or equal to 0% and lower than 30%, further preferably higher than or equal to 0% and lower than or equal to 10%.

For example, energy dispersive X-ray spectroscopy (EDX) is used to obtain EDX mapping, and according to the EDX mapping, the CAC-OS in the In—Ga—Zn oxide has a structure in which the region containing In as its main component (the first region) and the region containing Ga as its main component (the second region) are unevenly distributed and mixed.

Here, the first region has higher conductivity than the second region. In other words, when carriers flow through the first region, the conductivity of a metal oxide is exhibited. Accordingly, when the first regions are distributed in a metal oxide like a cloud, high field-effect mobility ($\mu$) can be achieved.

The second region has a higher insulating property than the first region. In other words, when the second regions are distributed in a metal oxide, leakage current can be inhibited.

Thus, in the case where a CAC-OS is used for a transistor, by the complementary action of the conductivity due to the first region and the insulating property due to the second region, the CAC-OS can have a switching function (On/Off function). That is, the CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, high on-state current ($I_{on}$), high field-effect mobility ($\mu$), and excellent switching operation can be achieved.

A transistor using the CAC-OS has high reliability. Thus, the CAC-OS is most suitable for a variety of semiconductor apparatuses such as a display apparatus.

An oxide semiconductor has various structures with different properties. Two or more kinds among an amorphous oxide semiconductor, a polycrystalline oxide semiconductor, an a-like OS, a CAC-OS, an nc-OS, and a CAAC-OS may be included in an oxide semiconductor of one embodiment of the present invention.

<Transistor Containing Oxide Semiconductor>

Next, the case where the above oxide semiconductor is used for a transistor will be described.

When the above oxide semiconductor is used for a transistor, a transistor with high field-effect mobility can be achieved. In addition, a transistor having high reliability can be achieved.

An oxide semiconductor having a low carrier concentration is preferably used in a transistor. For example, the carrier concentration of an oxide semiconductor is lower than or equal to $1\times10^{17}$ cm$^{-3}$, preferably lower than or equal to $1\times10^{15}$ cm$^{-3}$, further preferably lower than or equal to $1\times10^{13}$ cm$^{-3}$, still further preferably lower than or equal to $1\times10^{11}$ cm$^{-3}$, yet further preferably lower than $1\times10^{10}$ cm$^{-3}$, and higher than or equal to $1\times10^{-9}$ cm$^{-3}$. In order to reduce the carrier concentration of an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor having a low carrier concentration is sometimes referred to as a highly purified intrinsic or substantially highly purified intrinsic oxide semiconductor.

A highly purified intrinsic or substantially highly purified intrinsic oxide semiconductor film has a low density of defect states and thus also has a low density of trap states in some cases.

Charge trapped by the trap states in the oxide semiconductor takes a long time to disappear and might behave like fixed charge. Thus, a transistor whose channel formation region is formed in an oxide semiconductor with a high density of trap states has unstable electrical characteristics in some cases.

Accordingly, in order to obtain stable electrical characteristics of a transistor, reducing the impurity concentration in an oxide semiconductor is effective. In order to reduce the impurity concentration in the oxide semiconductor, it is preferable that the impurity concentration in an adjacent film be also reduced. Examples of impurities include hydrogen, nitrogen, an alkali metal, an alkaline earth metal, iron, nickel, and silicon. Note that an impurity in an oxide semiconductor refers to, for example, elements other than the main components of the oxide semiconductor. For example, an element with a concentration lower than 0.1 atomic % can be regarded as an impurity.

<Impurity>

Here, the influence of each impurity in the oxide semiconductor will be described.

When silicon or carbon, which is a Group 14 element, is contained in an oxide semiconductor, defect states are formed in the oxide semiconductor. Thus, the concentration of silicon or carbon in the oxide semiconductor and the concentration of silicon or carbon in the vicinity of an interface with the oxide semiconductor (the concentration obtained by secondary ion mass spectrometry (SIMS)) are each set lower than or equal to $2 \times 10^{18}$ atoms/cm$^3$, preferably lower than or equal to $2 \times 10^{17}$ atoms/cm$^3$.

When the oxide semiconductor contains an alkali metal or an alkaline earth metal, defect states are formed and carriers are generated in some cases. Thus, a transistor using an oxide semiconductor that contains an alkali metal or an alkaline earth metal is likely to have normally-on characteristics. Thus, the concentration of an alkali metal or an alkaline earth metal in the oxide semiconductor, which is obtained by SIMS, is set lower than or equal to $1 \times 10^{18}$ atoms/cm$^3$, preferably lower than or equal to $2 \times 10^{16}$ atoms/cm$^3$.

Furthermore, when the oxide semiconductor contains nitrogen, the oxide semiconductor easily becomes n-type by generation of electrons serving as carriers and an increase in carrier concentration. As a result, a transistor using an oxide semiconductor containing nitrogen as a semiconductor is likely to have normally-on characteristics. Alternatively, when nitrogen is contained in the oxide semiconductor, a trap state is sometimes formed. This might make the electrical characteristics of the transistor unstable. Therefore, the concentration of nitrogen in the oxide semiconductor, which is obtained by SIMS, is set lower than $5 \times 10^{19}$ atoms/cm$^3$, preferably lower than or equal to $5 \times 10^{18}$ atoms/cm$^3$, further preferably lower than or equal to $1 \times 10^{18}$ atoms/cm$^3$, still further preferably lower than or equal to $5 \times 10^{17}$ atoms/cm$^3$.

Hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom causes generation of an electron serving as a carrier in some cases. Thus, a transistor using an oxide semiconductor containing hydrogen is likely to have normally-on characteristics. For this reason, hydrogen in the oxide semiconductor is preferably reduced as much as possible. Specifically, the concentration of hydrogen in the oxide semiconductor, which is measured by SIMS, is lower than $1 \times 10^{20}$ atoms/cm$^3$, preferably lower than $1 \times 10^{19}$ atoms/cm$^3$, further preferably lower than $5 \times 10^{18}$ atoms/cm$^3$, still further preferably lower than $1 \times 10^{18}$ atoms/cm$^3$.

When an oxide semiconductor with sufficiently reduced impurities is used for the channel formation region of the transistor, stable electrical characteristics can be given.

At least part of any of the structure examples, the drawings corresponding thereto, and the like described in this embodiment can be implemented in combination with any of the other structure examples, the other drawings corresponding thereto, and the like as appropriate.

At least part of this embodiment can be implemented in combination with the other embodiments described in this specification as appropriate.

Embodiment 9

In this embodiment, electronic apparatuses each including a display apparatus of one embodiment of the present invention will be described.

The display apparatus of one embodiment of the present invention is a display apparatus capable of displaying an image overlapping with the background, which is what is called a see-through display. Furthermore, the display apparatus of one embodiment of the present invention has an image capturing function. Thus, the display apparatus of one embodiment of the present invention can have a function of a touch sensor and a function of performing biometric authentication, for example. Furthermore, the display apparatus of one embodiment of the present invention can perform display with high luminance, high definition, high contrast, and high resolution, and has low power consumption and high reliability.

The display apparatus of one embodiment of the present invention can be used for a digital camera, a digital video camera, a digital photo frame, a mobile phone, a portable game console, a portable information terminal, and an audio reproducing device, in addition to electronic apparatuses with a relatively large screen, such as a television device, a desktop or notebook personal computer, a monitor of a computer, digital signage, and a large game machine such as a pachinko machine, for example.

Alternatively, the display apparatus of one embodiment of the present invention can have a high resolution, and thus can be suitably used for an electronic apparatus having a relatively small display portion. Examples of such an electronic apparatus include information terminals (wearable devices) such as watch-type and bracelet-type information terminals and a VR device such as a head-mounted display, a glasses-type AR device, and the like and wearable devices capable of being worn on a head, and the like. Examples of wearable devices include a device for SR and a device for MR.

The display apparatus of this embodiment or the electronic apparatus including the display apparatus can be incorporated along a curved surface of an inside wall or an outside wall of a house or a building or the interior or the exterior of an automobile.

In particular, the display apparatus of one embodiment of the present invention can perform see-through display, so that the display apparatus can be provided in a transparent structure such as a glass pane, a showcase, a glass door, or a show window, or the structure can be replaced with the display apparatus.

Figure 36A:
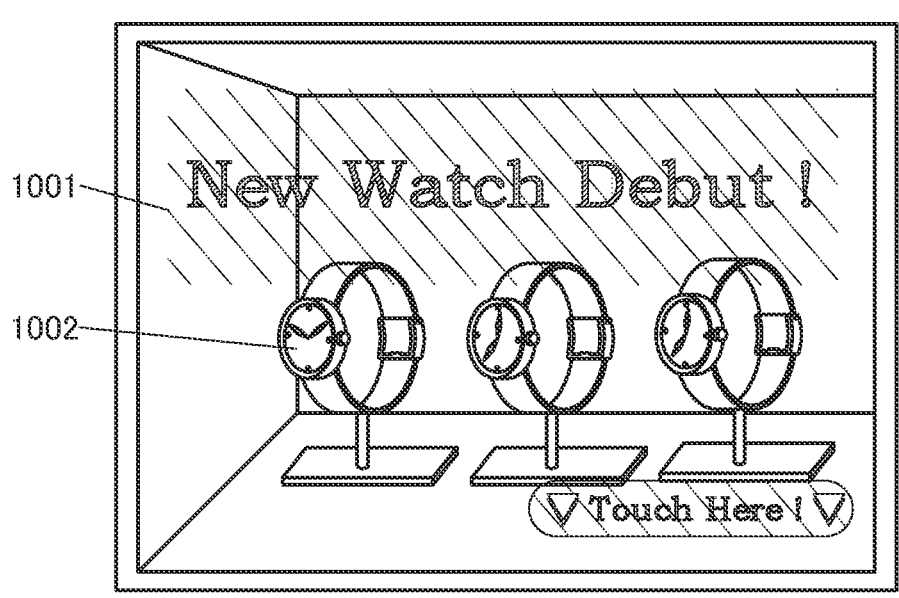
FIG. 36A and FIG. 36B are diagrams illustrating application examples of a display apparatus.

FIG. 36A illustrates an example in which the display apparatus of one embodiment of the present invention is used in a showcase displaying products. FIG. 36A illustrates a display portion 1001 functioning as a show window capable of displaying an image. The display apparatus of one embodiment of the present invention is used in the display portion 1001. There is a space behind the display portion 1001 where products 1002 (here, wristwatches) are displayed. Customers can see the products 1002 through the display portion 1001.

A still image or a video can be displayed on the display portion 1001. In addition, a speaker that outputs sound may be provided. In FIG. 36A, an image including the letters "New Watch Debut!" is displayed as an advertising slogan for a new product.

The display portion 1001 can have a function of a touch sensor. A customer can operate the display portion 1001 so that detailed information of the product 1002, product line-ups, related information, and the like can be displayed on the display portion 1001. By touching the portion displaying "Touch Here!" in FIG. 36A, a product introduction video can be displayed with sound, for example.

Furthermore, a customer can access a website for purchasing a product by reading a two-dimensional code that is displayed on the display portion 1001 with his or her smartphone or the like. In this manner, a customer can purchase a product with simple operation.

Glass that is not easily broken such as tempered glass or bulletproof glass is preferably used for the display portion 1001. Alternatively, the display apparatus may be attached to the glass. This can prevent the products 1002 from being stolen.

Figure 36B:
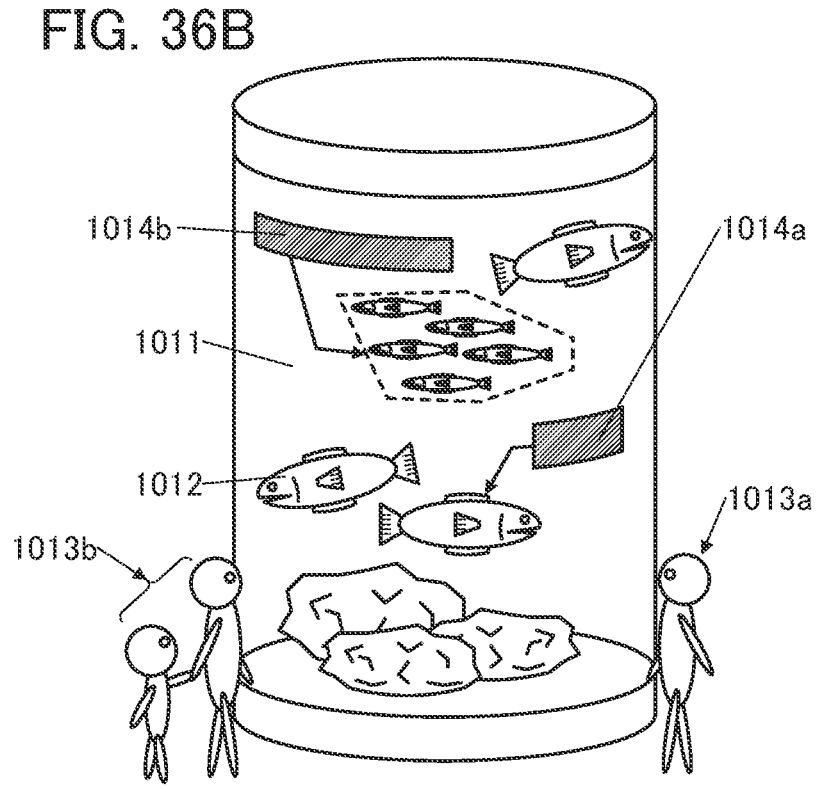

FIG. 36B is an example in which the display apparatus of one embodiment of the present invention is used for an aquarium. FIG. 36B illustrates a cylindrical display portion 1011 that is capable of displaying an image. The display apparatus of one embodiment of the present invention is used in the display portion 1011. A space behind the display portion 1011 is the aquarium and a customer 1013a, customers 1013b, and the like can see a fish 1012 through the display portion 1011.

For example, the display portion 1011 can display information related to a fish a customer is watching. FIG. 36B illustrates an example in which information 1014a for the customer 1013a and information 1014b for the customers 1013b are displayed.

The standing position, the height of the eyes, the direction of the line of sight, and the like of the customer 1013a and the customers 1013b can be detected and the position of the information displayed on the display portion 1011 can be controlled on the basis of the detected information. Thus, an image can be displayed in an optimal position that suits the positional relationship between the line of sight of the customer and the fish behind the display portion 1011.

The display portion 1011 can have a function of a touch sensor. Application software for a smartphone can also be used to operate an image displayed on the display portion 1011 of the aquarium. Information displayed on the display portion 1011 can be operated by operating the display portion 1011 by touch operation, by a smartphone, or the like. Ordering, reserving, placing on hold, or the like for a product from a souvenir store of a facility can be requested from the display portion 1011. Furthermore, reserving a seat, ordering, ordering take-out products, requesting a gift on back order, or the like for a restaurant of a facility is also possible.

Figure 37:
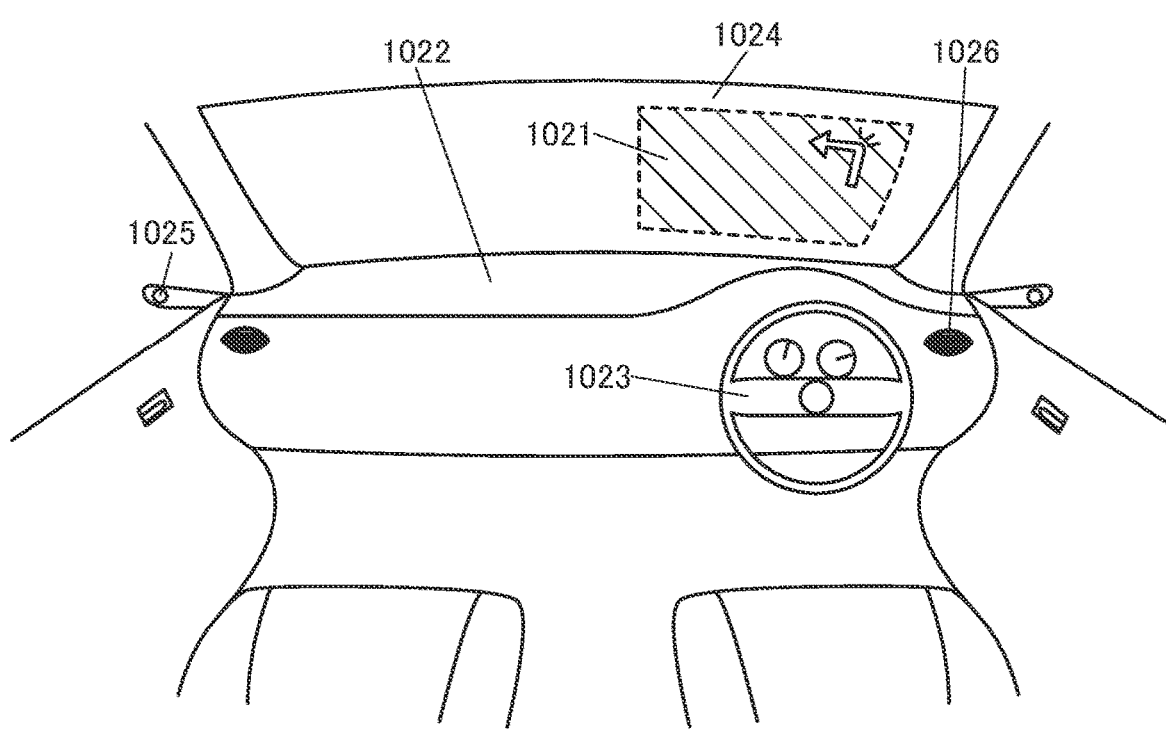
FIG. 37 is a diagram illustrating an application example of a display apparatus.

FIG. 37 illustrates a structure example of a vehicle equipped with a display portion 1021. The display apparatus of one embodiment of the present invention is used in the display portion 1021. Note that although in the example illustrated in FIG. 37, the display portion 1021 is installed in, but not limited to, a right-hand drive vehicle; installation in a left-hand drive vehicle is also possible. In that case, the left and right of the components arranged in FIG. 37 are reversed.

FIG. 37 illustrates a dashboard 1022, a wheel 1023, a windshield 1024, and the like that are arranged around a driver's seat and a front passenger seat. An air outlet 1026 is provided in the dashboard 1022.

The display portion 1021 is provided on the side of the windshield 1024 that faces the driver's seat. The driver can drive while seeing the outside view from the window through the display portion 1021.

The display portion 1021 can display a variety of information related to driving. For example, map information, navigation information, the weather, the temperature, the air pressure, and an image of an in-vehicle camera can be given. In the case of an autonomous car, the driver does not necessarily have to drive, and thus a variety of images that are not related to driving such as image contents can also be displayed.

In addition, a plurality of cameras 1025 that take pictures of the situations at the rear side may be provided outside the vehicle. Although the camera 1025 is provided instead of a side mirror in the example in FIG. 37, both the side mirror and the camera may be provided.

As the camera 1025, a CCD camera, a CMOS camera, or the like can be used. In addition, an infrared camera may be used in combination with such a camera. The infrared camera, which has a higher output level with a higher temperature of an object, can detect or extract a living body such as a human or an animal.

An image captured with the camera 1025 can be output to the display portion 1021. This display portion 1021 is mainly used for supporting driving of the vehicle. An image of the situation on the rear side is taken at a wide angle of view by the camera 1025, and the image is displayed on the display portion 1021 so that the driver can see a blind area for avoiding an accident.

The display portion 1021 preferably includes an authentication means. For example, when the driver touches the display portion 1021, the vehicle can perform biometric authentication such as fingerprint authentication or palm print authentication. The vehicle may have a function of setting an environment to meet the driver's preference when the driver is authenticated by biometric authentication. For example, one or more of adjustment of the position of the seat, adjustment of the position of the wheel, adjustment of the position of the camera 1025, setting of brightness, setting of an air conditioner, setting of the speed (frequency) of wipers, volume setting of audio, and reading of the playlist of the audio are preferably performed after authentication. Note that the wheel 1023 may include an authentication means instead of the display portion 1021.

Alternatively, a car can be brought into a state where the car can be driven, e.g., a state where an engine is started after the driver is authenticated by biometric authentication. This is preferable because a key, which is conventionally necessary, is unnecessary.

Figure 38:
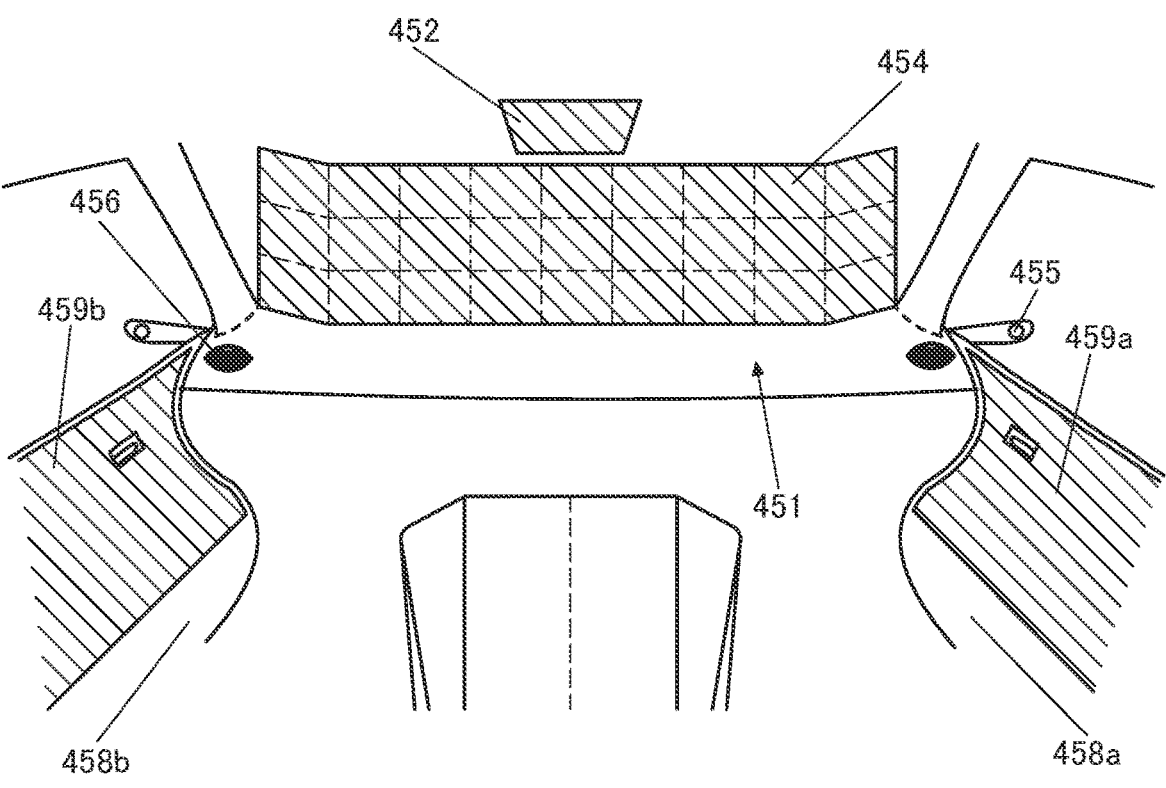
FIG. 38 is a diagram illustrating an application example of a display apparatus.

FIG. 38 is a diagram illustrating a structure example of a vehicle in which the display apparatus of one embodiment of the present invention is used. FIG. 38 illustrates a dashboard 451 placed around a driver's seat, a display apparatus 454 fixed in front of the driver's seat, a camera 455, an air outlet 456, a door 458a, a door 458b, and the like. The display apparatus 454 is provided to extend in front of the driver's seat.

The display apparatus of one embodiment of the present invention can be used as the display apparatus 454 fixed in front of the driver's seat. FIG. 38 illustrates an example in which one display apparatus is illustrated as one display surface, and display apparatuses in three rows and nine columns, which are 27 display apparatuses in total, are combined to form the display apparatus 454. Although a boundary between pixel regions is indicated by a dotted line in FIG. 38, the dotted line is not displayed on an actual display image and a seam is not generated or is less noticeable. The display apparatus 454 can perform a see-through display.

The display apparatus 454 has an image capturing function and thus can have a function of a touch sensor. Furthermore, the display apparatus 454 is preferably able to be operated by gestures with use of a camera that is separately provided, for example.

Although FIG. 38 illustrates a vehicle capable of autonomous driving provided with no wheel (also referred to as steering wheel), the present invention is not limited thereto; a wheel may be provided and the wheel may be provided with a display apparatus having a curved surface. The display apparatus of one embodiment of the present invention can be used for the display apparatus.

In addition, a plurality of cameras 455 that take pictures of the situations at the rear side may be provided outside the vehicle. Although the cameras 455 are provided instead of side mirrors in the example illustrated in FIG. 38, both the side mirrors and the cameras may be provided. As the camera 455, a CCD camera, a CMOS camera, or the like can be used. In addition, an infrared camera may be used in combination with such a camera. The infrared camera, which has a higher output level with a higher temperature of an object, can detect or extract a living body such as a human or an animal.

An image taken by the camera 455 can be output to the display apparatus 454. This display apparatus 454 is mainly used for supporting driving of the vehicle. An image of the situation on the rear side is taken at a wide angle of view by the camera 455, and the image is displayed on the display apparatus 454 so that the driver can see a blind area for avoiding an accident.

Furthermore, a distance image sensor may be provided over a roof of the vehicle, for example, and an image obtained by the distance image sensor may be displayed on the display apparatus 454. For the distance image sensor, an image sensor, LIDAR (Light Detection And Ranging), or the like can be used. An image obtained by the image sensor and the image obtained by the distance image sensor are displayed on the display apparatus 454, whereby more information can be provided to the driver to support driving.

In addition, a display apparatus 452 having a curved surface can be provided inside a roof of the vehicle, that is, in a roof portion, for example. The display apparatus of one embodiment of the present invention can be used in the display apparatus 452.

The display apparatus 452 and the display apparatus 454 may also have a function of displaying map information, traffic information, television images, DVD images, and the like.

The video displayed on the display apparatus 454 can be freely set depending on the driver's preference. For example, television images, DVD images, online videos, or the like can be displayed on an image region on the left side, map information can be displayed on an image region at the center, and meters such as a speed meter and a tachometer can be displayed on an image region on the right side.

In FIG. 38, a display apparatus 459a and a display apparatus 459b are provided along a surface of a door 458a and a surface of a door 458b, respectively. The display apparatus 459a and the display apparatus 459b can each be formed using one or a plurality of display apparatuses. For example, display apparatuses in one row and three columns can be used as one display surface.

The display apparatus 459a and the display apparatus 459b are placed to face each other.

As described above, the display apparatus 454 has an image capturing function. The display apparatus 452, the display apparatus 459a, and the display apparatus 459b can each have an image capturing function.

For example, when the driver touches an image region of at least one of the display apparatus 452, the display apparatus 454, the display apparatus 459a, and the display apparatus 459b, biometric authentication such as fingerprint authentication or palm print authentication can be performed. The vehicle may have a function of setting an environment to meet the driver's preference when the driver is authenticated by biometric authentication. For example, one or more of adjustment of the position of the seat, adjustment of the position of the wheel, adjustment of the direction of the cameras 455, setting of brightness, setting of an air conditioner, setting of the speed (frequency) of wipers, volume setting of audio, reading of the playlist of the audio, and the like are preferably performed after authentication.

Alternatively, a vehicle can be brought into a state where the vehicle can be driven, e.g., a state where an engine is started or a state where an electric vehicle can be started after the driver is authenticated by biometric authentication, which is preferable because a key, which is conventionally necessary, is unnecessary.

Although the display apparatus that surrounds the driver's seat is described here, a display apparatus can be provided to surround also a passenger on a rear seat.

As described above, the structure of one embodiment of the present invention improves flexibility in design of a display apparatus and thus can improve design of the display apparatus.

The display apparatus of one embodiment of the present invention can be suitably used in a vehicle, for example.

At least part of the structure examples, the drawings corresponding thereto, and the like illustrated in this embodiment can be combined with the other structure examples, the other drawings, and the like as appropriate.

At least part of this embodiment can be implemented in combination with the other embodiments described in this specification as appropriate.

REFERENCE NUMERALS

100: display apparatus, 101: substrate, 102: insulating layer, 103: insulating layer, 105: substrate, 106: substrate, 107: display portion, 111B: pixel electrode, 111G: pixel electrode, 111R: pixel electrode, 111S: pixel electrode, 111: pixel electrode, 112B: EL layer, 112Bf EL film, 112f EL film, 112G: EL layer, 112Gf: EL film, 112R: EL layer, 112Rf: EL film, 112: EL layer, 113: connection electrode, 114: common layer, 115: common electrode, 116B: tapered portion, 116G: tapered portion, 116R: tapered portion, 116S: tapered portion, 116: tapered portion, 117: insulating layer, 118: light-blocking layer, 121: protective layer, 123: conductive layer, 125f insulating film, 125: insulating layer, 126f insulating film, 126: insulating layer, 127f insulating film, 127: insulating layer, 128: layer, 129: conductive layer, 130B: light-emitting element, 130G: light-emitting element, 130R: light-emitting element, 130: light-emitting element, 131: conductive layer, 133: region, 135: light, 136B: light, 136G: light, 136: light, 137: light, 138: region, 140: connection portion, 142: adhesive layer, 143a: resist mask, 143b: resist mask, 143c: resist mask, 143d: resist mask, 144a: sacrificial film, 144b: sacrificial film, 144Ba: sacrificial film, 144Bb: sacrificial film, 144Ga: sacrificial film, 144Gb: sacrificial film, 144Ra: sacrificial film, 144Rb: sacrificial film, 144Sa: sacrificial film, 144Sb: sacrificial film, 144: sacrificial film, 145a: sacrificial layer, 145b: sacrificial layer, 145Ba: sacrificial layer, 145Bb: sacrificial layer, 145Ga: sacrificial layer, 145Gb: sacrificial layer, 145Ra: sacrificial layer, 145Rb: sacrificial layer, 145Sa: sacrificial layer, 145Sb: sacrificial layer, 145: sacrificial layer, 146: protective layer, 147f protective film, 147: protective layer, 150: light-receiving element, 155f PD film, 155: PD layer, 164: circuit, 165: wiring, 166: conductive layer, 172: FPC, 173: IC, 200A: display panel, 200B: display panel, 200: display panel, 201: transistor, 202: substrate, 203: functional layer, 204: connection portion, 205: transistor, 207: substrate, 209: transistor, 210: transistor, 211: insulating layer, 212: light-receiving element, 213R: light-emitting and light-receiving element, 213: insulating layer, 215: insulating layer, 216B: light-emitting element, 216G: light-emitting element, 216IR: light-emitting element, 216R: light-emitting element, 216W: light-emitting element, 216X: light-emitting element, 216: light-emitting element, 218: insulating layer, 220: finger, 221: conductive layer, 222a: conductive layer, 222b: conductive layer, 222: fingerprint, 223: conductive layer, 225: insulating layer, 226: path, 227: contact portion, 228: image capturing range, 229: stylus, 231i: channel formation region, 231n: low-resistance region, 231: semiconductor layer, 242: connection layer, 253: substrate, 255: adhesive layer, 262: insulating layer, 370B: light-emitting element, 370G: light-emitting element, 370PD: light-receiving element, 370R: light-emitting element, 370SR: light-emitting and light-receiving element, 371: pixel electrode, 373: active layer, 375: common electrode, 377: first electrode, 378: second electrode, 380A: display apparatus, 380B: display apparatus, 380C: display apparatus, 381: hole-injection layer, 382: hole-transport layer, 383B: light-emitting layer, 383G: light-emitting layer, 383R: light-emitting layer, 383: light-emitting layer, 384: electron-transport layer, 385: electron-injection layer, 389: layer, 451: dashboard, 452: display apparatus, 454: display apparatus, 455: camera, 456: air outlet, 458a: door, 458b: door, 459a: display apparatus, 459b: display apparatus, 500a: display panel, 500b: display panel, 500c: display panel, 500d: display panel, 500: display panel, 501a: display portion, 501b: display portion, 501c: display portion, 501d: display portion, 501: display portion, 510b: region, 510c: region, 510d: region, 510: region, 520b: region, 520c: region, 520: region, 550: display panel, 551: display portion, 600a: display panel, 600b: display panel, 600: display panel, 601a: substrate, 601b: substrate, 618: adhesive layer, 619: adhesive layer, 650: display panel, 701: substrate, 702L: display portion, 702R: display portion, 702: display portion, 1001: display portion, 1002: product, 1011: display portion, 1012: fish, 1013a: customer, 1013b: customer, 1014a: information, 1014b: information, 1021: display portion, 1022: dashboard, 1023: wheel, 1024: windshield, 1025: camera, 1026: air outlet

The invention claimed is:

1. A display apparatus comprising, over a substrate having a visible-light-transmitting property, a first light-emitting element, a second light-emitting element adjacent to the first light-emitting element, a light-receiving element adjacent to the second light-emitting element, a first organic layer provided between the second light-emitting element and the light-receiving element, and a second organic layer provided between the first light-emitting element and the second light-emitting element, wherein the first light-emitting element comprises a first pixel electrode, a first light-emitting layer over the first pixel electrode, and a common electrode over the first light-emitting layer, wherein the second light-emitting element comprises a second pixel electrode, a second light-emitting layer over the second pixel electrode, and the common electrode over the second light-emitting layer, wherein the light-receiving element comprises a third pixel electrode, a photoelectric conversion layer over the third pixel electrode, and the common electrode over the photoelectric conversion layer, wherein the common electrode is provided over the first organic layer and the second organic layer, wherein the common electrode has a visible-light-transmitting property, and wherein transmittance of light with a specific wavelength being at least part of a visible light wavelength through the first organic layer is lower than transmittance of light with the specific wavelength in the second organic layer.

2. The display apparatus according to claim 1, wherein the first and second pixel electrodes have a visible-light-transmitting property.

3. The display apparatus according to claim 1, wherein end portions of the first to third pixel electrodes have a tapered shape, wherein the first light-emitting layer covers the end portion of the first pixel electrode, wherein the second light-emitting layer covers the end portion of the second pixel electrode, and wherein the photoelectric conversion layer covers the end portion of the third pixel electrode.

4. The display apparatus according to claim 3, wherein the first light-emitting layer comprises a first tapered portion between the end portion of the first pixel electrode and the second organic layer, wherein the second light-emitting layer comprises a second tapered portion between the end portion of the second pixel electrode and the second organic layer, and wherein the photoelectric conversion layer comprises a third tapered portion between the end portion of the third pixel electrode and the first organic layer.

5. The display apparatus according to claim 1, further comprising:

a first carrier-transport layer over the first light-emitting layer;

a second carrier-transport layer over the second light-emitting layer; and a third carrier-transport layer over the photoelectric conversion layer.

6. The display apparatus according to claim 5, further comprising:

a common layer over the first carrier-transport layer, the second carrier-transport layer, the third carrier-transport layer, the first organic layer, and the second organic layer, wherein the common electrode is provided over the common layer.

7. The display apparatus according to claim 6, wherein the common layer comprises a carrier-injection layer.

8. A display module comprising:

the display apparatus according to claim 1, and at least one of a connector and an integrated circuit.

9. An electronic apparatus comprising:

the display module according to claim 8, and at least one of a battery, a camera, a speaker, and a microphone.

10. A display apparatus comprising, over a substrate having a visible-light-transmitting property, a first light-emitting element, a second light-emitting element adjacent to the first light-emitting element, a light-receiving element adjacent to the second light-emitting element, a first organic layer provided between the second light-emitting element and the light-receiving element, and a second organic layer provided between the first light-emitting element and the second light-emitting element, wherein the first light-emitting element comprises a first pixel electrode, a first light-emitting layer over the first pixel electrode, and a common electrode over the first light-emitting layer, wherein the second light-emitting element comprises a second pixel electrode, a second light-emitting layer over the second pixel electrode, and the common electrode over the second light-emitting layer, wherein the light-receiving element comprises a third pixel electrode, a photoelectric conversion layer over the third pixel electrode, and the common electrode over the photoelectric conversion layer, wherein the common electrode is provided over the first organic layer and the second organic layer, wherein the common electrode has a visible-light-transmitting property, and wherein transmittance of at least one of red light, green light, and blue light through the first organic layer is lower than the transmittance of the light in the second organic layer.

11. A method for fabricating a display apparatus comprising the steps of:

forming a first pixel electrode, a second pixel electrode, and a third pixel electrode over a substrate with a visible-light-transmitting property;

forming a first light-emitting film over the substrate and the first to third pixel electrodes;

forming a first sacrificial film over the first light-emitting film;

processing the first light-emitting film and the first sacrificial film to form a first light-emitting layer and a first sacrificial layer over the first light-emitting layer;

forming a second light-emitting film over the substrate, the second pixel electrode, the third pixel electrode, and the first sacrificial layer;

forming a second sacrificial film over the second light-emitting film;

processing the second light-emitting film and the second sacrificial film to form a second light-emitting layer adjacent to the first light-emitting layer and a second sacrificial layer over the second light-emitting layer;

forming a photoelectric conversion film over the substrate, the third pixel electrode, the first sacrificial layer, and the second sacrificial layer;

forming a third sacrificial film over the photoelectric conversion film;

processing the photoelectric conversion film and the third sacrificial film to form a photoelectric conversion layer adjacent to the second light-emitting layer and a third sacrificial layer over the photoelectric conversion layer;

forming a first organic layer between the second light-emitting layer and the photoelectric conversion layer;

forming a second organic layer between the first light-emitting layer and the second light-emitting layer, wherein transmittance of light with a specific wavelength being at least part of the visible light wavelength in the second organic layer is higher than transmittance of light with the specific wavelength in the first organic layer;

removing at least part of the first to third sacrificial layer; and forming a common electrode with a visible-light-transmitting property over the first light-emitting layer, the second light-emitting layer, the photoelectric conversion layer, the first organic layer, and the second organic layer.

12. The method for fabricating a display apparatus according to claim 11, wherein the first and second pixel electrodes have a visible-light-transmitting property.

13. The method for fabricating a display apparatus according to claim 11, further comprising the steps of:

forming the second organic layer before forming the first organic layer;

forming a protective film over the first to third sacrificial layers and the second organic layer before forming the first organic layer;

forming an organic film over the protective film; and processing the organic film to form the first organic layer.

14. The method for fabricating a display apparatus according to claim 13, further comprising the step of processing the protective film to form a protective layer below the first organic layer.

15. The method for fabricating a display apparatus according to claim 11, further comprising the steps of:

forming a common layer over the first light-emitting layer, the second light-emitting layer, the photoelectric conversion layer, the first organic layer, and the second organic layer after removing at least part of the first to third sacrificial layers; and forming the common electrode over the common layer.

16. The method for fabricating a display apparatus according to claim 15, wherein the common layer comprises a carrier-injection layer.

17. The method for fabricating a display apparatus according to claim 11, further comprising the steps of:

forming a film having a first carrier-transport property over the first light-emitting film before forming the first sacrificial film;

processing the first light-emitting film, the film having the first carrier-transport property, and the first sacrificial film to form the first light-emitting layer, a first carrier-transport layer over the first light-emitting layer, and the first sacrificial layer over the first carrier-transport layer;

forming a film having a second carrier-transport property over the second light-emitting film before forming the second sacrificial film;

processing the second light-emitting film, the film having the second carrier-transport property, and the second sacrificial film to form the second light-emitting layer, a second carrier-transport layer over the second light-emitting layer, and the second sacrificial layer over the second carrier-transport layer;

forming a film having a third carrier-transport property over the photoelectric conversion film before forming the third sacrificial film; and processing the photoelectric conversion film, the film having the third carrier-transport property, and the third sacrificial film to form the photoelectric conversion layer, a third carrier-transport layer over the photoelectric conversion layer, and the third sacrificial layer over the third carrier-transport layer.

18. The method for fabricating a display apparatus according to claim 11, further comprising the steps of:

forming the first to third pixel electrodes to have end portions with tapered shapes;

processing the first light-emitting film to form the first light-emitting layer to cover the end portion of the first pixel electrode;

processing the second light-emitting film to form the second light-emitting layer to cover the end portion of the second pixel electrode; and processing the photoelectric conversion film to form the photoelectric conversion layer to cover the end portion of the third pixel electrode.

19. The method for fabricating a display apparatus according to claim 18, further comprising the steps of:

processing the first light-emitting film to form the first light-emitting layer so as to comprise a first tapered portion between the end portion of the first pixel electrode and an end portion of the first sacrificial layer;

processing the second light-emitting film to form the second light-emitting layer so as to comprise a second tapered portion between the end portion of the second pixel electrode and an end portion of the second sacrificial layer; and processing the photoelectric conversion film to form the photoelectric conversion layer so as to comprise a third tapered portion between the end portion of the third pixel electrode and an end portion of the third sacrificial layer.

20. A method for fabricating a display apparatus comprising the steps of:

forming a first pixel electrode, a second pixel electrode, and a third pixel electrode over a substrate with a visible-light-transmitting property;

forming a first light-emitting film over the substrate and over the first to third pixel electrodes;

forming a first sacrificial film over the first light-emitting film;

processing the first light-emitting film and the first sacrificial film to form a first light-emitting layer and a first sacrificial layer over the first light-emitting layer;

forming a second light-emitting film over the substrate, the second pixel electrode, over the third pixel electrode, and the first sacrificial layer;

forming a second sacrificial film over the second light-emitting film;

processing the second light-emitting film and the second sacrificial film to form a second light-emitting layer adjacent to the first light-emitting layer and a second sacrificial layer over the second light-emitting layer;

forming a photoelectric conversion film over the substrate, the third pixel electrode, the first sacrificial layer, and the second sacrificial layer;

forming a third sacrificial film over the photoelectric conversion film;

processing the photoelectric conversion film and the third sacrificial film to form a photoelectric conversion layer adjacent to the second light-emitting layer and a third sacrificial layer over the photoelectric conversion layer;

forming a first organic layer between the second light-emitting layer and the photoelectric conversion layer;

forming a second organic layer between the first light-emitting layer and the second light-emitting layer, wherein the second organic layer has transmittance of at least one of red light, green light, and blue light higher than the transmittance of the light through the first organic layer;

removing at least part of the first to third sacrificial layer; and forming a common electrode with a visible-light-transmitting property over the first light-emitting layer, the second light-emitting layer, the photoelectric conversion layer, the first organic layer, and the second organic layer.

* * * * *